US012027579B2

(12) United States Patent
Mori et al.

(10) Patent No.: US 12,027,579 B2
(45) Date of Patent: Jul. 2, 2024

(54) SEMICONDUCTOR DEVICE HAVING A CARRIER TRAPPING REGION INCLUDING CRYSTAL DEFECTS

(71) Applicant: ROHM CO., LTD., Kyoto (JP)

(72) Inventors: Seigo Mori, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/480,203

(22) PCT Filed: Jan. 25, 2018

(86) PCT No.: PCT/JP2018/002358
§ 371 (c)(1),
(2) Date: Jul. 23, 2019

(87) PCT Pub. No.: WO2018/139557
PCT Pub. Date: Aug. 2, 2018

(65) Prior Publication Data
US 2019/0371885 A1 Dec. 5, 2019

(30) Foreign Application Priority Data
Jan. 25, 2017 (JP) ................................ 2017-011610

(51) Int. Cl.
*H01L 29/06* (2006.01)
*H01L 21/02* (2006.01)
(Continued)

(52) U.S. Cl.
CPC ...... *H01L 29/0634* (2013.01); *H01L 21/0223* (2013.01); *H01L 21/02529* (2013.01);
(Continued)

(58) Field of Classification Search
CPC ............. H01L 29/0634; H01L 29/0657; H01L 29/0696; H01L 29/1608; H01L 29/32;
(Continued)

(56) References Cited

U.S. PATENT DOCUMENTS 5,270,244 A * 12/1993 Baliga ................. H01L 21/0445
438/440
5,318,915 A * 6/1994 Baliga ................... H01L 21/046
257/E21.057
(Continued)

FOREIGN PATENT DOCUMENTS

CN 1161104 A 10/1997
CN 101645459 A 2/2010
(Continued)

OTHER PUBLICATIONS

Patent Cooperation Treaty: International Search Report and Written Opinion of PCT/JP2018/002358; Feb. 27, 2018; 13 pages (including English translation for the International Search Report only).
(Continued)

*Primary Examiner* — Eric W Jones
(74) *Attorney, Agent, or Firm* — XSENSUS LLP

(57) ABSTRACT

A semiconductor device includes a semiconductor layer of a first conductivity type having a main surface, a diode region of the first conductivity type formed in a surface layer portion of the main surface of the semiconductor layer, a carrier trapping region including crystal defects and formed along a peripheral edge of the diode region in the surface layer portion of the main surface of the semiconductor layer, and an anode electrode formed on the main surface of the semiconductor layer and forming a Schottky junction with the diode region.

14 Claims, 101 Drawing Sheets

1

(51) Int. Cl.

| | |
|---|---|
| ***H01L 21/04*** | (2006.01) |
| ***H01L 23/00*** | (2006.01) |
| ***H01L 23/31*** | (2006.01) |
| ***H01L 23/495*** | (2006.01) |
| ***H01L 29/16*** | (2006.01) |
| ***H01L 29/32*** | (2006.01) |
| ***H01L 29/417*** | (2006.01) |
| ***H01L 29/423*** | (2006.01) |
| ***H01L 29/66*** | (2006.01) |
| ***H01L 29/78*** | (2006.01) |
| ***H01L 29/872*** | (2006.01) |
| ***H02M 7/00*** | (2006.01) |
| ***H02M 7/5387*** | (2007.01) |
| ***H02P 27/06*** | (2006.01) |

(52) U.S. Cl.

CPC ........ *H01L 21/046* (2013.01); *H01L 21/0485* (2013.01); *H01L 21/049* (2013.01); *H01L 23/3121* (2013.01); *H01L 23/49562* (2013.01); *H01L 24/48* (2013.01); *H01L 29/0657* (2013.01); *H01L 29/0696* (2013.01); *H01L 29/1608* (2013.01); *H01L 29/32* (2013.01); *H01L 29/417* (2013.01); *H01L 29/4236* (2013.01); *H01L 29/6606* (2013.01); *H01L 29/66068* (2013.01); *H01L 29/66734* (2013.01); *H01L 29/7811* (2013.01); *H01L 29/7813* (2013.01); *H01L 29/872* (2013.01); *H02M 7/003* (2013.01); *H02M 7/5387* (2013.01); *H01L 21/02255* (2013.01); *H01L 2224/48177* (2013.01); *H01L 2924/10272* (2013.01); *H01L 2924/12032* (2013.01); *H01L 2924/13091* (2013.01); *H02P 27/06* (2013.01)

(58) Field of Classification Search

CPC ............... H01L 29/417; H01L 29/4236; H01L 29/6606; H01L 29/66068; H01L 29/66734; H01L 29/7811; H01L 29/7813; H01L 29/872; H01L 21/0223; H01L 21/02529; H01L 21/046; H01L 21/0485; H01L 21/049; H01L 21/02255; H01L 23/3121; H01L 23/49562; H01L 24/48; H01L 2224/48177; H01L 2924/10272; H01L 2924/12032; H01L 2924/13091; H02M 7/003; H02M 7/5387; H02P 27/06

USPC ............................................................ 257/77

See application file for complete search history.

(56) References Cited

U.S. PATENT DOCUMENTS

| | | | | |
|---|---|---|---|---|
| 5,436,174 | A * | 7/1995 | Baliga | H01L 21/7602 438/924 |
| 5,449,925 | A * | 9/1995 | Baliga | H01L 29/6606 257/77 |
| 5,635,412 | A * | 6/1997 | Baliga | H01L 29/6606 438/572 |
| 6,340,836 | B1 | 1/2002 | Shikata | |
| 6,673,679 | B1 | 1/2004 | Miyasaka et al. | |
| 9,704,949 | B1 * | 7/2017 | Ghandi | H01L 29/872 |
| 2003/0207536 | A1 | 11/2003 | Miyasaka et al. | |
| 2004/0256690 | A1 * | 12/2004 | Kocon | H01L 29/861 257/471 |
| 2007/0293001 | A1 | 12/2007 | Wu | |
| 2008/0169475 | A1 * | 7/2008 | Nishio | H01L 29/872 257/77 |
| 2012/0032305 | A1 * | 2/2012 | Kitamura | H01L 29/36 257/607 |
| 2012/0169262 | A1 | 7/2012 | Nakajima | |
| 2012/0223332 | A1 * | 9/2012 | Kamaga | H01L 29/0619 257/77 |
| 2013/0307130 | A1 | 11/2013 | Oga et al. | |
| 2014/0184303 | A1 * | 7/2014 | Hasegawa | H03K 17/567 327/377 |
| 2014/0252463 | A1 * | 9/2014 | Darwish | H01L 29/407 257/330 |
| 2014/0361398 | A1 * | 12/2014 | Higashida | H01L 29/66143 257/471 |
| 2015/0034970 | A1 * | 2/2015 | Aketa | H01L 29/0611 257/77 |
| 2015/0048384 | A1 * | 2/2015 | Tanaka | H01L 29/6606 257/77 |
| 2015/0140754 | A1 | 5/2015 | Nakajima | |
| 2015/0279932 | A1 | 10/2015 | Nakajima | |
| 2016/0035824 | A1 | 2/2016 | Nakajima | |
| 2016/0181442 | A1 | 6/2016 | Higashida | |
| 2016/0197201 | A1 * | 7/2016 | Van Brunt | H01L 29/1095 257/77 |
| 2016/0211323 | A1 | 7/2016 | Nakajima | |
| 2016/0315203 | A1 * | 10/2016 | Uchida | H01L 29/045 |
| 2017/0062568 | A1 * | 3/2017 | Caspary | C30B 15/04 |
| 2019/0371885 | A1 | 12/2019 | Mori et al. | |

FOREIGN PATENT DOCUMENTS

| | | | |
|---|---|---|---|
| CN | 103137618 | A | 6/2013 |
| CN | 103503132 | A | 1/2014 |
| DE | 10000754 | A1 | 7/2000 |
| DE | 10066412 | B4 | 12/2012 |
| EP | 2720263 | A1 | 4/2014 |
| JP | 2000208527 | A | 7/2000 |
| JP | 2007042997 | A | 2/2007 |
| JP | 2007266103 | A | 10/2007 |
| JP | 2009158519 | A | 7/2009 |
| JP | 2010109296 | A | 5/2010 |
| JP | 2012142330 | A | 7/2012 |
| JP | 2012182236 | A | 9/2012 |
| JP | 2014110382 | A | 6/2014 |
| JP | 2014236171 | A | 12/2014 |
| WO | 2012169044 | A1 | 12/2012 |
| WO | 2016125490 | A1 | 8/2016 |
| WO | 2018139557 | A1 | 8/2018 |

OTHER PUBLICATIONS

PCT: International Preliminary Report on Patentability of PCT/JP2018/002358 (related application): International Search Report and Written Opinion; 19 pages; Aug. 8, 2019.

CN: Chinese Search Report Office Action of CN 201880008393.7 (related application); Dec. 15, 2021; 3 Pages.

Japanese Patent Office; Notice of Reasons for Refusal for Japanese Patent Application 2018-564637 (related application); Iwamoto, Tsutomu; Dec. 23, 2021; 16 Pages.

Chinese Patent Office: Second Office Action of CN 201880008393.7 (related application); Apr. 28, 2022; 20 pages.

German Patent and Trademark Office: Office Action for German Patent Application No. 112018001442.8 (related application); Mar. 2, 2022; 18 pages (including translation).

Japanese Patent Office; Notice of Reasons for Refusal for Japanese Patent Application 2018-564637 (related application); Oct. 21, 2021; 16 pages.

* cited by examiner

SEMICONDUCTOR DEVICE HAVING A CARRIER TRAPPING REGION INCLUDING CRYSTAL DEFECTS

CROSS-REFERENCE TO RELATED APPLICATIONS

This application is a U.S. National Phase application submitted under 35 U.S.C. § 371 of Patent Cooperation Treaty application serial no. PCT/JP2018/002358, filed Jan. 25, 2018, and entitled SEMICONDUCTOR DEVICE, which application claims priority to Japanese patent application serial no. 2017-011610, filed Jan. 25, 2017, and entitled. 半導体装置.

Patent Cooperation Treaty application serial no. PCT/JP2018/002358, published as WO 2018/139557 A1, and Japanese patent application serial no. 2017-011610, are incorporated herein by reference.

TECHNICAL FIELD

The present invention relates to a semiconductor device.

BACKGROUND ART

Patent Literature 1 discloses a semiconductor device having a super junction structure. The semiconductor device includes an epitaxial layer. A p-type body region is formed in a surface layer portion of the epitaxial layer. An n-type potential extraction portion is formed in a surface layer portion of the p-type body region.

A $p^-$-type pillar region is formed in a region of the epitaxial layer lower than the p-type body region. A gate electrode is formed on the epitaxial layer. The gate electrode faces the p-type body region and the n-type potential extraction region across a gate insulating film.

CITATION LIST

Patent Literature

PATENT LITERATURE 1: JP 2010/109296 A

SUMMARY OF THE INVENTION

Technical Problem

A semiconductor device having a super junction structure has advantages in terms of achieving low on resistance and high withstand voltage. However, difficulty of manufacture is high because the $p^-$-type pillar region must be formed at a deep position of the semiconductor layer.

As one example, there is a method for forming a $p^-$-type pillar region oriented along a thickness direction of a semiconductor layer by repeating epitaxial growth of the semiconductor layer and implantation of a p-type impurity alternately. As another example, there is a method for forming a $p^-$-type pillar region by forming a trench in a semiconductor layer and thereafter embedding a $p^-$-type polysilicon in the trench.

These methods require effort and time in terms of forming the $p^-$-type pillar region. Also, with these methods, the difficulty of manufacture increases as the semiconductor layer becomes thicker.

A preferred embodiment of the present invention thus provides a semiconductor device which is easy to manufacture and with which reduction of on resistance and improvement of withstand voltage can be achieved.

Solution to the Problem

A preferred embodiment of the present invention provides a semiconductor device including a semiconductor layer of a first conductivity type having a main surface, a diode region of the first conductivity type formed in a surface layer portion of the main surface of the semiconductor layer, a carrier trapping region including crystal defects and formed along a peripheral edge of the diode region in the surface layer portion of the main surface of the semiconductor layer, and an anode electrode formed on the main surface of the semiconductor layer and forming a Schottky junction with the diode region.

The present semiconductor device has a Schottky barrier diode. In the surface layer portion of the main surface of the semiconductor layer, the carrier trapping region is formed along the peripheral edge of the diode region.

Majority carriers inside the semiconductor layer are trapped by the crystal defects included in the carrier trapping region. That is, the crystal defects included in the carrier trapping region have the same function as donors or acceptors.

The carrier trapping region becomes charged oppositely to a first conductivity type impurity that is ionized inside the semiconductor layer by trapping the majority carriers. Decrease in electric field strength along a thickness direction of the semiconductor layer when a voltage is applied to the semiconductor layer can thereby be suppressed. Consequently, the electric field strength inside the semiconductor layer can be made close to being uniform and a withstand voltage can thus be improved.

Also, with the present semiconductor device, the semiconductor layer can be increased in first impurity concentration while forming the carrier trapping region. Reduction of on resistance can thereby be achieved.

Such a carrier trapping region may be formed, for example, by irradiating the semiconductor layer with light ions, electrons, or neutrons, etc. A complicated manufacturing process is thus not required to form the carrier trapping region.

Also, with the irradiation of light ions, electrons, or neutrons, etc., a carrier trapping region having arbitrary crystal defect density can be formed in arbitrary region of the semiconductor layer by just adjusting conditions, such as an irradiation amount, irradiation energy, etc. A semiconductor device which is easy to manufacture and with which reduction of on resistance and improvement of withstand voltage can be achieved can thus be provided.

A preferred embodiment of the present invention provides a semiconductor device including a semiconductor layer of a first conductivity type having a main surface, a second conductivity type impurity region formed in a surface layer portion of the main surface of the semiconductor layer, a first conductivity type impurity region formed in a surface layer portion of the second conductivity type impurity region, a carrier trapping region including crystal defects introduced into the semiconductor layer and formed in a region of the semiconductor layer lower than the second conductivity type impurity region, and a gate electrode facing the second conductivity type impurity region and the first conductivity type impurity region across a gate insulating film.

The present semiconductor device has an insulated gate type transistor. The carrier trapping region is formed in the region of the semiconductor layer lower than the second conductivity type impurity region.

Majority carriers inside the semiconductor layer are trapped by the crystal defects included in the carrier trapping region. That is, the crystal defects included in the carrier trapping region have the same function as donors or acceptors.

The carrier trapping region becomes charged oppositely to an ionized first conductivity type impurity by trapping the majority carriers. Decrease in electric field strength along a thickness direction of the semiconductor layer when a voltage is applied to the semiconductor layer can thereby be suppressed. Consequently, the electric field strength inside the semiconductor layer can be made close to being uniform and a withstand voltage can thus be improved.

Also, with the present semiconductor device, the semiconductor layer can be increased in first impurity concentration while forming the carrier trapping region. Reduction of on resistance can thereby be achieved.

Such a carrier trapping region may be formed, for example, by irradiating the semiconductor layer with light ions, electrons, or neutrons, etc. A complicated manufacturing process is thus not required to form the carrier trapping region.

Also, with the irradiation of light ions, electrons, or neutrons, etc., a carrier trapping region having arbitrary crystal defect density can be formed in arbitrary region of the semiconductor layer by just adjusting conditions, such as an irradiation amount, irradiation energy, etc. A semiconductor device which is easy to manufacture and with which reduction of on resistance and improvement of withstand voltage can be achieved can thus be provided.

The aforementioned as well as yet other objects, features, and effects of the present invention will be made clear by the following description of the preferred embodiments, with reference to the accompanying drawings.

DESCRIPTION OF THE EMBODIMENTS

Figure 1:
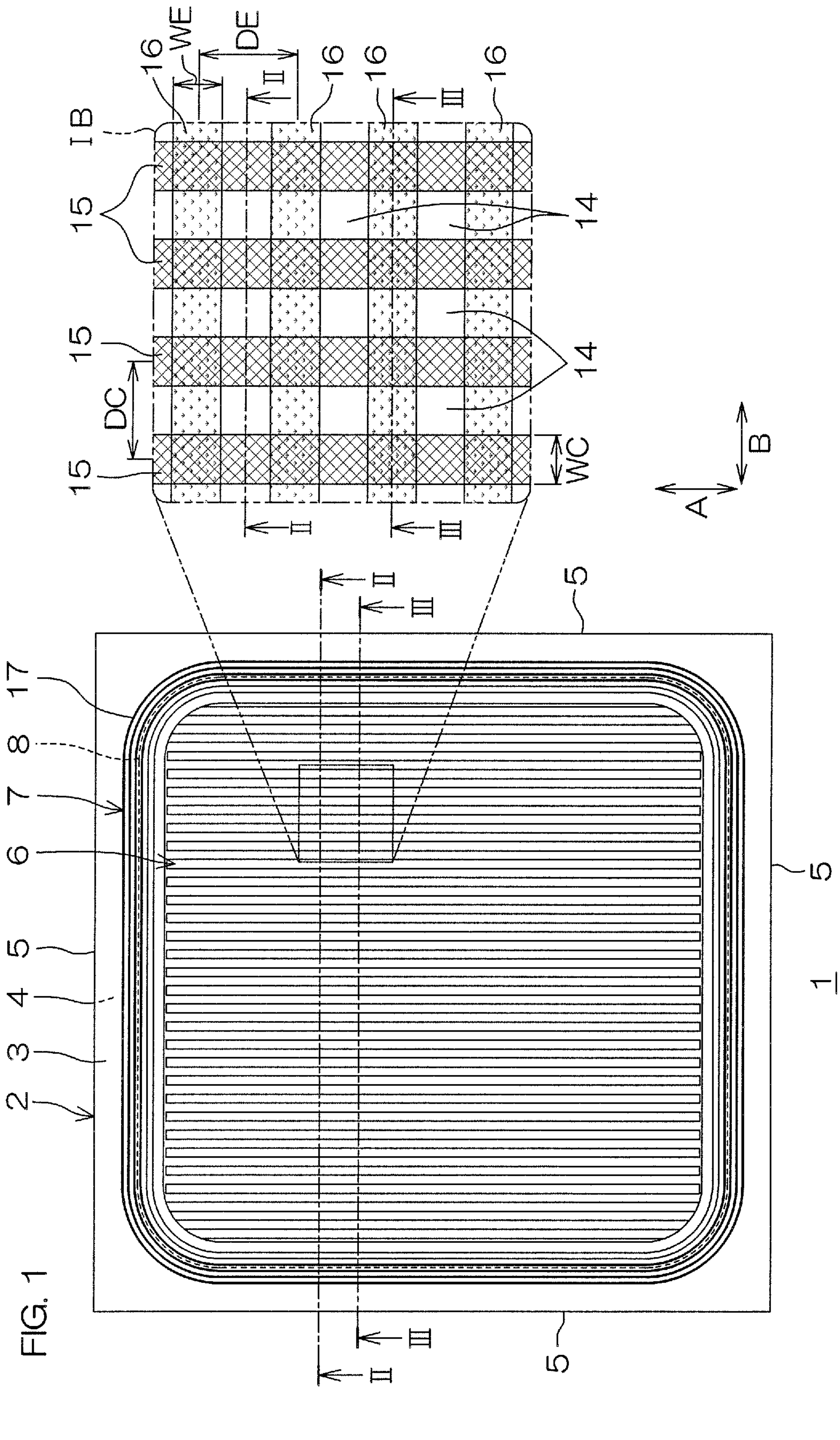
FIG. 1 is a plan view of a semiconductor device according to a first preferred embodiment of the present invention and is a diagram showing a first configuration example of carrier trapping regions and a first configuration example of electric field relaxation regions.
Figure 2:
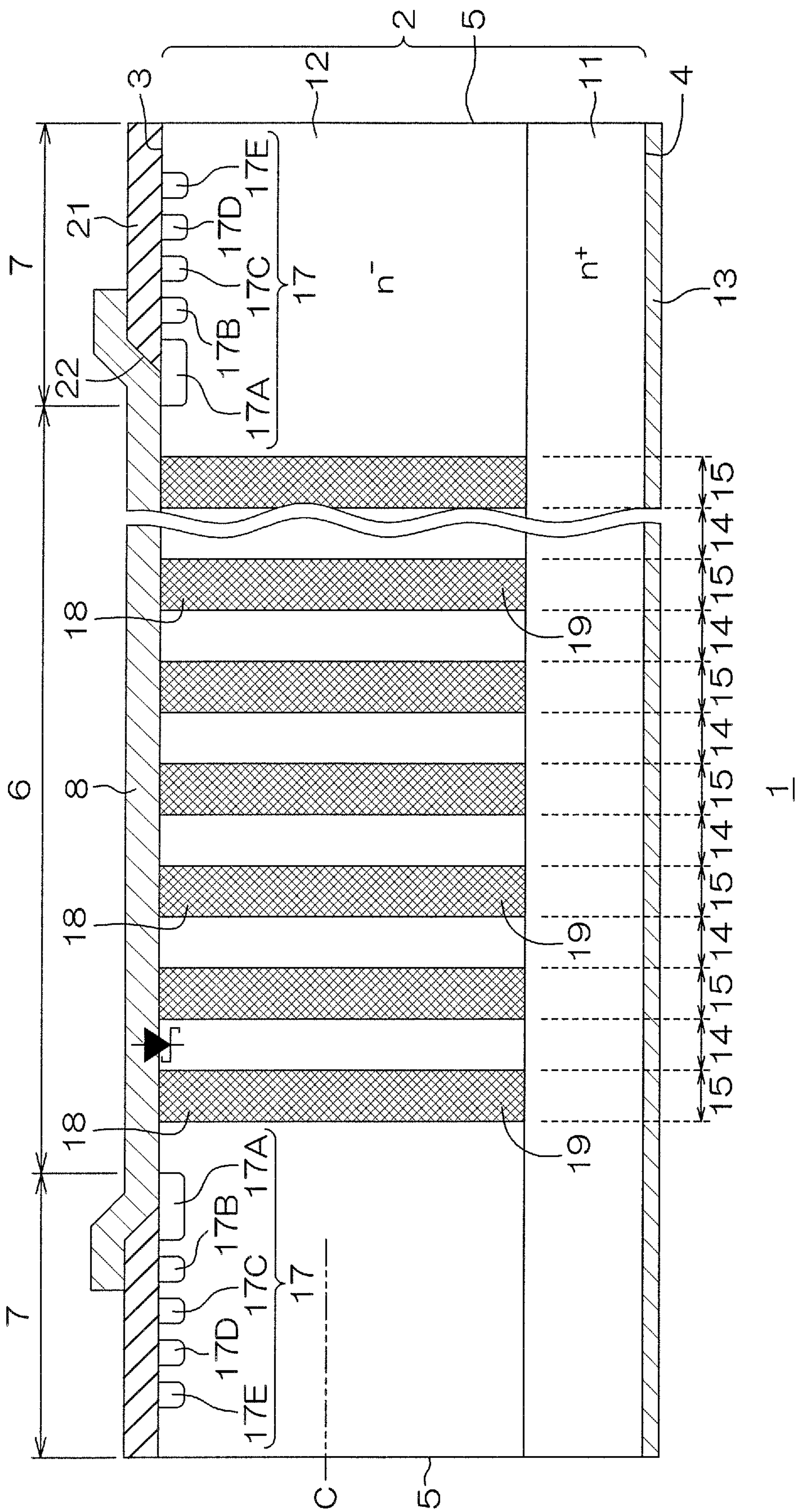
FIG. 2 is a sectional view taken along line II-II shown in FIG. 1.
Figure 3:
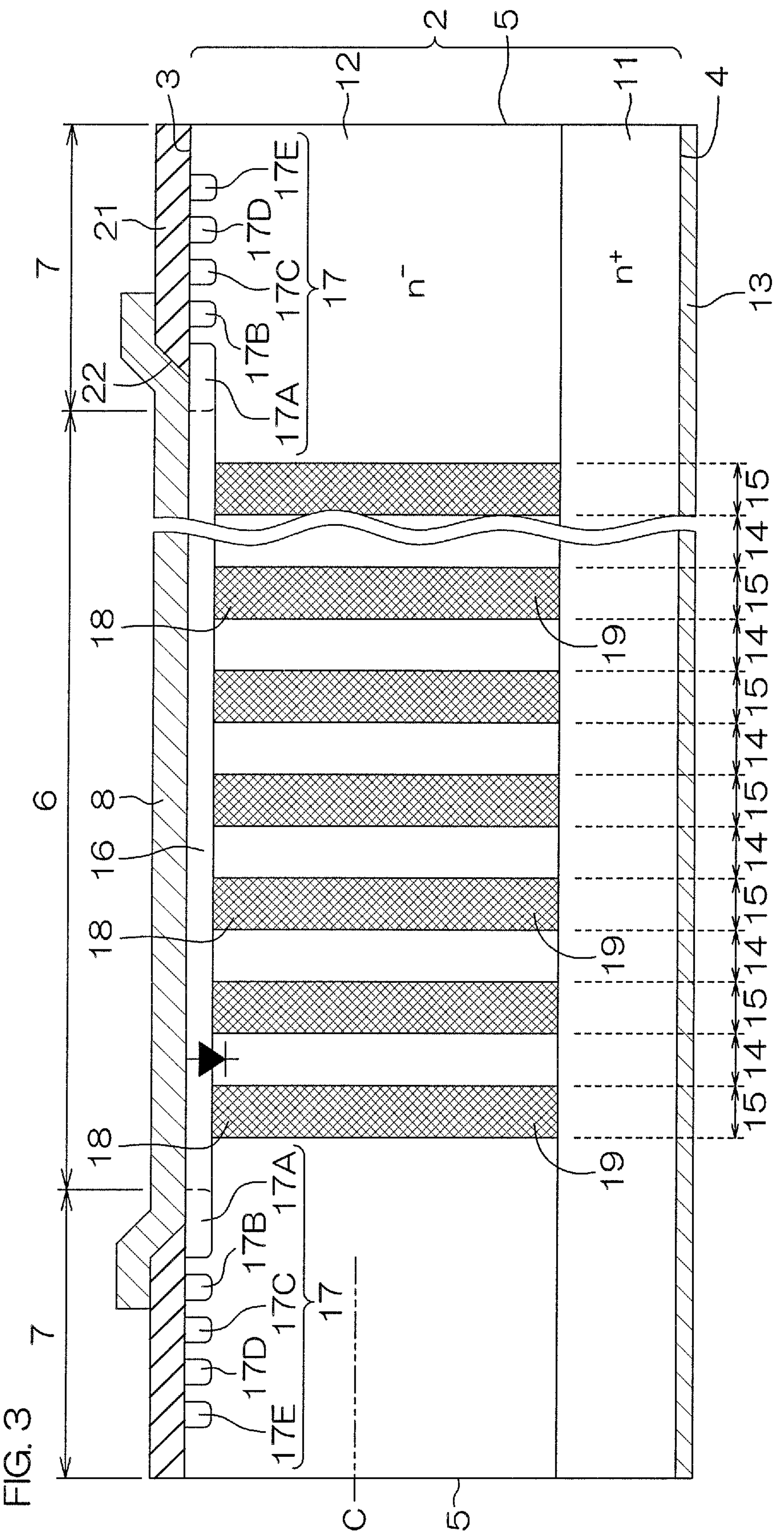
FIG. 3 is a sectional view taken along line shown in FIG. 1.

FIG. 1 is a plan view of a semiconductor device 1 according to a first preferred embodiment of the present invention and is a diagram showing a first configuration example of carrier trapping regions 15 and a first configuration example of electric field relaxation regions 16. FIG. 2 is a sectional view taken along line II-II shown in FIG. 1. FIG. 3 is a sectional view taken along line shown in FIG. 1.

Referring to FIG. 1, the semiconductor device 1 includes a chip main body 2. The chip main body 2 includes a first main surface 3 at one side, a second main surface 4 at another side, and side surfaces 5 connecting the first main surface 3 and the second main surface 4.

The first main surface 3 and the second main surface 4 are formed in quadrilateral shapes in a plan view as viewed in a normal direction thereof (hereinafter referred to simply as "plan view"). A device formation region 6 and an outer region 7 are set in the chip main body 2.

The device formation region 6 is a region in which a Schottky barrier diode is formed. The device formation region 6 is also referred to as an active region. The device formation region 6 is set to a quadrilateral shape having four sides parallel to the side surfaces 5 of the chip main body 2 in plan view. The device formation region 6 is set in an inner region of the chip main body 2 across intervals from peripheral edges of the chip main body 2.

The outer region 7 is set in a region between the side surfaces 5 of the chip main body 2 and peripheral edges of the device formation region 6 in plan view. The outer region 7 is set to an endless shape (quadrilateral annular shape) surrounding the device formation region 6 in plan view.

An anode pad electrode 8 is formed as a front surface electrode on the first main surface 3 of the chip main body 2. In FIG. 1, the anode pad electrode 8 is indicated by broken lines. The anode pad electrode 8 covers substantially an entirety of the device formation region 6. The anode pad electrode 8 may include at least one type of substance among nickel, aluminum, conductive polysilicon, molybdenum, and titanium.

Referring to FIG. 2, the chip main body 2 has a laminated structure that includes an $n^+$-type semiconductor substrate 11 and an $n^-$-type epitaxial layer 12 (semiconductor layer), formed on the $n^+$-type semiconductor substrate 11.

In the chip main body 2, the $n^+$-type semiconductor substrate 11 is formed as a high concentration region. In the chip main body 2, the $n^-$-type epitaxial layer 12 is formed as a low concentration region (drift region).

The $n^-$-type epitaxial layer 12 forms the first main surface 3 of the chip main body 2. The $n^+$-type semiconductor substrate 11 forms the second main surface 4 of the chip main body 2. In the description that follows, the first main surface 3 of the chip main body 2 may also be referred to as the first main surface 3 of the $n^-$-type epitaxial layer 12.

Each of the $n^+$-type semiconductor substrate 11 and the $n^-$-type epitaxial layer 12 includes a wide bandgap semiconductor. Each of the $n^+$-type semiconductor substrate 11 and the $n^-$-type epitaxial layer 12 may have a bandgap of not less than 3 eV and not more than 6 V. Each of the $n^+$-type semiconductor substrate 11 and the $n^-$-type epitaxial layer 12 may have a dielectric breakdown electric field strength of not less than 1 MV/cm and not more than 9 MV/cm.

The $n^+$-type semiconductor substrate 11 may include an SiC, diamond, or nitride semiconductor. The $n^-$-type epitaxial layer 12 may include an SiC, diamond, or nitride semiconductor. The SiC may be 4H—SiC. The nitride semiconductor may be GaN.

4H—SiC has a bandgap of approximately 3.26 eV and a dielectric breakdown electric field strength of approximately 2.8 MV/cm. Diamond has a bandgap of approximately 5.47 eV and a dielectric breakdown electric field strength of approximately 8.0 MV/cm. GaN has a bandgap of approximately 3.42 eV and a dielectric breakdown electric field strength of approximately 3.0 MV/cm.

The $n^-$-type epitaxial layer 12 may be formed of the same material type as the $n^+$-type semiconductor substrate 11. The $n^-$-type epitaxial layer 12 may be formed of a material type differing from the $n^+$-type semiconductor substrate 11.

With this embodiment, an example where both the $n^+$-type semiconductor substrate 11 and the $n^-$-type epitaxial layer 12 include an SiC (4H—SiC) shall be described. An off angle of the $n^+$-type semiconductor substrate 11 may be 4°.

A cathode pad electrode 13 as a rear surface electrode is connected to the second main surface 4 of the chip main body 2. The cathode pad electrode 13 forms an ohmic junction with the $n^+$-type semiconductor substrate 11.

The cathode pad electrode 13 may have a three-layer structure that includes a titanium film, a nickel film, and a silver film laminated in that order from the second main surface 4 of the chip main body 2. The cathode pad electrode 13 may have a four-layer structure that includes a titanium film, a nickel film, a gold film, and a silver film laminated in that order from the second main surface 4 of the chip main body 2.

A thickness of the $n^-$-type epitaxial layer 12 may be not less than 1 μm and not more than 200 μm (for example, approximately 4 μm). A withstand voltage of the semiconductor device 1 can be improved by increasing the thickness of the $n^-$-type epitaxial layer 12.

The withstand voltage of the semiconductor device 1 is defined by a maximum reverse voltage across the anode pad electrode 8 and the cathode pad electrode 13 when a reverse current is made to flow across the anode pad electrode 8 and the cathode pad electrode 13.

The maximum reverse voltage when the reverse current is set to 1 mA may be not less than 100 V and not more than 30000 V. For example, by setting the thickness of the $n^-$-type epitaxial layer 12 to not less than 5 μm, a reverse withstand voltage of not less than 1000 V can be obtained.

Referring to FIG. 1 to FIG. 3, $n^-$-type diode regions 14, carrier trapping regions 15, electric field relaxation regions 16, and p-type termination regions 17 are formed in the $n^-$-type epitaxial layer 12.

In FIG. 1 and FIG. 2, the carrier trapping regions 15 are indicated by cross hatching. Also, in FIG. 1, the electric field relaxation regions 16 are indicated by dot hatching.

In this embodiment, a plurality of the $n^-$-type diode regions 14 are formed at intervals in a surface layer portion of the first main surface 3 of the $n^-$-type epitaxial layer 12. The plurality of $n^-$-type diode regions 14 are arrayed in a matrix at intervals along an arbitrary first direction A and a second direction B intersecting the first direction A in plan view.

In this embodiment, the first direction A is a direction along an arbitrary one side surface 5 among the side surfaces 5 of the chip main body 2. The second direction B is a direction along a side surface 5 orthogonal to the arbitrary one side surface 5.

The first direction A and the second direction B are not restricted to directions along the side surfaces 5 of the chip main body 2. The first direction A and the second direction B may be directions along diagonal directions of the chip main body 2.

In this embodiment, each $n^-$-type diode region 14 is formed in a quadrilateral shape in plan view. In this embodiment, the $n^-$-type diode region 14 is formed using a region of a portion of the $n^-$-type epitaxial layer 12 as it is. The $n^-$-type diode region 14 has an n-type impurity concentration substantially equal to an n-type impurity concentration of the $n^-$-type epitaxial layer 12.

The $n^-$-type diode region 14 may be formed by introducing an n-type impurity into the region of the portion of the $n^-$-type epitaxial layer 12. In this case, the $n^-$-type diode region 14 may have a higher n-type impurity concentration than the n-type impurity concentration of the $n^-$-type epitaxial layer 12.

The $n^-$-type diode region 14 forms a Schottky junction with the anode pad electrode 8 described above. A Schottky diode having the anode pad electrode 8 as an anode region and the $n^-$-type diode region 14 (cathode pad electrode 13) as a cathode region is formed thereby.

Referring to FIG. 1 and FIG. 2, each carrier trapping region 15 includes crystal defects that are selectively introduced into the $n^-$-type epitaxial layer 12. The crystal defects may include lattice defects represented by interstitial atoms, atomic vacancies, etc.

The carrier trapping region 15 has a crystal defect density N2 that is higher than an n-type impurity density N1 of the $n^-$-type epitaxial layer 12 (N2>N1). The carrier trapping region 15 is also a high resistance region having a higher specific resistance ρ2 than a specific resistance ρ1 of the $n^-$-type epitaxial layer 12 (ρ2>ρ1).

The n-type impurity density N1 is obtained by converting a capacitance value and a voltage value obtained by a capacitance-voltage measurement method to an n-type impurity density. Also, the n-type impurity density N1 is obtained by a SIMS (secondary ion mass spectrometry) method. On the other hand, the crystal defect density N2 can be calculated from a trap level density obtained by a DLTS (deep level transient spectroscopy) method.

The carrier trapping regions 15 are formed along peripheral edges of the $n^-$-type diode regions 14. Each carrier trapping region 15 is formed in a band shape extending along the first direction A in plan view.

In this embodiment, a plurality of the carrier trapping regions 15 are formed at intervals along the second direction B. The plurality of carrier trapping regions 15 are thereby formed in a stripe shape in plan view. The carrier trapping regions 15 define regions between the $n^-$-type diode regions 14 that are mutually adjacent along the second direction B.

The carrier trapping regions 15 are formed in column shapes extending along a thickness direction (depth direction) of the $n^-$-type epitaxial layer 12. The thickness direction of the $n^-$-type epitaxial layer 12 is also the direction normal to the first main surface 3 of the $n^-$-type epitaxial layer 12.

Each carrier trapping region 15 includes a first region 18 of an upper side and a second region 19 of a lower side. The first region 18 is positioned upper than an intermediate region C of the $n^-$-type epitaxial layer 12. The second region 19 is positioned lower than the intermediate region C of the $n^-$-type epitaxial layer 12.

The intermediate region C of the $n^-$-type epitaxial layer 12 is a region of the $n^-$-type epitaxial layer 12 positioned at a thickness-direction intermediate portion of the $n^-$-type epitaxial layer 12. In FIG. 2, the intermediate region C is indicated by an alternate long and two short dashed lines.

In this embodiment, the first region 18 of the carrier trapping region 15 is exposed from the first main surface 3 of the $n^-$-type epitaxial layer 12. In this embodiment, the second region 19 of the carrier trapping region 15 is connected to the $n^+$-type semiconductor substrate 11.

Current paths rectilinearly connecting the anode pad electrode 8 and the cathode pad electrode 13 are formed in regions of the $n^-$-type epitaxial layer 12 positioned between mutually adjacent carrier trapping regions 15.

The carrier trapping regions 15 trap majority carriers and thereby form a carrier storage type super junction structure with the $n^-$-type epitaxial layer 12. By the carrier trapping regions 15, electric field strength inside the $n^-$-type epitaxial layer 12 can be maintained in a high state.

The crystal defects included in the carrier trapping regions 15 trap electrons which are the majority carriers included in the $n^-$-type epitaxial layer 12. That is, the crystal defects included in the carrier trapping regions 15 have the same function as acceptors.

More specifically, the n-type impurity introduced into the $n^-$-type epitaxial layer 12 becomes positively ionized by releasing electrons. The carrier trapping regions 15 become negatively charged in opposition to the positively ionized n-type impurity by trapping the electrons. That is, the carrier trapping regions 15 function virtually as acceptors.

By such carrier trapping regions 15, decrease in electric field strength along the thickness direction of the $n^-$-type epitaxial layer 12 when a voltage is applied to the $n^-$-type epitaxial layer 12 is suppressed.

The electric field strength inside the $n^-$-type epitaxial layer 12 is thereby maintained in a state of being high along the thickness direction of the $n^-$-type epitaxial layer 12. That is, the electric field strength inside the $n^-$-type epitaxial layer 12 is kept in a nearly uniform state or a uniform state.

A distance DC between carrier trapping regions 15 may be not less than 0.5 μm and not more than 10 μm. More specifically, the distance DC is a distance along the second direction B between a central portion of one carrier trapping region 15 and a central portion of another carrier trapping region 15. A width WC in the second direction B of each carrier trapping region 15 may be not less than 0.1 μm and not more than 10 μm.

A distance L, along the second direction B, of a portion of the $n^-$-type epitaxial layer 12 positioned between two mutually adjacent carrier trapping regions 15 may be not more than a sum W1+W2 of a first width W1 of a first depletion layer spreading from one carrier trapping region 15 and a second width W2 of a second depletion layer spreading from the other carrier trapping region 15 ($L \leq W1+W2$).

In this case, the first depletion layer and the second depletion layer overlap mutually in the portion of the $n^-$-type epitaxial layer 12 positioned between the two mutually adjacent carrier trapping regions 15. The portion of the $n^-$-type epitaxial layer 12 positioned between the two mutually adjacent carrier trapping regions 15 is thereby depleted.

Referring to FIG. 1, the electric field relaxation regions 16 are formed along peripheral edges of the $n^-$-type diode regions 14. Each electric field relaxation region 16 is formed in a band shape extending along the second direction B in plan view.

In this embodiment, a plurality of the electric field relaxation regions 16 are formed at intervals along the first direction A. The plurality of electric field relaxation regions 16 are thereby formed in a stripe shape in plan view. The plurality of electric field relaxation regions 16 define regions between the $n^-$-type diode regions 14 that are mutually adjacent along the first direction A.

In this embodiment, the electric field relaxation regions 16 have intersection portions intersecting the carrier trapping regions 15 in plan view. In this embodiment, the $n^-$-type diode regions 14 are defined by the carrier trapping regions 15 and the electric field relaxation regions 16.

A distance DE between electric field relaxation regions 16 may be not less than 0.2 μm and not more than 10 μm. More specifically, the distance DE is a distance along the first direction A between a central portion of one electric field relaxation region 16 and a central portion of another electric field relaxation region 16. A width WE in the first direction A of each electric field relaxation region 16 may be not less than 0.1 μm and not more than 10 μm.

Referring to FIG. 3, in this embodiment, the electric field relaxation regions 16 include $p^+$-type impurity regions formed in a surface layer portion of the $n^-$-type epitaxial layer 12. The electric field relaxation regions 16 form pn junction portions with the $n^-$-type diode regions 14.

A plurality of pn junction diodes having the electric field relaxation regions 16 as anode regions and the $n^-$-type diode regions 14 (cathode pad electrode 13) as cathode regions are thereby formed.

The semiconductor device 1 has an MPS (merged PiN Schottky) structure in which Schottky diodes and pn junction diodes are formed in the common $n^-$-type epitaxial layer 12.

The electric field relaxation regions 16 may include, in place of or in addition to the $p^+$-type impurity regions, crystal defects that are selectively introduced into the surface layer portion of the $n^-$-type epitaxial layer 12.

That is, the electric field relaxation regions 16 may be formed as second carrier trapping regions. The second carrier trapping regions may have the same structure as the carrier trapping regions 15 described above, with the exception of being formed in the surface layer portion of the $n^-$-type epitaxial layer 12.

Referring to FIG. 1 and FIG. 2, the p-type termination regions 17 are formed in the surface layer portion of the $n^-$-type epitaxial layer 12. In the surface layer portion of the $n^-$-type epitaxial layer 12, the p-type termination regions 17 relax an electric field.

The p-type termination regions 17 are formed in the outer region 7 and along the device formation region 6. In this embodiment, the p-type termination regions 17 are formed in endless shapes (quadrilateral annular shapes) surrounding the device formation region 6 in plan view.

In this embodiment, a plurality (five, here) of the p-type termination regions 17 are formed at intervals in directions away from the device formation region 6. The plurality of p-type termination regions 17 include p-type termination regions 17A, 17B, 17C, 17D, and 17E that are formed in that order at intervals from the device formation region 6 side toward the outer region 7 side. The device formation region 6 may be defined by a region surrounded by inner peripheral edges of the innermost side p-type termination region 17A.

When the electric field relaxation regions 16 include the $p^+$-type impurity regions, the plurality of p-type termination regions 17 may respectively have p-type impurity concentrations lower than p-type impurity concentrations of the electric field relaxation regions 16.

The plurality of p-type termination regions 17 may respectively have p-type impurity concentrations that are substantially equal. The plurality of p-type termination regions 17 may respectively have p-type impurity concentrations that are different.

The number and the p-type impurity concentrations of the p-type termination regions 17 may be adjusted as appropriate in accordance with a strength of the electric field to be relaxed and are not restricted to those of the configuration described above. End portions of the electric field relaxation regions 16 may be connected to the innermost side p-type termination region 17A. The end portions of the electric field relaxation regions 16 may be formed at intervals from the innermost side p-type termination region 17A.

Referring to FIG. 2 and FIG. 3, an insulating layer 21 is formed on the first main surface 3 of the $n^-$-type epitaxial layer 12. A contact hole 22 exposing the device formation region 6 is formed in the insulating layer 21. Inner edges (inner walls) of the insulating layer 21 that define the contact hole 22 are positioned directly above a p-type termination region 17 (here, the innermost side p-type termination region 17A).

The anode pad electrode 8 enters into the contact hole 22 from above the insulating layer 21. Inside the contact hole 22, the anode pad electrode 8 is electrically connected to the $n^-$-type diode regions 14, the carrier trapping regions 15, the electric field relaxation regions 16, and the p-type termination regions 17.

The structure of the carrier trapping regions 15 and the structure of the electric field relaxation regions 16 are not restricted to the configurations described above and may take on any of various configurations. Other configuration examples of the carrier trapping regions 15 and other configuration examples of the electric field relaxation regions 16 shall now be described.

Figure 4:
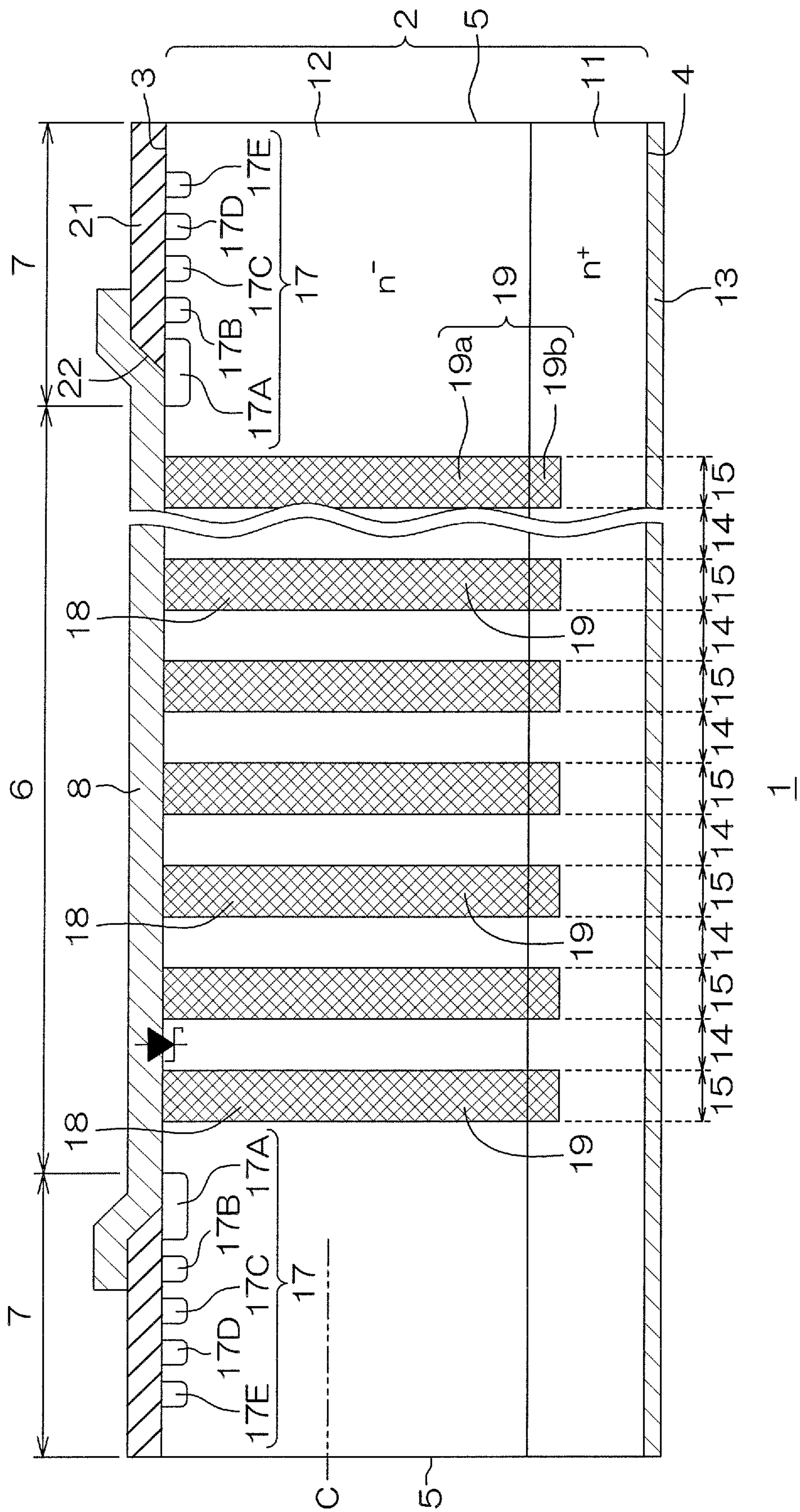
FIG. 4 is a sectional view of a portion corresponding to FIG. 2 and is a diagram showing a second configuration example of the carrier trapping regions.

FIG. 4 is a sectional view of a portion corresponding to FIG. 2 and is a diagram showing a second configuration example of the carrier trapping regions 15. Structures in FIG. 4 corresponding to structures described in FIG. 2, etc., are provided with the same reference signs and description thereof shall be omitted.

Referring to FIG. 4, in this embodiment, the second region 19 of each carrier trapping region 15 is connected to the $n^+$-type semiconductor substrate 11. The second region 19 of the carrier trapping region 15 includes a first portion 19*a* formed inside the $n^-$-type epitaxial layer 12 and a second portion 19*b* formed inside the $n^+$-type semiconductor substrate 11.

A crystal defect density N2 of the first portion 19*a* of the second region 19 is higher than the n-type impurity density N1 of the $n^-$-type epitaxial layer 12 (N2>N1). A crystal defect density N2 of the second portion 19*b* of the second region 19 is lower than an n-type impurity density N3 of the $n^+$-type semiconductor substrate 11 (N2<N3). Functioning virtually as an acceptor is suppressed in the second portion 19*b* of the second region 19.

Figure 5:
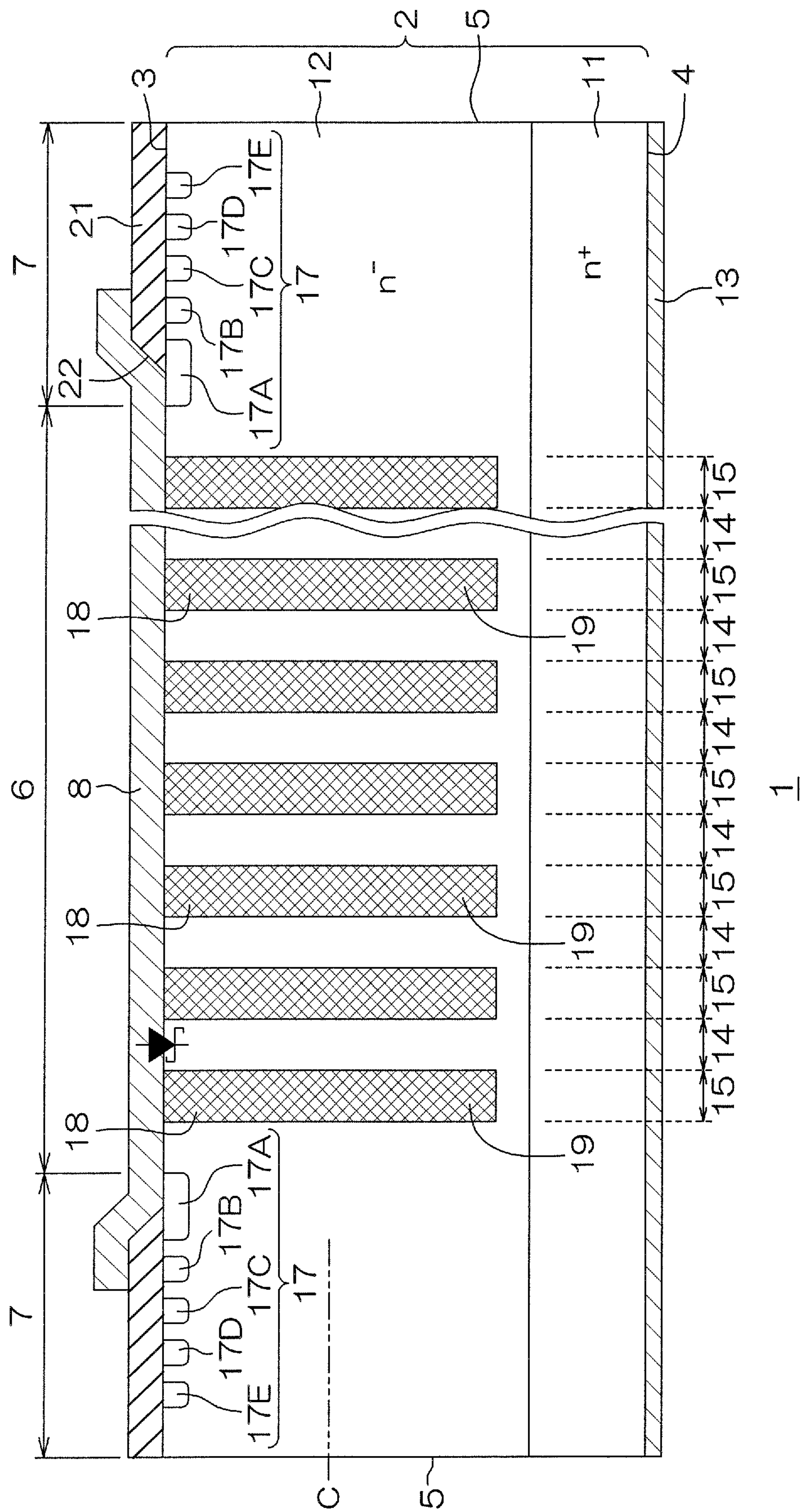
FIG. 5 is a sectional view of a portion corresponding to FIG. 2 and is a diagram showing a third configuration example of the carrier trapping regions.

FIG. 5 is a sectional view of a portion corresponding to FIG. 2 and is a diagram showing a third configuration example of the carrier trapping regions 15. Structures in FIG. 5 corresponding to structures described in FIG. 2, etc., are provided with the same reference signs and description thereof shall be omitted.

Referring to FIG. 5, in this configuration example, the second region 19 of each carrier trapping region 15 is formed across an interval to the first main surface 3 side from the $n^+$-type semiconductor substrate 11. A portion of the $n^-$-type epitaxial layer 12 is interposed in a region between the second region 19 and the $n^+$-type semiconductor substrate 11.

Figure 6:
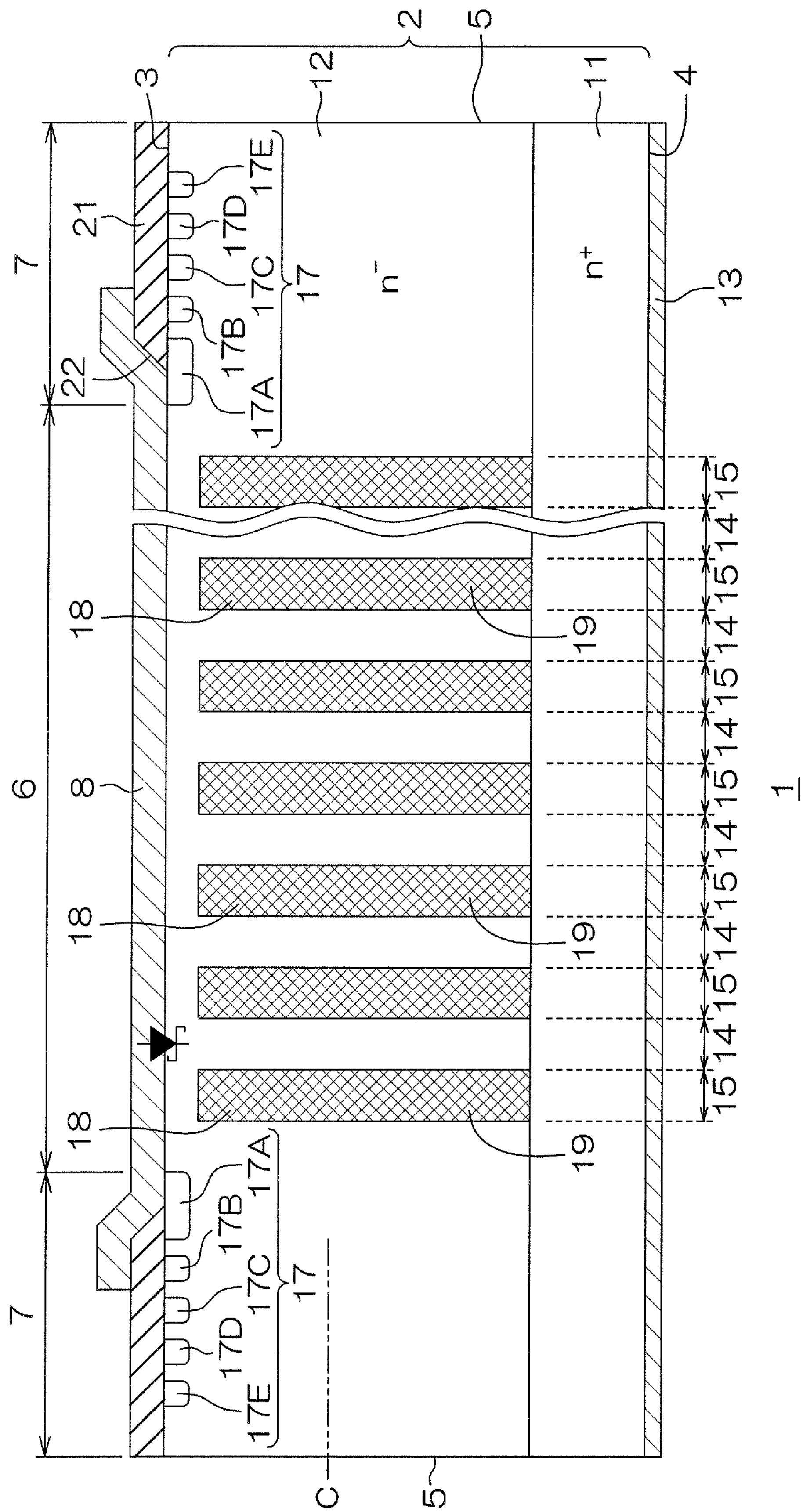
FIG. 6 is a sectional view of a portion corresponding to FIG. 2 and is a diagram showing a fourth configuration example of the carrier trapping regions.

FIG. 6 is a sectional view of a portion corresponding to FIG. 2 and is a diagram showing a fourth configuration example of the carrier trapping regions 15. Structures in FIG. 6 corresponding to structures described in FIG. 2, etc., are provided with the same reference signs and description thereof shall be omitted.

Referring to FIG. 6, in this configuration example, the first region 18 of each carrier trapping region 15 is formed across an interval to the second main surface 4 side from the first main surface 3 of the $n^-$-type epitaxial layer 12. A portion of the $n^-$-type epitaxial layer 12 is interposed in a region between the first region 18 and the first main surface 3.

Figure 7:
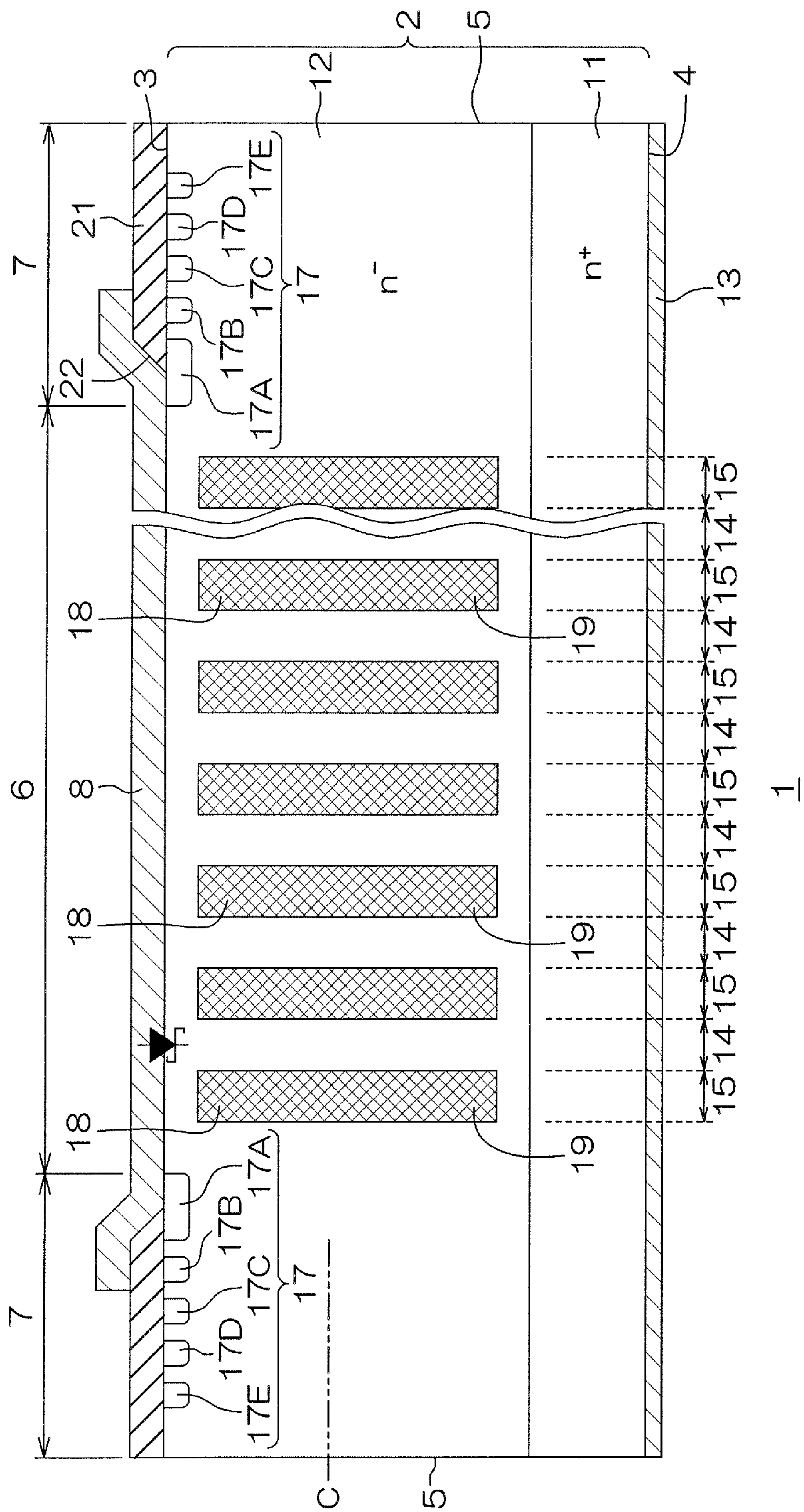
FIG. 7 is a sectional view of a portion corresponding to FIG. 2 and is a diagram showing a fifth configuration example of the carrier trapping regions.

FIG. 7 is a sectional view of a portion corresponding to FIG. 2 and is a diagram showing a fifth configuration example of the carrier trapping regions 15. Structures in FIG. 7 corresponding to structures described in FIG. 2, etc., are provided with the same reference signs and description thereof shall be omitted.

Referring to FIG. 7, in this configuration example, the carrier trapping regions 15 are floated in an interior of the $n^-$-type epitaxial layer 12.

That is, the first region 18 of each carrier trapping region 15 is formed across an interval to the second main surface 4 side from the first main surface 3 of the $n^-$-type epitaxial layer 12. A portion of the $n^-$-type epitaxial layer 12 is interposed in a region between the first region 18 and the first main surface 3.

Also, the second region 19 of each carrier trapping region 15 is formed across an interval to the first main surface 3 side from the $n^+$-type semiconductor substrate 11. A portion of the $n^-$-type epitaxial layer 12 is interposed in a region between the second region 19 and the $n^+$-type semiconductor substrate 11.

Figure 8:
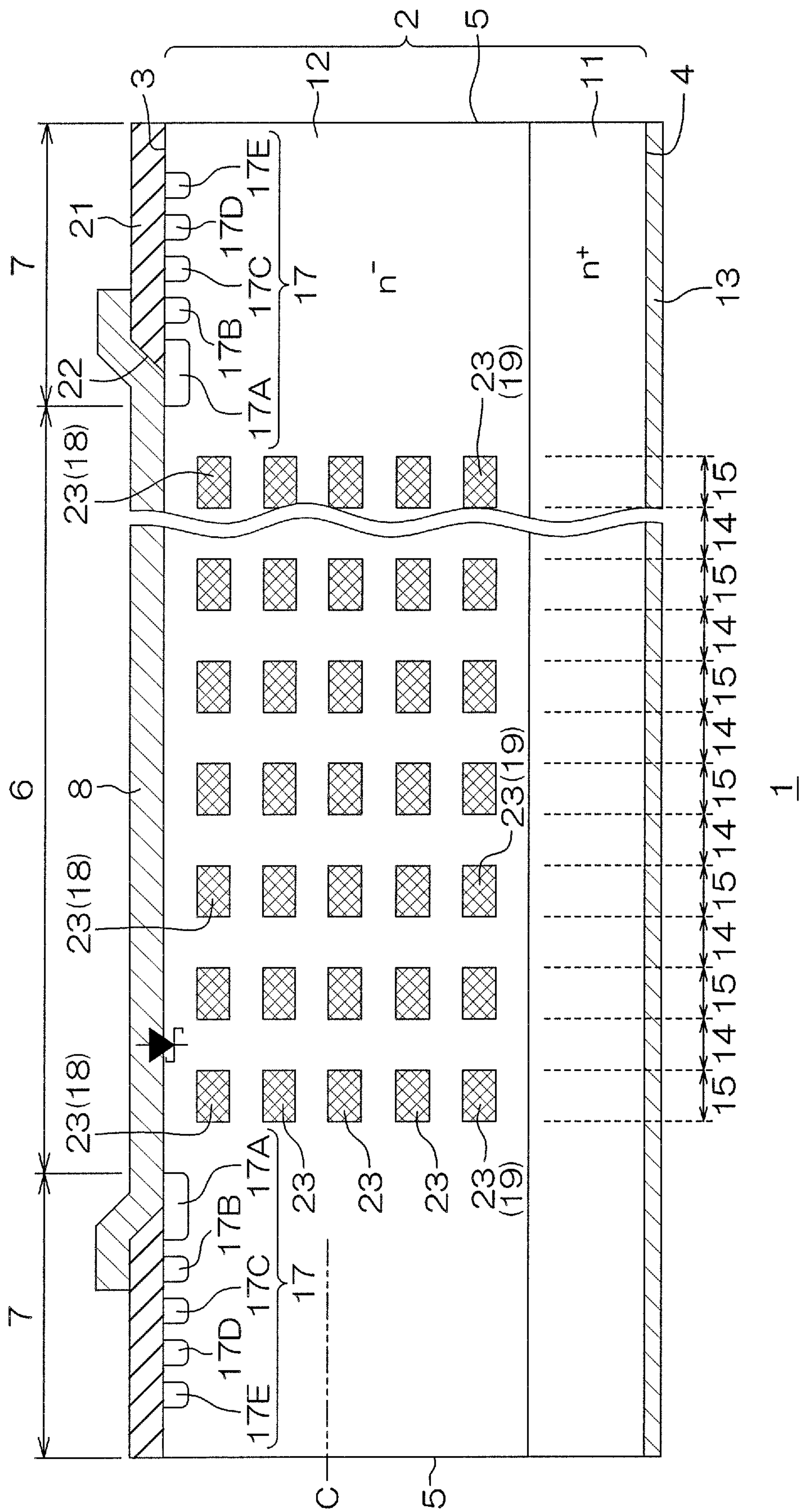
FIG. 8 is a sectional view of a portion corresponding to FIG. 2 and is a diagram showing a sixth configuration example of the carrier trapping regions.

FIG. 8 is a sectional view of a portion corresponding to FIG. 2 and is a diagram showing a sixth configuration example of the carrier trapping regions 15. Structures in FIG. 8 corresponding to structures described in FIG. 2, etc., are provided with the same reference signs and description thereof shall be omitted.

Referring to FIG. 8, in this configuration example, each carrier trapping region 15 includes a plurality of divided portions 23. The plurality of divided portions 23 are formed at intervals along the thickness direction of the $n^-$-type epitaxial layer 12.

An uppermost divided portion 23 positioned upper than the intermediate region C of the $n^-$-type epitaxial layer 12 in the plurality of divided portions 23 forms the first region 18. A lowermost divided portion 23 positioned lower than the intermediate region C in the plurality of divided portions 23 forms the second region 19.

The plurality of divided portions 23 may respectively have different thicknesses. The plurality of divided portions 23 may respectively have different crystal defect densities N2. The plurality of divided portions 23 may be formed at equal intervals along the thickness direction of the $n^-$-type epitaxial layer 12. The plurality of divided portions 23 may be formed at unequal intervals along the thickness direction of the $n^-$-type epitaxial layer 12.

Figure 9:
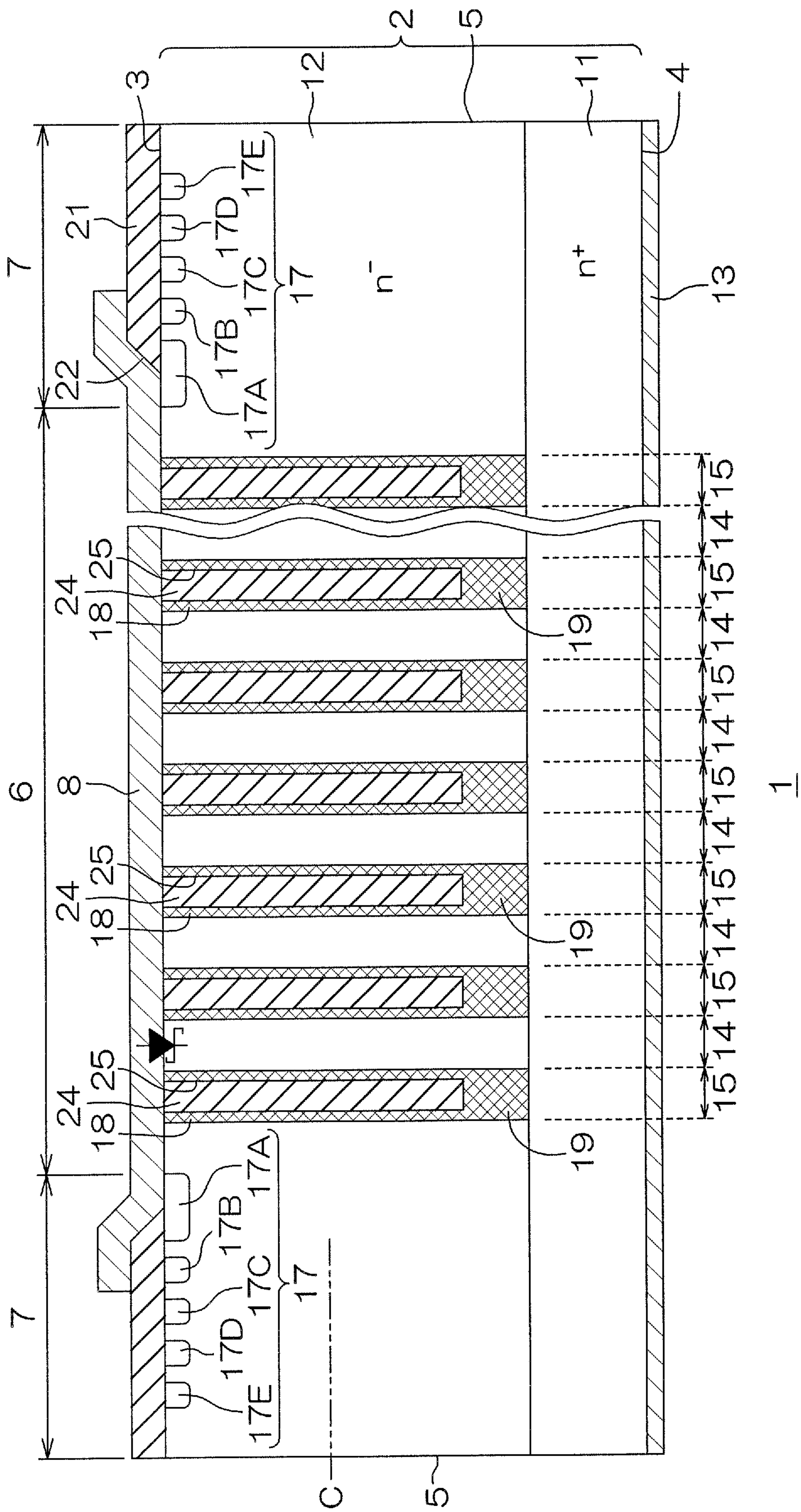
FIG. 9 is a sectional view of a portion corresponding to FIG. 2 and is a diagram showing a seventh configuration example of the carrier trapping regions.

FIG. 9 is a sectional view of a portion corresponding to FIG. 2 and is a diagram showing a seventh configuration example of the carrier trapping regions. Structures in FIG. 9 corresponding to structures described in FIG. 2, etc., are provided with the same reference signs and description thereof shall be omitted.

Referring to FIG. 9, in this configuration example, each carrier trapping region 15 is formed along peripheral edges of an embedded insulator 24 embedded in the surface layer portion of the first main surface 3 of the $n^-$-type epitaxial layer 12.

More specifically, the embedded insulators 24 are embedded in trenches 25 formed in the first main surface 3 of the $n^-$-type epitaxial layer 12. The trenches 25 are formed along peripheral edges of the $n^-$-type diode regions 14.

Each trench 25 is formed in a band shape extending along the first direction A in plan view. In this configuration example, the trenches 25 are formed at intervals along the second direction B.

That is, the trenches 25 are formed in a stripe shape in plan view. The trenches 25 define regions between the $n^-$-type diode regions 14 that are mutually adjacent along the second direction B. The embedded insulators 24 are embedded in the trenches 25 of such structure.

In this configuration example, the carrier trapping regions 15 are formed in regions of the $n^-$-type epitaxial layer 12 along side walls and bottom walls of the trenches 25.

A configuration example in which two or more configuration examples of the carrier trapping regions 15 according to the first configuration example to the seventh configuration example are combined in any way thereamong may be applied.

For example, a configuration example having the carrier trapping regions 15 according to the first configuration example while also having any one or plurality of the carrier trapping regions 15 according to the second configuration example to the seventh configuration example may be applied.

For example, the structure with which the first regions 18 of the carrier trapping regions 15 are exposed from the first main surface 3 and the second regions 19 are connected to the $n^+$-type semiconductor substrate 11 (see FIG. 2) may be applied to the divided portions 23 according to the sixth configuration example (see FIG. 8).

In this case, the uppermost divided portions 23 are exposed from the first main surface 3 of the $n^-$-type epitaxial layer 12. Also, the lowermost divided portions 23 are connected to the $n^+$-type semiconductor substrate 11.

For example, the structure of the carrier trapping regions 15 according to the third configuration example (see FIG. 5) may be applied to the carrier trapping regions 15 according to the seventh configuration example (see FIG. 9). In this case, the second regions 19 of the carrier trapping regions 15 according to the seventh configuration example are formed across intervals to the first main surface 3 side from the $n^+$-type semiconductor substrate 11.

Also, the structure of the carrier trapping regions 15 according to the sixth configuration example described above (see FIG. 8) may be applied to the carrier trapping regions 15 according to the seventh configuration example (see FIG. 9).

In this case, each of the carrier trapping regions 15 according to the seventh configuration example may include the plurality of divided portions 23 formed at intervals along the thickness direction of the $n^-$-type epitaxial layer 12.

Also, in this case, each of the carrier trapping regions 15 according to the seventh configuration example may include the plurality of divided portions 23 formed at intervals along the thickness direction of the $n^-$-type epitaxial layer 12 at a region lower than the bottom wall of a trench 25.

In this case, the uppermost divided portions 23 may be exposed from the bottom walls of the trenches 25. The uppermost divided portions 23 may be in contact with the embedded insulators 24. The lowermost divided portions 23 in the plurality of divided portions 23 may be in contact with the $n^+$-type semiconductor substrate 11.

Figure 10:
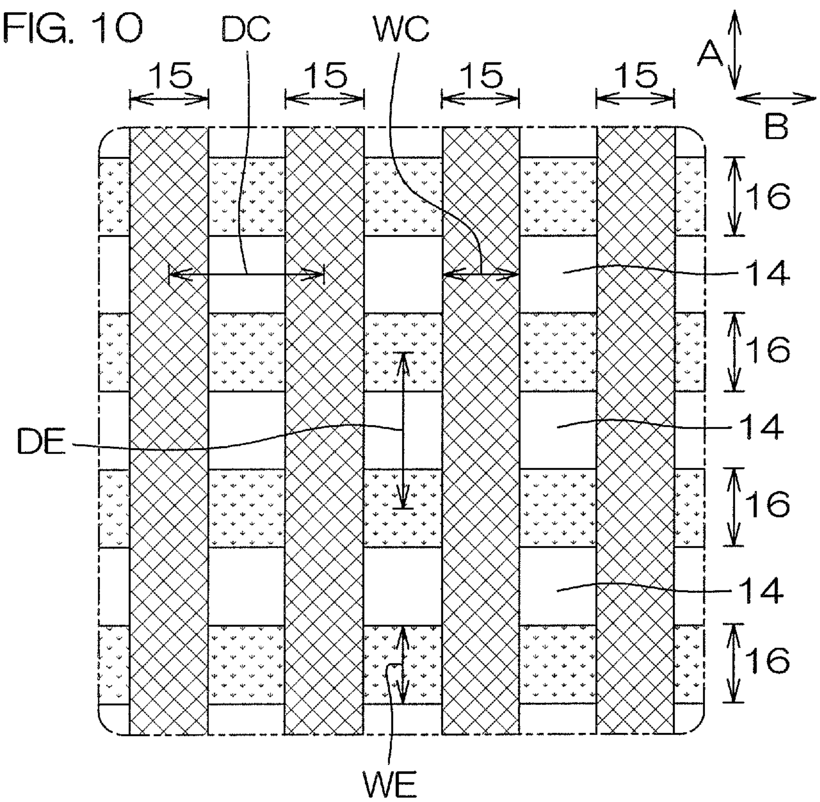
FIG. 10 is an enlarged view of a portion corresponding to an enlarged view shown in FIG. 1 and is a plan view showing a second configuration example of the electric field relaxation regions.

FIG. 10 is an enlarged view of a portion corresponding to an enlarged view shown in FIG. 1 and is a plan view showing a second configuration example of the electric field relaxation regions 16. Structures in FIG. 10 corresponding to structures described in FIG. 1, etc., are provided with the same reference signs and description thereof shall be omitted.

Referring to FIG. 10, in this configuration example, a plurality of the electric field relaxation regions 16 are formed at intervals along the first direction A in each region between mutually adjacent carrier trapping regions 15.

The plurality of electric field relaxation regions 16 may be formed in a matrix in plan view. The plurality of electric field relaxation regions 16 may be formed in a staggered arrangement in plan view. The plurality of electric field relaxation regions 16 may be formed in a random array.

In this configuration example, the plurality of electric field relaxation regions 16 do not intersect the carrier trapping regions 15 in plan view. The plurality of electric field relaxation regions 16 expose the carrier trapping regions 15. Portions of the plurality of electric field relaxation regions 16 may overlap with the carrier trapping regions 15 in plan view.

Figure 11:
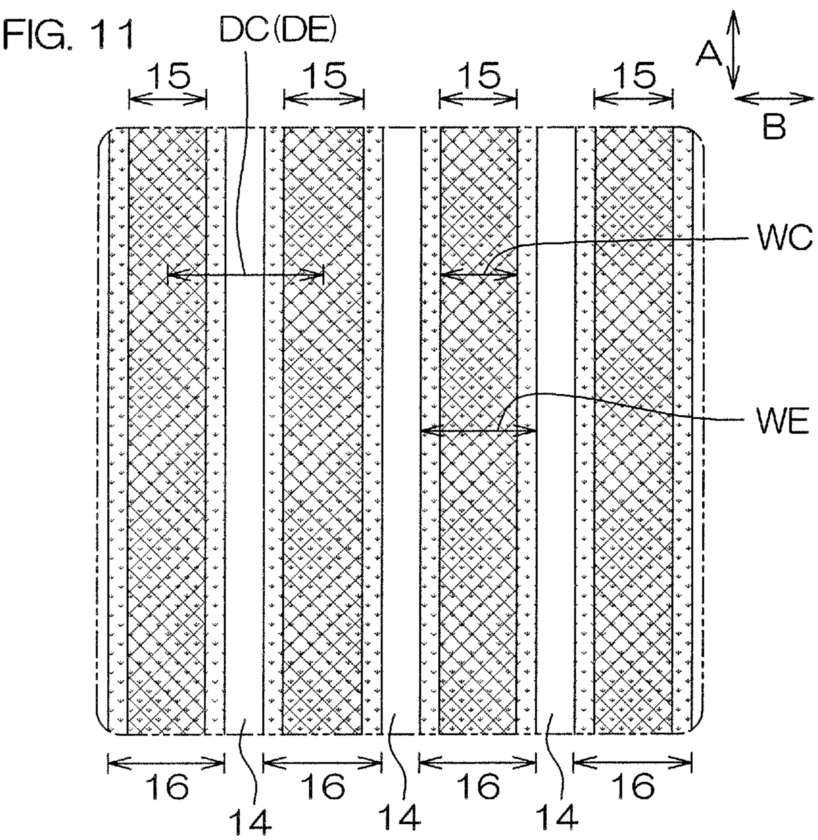
FIG. 11 is an enlarged view of a portion corresponding to the enlarged view shown in FIG. 1 and is a plan view showing a third configuration example of the electric field relaxation regions.

FIG. 11 is an enlarged view of a portion corresponding to the enlarged view shown in FIG. 1 and is a plan view showing a second configuration example of the electric field relaxation regions 16. Structures in FIG. 11 corresponding to structures described in FIG. 1, etc., are provided with the same reference signs and description thereof shall be omitted.

Referring to FIG. 11, in this configuration example, the electric field relaxation regions 16 extend along the first direction A. In this configuration example, the plurality of electric field relaxation regions 16 are formed at intervals along the second direction B.

Each electric field relaxation region 16 is overlapped with a carrier trapping region 15 in plan view. The distance DC between carrier trapping regions 47 is substantially equal to the distance DE between electric field relaxation regions 16.

The width WE in the second direction B of each electric field relaxation region 16 is greater than the width WC in the second direction B of each carrier trapping region 15. Both end portions in the second direction B of each carrier trapping region 15 are positioned in a more inner region than both end portion in the second direction B of a electric field relaxation region 16 in plan view.

In this configuration example, the $n^-$-type diode regions 14, each of band shape extending along the first direction A in plan view, are defined by the plurality of electric field relaxation regions 16. With the electric field relaxation regions 16 of such structure, when each electric field relaxation region 16 includes a $p^+$ impurity region, it can form a pn junction portion with an $n^-$-type diode region 14 satisfactorily.

Figure 12:
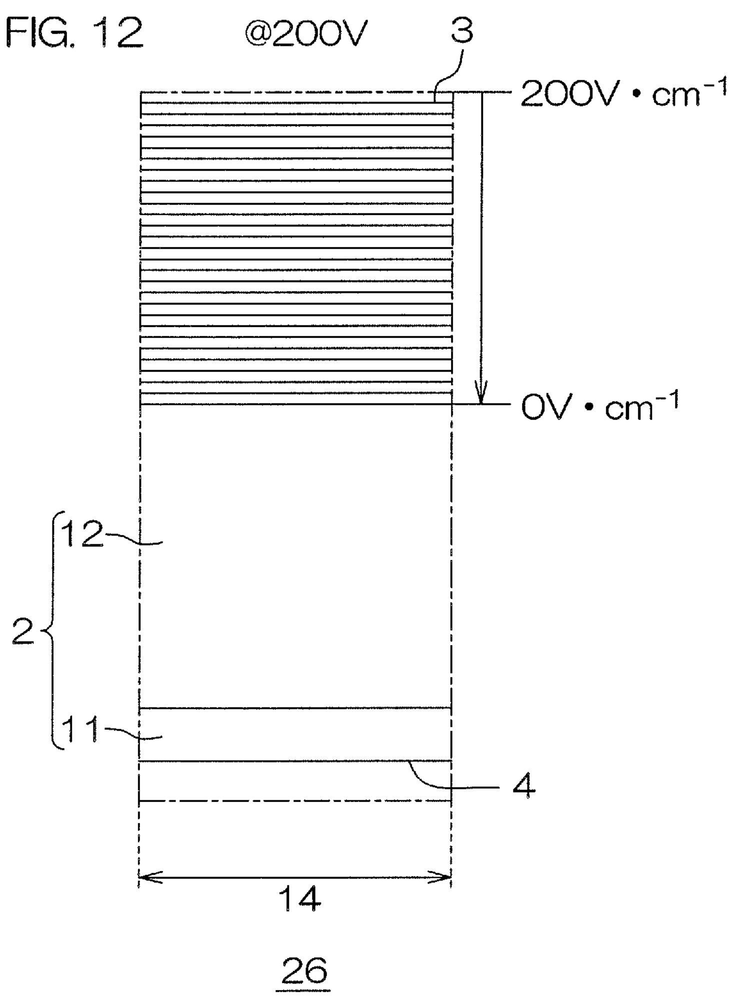
FIG. 12 is a diagram showing results of examining an electric field distribution of a semiconductor layer of a semiconductor device according to a reference example by simulation.

FIG. 12 is a diagram showing results of examining, by simulation, an electric field distribution in the $n^-$-type epitaxial layer 12 of a semiconductor device 26 according to a reference example. In FIG. 12, just principal portions of the $n^-$-type epitaxial layer 12 are shown.

Referring to FIG. 12, the semiconductor device 26 according to the reference example has substantially the same structure as the semiconductor device 1 with the exception of not having the carrier trapping regions 15. In FIG. 12, portions corresponding to structures described for the semiconductor device 1 are provided with the same reference signs and description thereof shall be omitted.

With the semiconductor device 26 according to the reference example, a reverse voltage of 200 V is applied across the anode pad electrode 8 and the cathode pad electrode 13. The thickness of the $n^-$-type epitaxial layer 12 is set to approximately 4 μm.

Figure 13:
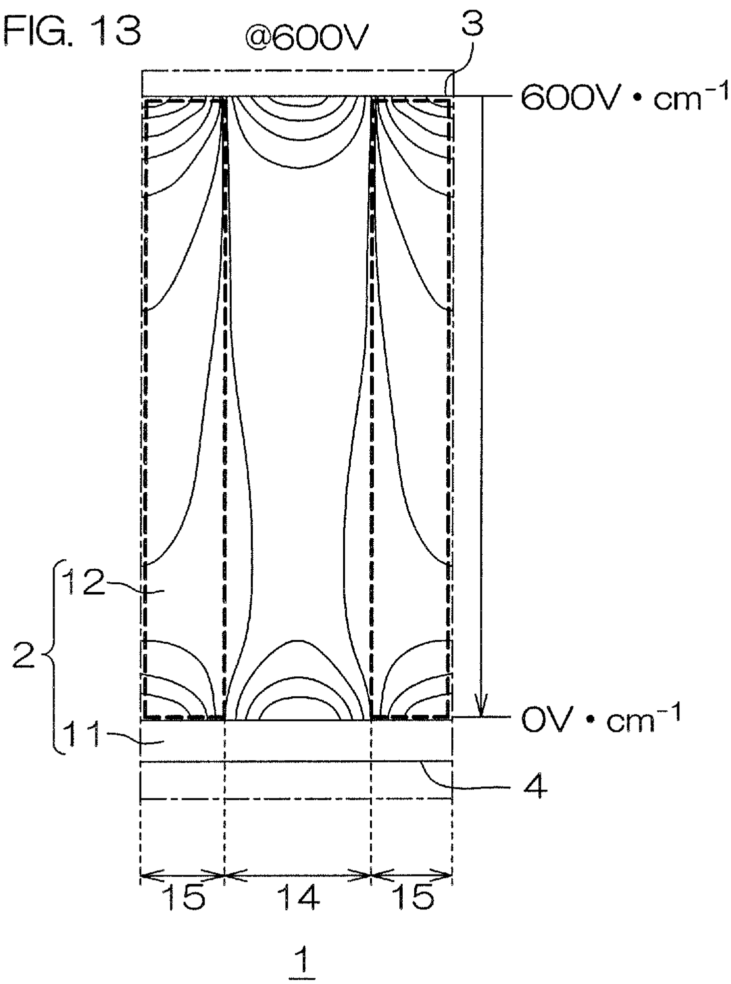
FIG. 13 is a diagram showing results of examining an electric field distribution of a semiconductor layer of the semiconductor device shown in FIG. 1 by simulation.

FIG. 13 is a diagram showing results of examining, by simulation, an electric field distribution inside the $n^-$-type epitaxial layer 12 of the semiconductor device 1. In FIG. 13, just principal portions of the $n^-$-type epitaxial layer 12 are shown.

With the semiconductor device 1, a reverse voltage of 600 V is applied across the anode pad electrode 8 and the cathode pad electrode 13. The thickness of the $n^-$-type epitaxial layer 12 is set to approximately 4 μm.

Figure 14:
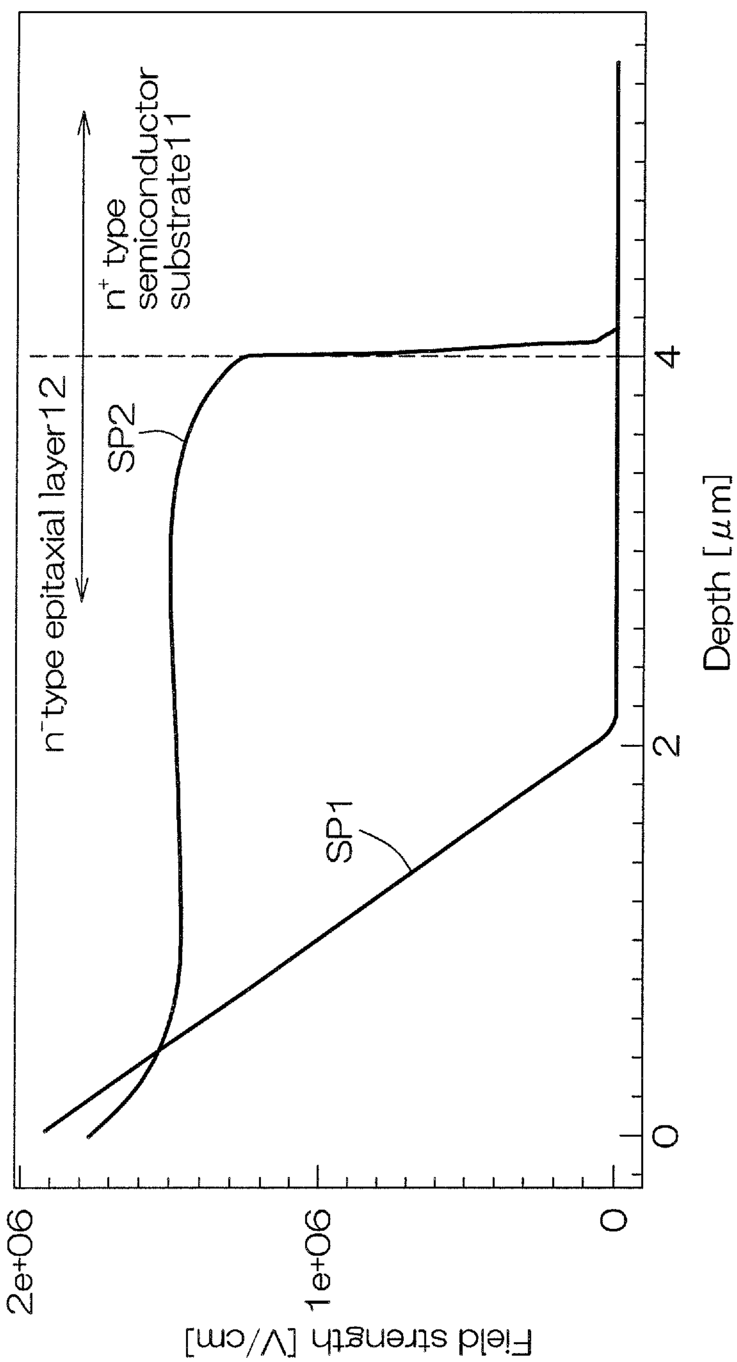
FIG. 14 is a graph in which the electric field distribution of FIG. 12 and the electric field distribution of FIG. 13 are respectively expressed numerically.

FIG. 14 is a graph in which the electric field distribution of the semiconductor device 26 according to the reference example and the electric field distribution of the semiconductor device 1 are expressed numerically. In FIG. 14, the ordinate indicates the electric field strength [V/cm]. In FIG. 14, the abscissa indicates a depth of the $n^-$-type epitaxial layer 12 [μm].

First characteristics SP1 and second characteristics SP2 are shown in FIG. 14. The first characteristics SP1 indicate characteristics of the semiconductor device 26 according to the reference example. The second characteristics SP2 indicate characteristics of the semiconductor device 1.

Referring to the electric field distribution of FIG. 12 and the first characteristics SP1 of FIG. 14, with the semiconductor device 26 according to the reference example, it was found that the electric field strength decreases gradually along the thickness direction of the type epitaxial layer 12.

A reverse withstand voltage of the semiconductor device 26 according to the reference example is determined by an area surrounded by the ordinate, the abscissa, and the first characteristics SP1. From the fact that the electric field strength decreases gradually along the thickness direction of the $n^-$-type epitaxial layer 12, it cannot be said that the reverse withstand voltage of the semiconductor device 26 according to the reference example is excellent.

On the other hand, referring to the electric field distribution of FIG. 13 and the second characteristics SP2 of FIG. 14, with the semiconductor device 1 it was found that the decrease in electric field strength inside the $n^-$-type epitaxial layer 12 is suppressed.

It was also found that the electric field strength inside the $n^-$-type epitaxial layer 12 is maintained in a high state. That is, with the semiconductor device 1, the electric field strength inside the $n^-$-type epitaxial layer 12 is in a state of being substantially uniform along the thickness direction of the $n^-$-type epitaxial layer 12.

An area surrounded by the ordinate, the abscissa, and the second characteristics SP2 is greater than the area surrounded by the ordinate, the abscissa, and the first characteristics SP1. It can thus be understood that the semiconductor device 1 has a more excellent reverse withstand voltage than the reverse withstand voltage of the semiconductor device 26 according to the reference example.

As described above, with the semiconductor device 1, electrons which are the majority carriers included in the $n^-$-type epitaxial layer 12 are trapped by the crystal defects included in the carrier trapping regions 15. The crystal defects included in the carrier trapping regions 15 thus have the same function as acceptors.

More specifically, the n-type impurity introduced into the $n^-$-type epitaxial layer 12 becomes positively ionized by releasing electrons. The carrier trapping regions 15 become negatively charged in opposition to the positively ionized n-type impurity by trapping the electrons. That is, carrier trapping regions 15 function virtually as acceptors.

Decrease in electric field strength along the thickness direction of the $n^-$-type epitaxial layer 12 when a voltage is applied to the $n^-$-type epitaxial layer 12 is suppressed by such carrier trapping regions 15.

In particular, with the semiconductor device 1, the carrier trapping regions 15 include the first regions 18 positioned upper than the intermediate region C of the $n^-$-type epitaxial layer 12 and the second regions 19 positioned lower than the intermediate region C.

Therefore, as shown in FIG. 13 and FIG. 14, the decrease in electric field strength can be suppressed in a region higher than the intermediate region C and a region lower than the intermediate region C by the carrier trapping regions 15.

The electric field strength inside the $n^-$-type epitaxial layer 12 can thereby be maintained in the state of being high along the thickness direction of the $n^-$-type epitaxial layer 12. That is, the electric field strength inside the $n^-$-type epitaxial layer 12 can be kept in a nearly uniform state. Consequently, the withstand voltage can be improved.

Also, a first impurity concentration of the $n^-$-type epitaxial layer 12 can also be increased while forming the carrier trapping regions 15. Reduction of on resistance can also be achieved thereby.

Figure 15:
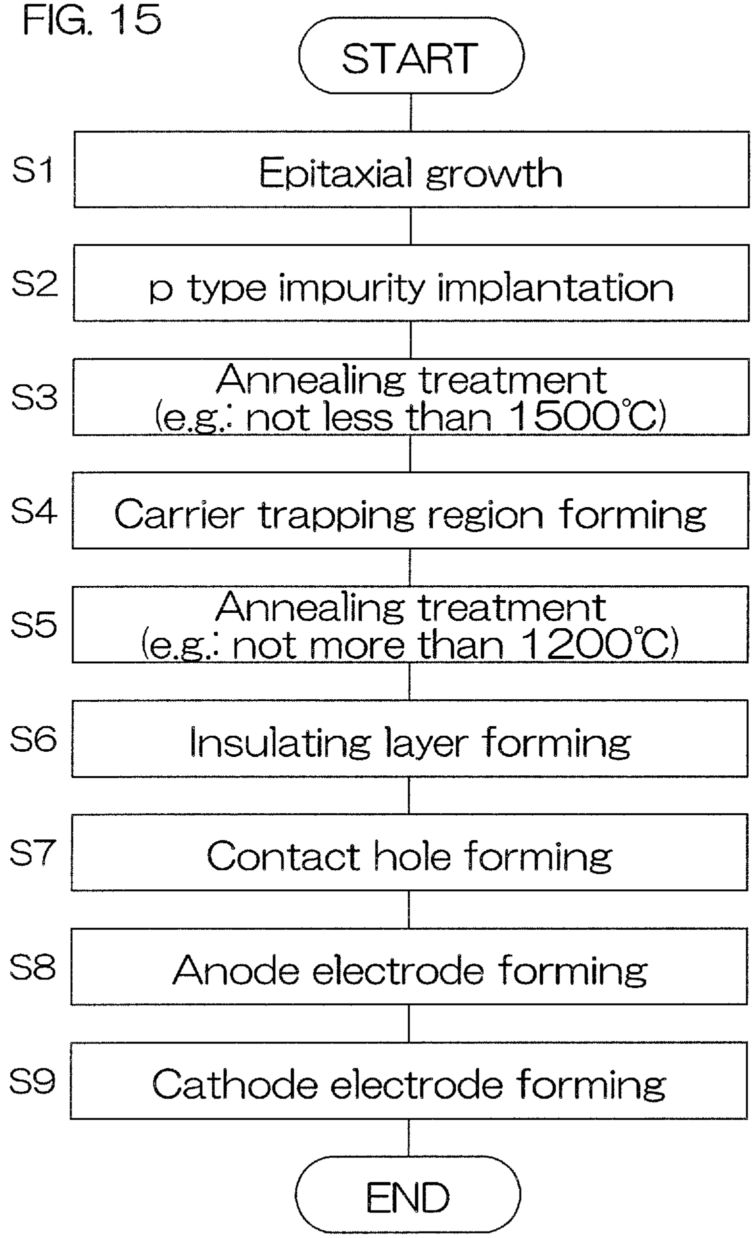
FIG. 15 is a flowchart of an example of a method for manufacturing the semiconductor device shown in FIG. 1.

FIG. 15 is a flowchart of an example of a method for manufacturing the semiconductor device 1 shown in FIG. 1.

In manufacturing the semiconductor device 1, first, the $n^+$-type semiconductor substrate 11 that includes 4H—SiC is prepared. Next, in parallel to introducing the n-type impurity, SiC is epitaxially grown from a main surface of the $n^+$-type semiconductor substrate 11 (step S1).

The $n^-$-type epitaxial layer 12 is thereby formed on the $n^+$-type semiconductor substrate 11. The first main surface 3 is formed by the $n^-$-type epitaxial layer 12 and the second main surface 4 is formed by the $n^+$-type semiconductor substrate 11.

Next, a p-type impurity is introduced into the surface layer portion of the first main surface 3 of the $n^-$-type epitaxial layer 12 (step S2). In the present step, first, the $n^-$-type diode regions 14 are set in the first main surface 3 of the $n^-$-type epitaxial layer 12. Next, the p-type impurity is selectively introduced into regions of the first main surface 3 of the $n^-$-type epitaxial layer 12 outside the $n^-$-type diode regions 14.

The p-type impurity is selectively introduced into regions in which the electric field relaxation regions 16 are to be formed. Also, the p-type impurity is selectively introduced into regions in which the p-type termination regions 17 are to be formed. The introduction of the p-type impurity may be performed by an ion implantation method via an ion implantation mask having a predetermined pattern.

Next, the p-type impurity is activated by an annealing treatment method (step S3). The annealing treatment method may be performed under an atmosphere of not less than 1500° C. The electric field relaxation regions 16 and the p-type termination regions 17 are thereby formed.

Next, the carrier trapping regions 15 are formed in regions of the surface layer portion of the first main surface 3 of the $n^-$-type epitaxial layer 12 along the peripheral edges of the $n^-$-type diode regions 14 (step S4).

The carrier trapping regions 15 are formed, for example, by selectively irradiating the $n^-$-type epitaxial layer 12 with light ions, electrons, or neutrons, etc. The light ions may include at least one type of ions among hydrogen ions ($H^+$), helium ions ($He^+$), and boron ions ($B^+$).

Next, the crystal defects formed in the $n^-$-type epitaxial layer 12 are partially recovered by an annealing treatment method (step S5). The annealing treatment method may be performed under an atmosphere of less than 1500° C. (for example, not more than 1200° C.). The annealing treatment step (step S5) does not have to be performed necessarily and may be omitted.

Depths and extents of the carrier trapping regions 15 can be controlled by adjusting an irradiation energy (acceleration voltage applied by an irradiating apparatus) of the light ions, electrons, or neutrons, etc. Crystal defect densities can also be controlled by an irradiation time of the light ions, electrons, or neutrons, etc. By appropriate adjustment of these conditions, the carrier trapping regions 15 according to the first configuration example to the seventh configuration example described above can be formed.

The steps of forming the electric field relaxation regions 16 and the p-type termination regions 17 (step S2 and step S3) described above may be performed after the steps of forming the carrier trapping regions 15 (step S4 and step S5).

Next, the insulating layer 21 is formed on the first main surface 3 of the $n^-$-type epitaxial layer 12 (step S6). The insulating layer 21 may be formed by a CVD (chemical vapor deposition) method.

Next, unnecessary portions of the insulating layer 21 are selectively removed (step S7). The unnecessary portions of the insulating layer 21 may be removed by an etching method via a mask having a predetermined pattern. The contact hole 22 is thereby formed in the insulating layer 21.

Next, the anode pad electrode 8 is formed on the first main surface 3 of the $n^-$ type epitaxial layer 12 (step S8). The anode pad electrode 8 may be formed by a sputtering method or a plating method.

Also, the cathode pad electrode 13 is formed on the second main surface 4 of the $n^-$-type epitaxial layer 12 (step S9). The cathode pad electrode 13 may be formed by a sputtering method or a plating method.

The step of forming the anode pad electrode 8 (step S8) may be performed after the step of forming the cathode pad electrode 13 (step S9). The semiconductor device 1 is manufactured through such steps.

As described above, with the method for manufacturing the semiconductor device 1, the carrier trapping regions 15 can be formed by selectively irradiating the $n^-$-type epitaxial layer 12 with light ions, electrons, or neutrons, etc. (step S4 and step S5).

A complicated manufacturing process is thus not required to form the carrier trapping regions 15. The semiconductor device 1 which is easy to manufacture and with which the reduction of on resistance and the improvement of withstand voltage can be achieved can thus be provided.

A case of forming a super junction structure by p-type impurity regions in place of the carrier trapping regions 15 shall now be considered. If a comparatively thick $n^-$-type epitaxial layer 12 is adopted in this structure, it would be difficult to introduce the p-type impurity into comparatively deep positions of the $n^-$-type epitaxial layer 12. Difficulty of manufacture is thus increased.

Especially in a case where the $n^-$-type epitaxial layer 12 that includes SiC is adopted, diffusion of the p-type impurity cannot be expected due to the properties of SiC unlike with silicon (S1). The manufacturing method thus tends to become troublesome.

As one example, there is a method where p-type impurity regions oriented along the thickness direction of the $n^-$-type epitaxial layer 12 are formed by alternately repeating epitaxial growth of SiC and implantation of the p-type impurity.

As another example, there is a method for forming p-type impurity regions by forming trenches in the $n^-$-type epitaxial layer 12 and thereafter embedding a p-type SiC by epitaxial growth inside the trenches. With these methods, the difficulty of manufacture increases as the $n^-$-type epitaxial layer 12 becomes thicker.

On the other hand, with the method for manufacturing the semiconductor device 1, the carrier trapping regions 15 having arbitrary crystal defect density N2 can be formed in arbitrary region of the $n^-$-type epitaxial layer 12 by just adjusting conditions, such as the irradiation amount, irradiation energy, etc., of the light ions, electrons, or neutrons, etc.

Therefore, the effects of introducing the carrier trapping regions 15 can be said to be especially high, from the standpoint of difficulty and cost of manufacture, when the $n^-$-type epitaxial layer 12 constituted of an SiC is adopted or when a comparatively thick $n^-$-type epitaxial layer 12 is adopted.

The steps of forming the carrier trapping regions 15 are effective when a comparatively thin $n^-$-type epitaxial layer 12, for example, of not less than 1 μm and not more than 10 μm is adopted.

The steps of forming the carrier trapping regions 15 are also effective when a comparatively thick $n^-$-type epitaxial layer 12, for example, of not less than 10 μm and not more than 50 μm is adopted.

The steps of forming the carrier trapping regions 15 are also effective when a comparatively thick $n^-$-type epitaxial layer 12, for example, of not less than 50 μm and not more than 100 μm is adopted.

The steps of forming the carrier trapping regions 15 are also effective when a comparatively thick $n^-$-type epitaxial layer 12, for example, of not less than 100 μm and not more than 150 μm is adopted.

The steps of forming the carrier trapping regions 15 are also effective when a comparatively thick $n^-$-type epitaxial layer 12, for example, of not less than 150 μm and not more than 200 μm is adopted.

Also, with the method for manufacturing the semiconductor device 1, the steps of forming the carrier trapping regions 15 (step S4 and step S5) are performed after the steps of forming the electric field relaxation regions 16 and the p-type termination regions 17 (step S2 and step S3).

The steps of forming the electric field relaxation regions 16 and the p-type termination regions 17 thus do not have to be executed after the steps of forming the carrier trapping regions 15. Excessive heating of the carrier trapping regions 15 after the steps of forming the carrier trapping regions 15 can thereby be suppressed. Undesired recovery of the crystal defects can thus be suppressed.

Also, with the method for manufacturing the semiconductor device 1, the electric field relaxation regions 16 which include p-type impurity regions can be formed using the step of forming the p-type termination regions 17. Increase in workload accompanying the addition of the electric field relaxation regions 16 can thus be prevented when manufacturing the semiconductor device 1 that includes the p-type termination regions 17.

If the electric field relaxation regions 16 include second carrier trapping regions in place of the p-type impurity regions, the electric field relaxation regions 16 can be formed using the steps of forming the carrier trapping regions 15. Increase in workload accompanying the addition of the electric field relaxation regions 16 can thus be prevented in this case as well.

With the method for manufacturing the semiconductor device 1, the semiconductor device 1 having the carrier trapping regions 15 according to the seventh configuration example (see FIG. 9) can be formed by the following manufacturing method.

First, prior to the steps of forming the carrier trapping regions 15 (step S4 and step S5), the plurality of trenches 25 are formed in the first main surface 3 of the $n^-$-type epitaxial layer 12.

In the present step, first, a mask having a predetermined pattern is formed on the first main surface 3 of the $n^-$-type epitaxial layer 12. The mask has a plurality of openings that expose regions at which the plurality of trenches 25 are to be formed.

Next, unnecessary portions of the first main surface 3 of the $n^-$-type epitaxial layer 12 are selectively removed by an etching method via the mask. The plurality of trenches 25 are thereby selectively formed in the first main surface 3 of the $n^-$-type epitaxial layer 12.

Next, the carrier trapping regions 15 are formed through step S4 and step S5. In step S4, light ions, electrons, or neutrons, etc., are irradiated on the $n^-$-type epitaxial layer 12 exposed from inner wall surfaces of the trenches 25.

Next, insulators are embedded in the trenches 25. The insulators are embedded in the trenches 25 through deposition of an insulating material by a CVD method and removal of the insulating material by an etch back method. The embedded insulators 24 are thereby formed inside the trenches 25.

Thereafter, through step S6 to step S9, the semiconductor device 1 having the carrier trapping regions 15 according to the seventh configuration example (see FIG. 9) is manufactured.

Figure 16:
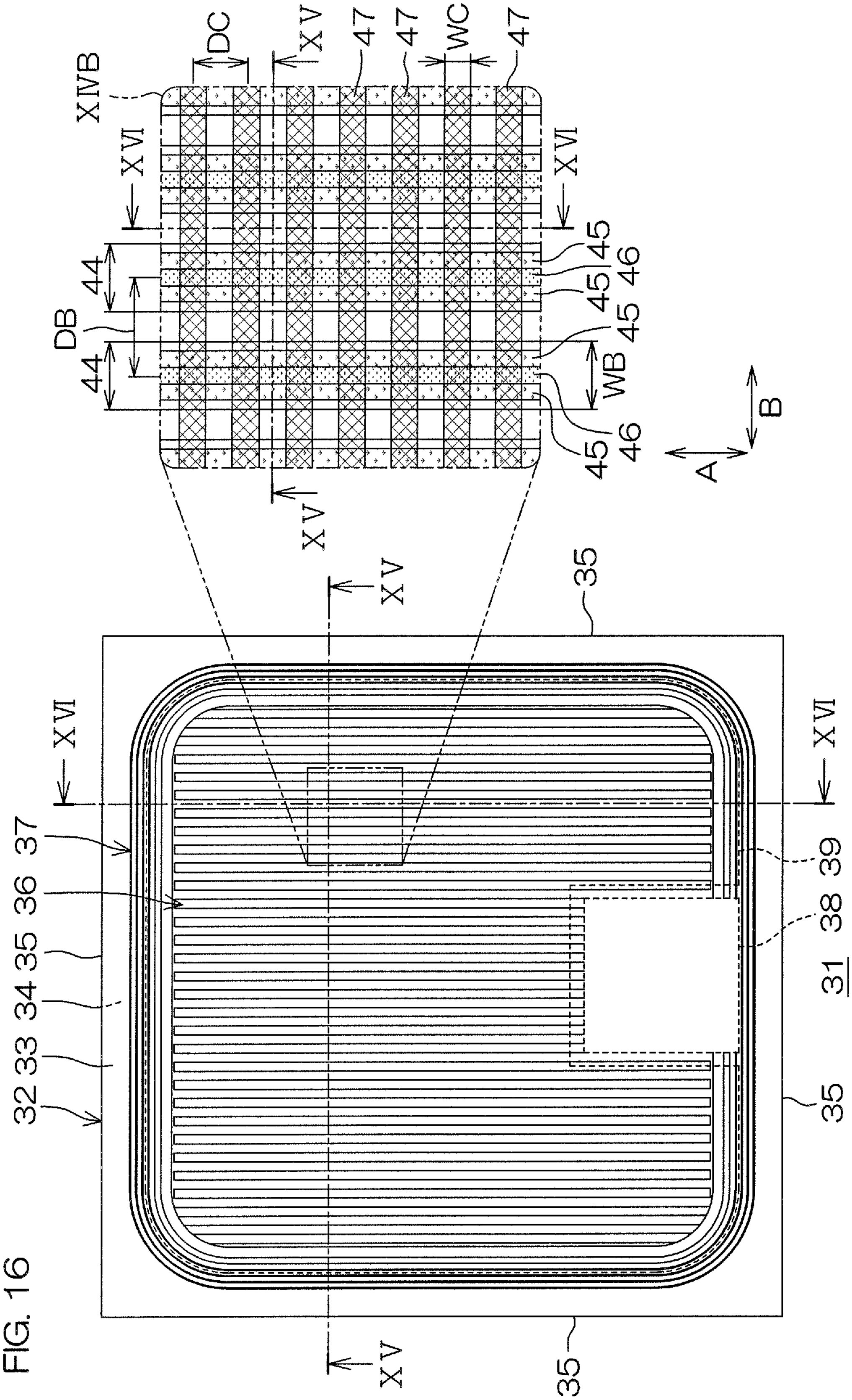
FIG. 16 is a plan view of a semiconductor device according to a second preferred embodiment of the present invention and is a diagram showing a first configuration example of carrier trapping regions.
Figure 17:
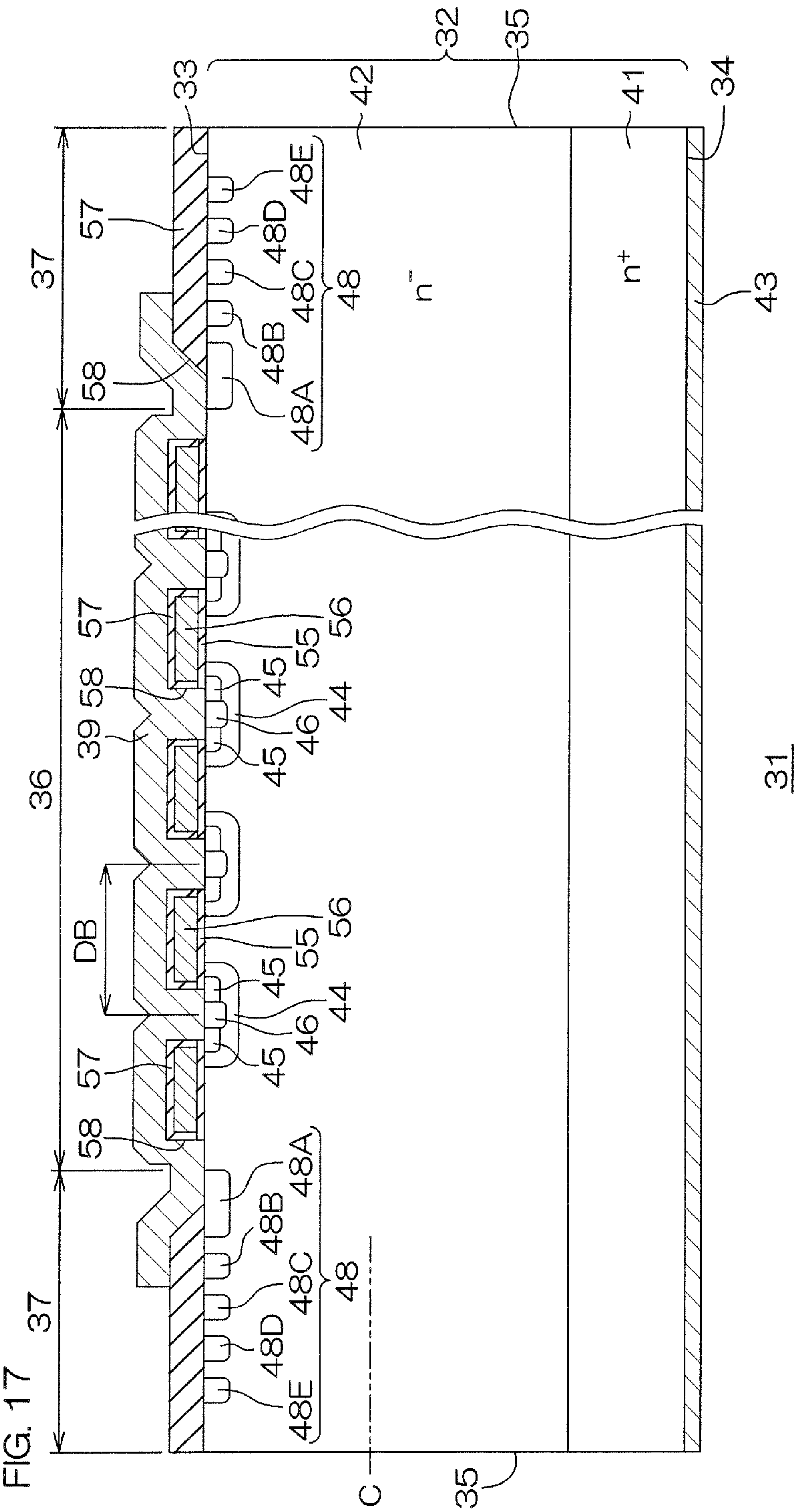
FIG. 17 is a sectional view taken along line XVII-XVII of FIG. 16.
Figure 18:
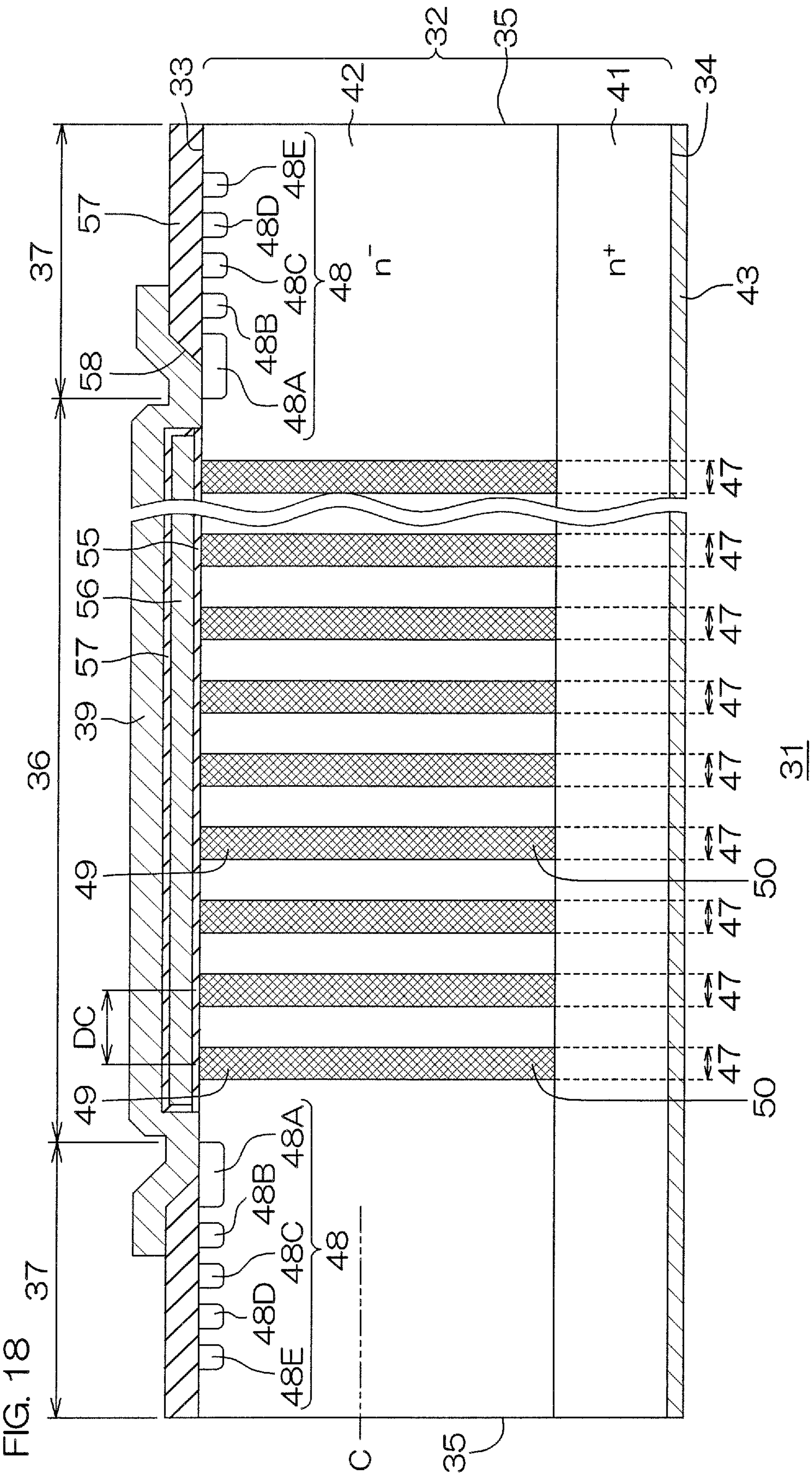
FIG. 18 is a sectional view taken along line XVIII-XVIII of FIG. 16.

FIG. 16 is a plan view of a semiconductor device 31 according to a second preferred embodiment of the present invention and is a diagram showing a first configuration example of carrier trapping regions 47. FIG. 17 is a sectional view taken along line XVII-XVII of FIG. 16. FIG. 18 is a sectional view taken along line XVIII-XVIII of FIG. 16.

Referring to FIG. 16, the semiconductor device 31 includes a chip main body 32. The chip main body 32 includes a first main surface 33 at one side, a second main surface 34 at another side, and side surfaces 35 connecting the first main surface 33 and the second main surface 34.

The first main surface 33 and the second main surface 34 are formed in quadrilateral shapes in a plan view as viewed in a direction normal to the surfaces (hereinafter referred to simply as "plan view"). A device formation region 36 and an outer region 37 are set in the chip main body 32.

The device formation region 36 is a region in which a MISFET (metal insulator semiconductor field transistor) is formed. The device formation region 36 is also referred to as an active region.

The device formation region 36 is set to a quadrilateral shape having four sides parallel to the side surfaces 35 of the chip main body 32 in plan view. The device formation region 36 is set in an inner region of the chip main body 32 across intervals from peripheral edges of the chip main body 32.

The outer region 37 is set to an endless shape (quadrilateral annular shape) surrounding the device formation region 36 in a region between the side surfaces 35 of the chip main body 32 and the peripheral edges of the device formation region 36 in plan view.

A gate pad electrode 38 and a source pad electrode 39 are formed as front surface electrodes on the first main surface 33 of the chip main body 32. In FIG. 16, the gate pad electrode 38 and the source pad electrode 39 are indicated by broken lines.

In this embodiment, the gate pad electrode 38 is formed along a central region of one side surface 35 in plan view. In this embodiment, the gate pad electrode 38 is formed in a quadrilateral shape in plan view. The gate pad electrode 38 may instead be formed along one corner portion connecting two side surfaces 35 extending along mutually intersecting directions in plan view.

The source pad electrode 39 covers the device formation region 36 in a region outside the gate pad electrode 38. The gate pad electrode 38 and the source pad electrode 39 may include at least one type of substance among gold, copper, and aluminum.

Referring to FIG. 17, the chip main body 32 has a laminated structure that includes an $n^+$-type semiconductor substrate 41 and an $n^-$-type epitaxial layer 42 (semiconductor layer) formed on the $n^+$-type semiconductor substrate 41.

The $n^+$-type semiconductor substrate 41 is formed as a high concentration region (drain region). The $n^-$-type epitaxial layer 42 is formed as a low concentration region (drain drift region).

The $n^-$-type epitaxial layer 42 forms the first main surface 33 of the chip main body 32. The $n^+$-type semiconductor substrate 41 forms the second main surface 34 of the chip main body 32. In the description that follows, the first main surface 33 of the chip main body 32 may also be referred to as the first main surface 33 of the $n^-$-type epitaxial layer 42.

As materials of the $n^+$-type semiconductor substrate 41 and the $n^-$-type epitaxial layer 42, the same materials as those of $n^+$-type semiconductor substrate 11 and the $n^-$-type epitaxial layer 12 described above may be adopted. Specific description of the $n^+$-type semiconductor substrate 41 and the $n^-$-type epitaxial layer 42 shall be omitted.

A drain pad electrode 43 as a rear surface electrode is connected to the second main surface 34 of the chip main body 32. The drain pad electrode 43 forms an ohmic junction with the $n^+$-type semiconductor substrate 41.

The drain pad electrode 43 may have a three-layer structure that includes a titanium film, a nickel film, and a silver film laminated in that order from the second main surface 34 of the chip main body 32. The drain pad electrode 43 may have a four-layer structure that includes a titanium film, a nickel film, a gold film, and a silver film laminated in that order from the second main surface 34 of the chip main body 32.

A thickness of the $n^-$-type epitaxial layer 42 may be not less than 1 μm and not more than 200 μm (for example, approximately 4 μm). A withstand voltage of the semiconductor device 31 can be improved by increasing the thickness of the $n^-$-type epitaxial layer 42.

The withstand voltage of the semiconductor device 31 is defined by a maximum voltage across the source pad electrode 39 and the drain pad electrode 43 when a current is made to flow across the source pad electrode 39 and the drain pad electrode 43.

The maximum voltage across the source pad electrode 39 and the drain pad electrode 43 when the current across the source pad electrode 39 and the drain pad electrode 43 is set to 1 mA may be not less than 100 V and not more than 30000 V. For example, by setting the thickness of the $n^-$-type epitaxial layer 42 to not less than 5 μm, a withstand voltage of not less than 1000 V can be obtained.

Referring to FIG. 16 to FIG. 18, p-type body regions 44 (second conductivity type impurity regions), $n^+$-type source regions 45 (first conductivity type impurity regions), $p^+$-type contact regions 46, carrier trapping regions 47, and p-type termination regions 48 are formed in the $n^-$-type epitaxial layer 42.

In FIG. 16 and FIG. 18, the carrier trapping regions 47 are indicated by cross hatching. Also, in FIG. 16, the $n^+$-type source regions 45 and the $p^+$-type contact regions 46 are indicated by dot hatching.

Referring to FIG. 16 and FIG. 17, the p-type body regions 44 are formed in a surface layer portion of the first main surface 33 of the $n^-$-type epitaxial layer 42. Each p-type body region 44 is formed in a band shape extending along a first direction A in plan view.

In this embodiment, a plurality of the p-type body regions 44 are formed at intervals along a second direction B that intersects the first direction A. The p-type body regions 44 are formed in a stripe shape in plan view.

In this embodiment, the first direction A is a direction along an arbitrary one side surface 35 among the side surfaces 35 of the chip main body 32. The second direction B is a direction along a side surface 35 orthogonal to the arbitrary one side surface 35.

The first direction A and the second direction B are not restricted to directions extending along the side surfaces 35 of the chip main body 32. The first direction A and the second direction B may be directions extending along diagonal directions of the chip main body 32.

Referring to FIG. 16 and FIG. 17, the $n^+$-type source regions 45 are formed in surface layer portions of the p-type body regions 44. Each $n^+$-type source region 45 is formed in an inner region across intervals from peripheral edges of a p-type body region 44. The $n^+$-type source region 45 is formed in a band shape extending along the first direction A in plan view.

Referring to FIG. 16 and FIG. 17, the $p^+$-type contact regions 46 are formed in the surface layer portions of the p-type body regions 44. Each $p^+$-type contact region 46 is formed in a central portion of a p-type body region 44 in plan view.

In this embodiment, each $p^+$-type contact region 46 is formed in a band shape extending along the first direction A in plan view. The $p^+$-type contact region 46 penetrates through an $n^+$-type source region 45 from the first main surface 33 of the $n^-$-type epitaxial layer 42 and is electrically connected to a p-type body region 44.

Referring to FIG. 16 and FIG. 18, each carrier trapping region 47 includes crystal defects that are selectively introduced into the $n^-$-type epitaxial layer 42. The crystal defects may include lattice defects represented by interstitial atoms or atomic vacancies.

The carrier trapping region 47 has a crystal defect density N2 that is higher than an n-type impurity density N1 of the $n^-$-type epitaxial layer 42 ($N1<N2$). The carrier trapping region 47 is also a high resistance region having a higher specific resistance $\rho 2$ than a specific resistance $\rho 1$ of the $n^-$-type epitaxial layer 42 ($\rho 1<\rho 2$).

The n-type impurity density N1 is obtained by converting a capacitance value and a voltage value obtained by a capacitance-voltage measurement method to an n-type impurity density. Also, the n-type impurity density N1 is also obtained by a SIMS (secondary ion mass spectrometry) method. On the other hand, the crystal defect density N2 can be calculated from a trap level density obtained by a DLTS (deep level transient spectroscopy) method.

Referring to FIG. 16, each carrier trapping region 47 is formed in a band shape extending along an intersecting direction (more specifically, the second direction B) intersecting the p-type body regions 44 in plan view.

In this embodiment, a plurality of the carrier trapping regions 47 are formed at intervals along the first direction A. The plurality of carrier trapping regions 47 are thereby formed in a stripe shape in plan view. Each carrier trapping region 47 has intersection portions intersecting the p-type body regions 44 in plan view.

Referring to FIG. 16, the carrier trapping regions 47 are selectively formed in regions lower than the first main surface 33 of the $n^-$-type epitaxial layer 42 and/or the p-type body regions 44.

The carrier trapping regions 47 are formed in column shapes extending along a thickness direction (depth direction) of the $n^-$-type epitaxial layer 42. The thickness direction of the $n^-$-type epitaxial layer 42 is also the direction normal to the first main surface 33 of the $n^-$ type epitaxial layer 42.

Each carrier trapping region 47 includes a first region 49 of an upper side and a second region 50 of a lower side. The first region 49 is positioned upper than an intermediate region C of the $n^-$-type epitaxial layer 42. The second region 50 is positioned lower than the intermediate region C of the $n^-$-type epitaxial layer 42.

The intermediate region C of the $n^-$-type epitaxial layer 42 is a region of the $n^-$-type epitaxial layer 42 positioned at a thickness-direction intermediate portion of the $n^-$-type epitaxial layer 42. In FIG. 15 and FIG. 16, the intermediate region C is indicated by an alternate long and two short dashed lines.

The first region 49 of the carrier trapping region 47 may be exposed from the first main surface 33 of the $n^-$-type epitaxial layer 42 in regions outside the intersections portions with the p-type body regions 44.

At the intersection portions with the p-type body regions 44, the first region 49 of the carrier trapping region 47 may be in contact with the p-type body regions 44. In this embodiment, the second region 50 of the carrier trapping region 47 is connected to the $n^+$-type semiconductor substrate 41.

Current paths are formed in regions of the $n^-$-type epitaxial layer 42 positioned between mutually adjacent carrier trapping regions 47. The current paths include current paths via inversion channels induced in the surface layer portions of the p-type body regions 44 between the source pad electrode 39 and the drain pad electrode 43.

The carrier trapping regions 47 trap majority carriers and thereby form a carrier storage type super junction structure with the $n^-$-type epitaxial layer 42. By the carrier trapping regions 47, electric field strength inside the $n^-$-type epitaxial layer 42 can be maintained in a high state.

The crystal defects included in the carrier trapping regions 47 trap electrons which are the majority carriers included in the $n^-$-type epitaxial layer 42. That is, the crystal defects included in the carrier trapping regions 47 have the same function as acceptors.

More specifically, by releasing electrons, the n-type impurity introduced into the $n^-$-type epitaxial layer 42 becomes positively ionized. By trapping the electrons, the carrier trapping regions 47 become negatively charged in opposition to the positively ionized n-type impurity. That is, the carrier trapping regions 47 function virtually as acceptors.

By such carrier trapping regions 47, decrease in electric field strength along the thickness direction of the $n^-$-type epitaxial layer 42 when a voltage is applied to the $n^-$-type epitaxial layer 42 is suppressed.

The electric field strength inside the $n^-$-type epitaxial layer 42 is thereby maintained in a state of being high along the thickness direction of the $n^-$-type epitaxial layer 42. That is, the electric field strength inside the $n^-$-type epitaxial layer 42 is kept in a nearly uniform state or a uniform state.

Referring to FIG. 16 to FIG. 18, a distance DC between carrier trapping regions 47 is preferably set to not more than a distance DB between p-type body regions 44. More specifically, the distance DC is a distance along the first direction A between a central portion of one carrier trapping region 47 and a central portion of another carrier trapping region 47. Also, the distance DB is, more specifically, a distance along the second direction B between a central portion of one p-type body region 44 and a central portion of another p-type body region 44.

A case where the distance DC between carrier trapping regions 47 is set to not more than the distance DB between p-type body regions 44 shall now be considered, in a structure where the carrier trapping regions 47 extend along the p-type body regions 44 and in the first direction A.

In this case, it is possible for two or more carrier trapping regions 47 to be formed in a region of the $n^-$-type epitaxial layer 42 lower than one p-type body region 44. In the region lower than the p-type body region 44, a current path is hardly formed in a region defined by the p-type body region 44 and the two or more carrier trapping regions 47. Therefore, as a result of the reduction of current path, an on resistance increases.

Thus, with the semiconductor device 31, a structure in which the carrier trapping regions 47 intersect the p-type body regions 44 is adopted. Forming of a region defined by a p-type body region 44 and two or more carrier trapping regions 47 in a region lower than the p-type body region 44 can thereby be prevented.

The reduction of current path can thus be suppressed and therefore increase in on resistance can be suppressed. Also, the distance DC between carrier trapping regions 47 can be set to any value not more than the distance DB between p-type body regions 44. Suppression of increase in on resistance and improvement of withstand voltage can thereby be achieved.

The distance DC may be not less than 1 μm and not more than 20 μm. The distance DB may be not less than 2 μm and not more than 25 μm. A width WC in the second direction B of each carrier trapping region 47 is smaller than a width WB in the second direction B of each p-type body region 44. The width WC may be not less than 0.1 μm and not more than 10 μm. The width WB may be not less than 2 μm and not more than 20 μm.

A distance L, along the second direction B, of a portion of the $n^-$-type epitaxial layer 42 positioned between two mutually adjacent carrier trapping regions 47 may be not more than a sum W1+W2 of a first width W1 of a first depletion layer spreading from one carrier trapping region 47 and a second width W2 of a second depletion layer spreading from the other carrier trapping region 47 ($L \leq W1+W2$).

In this case, the first depletion layer and the second depletion layer overlap mutually in the portion of the $n^-$-type epitaxial layer 42 positioned between the two mutually adjacent carrier trapping regions 47. The portion of the $n^-$-type epitaxial layer 42 positioned between the two mutually adjacent carrier trapping regions 47 is thereby depleted.

Referring to FIG. 16 to FIG. 18, the p-type termination regions 48 are formed in a surface layer portion of the $n^-$-type epitaxial layer 42. In the surface layer portion of the $n^-$-type epitaxial layer 42, the p-type termination regions 48 relax an electric field.

The p-type termination regions 48 are formed in the outer region 37 and along the device formation region 36. In this embodiment, the p-type termination regions 48 are formed in endless shapes (quadrilateral annular shapes) surrounding the device formation region 36 in plan view.

In this embodiment, a plurality (five, here) of the p-type termination regions 48 are formed at intervals in directions away from the device formation region 36. The plurality of p-type termination regions 48 include p-type termination regions 48A, 48B, 48C, 48D, and 48E that are formed in that order at intervals from the device formation region 36 side toward the outer region 37 side. The device formation region 36 may be defined by a region surrounded by inner peripheral edges of the innermost side p-type termination region 48A.

The plurality of p-type termination regions 48 may respectively have p-type impurity concentrations lower than p-type impurity concentrations of the $p^+$-type contact regions 46. The plurality of p-type termination regions 48 may respectively have p-type impurity concentrations that are substantially equal. The plurality of p-type termination regions 48 may respectively have p-type impurity concentrations that are different.

The number and the p-type impurity concentrations of the p-type termination regions 48 may be adjusted as appropriate in accordance with a strength of the electric field to be relaxed and are not restricted to those of the configuration described above.

Referring to FIG. 17 and FIG. 18, planar gate structures 54 are formed on the first main surface 33 of the $n^-$-type epitaxial layer 42. Each planar gate structure 54 has a laminated structure that includes a gate insulating film 55 and a gate electrode 56 that are formed in that order on the first main surface 33 of the $n^-$-type epitaxial layer 42.

The planar gate structure 54 is formed in a band shape extending along the first direction A between mutually adjacent p-type body regions 44 in plan view. In this embodiment, a plurality of the planar gate structures 54 are formed at intervals along the second direction B. The plurality of planar gate structures 54 are thereby formed in a stripe shape in plan view.

The gate electrodes 56 face the p-type body regions 44, the $n^+$-type source regions 45, and the $n^-$-type epitaxial layer 42 across the gate insulating films 55. The gate electrodes 56 are electrically connected to the gate pad electrode 38 in an unillustrated region.

An insulating layer 57 is formed on the first main surface 33 of the $n^-$-type epitaxial layer 42. The insulating layer 57 covers the gate electrodes 56. Contact holes 58 exposing the $n^+$-type source regions 45 the $p^+$-type contact regions 46, and the p-type termination regions 48 are selectively formed in the insulating layer 57.

Inner edges (inner walls) of the insulating layer 57 that define the contact hole 58 positioned at an outermost side are positioned directly above a p-type termination region 48 (here, the innermost side p-type termination region 48A).

The source pad electrode 39 described above enters into the contact holes 58 from above the insulating layer 57. Inside the contact holes 58, the source pad electrode 39 is electrically connected to the $n^+$-type source regions 45, the $p^+$-type contact regions 46, and the p-type termination regions 48.

The structure of the carrier trapping regions 47 is not restricted to the configuration described above and may take on any of various configurations. Other configuration examples of the carrier trapping regions 47 shall now be described.

Figure 19:
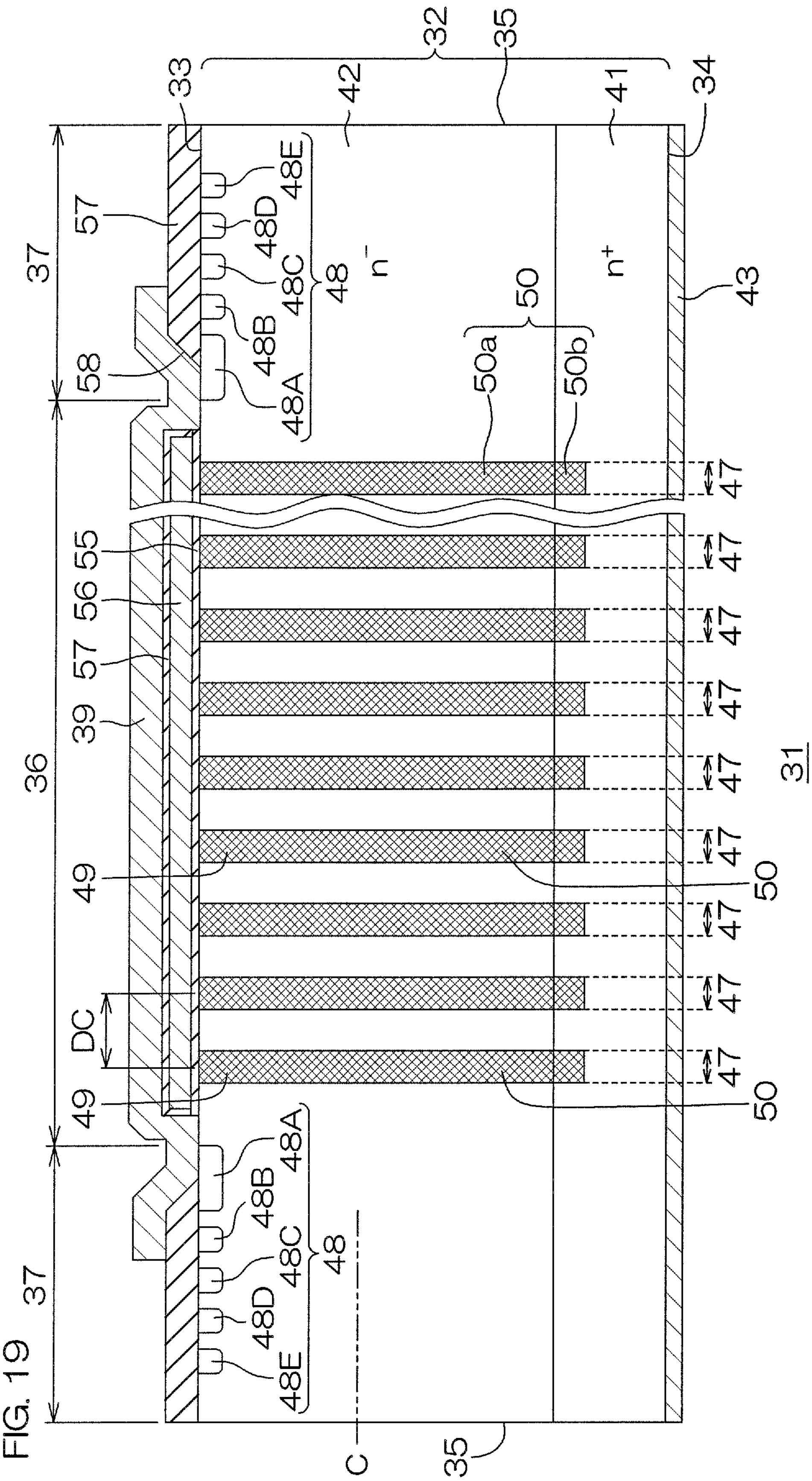
FIG. 19 is a sectional view of a portion corresponding to FIG. 18 and is a sectional view showing a second configuration example of the carrier trapping regions.

FIG. 19 is a sectional view of a portion corresponding to FIG. 18 and is a sectional view showing a second configuration example of the carrier trapping regions 47. Structures in FIG. 19 corresponding to structures described in FIG. 18, etc., are provided with the same reference signs and description thereof shall be omitted.

Referring to FIG. 19, in this configuration example, the second region 50 of each carrier trapping region 47 is connected to the $n^+$-type semiconductor substrate 41. The second region 50 of the carrier trapping region 47 includes a first portion 50*a* formed inside the $n^-$-type epitaxial layer 42 and a second portion 50*b* formed inside the $n^+$-type semiconductor substrate 41.

A crystal defect density N2 of the first portion 50*a* of the second region 50 is higher than the n-type impurity density N1 of the $n^-$-type epitaxial layer 42 (N2>N1). The crystal defect density N2 of the second portion 50*b* of the second region 50 is lower than an n-type impurity density N3 of the $n^+$-type semiconductor substrate 41 (N2<N3). Functioning virtually as an acceptor is suppressed in the second portion 50*b* of the second region 50.

Figure 20:
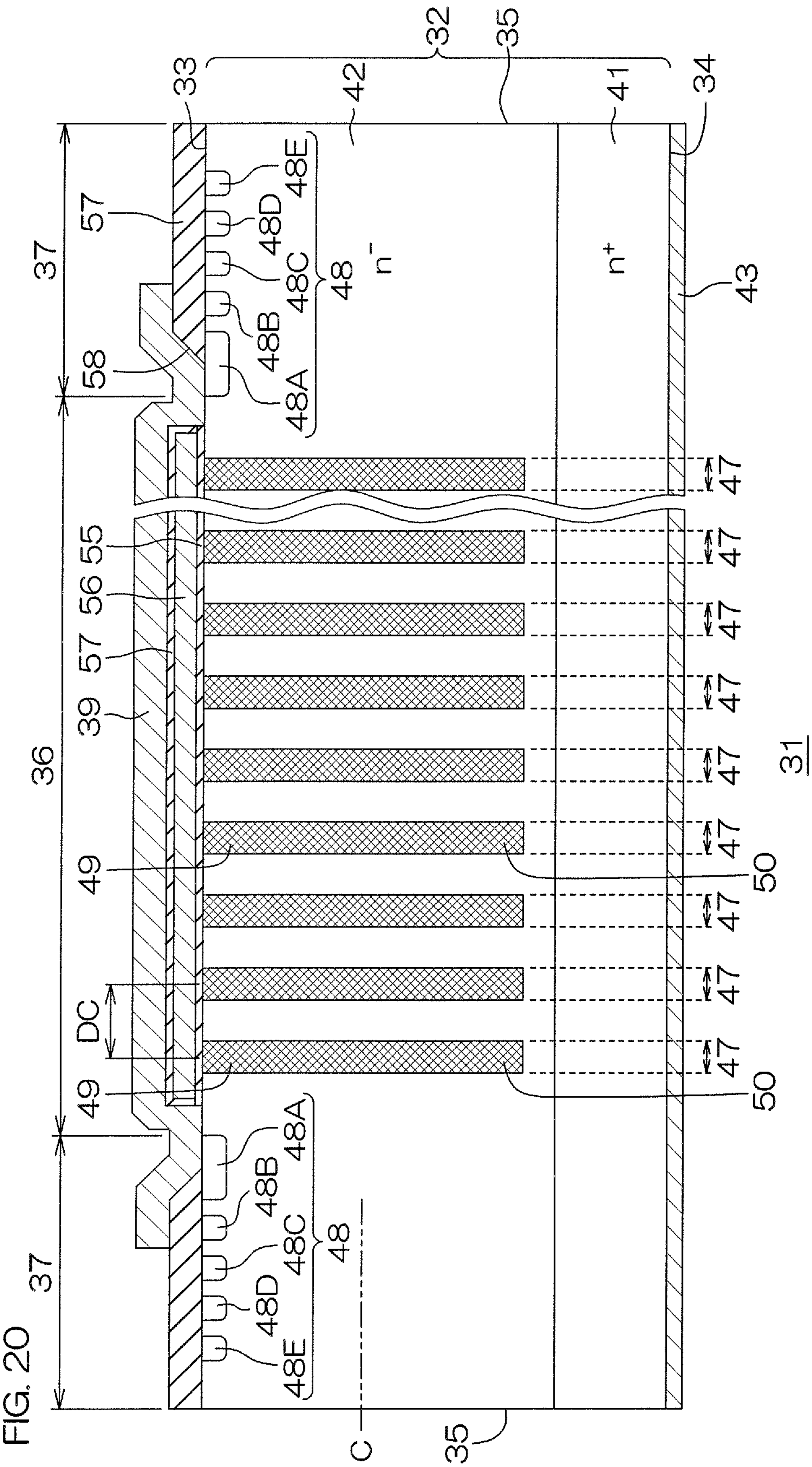
FIG. 20 is a sectional view of a portion corresponding to FIG. 18 and is a sectional view showing a third configuration example of the carrier trapping regions.

FIG. 20 is a sectional view of a portion corresponding to FIG. 18 and is a sectional view showing a third configuration example of the carrier trapping regions 47. Structures in FIG. 20 corresponding to structures described in FIG. 18, etc., are provided with the same reference signs and description thereof shall be omitted.

Referring to FIG. 20, in this configuration example, the second region 50 of each carrier trapping region 47 is formed across an interval to the first main surface 33 side from the $n^+$-type semiconductor substrate 41. A portion of the $n^-$-type epitaxial layer 42 is interposed in a region between the second region 50 and the $n^+$-type semiconductor substrate 41.

Figure 21:
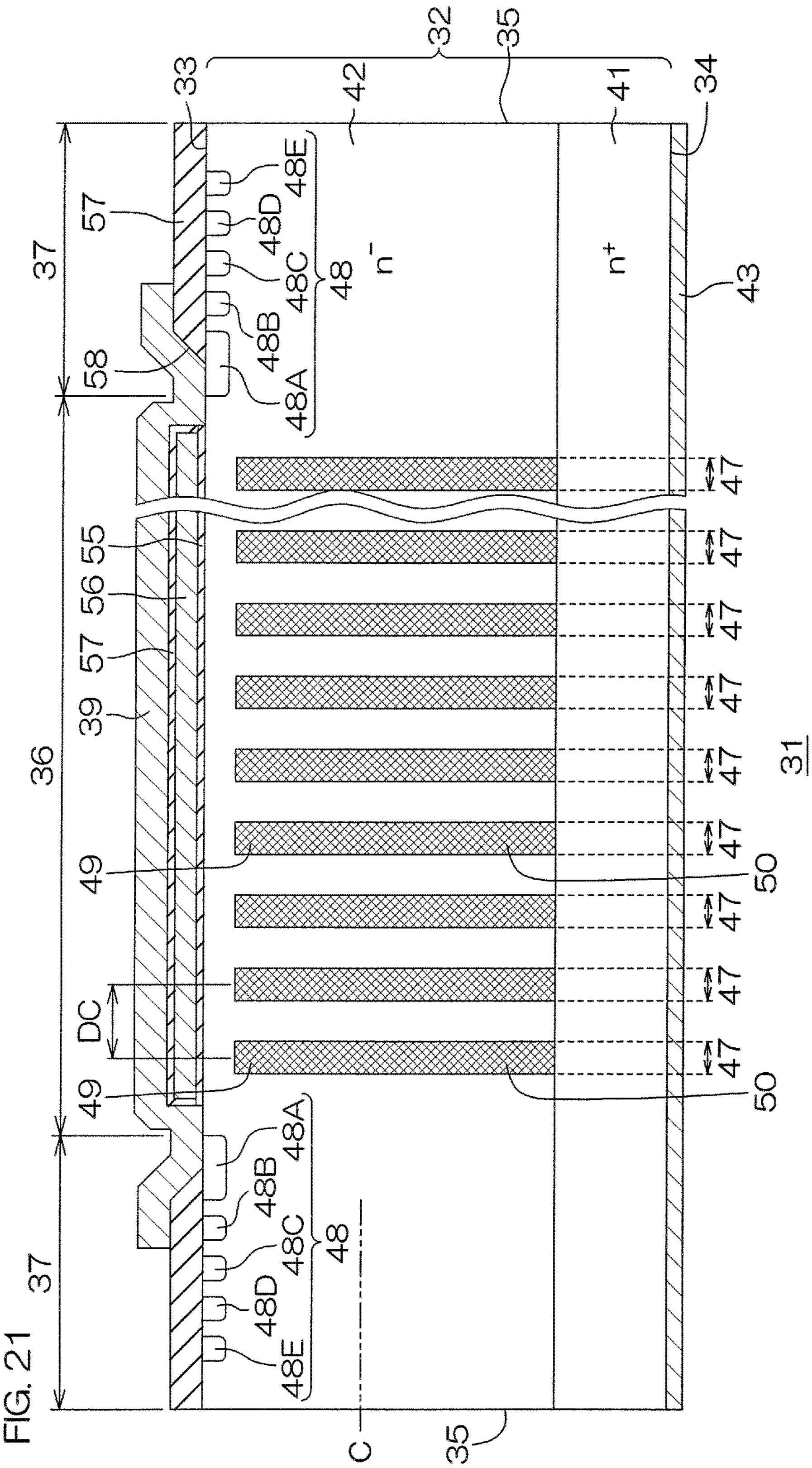
FIG. 21 is a sectional view of a portion corresponding to FIG. 18 and is a sectional view showing a fourth configuration example of the carrier trapping regions.

FIG. 21 is a sectional view of a portion corresponding to FIG. 18 and is a sectional view showing a fourth configuration example of the carrier trapping regions 47. Structures in FIG. 21 corresponding to structures described in FIG. 18, etc., are provided with the same reference signs and description thereof shall be omitted.

Referring to FIG. 21, in this configuration example, the first region 49 of each carrier trapping region 47 is formed across an interval to the second main surface 34 side from the first main surface 33 of the $n^-$-type epitaxial layer 42. A portion of the $n^-$-type epitaxial layer 42 is interposed in a region between the first region 49 and the first main surface 33.

Figure 22:
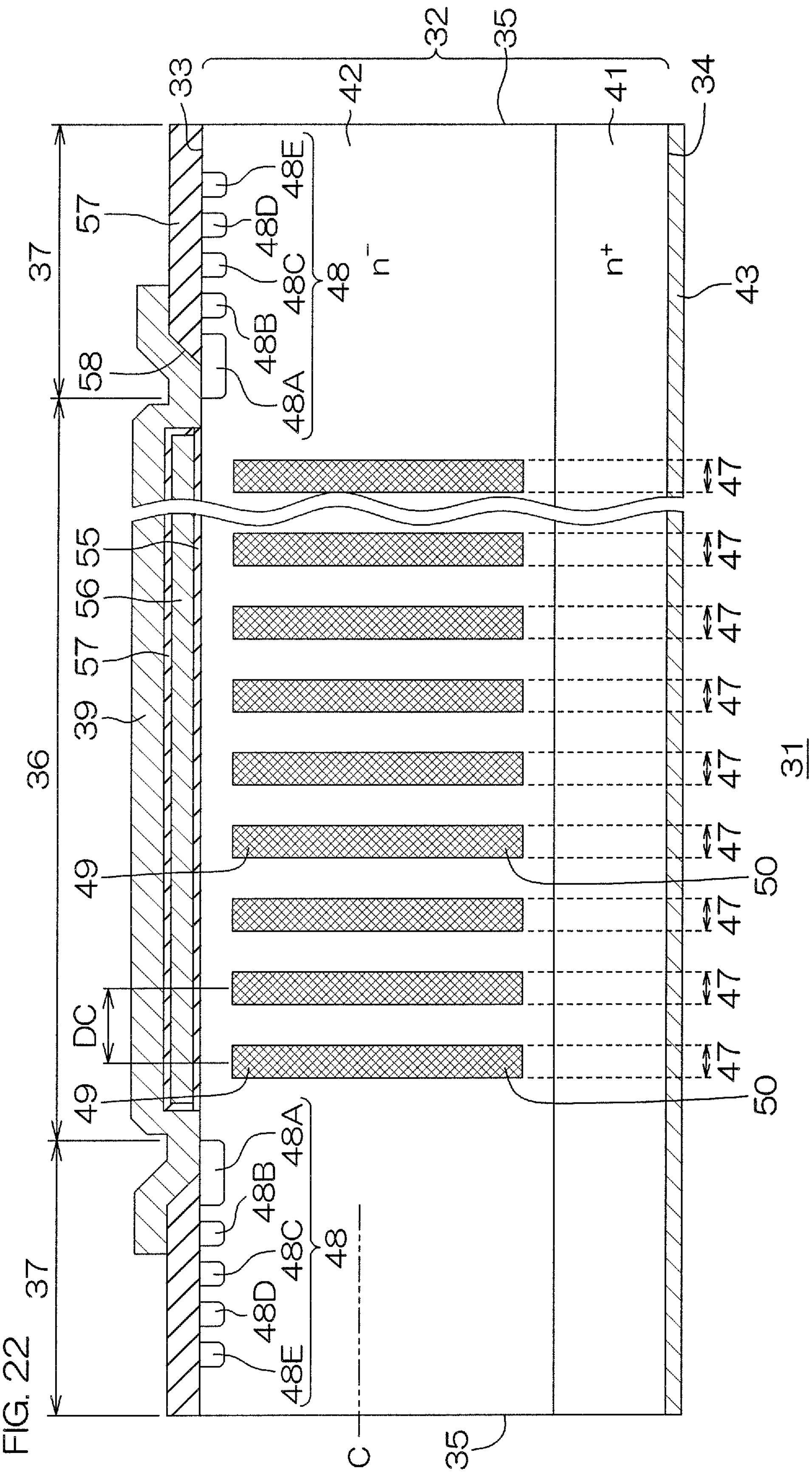
FIG. 22 is a sectional view of a portion corresponding to FIG. 18 and is a sectional view showing a fifth configuration example of the carrier trapping regions.

FIG. 22 is a sectional view of a portion corresponding to FIG. 18 and is a sectional view showing a fifth configuration example of the carrier trapping regions 47. Structures in FIG. 22 corresponding to structures described in FIG. 18, etc., are provided with the same reference signs and description thereof shall be omitted.

Referring to FIG. 22, in this configuration example, the carrier trapping regions 47 are floated in an interior of the $n^-$-type epitaxial layer 42.

That is, the first region 49 of each carrier trapping region 47 is formed across an interval to the second main surface 34 side from the first main surface 33 of the $n^-$-type epitaxial layer 42. A portion of the $n^-$-type epitaxial layer 42 is interposed in a region between the first region 49 and the first main surface 33 of the $n^-$-type epitaxial layer 42.

Also, the second region 50 of each carrier trapping region 47 is formed across an interval to the first main surface 33 side from the $n^+$-type semiconductor substrate 41. A portion of the $n^-$-type epitaxial layer 42 is interposed in a region between the second region 50 and the $n^+$-type semiconductor substrate 41.

Figure 23:
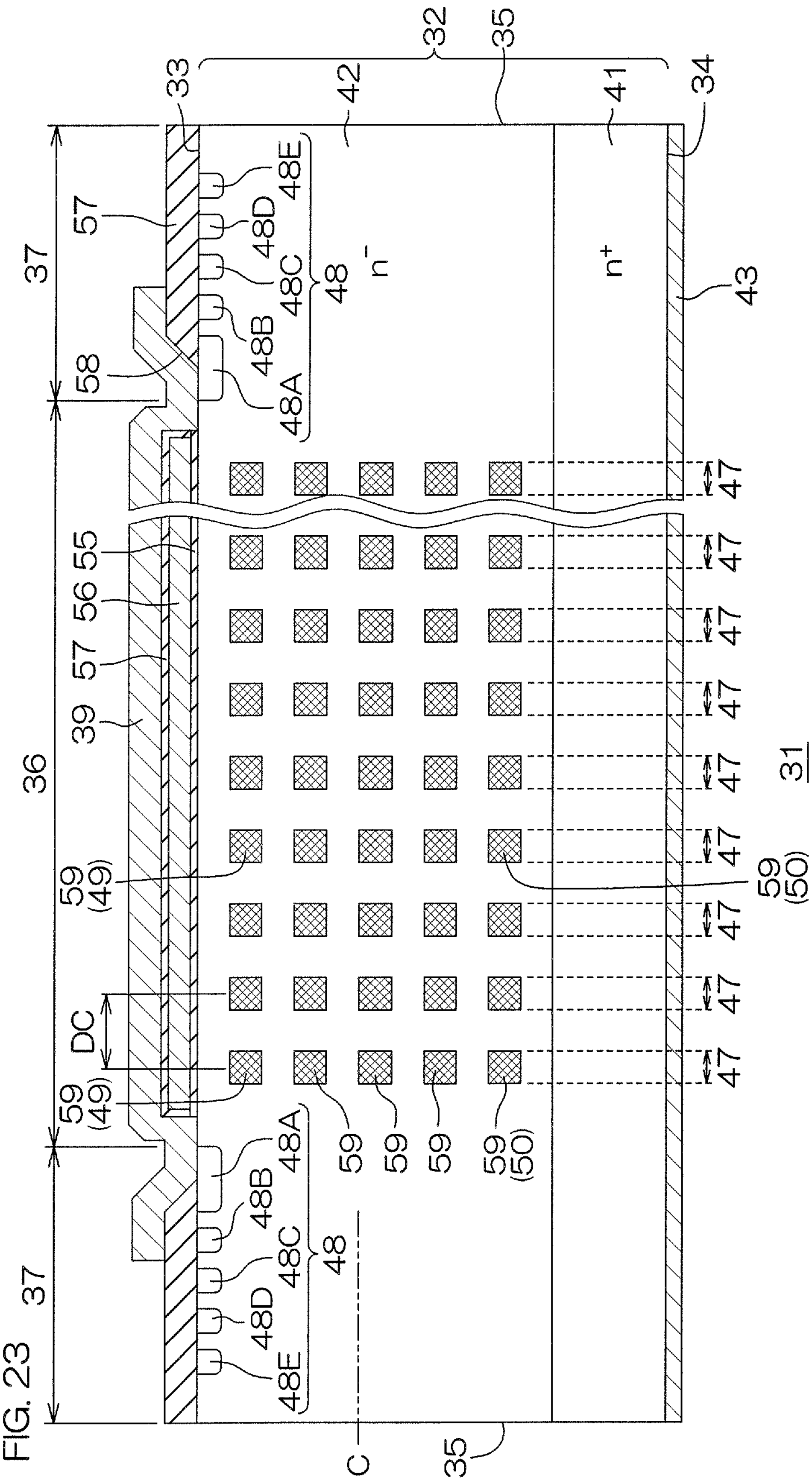
FIG. 23 is a sectional view of a portion corresponding to FIG. 18 and is a sectional view showing a sixth configuration example of the carrier trapping regions.

FIG. 23 is a sectional view of a portion corresponding to FIG. 18 and is a sectional view showing a sixth configuration example of the carrier trapping regions 47. Structures in FIG. 23 corresponding to structures described in FIG. 18, etc., are provided with the same reference signs and description thereof shall be omitted.

Referring to FIG. 23, in this configuration example, each carrier trapping region 47 includes a plurality of divided portions 59. The plurality of divided portions 59 are formed at intervals along the thickness direction of the $n^-$-type epitaxial layer 42.

An uppermost divided portion 59 positioned upper than the intermediate region C of the $n^-$-type epitaxial layer 42 in the plurality of divided portions 59 forms the first region 49. A lowermost divided portion 59 positioned lower than the intermediate region C in the plurality of divided portions 59 forms the second region 50.

The plurality of divided portions 59 may respectively have different thicknesses. Also, the plurality of divided portions 59 may respectively have different crystal defect densities N2. Also, the plurality of divided portions 59 may be formed at equal intervals along the thickness direction of the $n^-$-type epitaxial layer 42. Also, the plurality of divided portions 59 may be formed at unequal intervals along the thickness direction of the $n^-$-type epitaxial layer 42.

Figure 24:
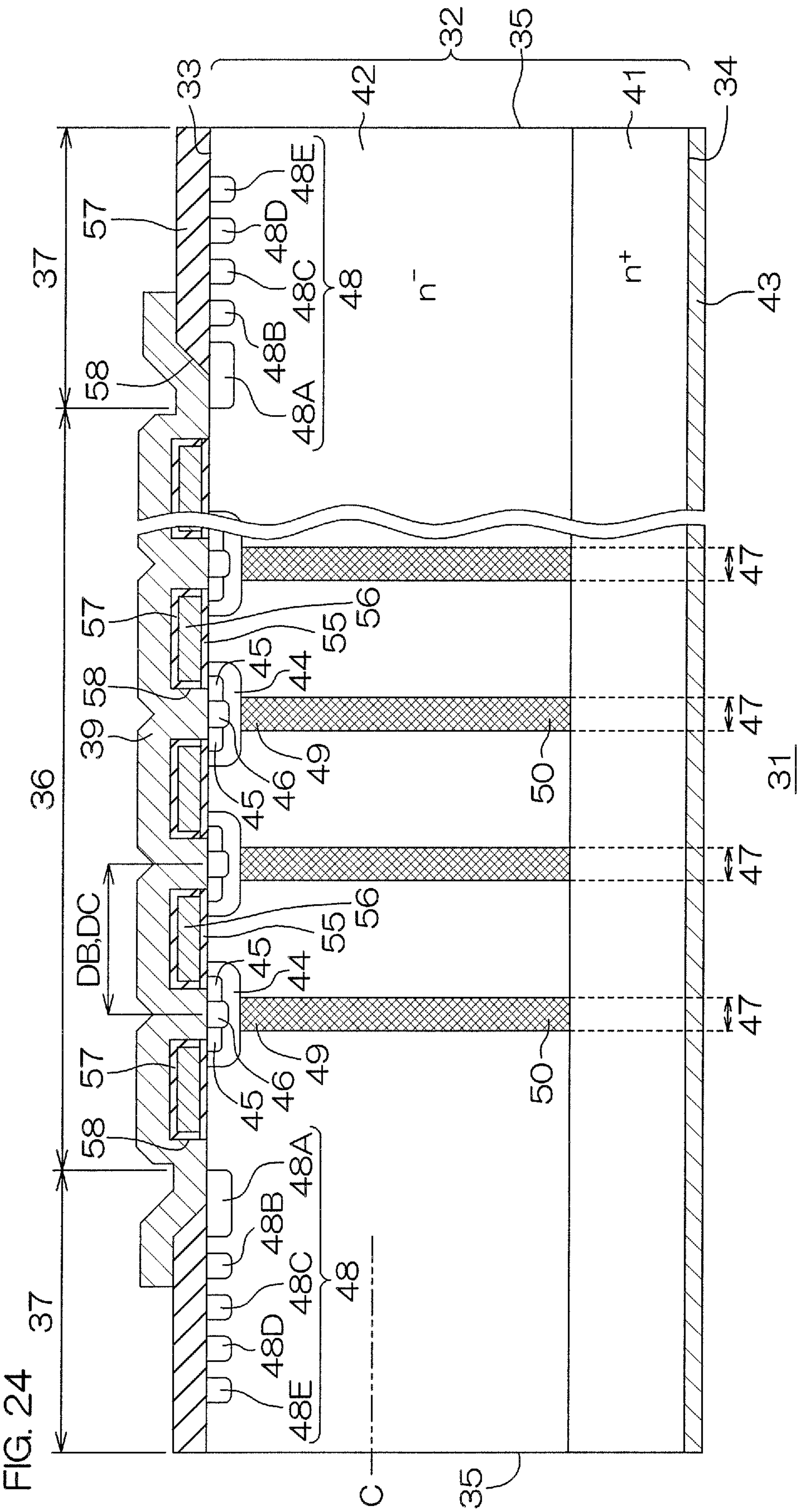
FIG. 24 is a sectional view of a portion corresponding to FIG. 17 and is a sectional view showing a seventh configuration example of the carrier trapping regions.

FIG. 24 is a sectional view of a portion corresponding to FIG. 17 and is a sectional view showing a seventh configuration example of the carrier trapping regions. Structures in FIG. 24 corresponding to structures described in FIG. 17, etc., are provided with the same reference signs and description thereof shall be omitted.

In this configuration example, the carrier trapping regions 47 extend along the first direction A. The carrier trapping regions 47 extend along the p-type body regions 44 and overlap with the p-type body regions 44 in plan view.

The distance DC between carrier trapping regions 47 is substantially equal to the distance DB between p-type body regions 44. The respective carrier trapping regions 47 are formed in regions of the $n^-$-type epitaxial layer 42 lower than the p-type body regions 44 in one-to-one correspondence with the respective p-type body regions 44.

The first region 49 of each carrier trapping region 47 may be in contact with a p-type body region 44. The second region 50 of each carrier trapping region 47 may be connected to the $n^+$-type semiconductor substrate 41.

A configuration example in which two or more configuration examples of the carrier trapping regions 47 according to the first configuration example to the seventh configuration example are combined in any way thereamong may be applied.

For example, a configuration example having the carrier trapping regions 47 according to the first configuration example while also having any one or plurality of the carrier trapping regions 47 according to the second configuration example to the seventh configuration example may be applied.

For example, the structure with which the first regions 49 of the carrier trapping regions 47 are exposed from the first main surface 33 and the second regions 50 are connected to the $n^+$-type semiconductor substrate 41 (see FIG. 18) may be applied to the divided portions 59 according to the sixth configuration example (see FIG. 23).

In this case, the uppermost divided portions 59 are exposed from the first main surface 33 of the $n^-$-type epitaxial layer 42. Also, the lowermost divided portions 59 are connected to the $n^+$-type semiconductor substrate 41.

For example, the structure where the first regions 49 of the carrier trapping regions 47 are formed across intervals in the thickness direction (to the second main surface 34 side) from the p-type body regions 44 and the second regions 50 are formed across intervals to the first main surface 33 side from the $n^+$-type semiconductor substrate 41 (see FIG. 22) may be applied to the divided portions 59 according to the sixth configuration example (see FIG. 23).

In this case, the uppermost divided portions 59 are formed across the intervals in the thickness direction (to the second main surface 34 side) from the p-type body regions 44. Also, the lowermost divided portions 59 are formed across the intervals to the first main surface 33 side from the $n^+$-type semiconductor substrate 41.

As described above, with the semiconductor device 31, electrons which are the majority carriers included in the $n^-$-type epitaxial layer 42 are trapped by the crystal defects. The crystal defects included in the carrier trapping regions 47 thus have the same function as acceptors.

More specifically, the n-type impurity introduced into the $n^-$-type epitaxial layer 42 becomes positively ionized by releasing electrons. The carrier trapping regions 47 become negatively charged in opposition to the positively ionized n-type impurity by trapping the electrons. That is, the carrier trapping regions 47 function virtually as acceptors.

Decrease in electric field strength along the thickness direction of the $n^-$-type epitaxial layer 42 when a voltage is applied to the $n^-$-type epitaxial layer 42 is suppressed by such carrier trapping regions 47.

In particular, with the semiconductor device 31, the carrier trapping regions 47 include the first regions 49 positioned upper than the intermediate region C of the $n^-$-type epitaxial layer 42 and the second regions 50 positioned lower than the intermediate region C.

Therefore, the decrease in electric field strength can be suppressed in a region higher than the intermediate region C and a region lower than the intermediate region C by the carrier trapping regions 47 in the same manner as in the electric field distribution of FIG. 13 and the second characteristics SP2 of FIG. 14 described above.

The electric field strength inside the $n^-$-type epitaxial layer 42 can thereby be maintained in the state of being high along the thickness direction of the $n^-$-type epitaxial layer 42. That is, the electric field strength inside the $n^-$-type epitaxial layer 42 can be kept in a nearly uniform state. Consequently, the withstand voltage can be improved.

Also, a first impurity concentration of the $n^-$-type epitaxial layer 42 can also be increased while forming the carrier trapping regions 47. Reduction of on resistance can also be achieved thereby.

Figure 25:
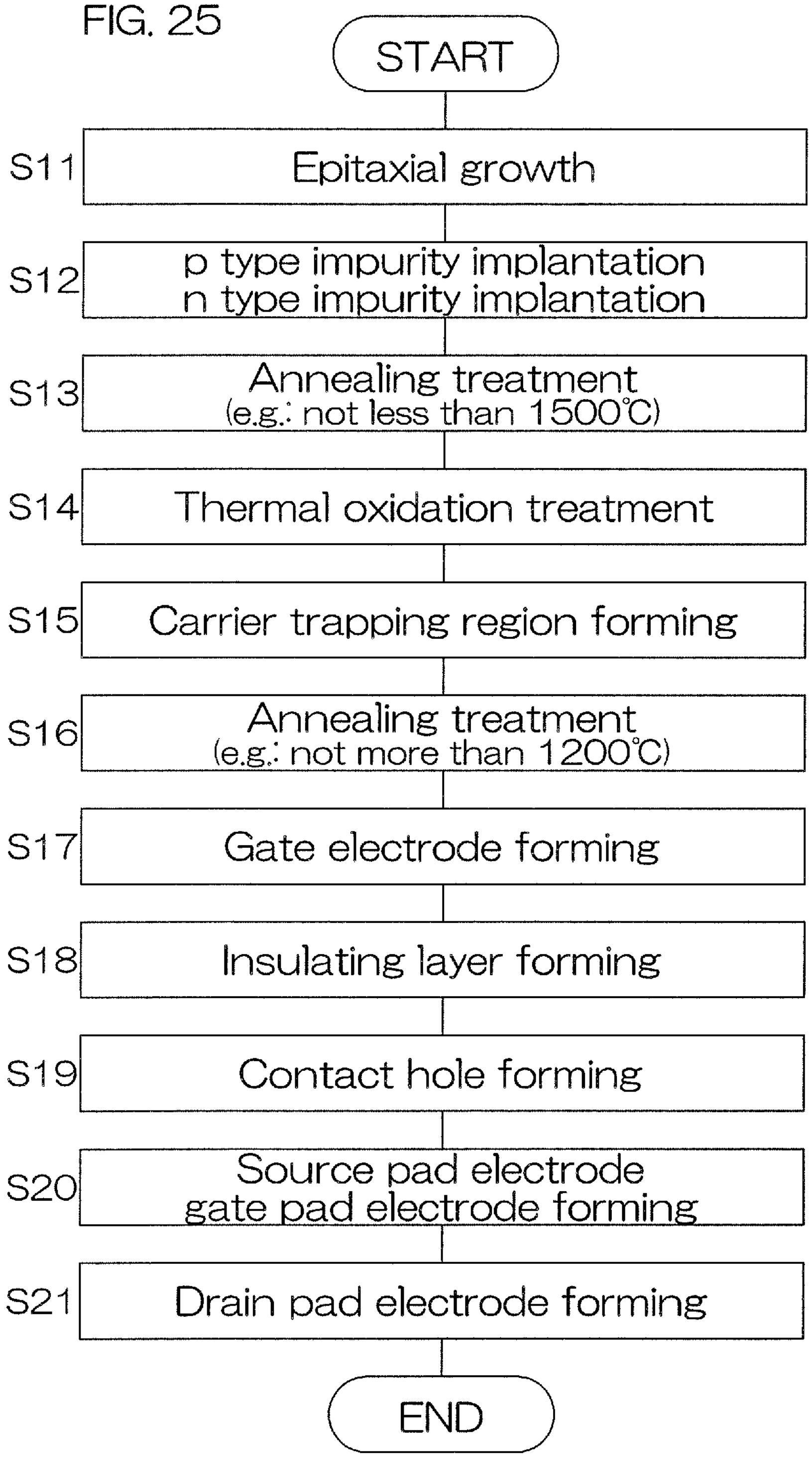
FIG. 25 is a flowchart of an example of a method for manufacturing the semiconductor device shown in FIG. 16.

FIG. 25 is a flowchart of an example of a method for manufacturing the semiconductor device 31 shown in FIG. 16.

In manufacturing the semiconductor device 31, first, the $n^+$-type semiconductor substrate 41 that includes 4H—SiC is prepared. Next, in parallel to introducing the n-type impurity, SiC is epitaxially grown from a main surface of the $n^+$-type semiconductor substrate 41 (step S11).

The $n^-$-type epitaxial layer 42 is thereby formed on the $n^+$-type semiconductor substrate 41. The first main surface 33 is formed by the $n^-$-type epitaxial layer 42 and the second main surface 34 is formed by the $n^+$-type semiconductor substrate 41.

Next, a p-type impurity and an n-type impurity are selectively introduced into the surface layer portion of the first main surface 33 of the $n^-$-type epitaxial layer 42 (step S12).

The p-type impurity is selectively introduced into regions in which the p-type body regions 44 are to be formed, regions in which the $p^+$-type contact regions 46 are to be formed, and regions in which the p-type termination regions 48 are to be formed.

The n-type impurity is introduced into regions in which the $n^+$-type source regions 45 are to be formed. The introduction of the p-type impurity and the introduction of the n-type impurity may each be performed by an ion implantation via an ion implantation mask having a predetermined pattern.

Next, the p-type impurity and the n-type impurity are activated by an annealing treatment method (step S13). The annealing treatment method may be performed under an atmosphere of not less than 1500° C. The p-type body regions 44, the $p^+$-type contact regions 46, the p-type termination regions 48, and the $n^+$-type source regions 45 are thereby formed.

Next, the gate insulating films 55 are formed on the first main surface 33 of the $n^-$ -type epitaxial layer 42 (step S14). The gate insulating films 55 may be formed by a thermal oxidation treatment method or a CVD method. The gate insulating films 55 may include $SiO_2$ films.

The gate insulating films 55 may include insulating films other than $SiO_2$ films. The gate insulating films 55 may include SiN films. In this case, the gate insulating films 55 may be formed by the CVD method.

Next, the carrier trapping regions 47 are formed in the $n^-$-type epitaxial layer 42 (step S15). The carrier trapping regions 47 are formed, for example, by selectively irradiating the $n^-$-type epitaxial layer 42 with light ions, electrons, or neutrons, etc. The light ions may include at least one type of ions among hydrogen ions ($H^+$), helium ions ($He^+$), and boron ions ($B^+$).

Next, the crystal defects formed in the $n^-$-type epitaxial layer 42 are partially recovered by an annealing treatment method (step S16). The annealing treatment method may be performed under an atmosphere of less than 1500° C. (for example, not more than 1200° C.). The annealing treatment step (step S16) does not have to be performed necessarily and may be omitted.

Depths and extents of the carrier trapping regions 47 can be controlled by adjusting an irradiation energy (acceleration voltage applied by an irradiating apparatus) of the light ions, electrons, or neutrons, etc. Crystal defect densities can also be controlled by an irradiation time of the light ions, electrons, or neutrons, etc. By appropriate adjustment of these conditions, the carrier trapping regions 47 according to the first configuration example to the seventh configuration example described above can be formed.

The steps of forming the carrier trapping regions 47 (step S15 and step S16) may be performed before the step of forming the gate insulating film (step S14). Also, the steps of forming the carrier trapping regions 47 (step S15 and step S16) may be performed before the steps of forming the p-type body regions 44, the $n^+$-type source regions 45, etc. (step S12 and step S13).

Next, the gate electrodes 56 are formed on the first main surface 33 of the $n^-$-type epitaxial layer 42 (step S17). In the present step, first, a conductor layer that is to be a base of the gate electrodes 56 is formed on the first main surface 33 of the $n^-$-type epitaxial layer 42.

The conductor layer may be formed by a CVD method. Next, unnecessary portions of the conductor layer are selectively removed. The unnecessary portions of the conductor layer may be removed by an etching method. The gate electrodes 56 are thereby formed.

Next, the insulating layer 57 is formed on the first main surface 33 of the $n^-$-type epitaxial layer 42 (step S18). The insulating layer 57 may be formed by a CVD method.

Next, the contact holes 58 are formed in the insulating layer 57 (step S19). In the present step, first, a mask having a predetermined pattern is formed on the insulating layer 57. The mask has openings exposing regions at which the contact holes 58 are to be formed.

Next, unnecessary portions of the insulating layer 57 are selectively removed by an etching method via the mask. The contact holes 58 are thereby formed in the insulating layer 57.

Next, the gate pad electrode 38 and the source pad electrode 39 are formed on the first main surface 33 of the $n^-$-type epitaxial layer 42 (step S20). The gate pad electrode 38 and the source pad electrode 39 may be formed by a sputtering method or a plating method.

Also, the drain pad electrode 43 is formed on the second main surface 34 of the $n^+$-type semiconductor substrate 41 (step S21). The drain pad electrode 43 may be formed by a sputtering method or a plating method.

The step of forming the gate pad electrode 38 and the source pad electrode 39 (step S20) may be performed after the step of forming the drain pad electrode 43 (step S21). The semiconductor device 31 is manufactured through such steps.

As described above, with the method for manufacturing the semiconductor device 31, the carrier trapping regions 47 can be formed by selectively irradiating the $n^-$-type epitaxial layer 42 with light ions, electrons, or neutrons, etc. (step S15 and step S16).

A complicated manufacturing process is thus not required to form the carrier trapping regions 47. The semiconductor device 31 which is easy to manufacture and with which the reduction of on resistance and the improvement of withstand voltage can be achieved can thus be provided.

A case of forming a super junction structure by p-type impurity regions in place of the carrier trapping regions 47 shall now be considered. If a comparatively thick $n^-$-type epitaxial layer 42 is adopted in this structure, it would be difficult to introduce the p-type impurity into comparatively deep positions of the $n^-$-type epitaxial layer 42. Difficulty of manufacture is thus increased.

Especially in a case where the $n^-$-type epitaxial layer 42 that includes SiC is adopted, there is a problem that diffusion of the p-type impurity cannot be expected due to the properties of SiC unlike in a case where silicon (S1) is adopted. The manufacturing method thus tends to become troublesome.

As one example, there is a method where p-type impurity regions oriented along the thickness direction of the $n^-$-type epitaxial layer 42 are formed by alternately repeating epitaxial growth of SiC and implantation of the p-type impurity.

As another example, there is a method for forming p-type impurity regions by forming trenches in the $n^-$-type epitaxial layer 42 and thereafter embedding a p-type SiC by epitaxial growth inside the trenches. With these methods, the difficulty of manufacture increases as the $n^-$-type epitaxial layer 42 becomes thicker.

On the other hand, with the method for manufacturing the semiconductor device 31, the carrier trapping regions 47 having arbitrary crystal defect density N2 can be formed in arbitrary region of the $n^-$-type epitaxial layer 42 by just adjusting conditions, such as the irradiation amount, irradiation energy, etc., of the light ions, electrons, or neutrons, etc.

Therefore, the effects of introducing the carrier trapping regions 47 can be said to be especially high, from the standpoint of difficulty and cost of manufacture, when the $n^-$-type epitaxial layer 42 constituted of an SiC is adopted or when a comparatively thick $n^-$-type epitaxial layer 42 is adopted.

The steps of forming the carrier trapping regions 47 are effective when a comparatively thin $n^-$-type epitaxial layer 42, for example, of not less than 1 μm and not more than 10 μm is adopted.

The steps of forming the carrier trapping regions 47 are also effective when a comparatively thick $n^-$-type epitaxial layer 42, for example, of not less than 10 μm and not more than 50 μm is adopted.

The steps of forming the carrier trapping regions 47 are also effective when a comparatively thick $n^-$-type epitaxial layer 42, for example, of not less than 50 μm and not more than 100 μm is adopted.

The steps of forming the carrier trapping regions 47 are also effective when a comparatively thick $n^-$-type epitaxial layer 42, for example, of not less than 100 μm and not more than 150 μm is adopted.

The steps of forming the carrier trapping regions 47 are also effective when a comparatively thick $n^-$-type epitaxial layer 42, for example, of not less than 150 μm and not more than 200 μm is adopted.

Also, with the method for manufacturing the semiconductor device 31, the steps of forming the carrier trapping regions 47 (step S15 and step S16) are performed after the steps of forming the p-type body regions 44, the $n^+$-type source regions 45, etc. (step S12 and step S13).

The steps of forming the p-type body regions 44, the $n^+$-type source regions 45, etc., thus do not have to be executed after the steps of forming the carrier trapping regions 47. Excessive heating of the carrier trapping regions 47 after the steps of forming the carrier trapping regions 47 can thereby be suppressed. Undesired recovery of the crystal defects can thus be suppressed.

Figure 26:
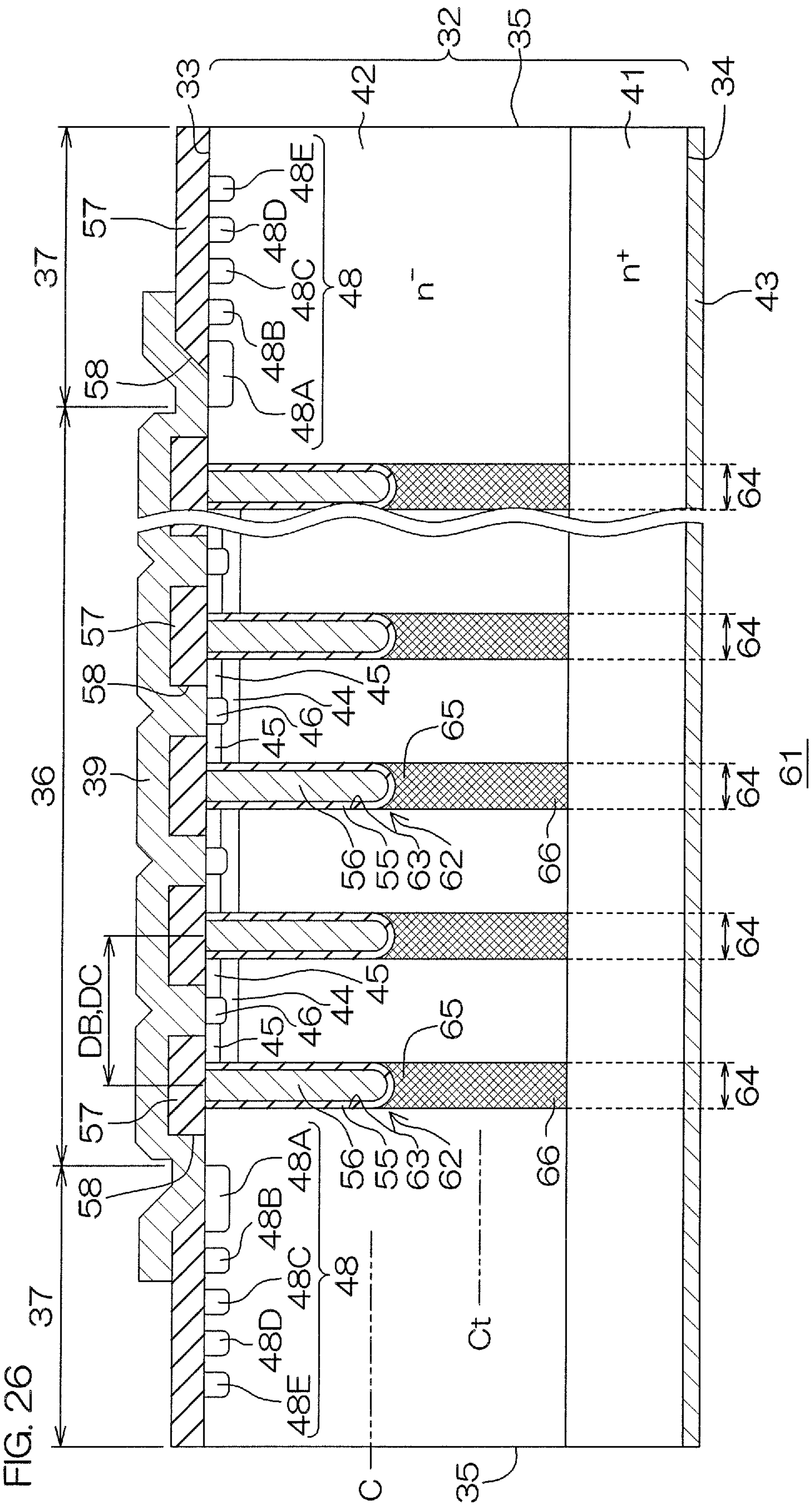
FIG. 26 is a sectional view of a semiconductor device according to a third preferred embodiment of the present invention and is a diagram showing a first configuration example of carrier trapping regions.

FIG. 26 is a sectional view of a semiconductor device 61 according to a third preferred embodiment of the present invention and is a diagram showing a first configuration example of carrier trapping regions 64. FIG. 26 is also a sectional view of a portion corresponding to FIG. 15 described above. Structures in FIG. 26 corresponding to structures described in FIG. 15, etc., described above are provided with the same reference signs and description thereof shall be omitted.

The semiconductor device 61 has substantially the same structure as the semiconductor device 31 with the exception of including trench gate structures 62 and including the carrier trapping regions 64.

Each trench gate structure 62 is formed in a band shape extending along the first direction A (see FIG. 14) in plan view. In this embodiment, a plurality of the trench gate structures 62 are formed at intervals along the second direction B (see FIG. 14). The plurality of trench gate structures 62 are thereby formed in a stripe shape in plan view.

Each trench gate structure 62 includes a gate electrode 56 embedded, across a gate insulating film 55, in a gate trench 63 (first trench) formed in the first main surface 33 of the $n^-$-type epitaxial layer 42.

The gate trench 63 includes a side wall and a bottom wall. In this embodiment, the side wall of the gate trench 63 is formed perpendicular to the first main surface 33 of the $n^-$ type epitaxial layer 42. The gate trench 63 may be formed to a tapered shape with an opening area being greater than a bottom surface area.

The gate insulating film 55 is formed along the side wall and the bottom wall of the gate trench 63. The gate insulating film 55 defines a recessed space inside the gate trench 63. The gate electrode 56 is embedded in the recessed space defined by the gate insulating film 55.

A p-type body region 44, an $n^+$-type source region 45, and a $p^+$-type contact region 46 are formed in each region of the surface layer portion of the first main surface 33 of the $n^-$-type epitaxial layer 42 between mutually adjacent trench gate structures 62.

The p-type body region 44 is formed in a band shape extending along the first direction A in the region between the mutually adjacent trench gate structures 62 in plan view. The p-type body region 44 is shared by the mutually adjacent trench gate structures 62. The p-type body region 44 faces the gate electrodes 56 across the gate insulating films 55.

The $n^+$-type source region 45 is formed in a surface layer portion of the p-type body region 44. The $n^+$-type source region 45 is formed in a band shape extending along the first direction A in plan view such as to be oriented along the side walls of the gate trenches 63 in plan view. The $n^+$-type source region 45 faces the gate electrodes 56 across the gate insulating films 55.

The $p^+$-type contact region 46 is formed in the surface layer portion of the p-type body region 44. The $p^+$-type contact region 46 is formed in a central portion of the p-type body region 44 in plan view.

The $p^+$-type contact region 46 is formed in a band shape extending along the first direction A in plan view. The $p^+$-type contact region 46 penetrates through the $n^+$-type source region 45 from the first main surface 33 of the $n^-$-type epitaxial layer 42 and is electrically connected to the p-type body region 44.

Each gate electrode 56 faces partial regions of an $n^+$-type source region 45, a p-type body region 44, and the $n^-$-type epitaxial layer 42 across a gate insulating film 55. In each p-type body region 44, a region between an $n^+$-type source region 45 and the $n^-$-type epitaxial layer 42 is a MISFET channel.

Each carrier trapping region 64 includes crystal defects that are selectively introduced into the $n^-$-type epitaxial layer 42. Besides being formed in regions differing from the carrier trapping regions 47, the carrier trapping regions 64 the carrier trapping regions 64 have the same properties as the carrier trapping regions 47 described above.

In the following description, just aspects by which the carrier trapping regions 64 differ from the carrier trapping regions 47 shall be described and description of other aspects shall be omitted.

Each carrier trapping region 64 is formed in a region of the $n^-$-type epitaxial layer 42 lower than the bottom wall of a gate trench 63. The carrier trapping region 64 overlaps with the gate trench 63 in plan view. In this embodiment, the carrier trapping region 64 extends along the first direction A (see FIG. 14) such as to be oriented along the gate trench 63.

A distance DC between carrier trapping regions 64 is substantially equal to a distance DT between trench gate structures 62. More specifically, the distance DC is a distance along the second direction B between a central portion of one carrier trapping region 64 and a central portion of another carrier trapping region 64. The distance DT is, more specifically, a distance along the second direction B between a central portion of one trench gate structure 62 and a central portion of another trench gate structure 62.

The respective carrier trapping regions 64 are formed in one-to-one correspondence with the respective trench gate structures 62. In this embodiment, each carrier trapping region 64 is formed in a column shape extending along the thickness direction of the $n^-$ type epitaxial layer 42.

Each carrier trapping region 64 includes a first region 65 positioned at an upper side and a second region 66 positioned at a lower side in a region lower than the bottom wall of a gate trench 63. The first region 65 is positioned upper than a lower intermediate region Ct of the $n^-$-type epitaxial layer 42. The second region 66 is positioned lower than the lower intermediate region Ct of the $n^-$-type epitaxial layer 42.

The lower intermediate region Ct of the $n^-$-type epitaxial layer 42 is a region positioned at an intermediate portion of the $n^-$-type epitaxial layer 42 between the bottom walls of the gate trenches 63 and the $n^+$-type semiconductor substrate 41. In FIG. 26, the lower intermediate region Ct is indicated by an alternate long and two short dashed lines.

The first region 65 of each carrier trapping region 64 is formed in a region of the $n^-$-type epitaxial layer 42 along the bottom wall of a gate trench 63. The first region 65 of the carrier trapping region 64 may cover an edge portion connecting the side wall and the bottom wall of the gate trench 63.

In this embodiment, the first region 65 of the carrier trapping region 64 is exposed from the bottom wall of the gate trench 63. The first region 65 of each carrier trapping region 64 faces a gate electrode 56 across a gate insulating film 55. In this embodiment, the second region 66 of each carrier trapping region 64 is connected to the $n^+$-type semiconductor substrate 41.

A distance L, along the second direction B, of a portion of the $n^-$-type epitaxial layer 42 positioned between two mutually adjacent carrier trapping regions 64 may be not more than a sum W1+W2 of a first width W1 of a first depletion layer spreading from one carrier trapping region 64 and a second width W2 of a second depletion layer spreading from the other carrier trapping region 64 ($L \leq W1+W2$).

In this case, the first depletion layer and the second depletion layer overlap mutually in the portion of the $n^-$-type epitaxial layer 42 positioned between the two mutually adjacent carrier trapping regions 64. The portion of the $n^-$-type epitaxial layer 42 positioned between the two mutually adjacent carrier trapping regions 64 is thereby depleted.

As with the carrier trapping regions 47 described above, each carrier trapping region 64 may be formed along an intersecting direction (that is, the second direction B) intersecting the p-type body regions 44, etc.

In this case, each carrier trapping region 64 includes first intersection portions intersecting the trench gate structures 62 and second intersection portions intersecting the p-type body regions 44 in plan view.

The carrier trapping region 64 may have a first region 65 positioned upper than the lower intermediate region Ct and a second region 66 positioned lower than the lower intermediate region Ct at each first intersection portion.

The carrier trapping region 64 may have a first region 65 positioned upper than the lower intermediate region Ct and a second region 66 positioned lower than the lower intermediate region Ct at each second intersection portion.

The carrier trapping region 64 may have the same structure as that of each carrier trapping region 47 described above (see also FIG. 18) at each second intersection portion. More specifically, the carrier trapping region 64 may have a first region 49 positioned upper than the intermediate region C in the thickness direction of the $n^-$-type epitaxial layer 42 and a second region 50 positioned lower than the intermediate region C at each second intersection portion.

In this case, the first region 49 of the carrier trapping region 64 may be connected to a p-type body region 44 or may be formed across an interval to the $n^+$-type semiconductor substrate 41 side from the p-type body region 44.

Also, in this case, the second region 50 of the carrier trapping region 64 may be connected to the $n^+$-type semiconductor substrate 41 or may be formed across an interval to the first main surface 33 side from the $n^+$-type semiconductor substrate 41.

The insulating layer 57 described above is formed on the first main surface 33 of the $n^-$-type epitaxial layer 42. The insulating layer 57 covers the trench gate structures 62. Contact holes 58, exposing the $n^+$-type source regions 45, the $p^+$-type contact regions 46, and the p-type termination regions 48 are selectively formed in the insulating layer 57.

The source pad electrode 39 enters into the contact holes 58 from above the insulating layer 57. Inside the contact holes 58, the source pad electrode 39 is electrically connected to the $n^+$-type source regions 45, the $p^+$-type contact regions 46, and the p-type termination regions 48.

The structure of the carrier trapping regions 64 is not restricted to the configuration described above and may take on any of various configurations. Other configuration examples of the carrier trapping regions 64 shall now be described.

Figure 27:
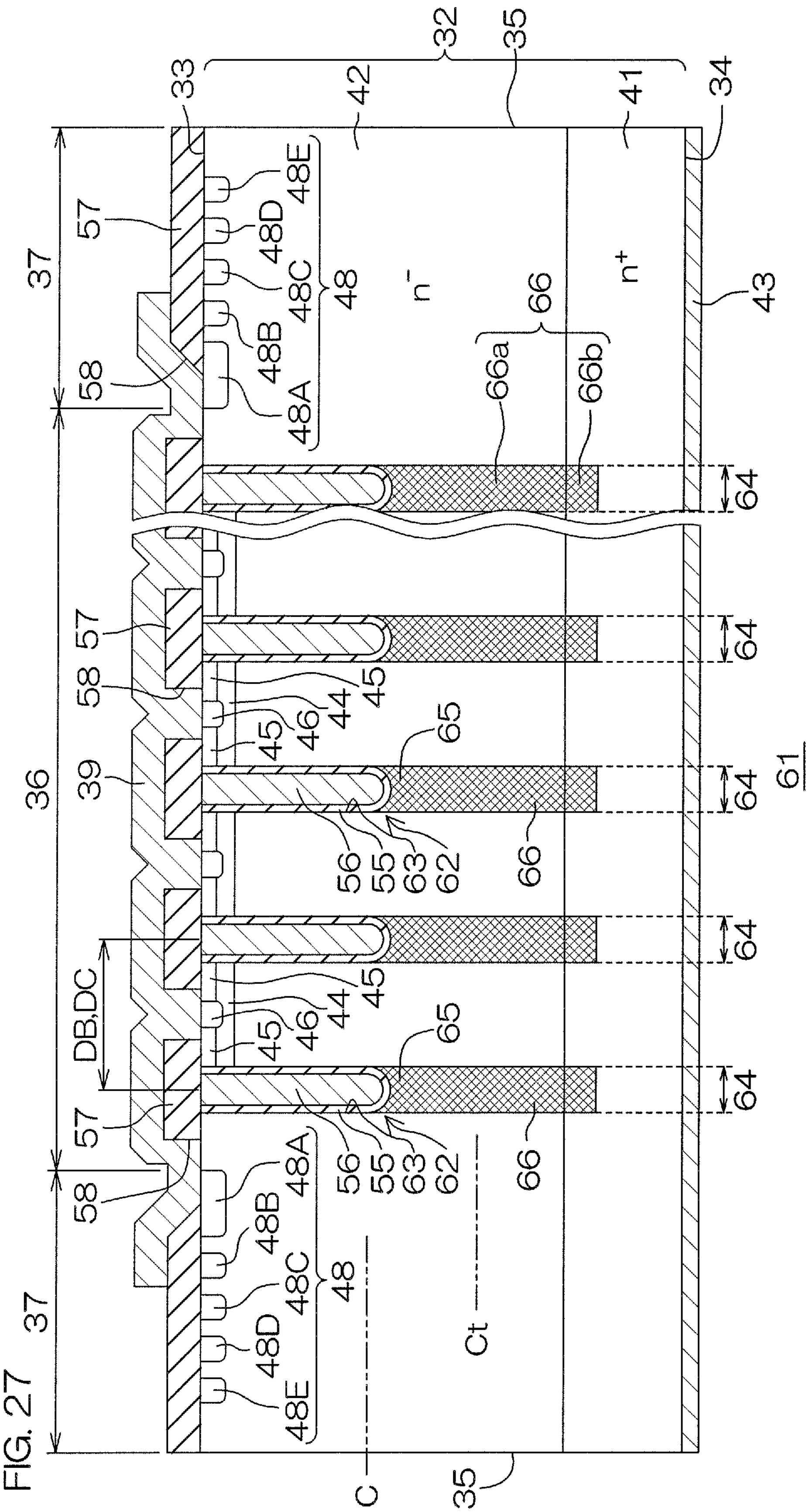
FIG. 27 is a sectional view of a second configuration example of the carrier trapping regions shown in FIG. 26.

FIG. 27 is a sectional view of a second configuration example of the carrier trapping regions 64 shown in FIG. 26. Structures in FIG. 27 corresponding to structures described in FIG. 26, etc., described above are provided with the same reference signs and description thereof shall be omitted.

Referring to FIG. 27, in this configuration example, the second region 66 of each carrier trapping region 64 is connected to the $n^+$-type semiconductor substrate 41. The second region 66 of the carrier trapping region 64 includes a first portion 66*a* formed inside the $n^-$-type epitaxial layer 42 and a second portion 66*b* formed inside the $n^+$-type semiconductor substrate 41.

A crystal defect density N2 of the first portion 66*a* of the second region 66 is higher than the n-type impurity density N1 of the $n^-$-type epitaxial layer 42 (N2>N1). The crystal defect density N2 of the second portion 66*b* of the second region 66 is lower than the n-type impurity density N3 of the $n^+$-type semiconductor substrate 41 (N2<N3). Functioning virtually as an acceptor is suppressed in the second portion 66*b* of the second region 66.

Figure 28:
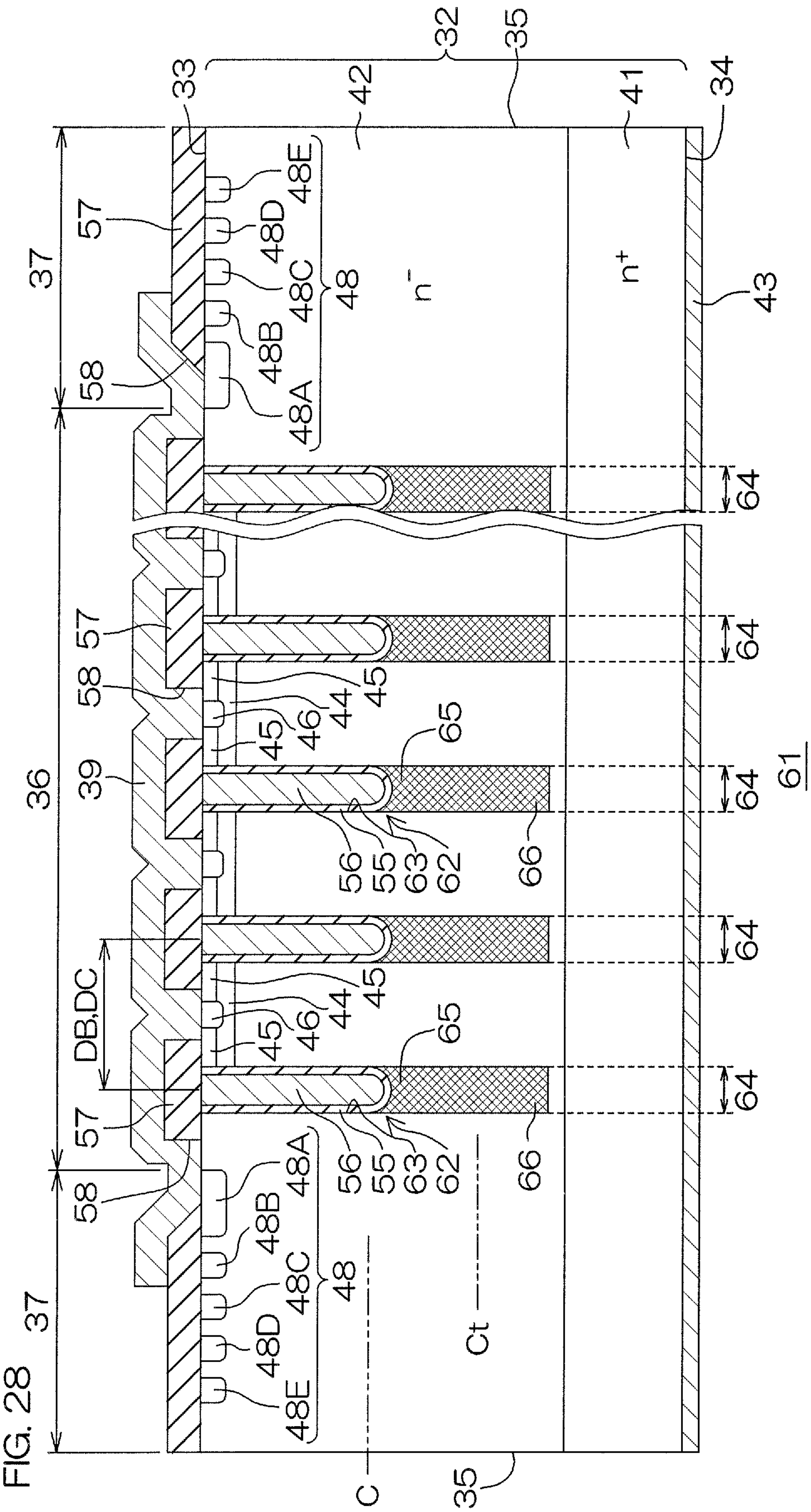
FIG. 28 is a sectional view of a third configuration example of the carrier trapping regions shown in FIG. 26.

FIG. 28 is a sectional view of a third configuration example of the carrier trapping regions 64 shown in FIG. 26. Structures in FIG. 28 corresponding to structures described in FIG. 26, etc., described above are provided with the same reference signs and description thereof shall be omitted.

Referring to FIG. 28, in this configuration example, the second region 66 of each carrier trapping region 64 is formed across an interval to the first main surface 33 side from the $n^+$-type semiconductor substrate 41. A portion of the $n^-$-type epitaxial layer 42 is interposed in a region between the second region 66 and the $n^+$-type semiconductor substrate 41.

Figure 29:
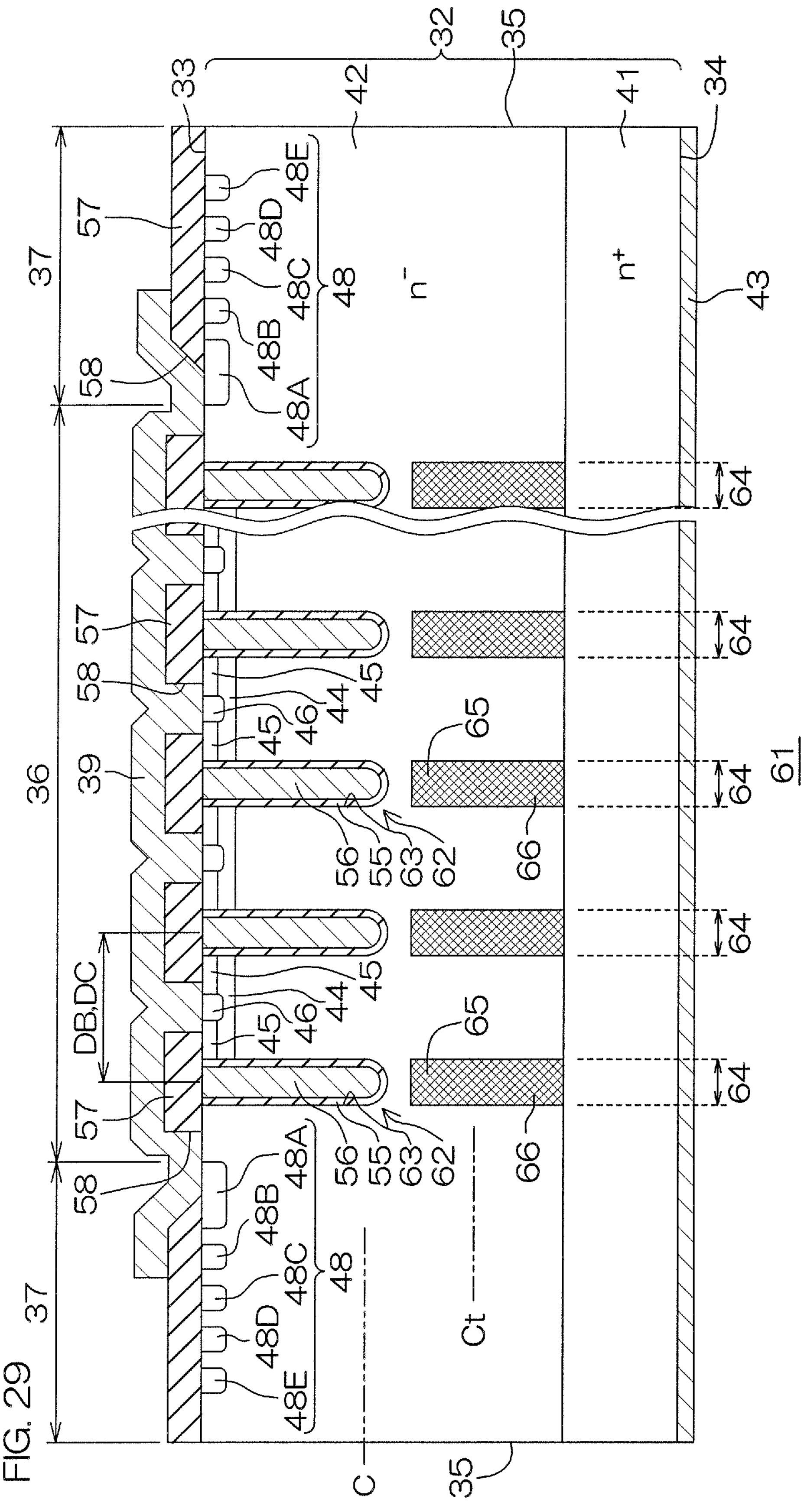
FIG. 29 is a sectional view of a fourth configuration example of the carrier trapping regions shown in FIG. 26.

FIG. 29 is a sectional view of a fourth configuration example of the carrier trapping regions 64 shown in FIG. 26. Structures in FIG. 29 corresponding to structures described in FIG. 26, etc., described above are provided with the same reference signs and description thereof shall be omitted.

Referring to FIG. 29, in this configuration example, the first region 65 of each carrier trapping region 64 is formed across an interval to the second main surface 34 side from the bottom wall of a gate trench 63. A portion of the $n^-$-type epitaxial layer 42 is interposed in a region between the first region 49 and the bottom wall of the gate trench 63.

Figure 30:
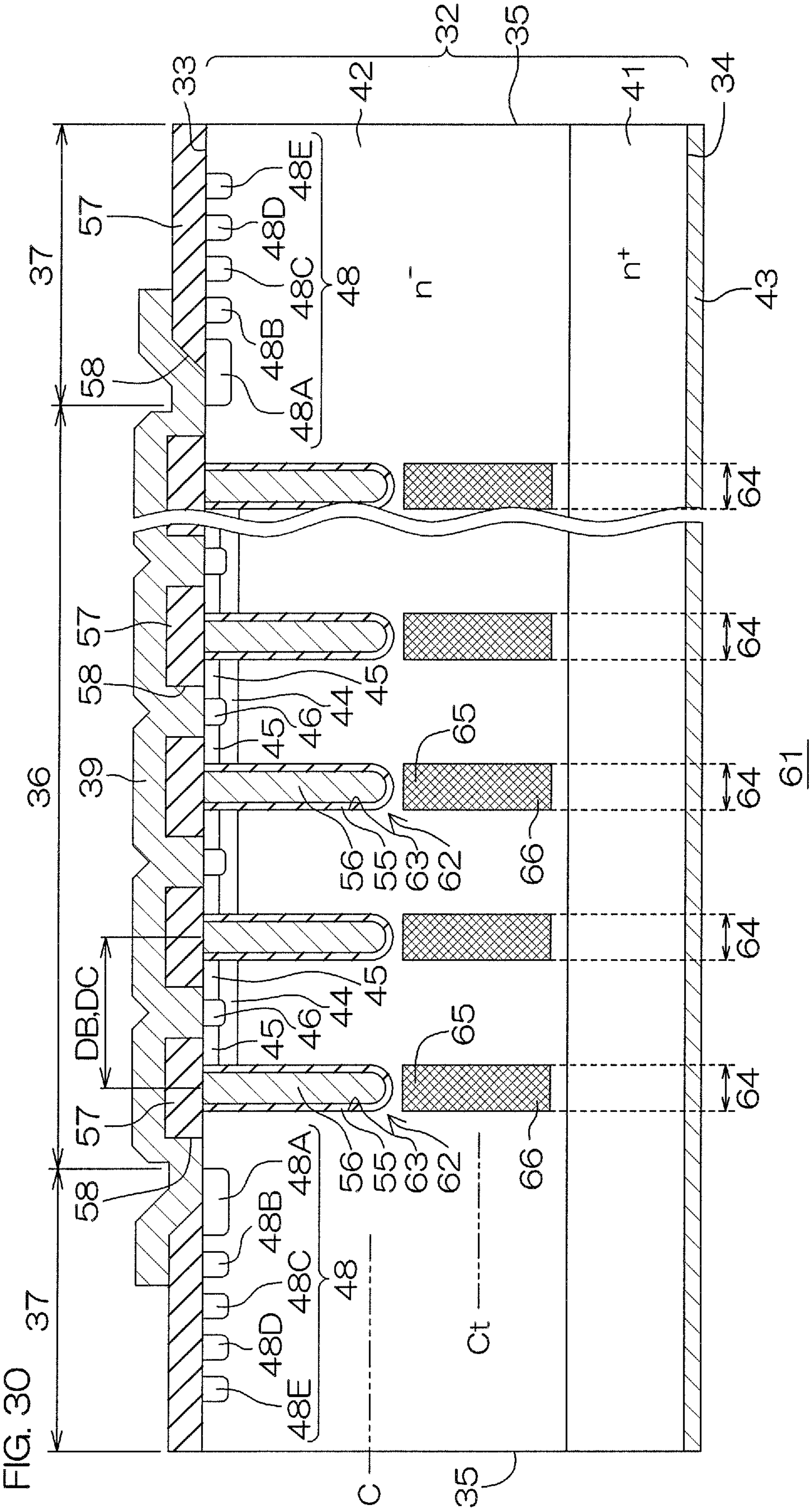
FIG. 30 is a sectional view of a fifth configuration example of the carrier trapping regions shown in FIG. 26.

FIG. 30 is a sectional view of a fifth configuration example of the carrier trapping regions 64 shown in FIG. 26. Structures in FIG. 30 corresponding to structures described in FIG. 26, etc., described above are provided with the same reference signs and description thereof shall be omitted.

Referring to FIG. 30, in this configuration example, the first regions 65 of the carrier trapping regions 64 are floated in the interior of the $n^-$-type epitaxial layer 42.

That is, the first region 65 of each carrier trapping region 64 is formed across an interval to the second main surface 34 side from the first main surface 33 of the $n^-$-type epitaxial layer 42. A portion of the $n^-$-type epitaxial layer 42 is interposed in a region between the first region 65 and the first main surface 33 of the $n^-$-type epitaxial layer 42.

Also, the second region 66 of each carrier trapping region 64 is formed across an interval to the first main surface 33 side from the $n^+$-type semiconductor substrate 41. A portion of the $n^-$-type epitaxial layer 42 is interposed in a region between the second region 66 and the $n^+$-type semiconductor substrate 41.

Figure 31:
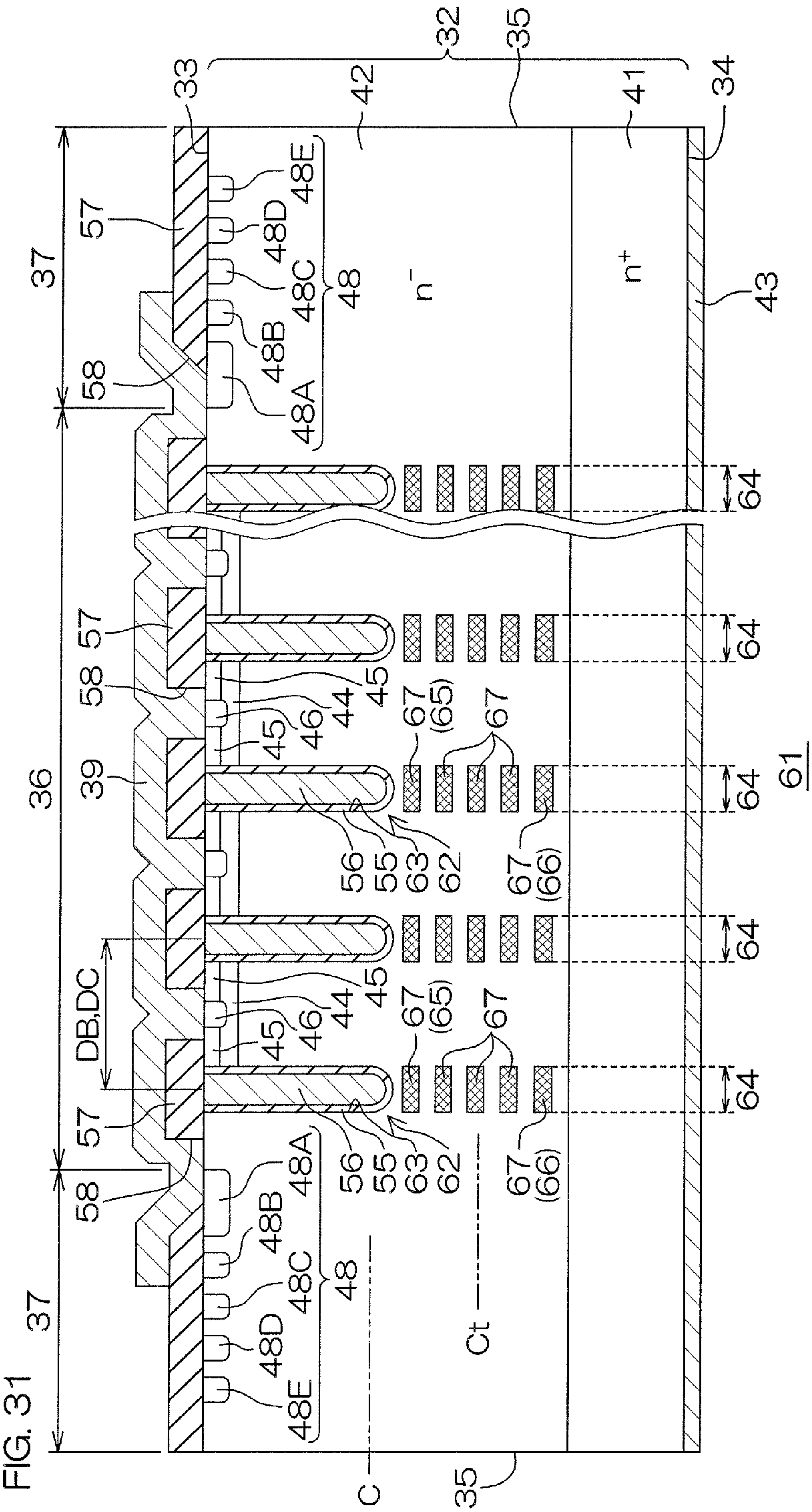
FIG. 31 is a sectional view of a sixth configuration example of the carrier trapping regions shown in FIG. 26.

FIG. 31 is a sectional view of a sixth configuration example of the carrier trapping regions 64 shown in FIG. 26. Structures in FIG. 31 corresponding to structures described in FIG. 26, etc., described above are provided with the same reference signs and description thereof shall be omitted.

Referring to FIG. 31, in this configuration example, each carrier trapping region 64 includes a plurality of divided portions 67. The plurality of divided portions 67 are formed at intervals along the thickness direction of the $n^-$-type epitaxial layer 42 in a region between the bottom wall of a gate trench 63 and the $n^+$-type semiconductor substrate 41.

An uppermost divided portion 67 positioned upper than the lower intermediate region Ct in the plurality of divided portions 67 forms the first region 65. A lowermost divided portion 67 positioned lower than the lower intermediate region Ct in the plurality of divided portions 67 forms the second region 66.

The plurality of divided portions 67 may respectively have different thicknesses. Also, the plurality of divided portions 67 may respectively have different crystal defect densities N2. Also, the plurality of divided portions 67 may be formed at equal intervals along the thickness direction of the $n^-$-type epitaxial layer 42. Also, the plurality of divided portions 67 may be formed at unequal intervals along the thickness direction of the $n^-$-type epitaxial layer 42.

Figure 32:
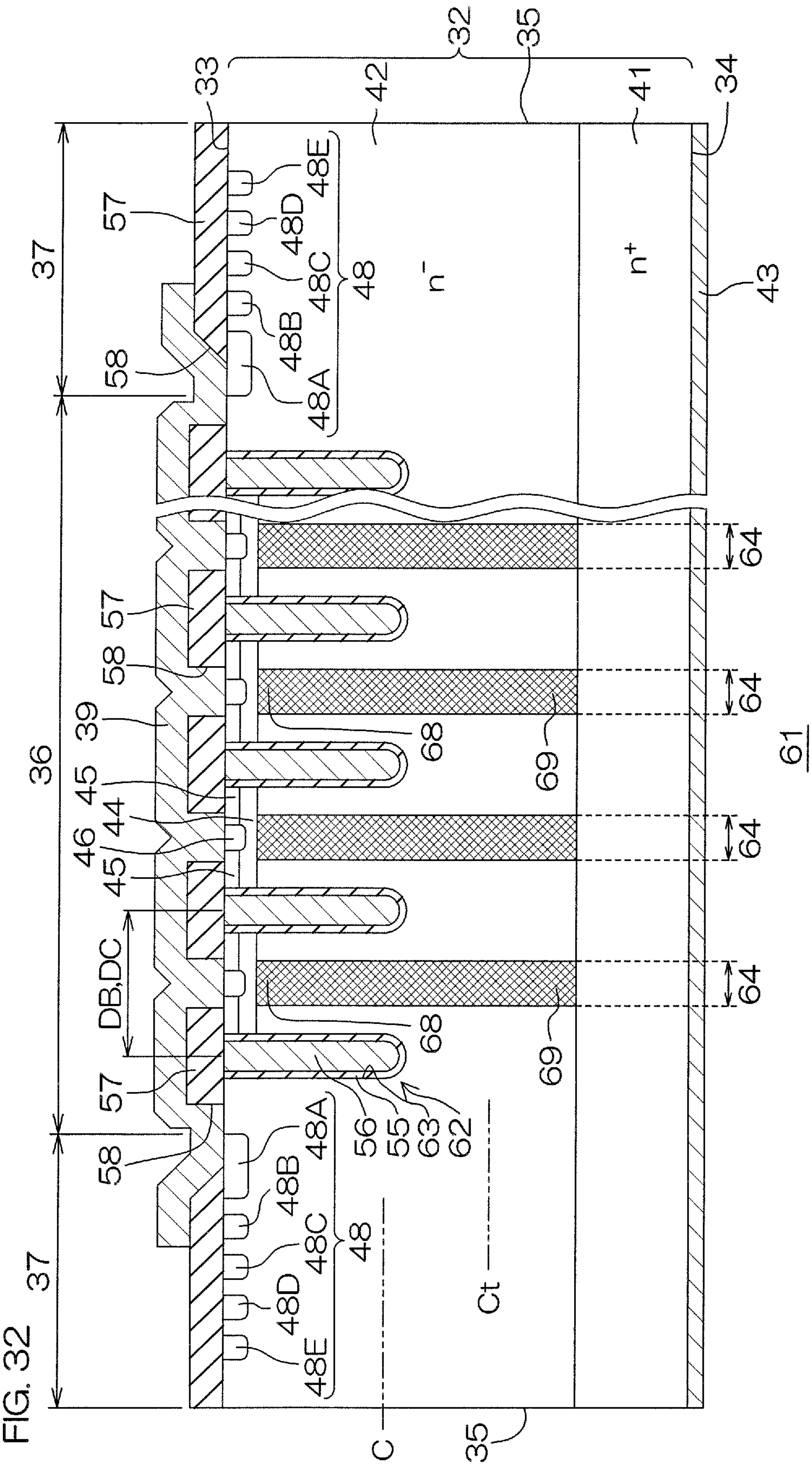
FIG. 32 is a sectional view of a seventh configuration example of the carrier trapping regions shown in FIG. 26.

FIG. 32 is a sectional view of a seventh configuration example of the carrier trapping regions 64 shown in FIG. 26. Structures in FIG. 32 corresponding to structures described in FIG. 26, etc., described above are provided with the same reference signs and description thereof shall be omitted.

In this configuration example, the carrier trapping regions 64 extend along the first direction A. The carrier trapping regions 64 extend along the p-type body regions 44 and overlap with the p-type body regions 44 in plan view.

The distance DC between carrier trapping regions 64 is substantially equal to the distance DB between p-type body regions 44. The respective carrier trapping regions 64 are formed in regions of the $n^-$-type epitaxial layer 42 lower than the p-type body regions 44 in one-to-one correspondence with the respective p-type body regions 44.

Each carrier trapping region 64 has, in place of the first region 65 and the second region 66, a first region 68 and a second region 69. The first region 68 is positioned upper than the intermediate region C of the $n^-$-type epitaxial layer 42.

The second region 69 is positioned lower than the intermediate region C of the $n^-$-type epitaxial layer 42. The first region 68 may be in contact with a p-type body region 44. The second region 69 may be connected to the $n^+$-type semiconductor substrate 41.

Figure 33:
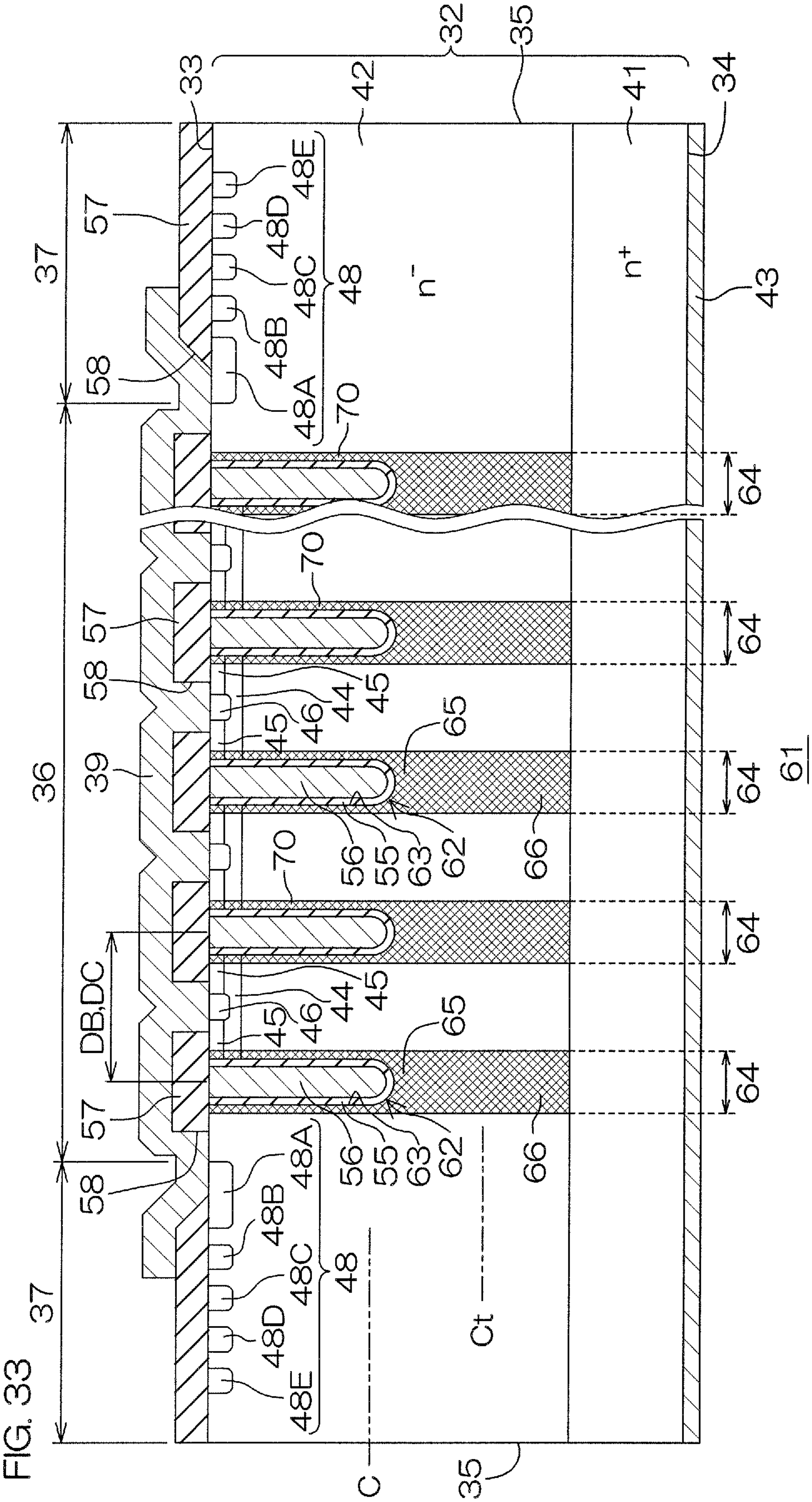
FIG. 33 is a sectional view of an eighth configuration example of the carrier trapping regions shown in FIG. 26.

FIG. 33 is a sectional view of an eighth configuration example of the carrier trapping regions 64 shown in FIG. 26. Structures in FIG. 33 corresponding to structures described in FIG. 26, etc., described above are provided with the same reference signs and description thereof shall be omitted.

Referring to FIG. 33, in this configuration example, each carrier trapping region 64 is formed in a region of the $n^-$-type epitaxial layer 42 along the side wall and the bottom wall of a gate trench 63.

In this configuration example, the carrier trapping region 64 includes a third region 70 covering the side wall of the gate trench 63 in addition to the first region 65 and the second region 69.

The third region 70 extends along the side wall of the gate trench 63 and is connected to the first region 65 in a region of the $n^-$-type epitaxial layer 42 at the bottom wall side of the gate trench 63.

The third region 70 crosses the intermediate region C of the $n^-$-type epitaxial layer 42. In this embodiment, the third region 70 is exposed from the first main surface 33 of the $n^-$-type epitaxial layer 42. The third region 70 may instead be formed across an interval to the second main surface 34 side from the first main surface 33 of the $n^-$-type epitaxial layer 42.

A crystal defect density N2 of the third region 70 is higher than an n-type impurity density N4 of the $n^+$-type source region 45 ($N2<N4$). Functioning virtually as an acceptor is thus suppressed in a portion of the third region 70 that is present inside the $n^+$-type source region 45.

A configuration example in which two or more configuration examples of the carrier trapping regions 64 according to the first configuration example to the eighth configuration example are combined in any way thereamong may be applied.

For example, a configuration example having the carrier trapping regions 64 according to the first configuration example while also having any one or plurality of the carrier trapping regions 64 according to the second configuration example to the eighth configuration example may be applied.

For example, the structure with which the first regions 65 of the carrier trapping regions 64 are exposed from the bottom walls of the gate trenches 63 and the second regions 66 are connected to the $n^+$-type semiconductor substrate 41 (see FIG. 26) may be applied to the structure of the carrier trapping regions 64 according to the sixth configuration example (see FIG. 31). In this case, the uppermost divided portions 67 are exposed from the bottom walls of the gate trenches 63. Also, the lowermost divided portions 67 are connected to the $n^+$-type semiconductor substrate 41.

For example, the structure of the carrier trapping regions 64 according to the third configuration example (see FIG. 28) may be applied to the structure of the carrier trapping regions 64 according to the seventh configuration example (see FIG. 32).

In this case, the second regions 69 of the carrier trapping regions 64 according to the seventh configuration example may have a structure of being arranged across intervals to the first main surface 33 side from the $n^+$-type semiconductor substrate 41.

For example, the structure of the carrier trapping regions 64 according to the fifth configuration example (see FIG. 30) may be applied to the structure of the carrier trapping regions 64 according to the seventh configuration example (see FIG. 32).

In this case, the carrier trapping regions 64 according to the seventh configuration example are formed such as to float in the interior of the $n^-$-type epitaxial layer 42. That is, the first regions 68 of the carrier trapping regions 64 according to the seventh configuration example are formed across intervals to the second main surface 34 side from the p-type body regions 44. Also, the second regions 69 are formed across intervals to the first main surface 33 side from the $n^+$-type semiconductor substrate 41.

Figure 34:
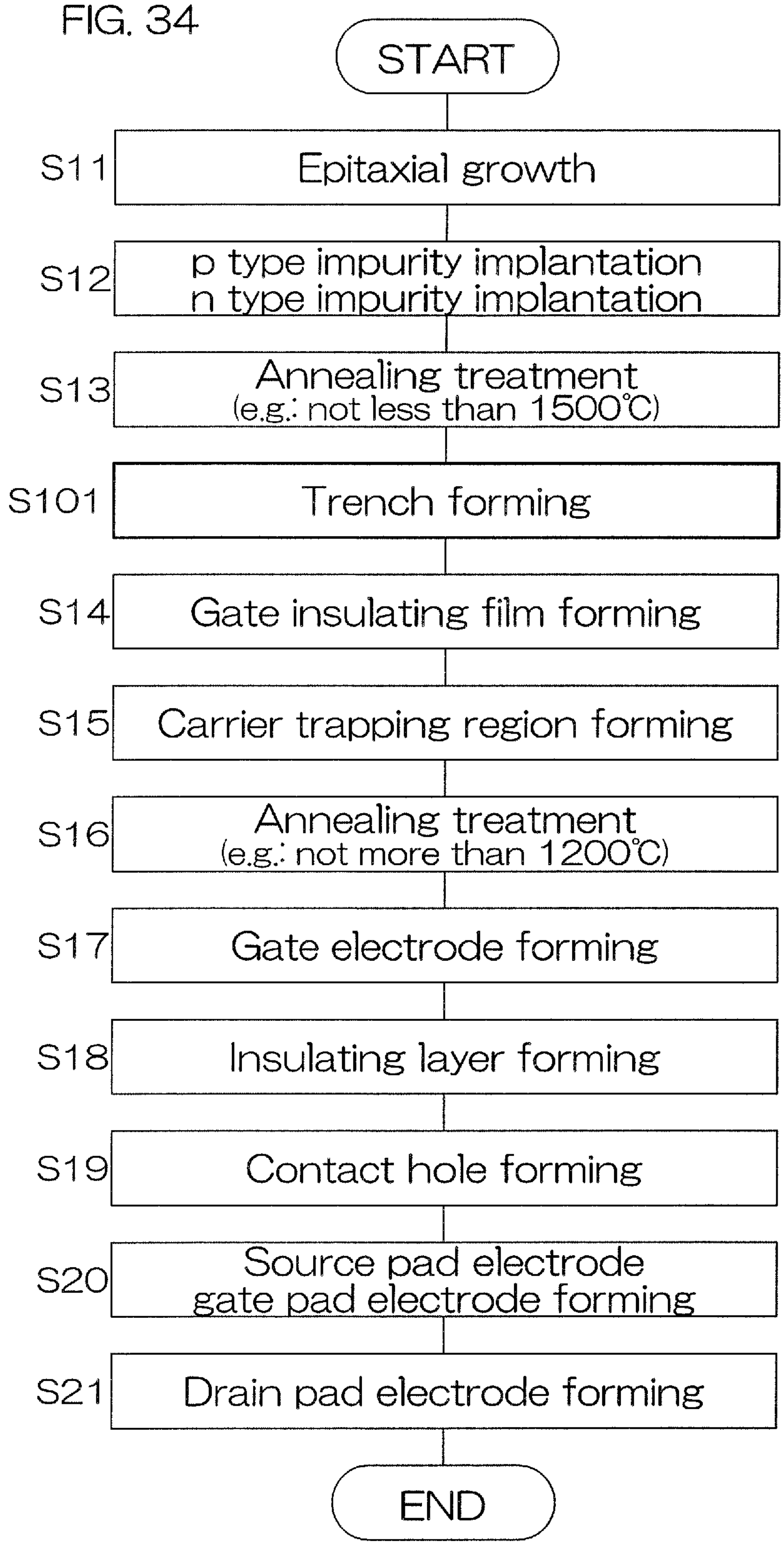
FIG. 34 is a flowchart of an example of a method for manufacturing the semiconductor device shown in FIG. 26.

For example, the structure of the carrier trapping regions 64 according to the sixth configuration example (see FIG. 31) may be applied to the structure of the carrier trapping regions 64 according to the seventh configuration example (see FIG. 34).

In this case, each carrier trapping region 64 according to the seventh configuration example includes a plurality of divided portions 67 that are formed at intervals along the thickness direction of the $n^-$-type epitaxial layer 42 in a region between a p-type body region 44 and the $n^+$-type semiconductor substrate 41.

FIG. 34 is a flowchart of an example of a method for manufacturing the semiconductor device 61 shown in FIG. 26.

The method for manufacturing the semiconductor device 61 differs from the method for manufacturing the semiconductor device 31 in including a step of forming the gate trenches 63 (step S101). The step of forming the gate trenches 63 (step S101) is executed after the step of forming the $n^-$-type epitaxial layer 42 (step S11) and before the steps of introducing the impurities (step S12 and step S13).

In the following, just differences with respect to the method for manufacturing the semiconductor device 31 shall be described and description of other aspects shall be omitted.

In the step of forming the gate trenches 63 (step S101), first, a mask having a predetermined pattern is formed on the first main surface 33 of the $n^-$-type epitaxial layer 42. The mask has openings exposing regions at which the gate trenches 63 are to be formed.

Next, unnecessary portions of the $n^-$-type epitaxial layer 42 are selectively removed by an etching method via the mask. The gate trenches 63 are thereby formed in the first main surface 33 of the $n^-$-type epitaxial layer 42.

The steps of introducing the impurities (step S12 and step S13) include a step of selectively introducing the p-type impurity and the n-type impurity into regions of the surface layer portion of the first main surface 33 of the $n^-$-type epitaxial layer 42 between mutually adjacent gate trenches 63. The p-type body regions 44, the $n^+$-type source regions 45, and the $p^+$-type contact regions 46 are thereby formed respectively.

In this embodiment, the step of forming the gate insulating films 55 (step S14) includes a step of forming the gate insulating films 55 along the side walls and the bottom walls of the gate trenches 63. The gate insulating films 55 may be formed by a thermal oxidation treatment or a CVD method.

The step of forming the gate trenches 63 (step S101) may be executed after the steps of introducing the impurities (step S12 and step S13) and before the step of forming the gate insulating films 55 (step S14).

In this embodiment, the steps of forming the carrier trapping regions 64 (step S15 and step S16) include a step of selectively irradiating the light ions, electrons, or neutrons, etc., into the $n^-$-type epitaxial layer 42 from inner wall surfaces of the gate trenches 63 or more specifically from the bottom walls of the gate trenches 63. The carrier trapping regions 64 are thereby formed in regions of the $n^-$-type epitaxial layer 42 lower than the bottom walls of the gate trenches 63.

The light ions, electrons, or neutrons, etc., may be irradiated into the $n^-$-type epitaxial layer 42 from the side walls and the bottom walls of the gate trenches 63. In this case, the carrier trapping regions 64 that are oriented along the side walls and the bottom walls of the gate trenches 63 are formed.

The steps of forming the carrier trapping regions 64 (step S15 and step S16) may be executed after the steps of introducing the impurities (step S12 and step S13) and before the step of forming the gate insulating films 55 (step S14).

In this case, the step of forming the gate trenches 63 (step S101) and the step of forming the gate insulating films 55 (step S14) may be executed in that order after the steps of forming the carrier trapping regions 64 (step S15 and step S16) and before the step of forming the gate electrodes 56 (step S17).

The step of forming the gate electrodes 56 (step S17) includes a step of forming a conductor layer that fills the gate trenches 63 and covers the first main surface 33 of the $n^-$-type epitaxial layer 42. The conductor layer may be formed by a CVD method.

Also, the step of forming the gate electrodes 56 (step S17) includes a step of selectively removing portions of the conductor layer covering the first main surface 33 of the $n^-$ type epitaxial layer 42. Unnecessary portions of the conductor layer may be removed by an etching method. The gate electrodes 56 are thereby formed inside the gate trenches 63.

Thereafter, the semiconductor device 61 is manufactured through step S18 to step S21.

As described above, the semiconductor device 61 includes the carrier trapping regions 64 formed in regions of the $n^-$-type epitaxial layer 42 lower than the trench gate structures 62. Decrease in electric field strength along the thickness direction of the $n^-$-type epitaxial layer 42 when a voltage is applied to the $n^-$-type epitaxial layer 42 can thereby be suppressed.

In particular, with the semiconductor device 61, the carrier trapping regions 64 include the first regions 65 positioned upper than the lower intermediate region Ct and the second regions 66 positioned lower than the lower intermediate region Ct.

Therefore, the decrease in electric field strength can be suppressed in a region higher than the lower intermediate region Ct and a region lower than the lower intermediate region Ct by the carrier trapping regions 64.

The same actions and effects as the actions and effects described for the second preferred embodiment can thus be exhibited by the semiconductor device 61 as well.

Figure 35:
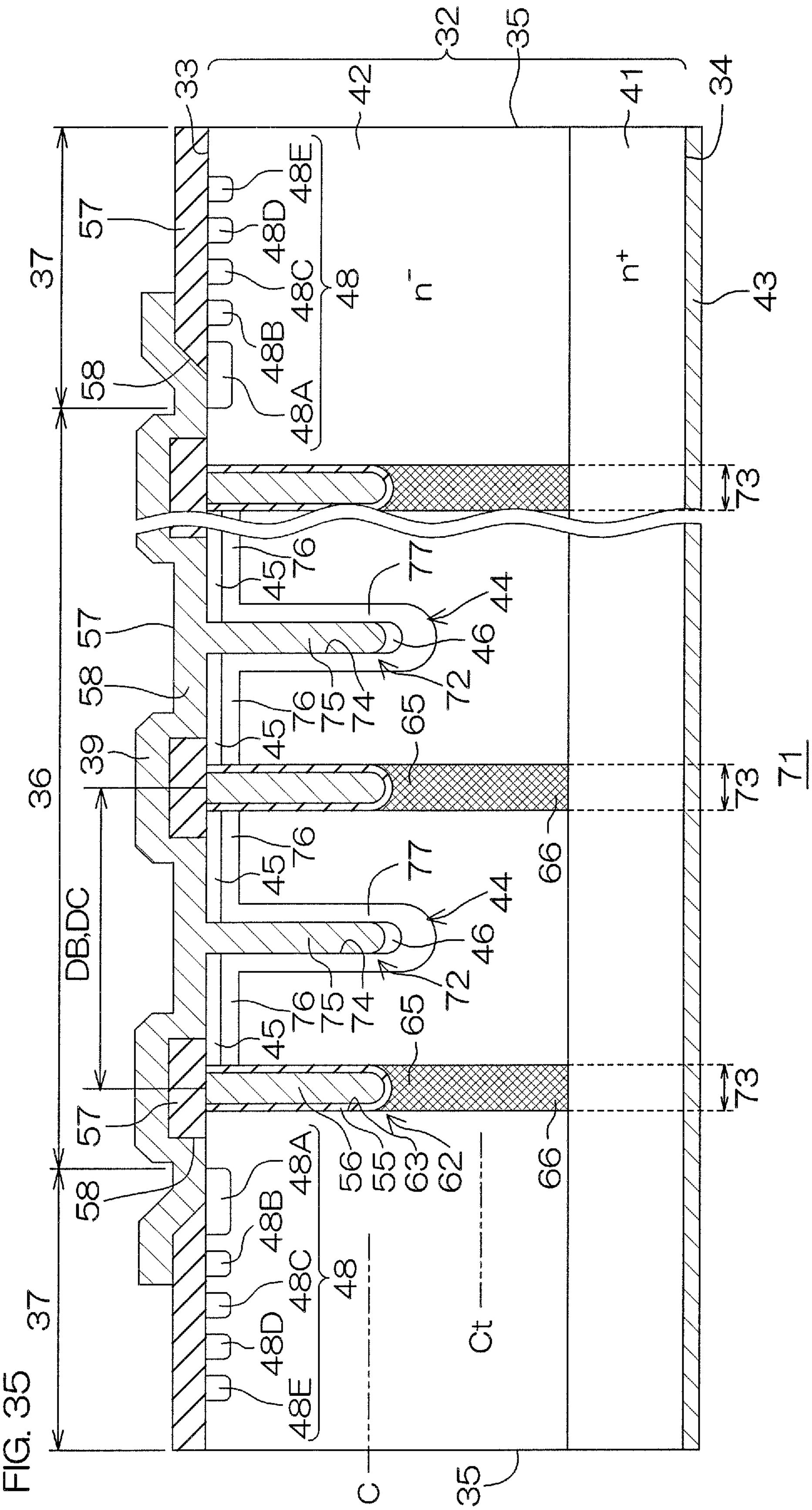
FIG. 35 is a sectional view of a semiconductor device according to a fourth preferred embodiment of the present invention and is a diagram showing a first configuration example of carrier trapping regions.

FIG. 35 is a sectional view of a semiconductor device 71 according to a fourth preferred embodiment of the present invention. FIG. 35 is also a sectional view of a portion corresponding to FIG. 26. Structures in FIG. 35 corresponding to structures described in FIG. 26, etc., are provided with the same reference signs and description thereof shall be omitted.

The semiconductor device 71 differs from the semiconductor device 61 in that trench source structures 72 are formed and in that carrier trapping regions 73 are formed in place of the carrier trapping regions 64. In FIG. 35, the carrier trapping regions 73 are indicated by cross hatching.

Each trench source structure 72 is formed in a region between mutually adjacent trench gate structures 62. In this embodiment, each trench source structure 72 is formed in a band shape extending along the first direction A in a region between mutually adjacent trench gate structures 62 in plan view.

Each trench source structure 72 may include a plurality of divided portions formed at intervals along the first direction A in plan view in a region between mutually adjacent trench gate structures 62.

Each trench source structure 72 includes an embedded source electrode 75 embedded in a source trench 74 (second trench) formed in the first main surface 33 of the $n^-$-type epitaxial layer 42.

The source trench 74 includes a side wall and a bottom wall. In this embodiment, the side wall of the source trench 74 is formed perpendicular to the first main surface 33 of the $n^-$ -type epitaxial layer 42. The source trench 74 may be formed to a tapered shape with an opening area being greater than a bottom surface area.

In this embodiment, the source trenches 74 are formed using the step of forming the gate trenches 63 (step S101 of FIG. 34). That is, the step of forming the gate trenches 63 (step S101 of FIG. 34) is formed by an etching method via the same mask.

In the present step, the gate trenches 63 and the source trenches 74 are formed in the first main surface 33 of the $n^-$-type epitaxial layer 42 at the same time. The source trenches 74 thus have a shape and a depth substantially equal to a shape and a depth of the gate trenches 63.

The source trenches 74 may be formed through a step differing from the step of forming the gate trenches 63 (step S101 of FIG. 34). The source trenches 74 may thus have a shape and a depth different from the shape and the depth of the gate trenches 63.

The p-type body regions 44 are formed by introducing the p-type impurity into the side walls and the bottom walls of the source trenches 74 in addition to the surface layer portion of the first main surface 33 of the $n^-$-type epitaxial layer 42 in the steps of introducing the impurities (step S12 and step S13 of FIG. 34).

Each p-type body region 44 includes a first portion 76 and a second portion 77. The first portion 76 of the p-type body region 44 is formed in the surface layer portion of the first main surface 33 of the $n^-$-type epitaxial layer 42. The second portion 77 of the p-type body region 44 is formed in a region of the $n^-$-type epitaxial layer 42 along the side wall and the bottom wall of a source trench 74.

The $n^+$-type source regions 45 are formed in surface layer portions of the first portions 76 of the p-type body regions 44. Each $n^+$-type source region 45 is formed between a gate trench 63 and a source trench 74.

Each $n^+$-type source region 45 is formed such as to be oriented along the side wall of a gate trench 63 and the side wall of a source trench 74 in plan view. Each $n^+$-type source region 45 is formed in a band shape extending along the first direction A.

Each $n^+$-type source region 45 is exposed from the side wall of a source trench 74. The $n^+$-type source regions 45 are electrically connected to the source pad electrode 39 on the first main surface 33 of the $n^-$-type epitaxial layer 42. Also, each $n^+$-type source region 45 is electrically connected to an embedded source electrode 75.

The $p^+$-type contact regions 46 are formed by introducing the p-type impurity into the bottom walls of the source trenches 74 in the steps of introducing the impurities (step S12 and step S13 of FIG. 34).

The $p^+$-type contact regions 46 are formed in regions of the second portions 77 of the p-type body regions 44 along the bottom walls of the source trenches 74. The $p^+$-type contact regions 46 are electrically connected to the embedded source electrodes 75.

The carrier trapping regions 73 have the same structure as the carrier trapping regions 64. As the carrier trapping regions 73, the carrier trapping regions 64 according to the first configuration example to the eighth configuration example and configuration examples arbitrarily combining these may be applied. Portions of the carrier trapping regions 73 corresponding to those of the carrier trapping regions 64 shall be provided with the same reference signs and description thereof shall be omitted.

The source pad electrode 39 enters into the source trenches 74 from above the first main surface 33 of the $n^-$-type epitaxial layer 42. The embedded source electrodes 75 are formed of portions of the source pad electrode 39 that are formed inside the source trenches 74.

The embedded source electrodes 75 may be formed of a conductive material differing from the source trenches 74. The embedded source electrodes 75 may be formed at the same time as the gate electrodes 56 in the step of forming the gate electrodes 56 (step S17 of FIG. 34). The embedded source electrodes 75 may be formed of the same conductive material as the gate electrodes 56.

Even with a structure which includes the trench source structures 72 in addition to the trench gate structures 62 as in the semiconductor device 71 described above, the same actions and effects as the actions and effects described for the third preferred embodiment can be exhibited.

Figure 36:
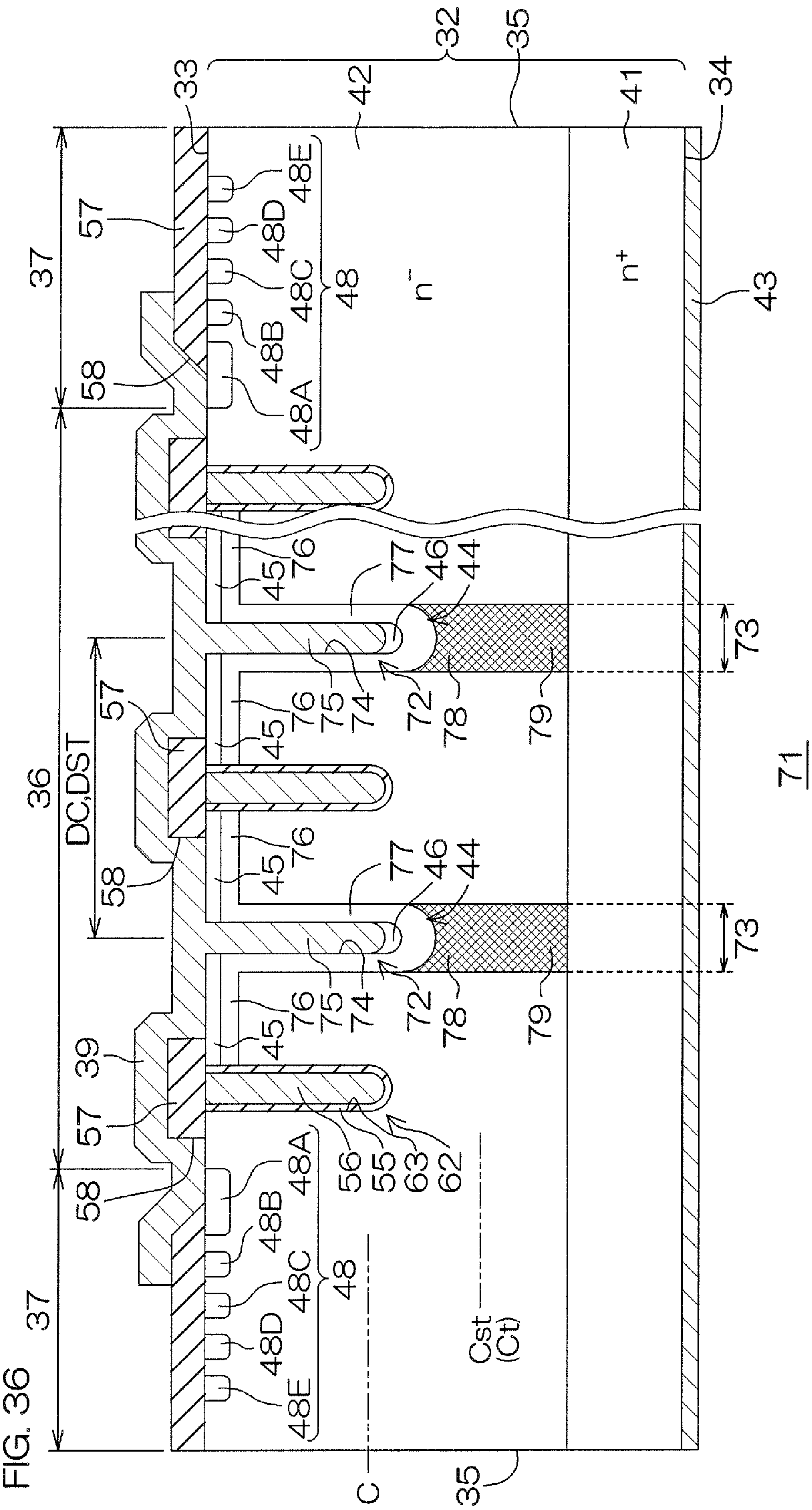
FIG. 36 is a sectional view of a second configuration example of the carrier trapping regions shown in FIG. 35.

FIG. 36 is a sectional view of a second configuration example of the carrier trapping regions 73 shown in FIG. 35. Structures in FIG. 36 corresponding to structures described in FIG. 35, etc., are provided with the same reference signs and description thereof shall be omitted.

In this configuration example, the carrier trapping regions 73 are formed in regions of the $n^-$-type epitaxial layer 42 between the bottom walls of the source trenches 74 and the $n^+$-type semiconductor substrate 41.

A distance DC between carrier trapping regions 73 is substantially equal to a distance DST between source trenches 74. More specifically, the distance DST is a distance along the second direction B between a central portion of one source trench 74 and a central portion of another source trench 74.

The respective carrier trapping regions 73 are formed in one-to-one correspondence with the respective trench source structures 72. Each carrier trapping region 73 includes a first region 78 positioned at an upper side and a second region 79 positioned at a lower side in a region lower than the bottom wall of a source trench 74.

The first region 78 is positioned upper than a lower intermediate region Cst of the $n^-$-type epitaxial layer 42. The second region 79 is positioned lower than the lower intermediate region Cst of the $n^-$-type epitaxial layer 42.

The lower intermediate region Cst of the $n^-$-type epitaxial layer 42 is a region positioned at an intermediate portion of the $n^-$-type epitaxial layer 42 between the bottom walls of the source trenches 74 and the $n^+$-type semiconductor substrate 41. In FIG. 26, the lower intermediate region Cst is indicated by an alternate long and two short dashed lines.

In this configuration example, the source trenches 74 are formed to be substantially equal in depth to the gate trenches 63. The lower intermediate region Cst of the $n^-$ type epitaxial layer 42 substantially matches the lower intermediate region Ct of the $n^-$-type epitaxial layer 42.

The first regions 78 may be connected to the second portions 77 of the p-type body regions 44. The first regions 78 may be connected to the bottom walls of the source trenches 74. In this case, the p-type body regions 44 and the $p^+$-type contact regions 46 may be formed in regions of the $n^-$-type epitaxial layer 42 outside the bottom walls of the source trenches 74. The second regions 79 may be connected to the $n^+$-type semiconductor substrate 41.

Each first region 78 may be formed across an interval to the second main surface 34 side from the second portion 77 of a p-type body region 44. Also, each second region 79 may be formed across an interval to the first main surface 33 side from the $n^+$-type semiconductor substrate 41.

The second region 79 may include a first portion formed inside the $n^-$-type epitaxial layer 42 and a second portion formed inside the $n^+$-type semiconductor substrate 41. In this case, a crystal defect density N2 of the first portion of the second region 66 is higher than the n-type impurity density N1 of the $n^-$-type epitaxial layer 42 (N2>N1).

Also, a crystal defect density N2 of the second portion of the second region 66 is lower than the n-type impurity density N3 of the $n^+$-type semiconductor substrate 41 (N2<N3). Functioning virtually as an acceptor is suppressed in the second portion of the second region 66.

The carrier trapping regions 73 may be formed such as to be floated in the regions between the bottom walls of the source trenches 74 and the $n^+$-type semiconductor substrate 41.

That is, each first region 78 may be formed across an interval to the second main surface 34 side from the second portion 77 of a p-type body region 44. Also, each second region 79 may be formed across an interval to the first main surface 33 side from the $n^+$-type semiconductor substrate 41.

Each carrier trapping region 73 may include a plurality of divided portions, formed at intervals along the thickness direction of the $n^-$-type epitaxial layer 42 in a region between the bottom wall of a source trench 74 and the $n^+$-type semiconductor substrate 41.

In this case, an uppermost divided portion of the plurality of divided portions may be exposed from the bottom wall of the source trench 74 or may be formed in a region lower than the bottom wall of the source trench 74. Also, a lowermost divided portion of the plurality of divided portions may be connected to the $n^+$-type semiconductor substrate 41 or may be formed across an interval from the $n^+$-type semiconductor substrate 41.

Figure 37:
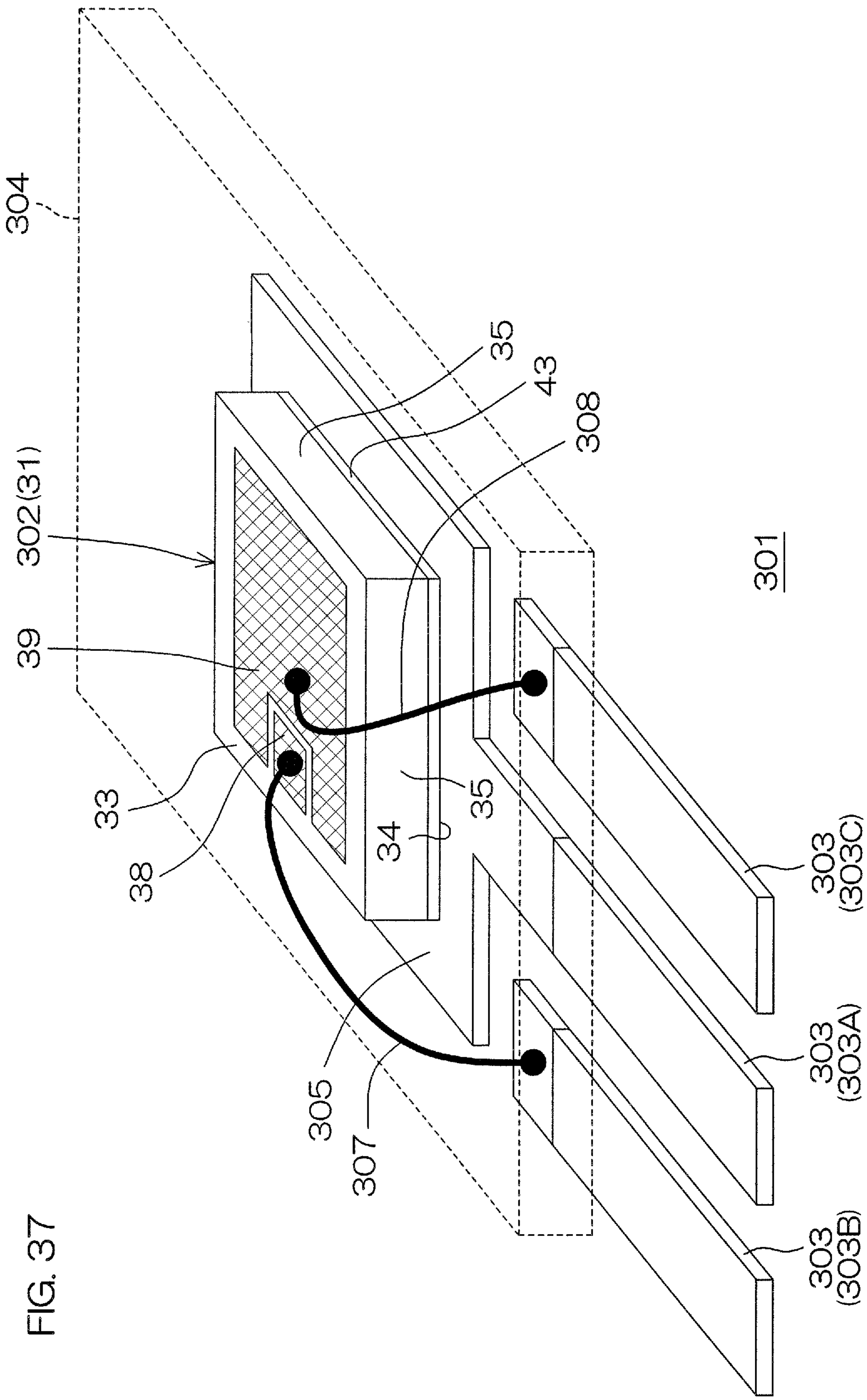
FIG. 37 is a perspective view of a semiconductor package in which any of the semiconductor devices according to the first to fourth preferred embodiments can be incorporated.

FIG. 37 is a perspective view of a semiconductor package 301 in which any of the semiconductor devices 1, 31, 61, and 71 according to the first to fourth preferred embodiments can be incorporated.

The semiconductor package 301 includes an island portion 305, a semiconductor chip 302, a plurality (three, in this embodiment) of terminals 303, and a sealing resin 304. For clarity, an interior of the sealing resin 304 is shown perspectively in FIG. 37. Also, an example where the semiconductor device 31 is incorporated as the semiconductor chip 302 is shown in FIG. 37.

The island portion 305 includes a metal plate. The island portion 305 may include Cu or other metal material. The island portion 305 is formed to a quadrilateral shape in plan view.

The island portion 305 has an area larger than the semiconductor chip 302. The drain pad electrode 43 of the semiconductor chip 302 is electrically connected by die bonding to the island portion 305.

The plurality of terminals 303 include metal plates. The terminals 303 may include Cu or other metal material. The plurality of terminals 303 include a first terminal 303A, a second terminal 303B, and a third terminal 303C.

The first terminal 303A, the second terminal 303B, and the third terminal 303C are aligned at intervals along one side of the island portion 305. The first terminal 303A is led out as a band from one side of the island portion 305.

The second terminal 303B and the third terminal 303C are formed across intervals from the island portion 305. The second terminal 303B and the third terminal 303C sandwich the first terminal 303A from both sides. The second terminal 303B and the third terminal 303C are formed in bands parallel to the first terminal 303A.

The gate pad electrode 38 of the semiconductor chip 302 is electrically connected via a lead wire 307 to the second terminal 303B. The lead wire 307 may be a bonding wire, etc.

The source pad electrode 39 of the semiconductor chip 302 is electrically connected via a lead wire 308 to the third terminal 303C. The lead wire 308 may be a bonding wire, etc.

The semiconductor device 1 may be adopted as the semiconductor chip 302 in place of the semiconductor device 31. In this case, the cathode pad electrode 13 of the semiconductor device 1 may be electrically connected by die bonding to the island portion 305.

Also, the anode pad electrode 8 of the semiconductor device 1 may be electrically connected to one of either or both of the second terminal 303B or the third terminal 303C via a lead wire or lead wires.

A connection configuration of the anode pad electrode 8 and the cathode pad electrode 13 of the semiconductor device 1 may be interchanged. The anode pad electrode 8 of the semiconductor device 1 may be electrically connected by die bonding to the island portion 305.

The semiconductor device 61 or the semiconductor device 71 may be adopted as the semiconductor chip 302 in place of the semiconductor device 31. In either case, the internal structure of the semiconductor package 301 would be the same as that shown in FIG. 37.

Figure 38:
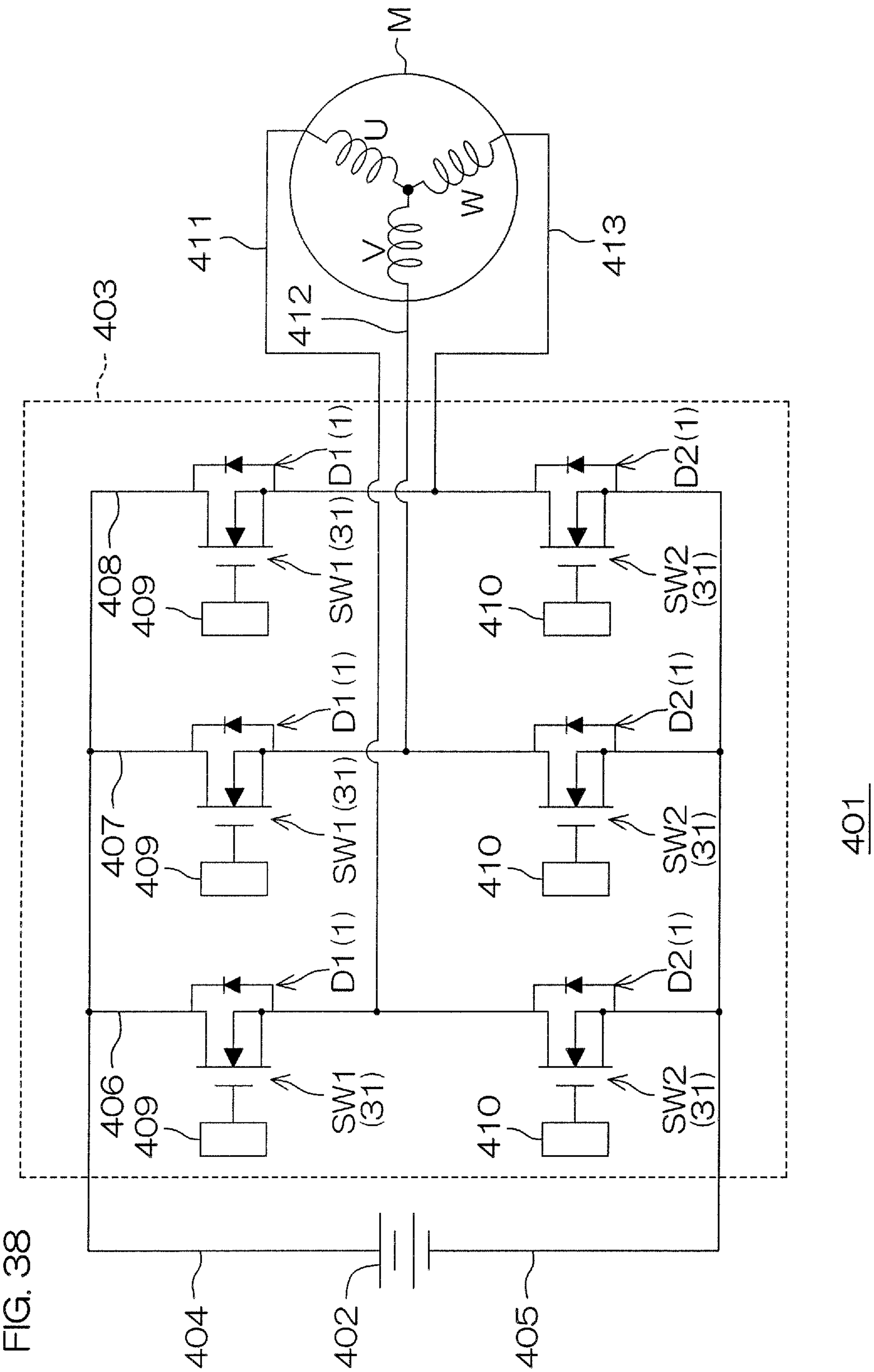
FIG. 38 is a circuit diagram of an inverter circuit in which any of the semiconductor devices according to the first to fourth preferred embodiments can be incorporated.

FIG. 38 is a circuit diagram of an inverter circuit 401 (inverter) in which any of the semiconductor devices 1, 31, 61, and 71 according to the first to fourth preferred embodiments can be incorporated.

Referring to FIG. 38, the inverter circuit 401 is a three-phase inverter circuit to which a three-phase motor M is connected as a load. The inverter circuit 401 includes a DC power supply 402 and a switch portion 403.

A voltage of the DC power supply 402 is, for example, not less than 100 V and not more than 10000 V. A high voltage wiring 404 is connected to a high voltage side of the DC power supply 402. A low voltage wiring 405 is connected to a low voltage side of the DC power supply 402.

The switch portion 403 includes a U-phase arm circuit 406, a V-phase arm circuit 407, and a W-phase arm circuit 408. The U-phase arm circuit 406, the V-phase arm circuit 407, and the W-phase arm circuit 408 respectively correspond to a U phase, a V phase, and a W phase of the three-phase motor M.

The U-phase arm circuit 406, the V-phase arm circuit 407, and the W-phase arm circuit 408 are connected in parallel between the high voltage wiring 404 and the low voltage wiring 405. Each of the U-phase arm circuit 406, the V-phase arm circuit 407, and the W-phase arm circuit 408 includes a first switching element SW1 of a high side arm and a second switching element SW2 of a low side arm.

Here, the semiconductor devices 31 are adopted as the first switching elements SW1 and the second switching elements SW2. Semiconductor packages 301, each including a semiconductor device 31, may be adopted as the first switching elements SW1 and the second switching elements SW2.

Semiconductor devices 61 or semiconductor devices 71 may be adopted as the first switching elements SW1 and the second switching elements SW2 in place of the semiconductor devices 31 (the semiconductor devices 31 included in the semiconductor packages 301).

A first regenerative diode D1 is connected between the source pad electrode 39 and the drain pad electrode 43 of each first switching element SW1. A second regenerative diode D2 is connected between the source pad electrode 39 and the drain pad electrode 43 of each second switching element SW2.

Here, the semiconductor devices 1 are adopted as the first regenerative diodes D1 and the second regenerative diodes D2. Semiconductor packages 301, each including a semiconductor device 1, may be adopted as the first regenerative diodes D1 and the second regenerative diodes D2.

If parasitic diodes of the first switching elements SW1 are to be used, the first regenerative diodes D1 may be omitted. If parasitic diodes of the second switching elements SW2 are to be used, the second regenerative diodes D2 may be omitted.

The anode pad electrodes 8 of the first regenerative diodes D1 are electrically connected to the source pad electrodes 39 of the first switching elements SW1. The cathode pad electrodes 13 of the first regenerative diodes D1 are electrically connected to the drain pad electrodes 43 of the first switching elements SW1.

The anode pad electrodes 8 of the second regenerative diodes D2 are electrically connected to the source pad electrodes 39 of the second switching elements SW2. The cathode pad electrodes 13 of the second regenerative diodes D2 are electrically connected to the drain pad electrodes 43 of the second switching elements SW2.

A first gate driver 409 for the high side is connected to the gate pad electrode 38 of each first switching element SW1. The first switching element SW1 is driven and controlled by the first gate driver 409.

A second gate driver 410 for the low side is connected to the gate pad electrode 38 of each second switching element SW2. The second switching element SW2 is driven and controlled by the second gate driver 410.

In the U-phase arm circuit 406, a connection portion of the first switching element SW1 and the second switching element SW2 is connected to the U phase of the three-phase motor M via a U-phase wiring 411.

In the V-phase arm circuit 407, a connection portion of the first switching element SW1 and the second switching element SW2 is connected to the V phase of the three-phase motor M via a V-phase wiring 412.

In the W-phase arm circuit 408, a connection portion of the first switching element SW1 and the second switching element SW2 is connected to the W phase of the three-phase motor M via a W-phase wiring 413.

With the inverter circuit 401, the first switching elements SW1 and the second switching elements SW2 of the U-phase arm circuit 406, the V-phase arm circuit 407, and the W-phase arm circuit 408 are on-off controlled according to a predetermined pattern. The three-phase motor M is thereby sinusoidally driven.

Although preferred embodiments of the present invention have been described above, the present invention may also be implemented in yet other configurations.

In each of the preferred embodiments described above, the $n^+$-type semiconductor substrate 11 or 41 constituted of silicon (S1) instead of a wide bandgap semiconductor may be adopted.

In each of the preferred embodiments described above, the $n^-$-type epitaxial layer 12 or 42 constituted of silicon (S1) instead of a wide bandgap semiconductor may be adopted.

In each of the preferred embodiments described above, a structure with which the conductivity types of the respective semiconductor portions are inverted may be adopted. That is, a p-type portion may be formed to be of an n-type and an n-type portion may be formed to be of a p-type. In this case, with each of the preferred embodiments described above, a $p^-$-type epitaxial layer 12 or 42 is formed instead of the $n^-$-type epitaxial layer 12 or 42.

In this case, holes which are the majority carriers included in the $p^-$-type epitaxial layer 12 or 42 are trapped by the crystal defects included in the carrier trapping regions 15, 47, or 64. That crystal defects included in the carrier trapping regions 15, 47, or 64 thus have the same function as donors.

More specifically, by releasing holes, the p-type impurity introduced into the $p^-$-type epitaxial layer 12 or 42 becomes negatively ionized. By trapping the holes, the carrier trapping regions 15, 47, or 64 become positively charged in opposition to the negatively ionized p-type impurity. The carrier trapping regions 15, 47, or 64 thus function virtually as donors.

Even by such carrier trapping regions 15, 47, or 64, decrease in electric field strength along the thickness direction of the $p^-$-type epitaxial layer 12 or 42 when a voltage is applied to the $p^-$-type epitaxial layer 12 or 42 can be suppressed. Consequently, the withstand voltage can be improved.

In each of the preferred embodiments described above, termination regions that include crystal defects may be formed instead of the p-type termination regions 17 or 48 that include the p-type impurity. With the exception of being formed in the surface layer portion of the first main surface 3 of the $n^-$-type epitaxial layer 12, the termination regions that include crystal defects may have the same structure as the carrier trapping regions 15, 47, or 64 described above. Termination regions that include both a p-type impurity and crystal defects may be formed.

Figure 39:
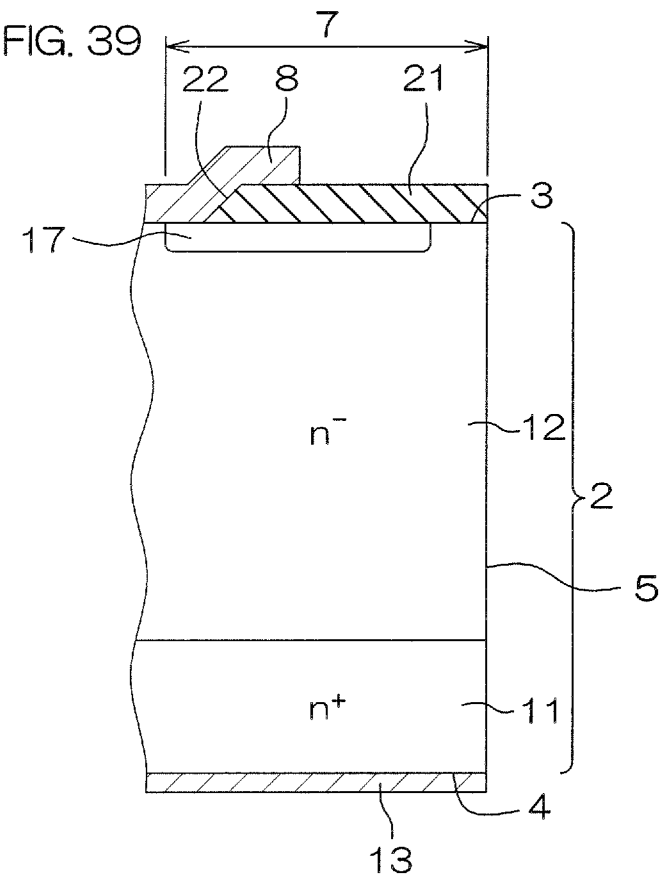
FIG. 39 is a sectional view of another configuration example of a p-type termination region of the semiconductor device according to the first preferred embodiment.

In the first preferred embodiment described above, the p-type termination region 17 shown in FIG. 39 may be adopted. FIG. 39 is a sectional view of another configuration example of the p-type termination region 17 of the semiconductor device 1. Structures in FIG. 39 that are the same as the structures described for the semiconductor device 1 are provided with the same reference signs and description thereof shall be omitted.

In this configuration example, the p-type termination region 17 is formed of a single p-type impurity region. The p-type termination region 17 is formed in a band shape of comparatively wide width. An outer peripheral edge of the p-type termination region 17 is formed in an inner region across intervals from the side surfaces 5 of the chip main body 2. The p-type termination region 17 may occupy a region of not less than 50% of the outer region 7 in plan view.

In each of the second to fourth preferred embodiments described above, a p-type termination region 48 having the same structure as the p-type termination region 17 shown in FIG. 39 may be adopted.

Figure 40:
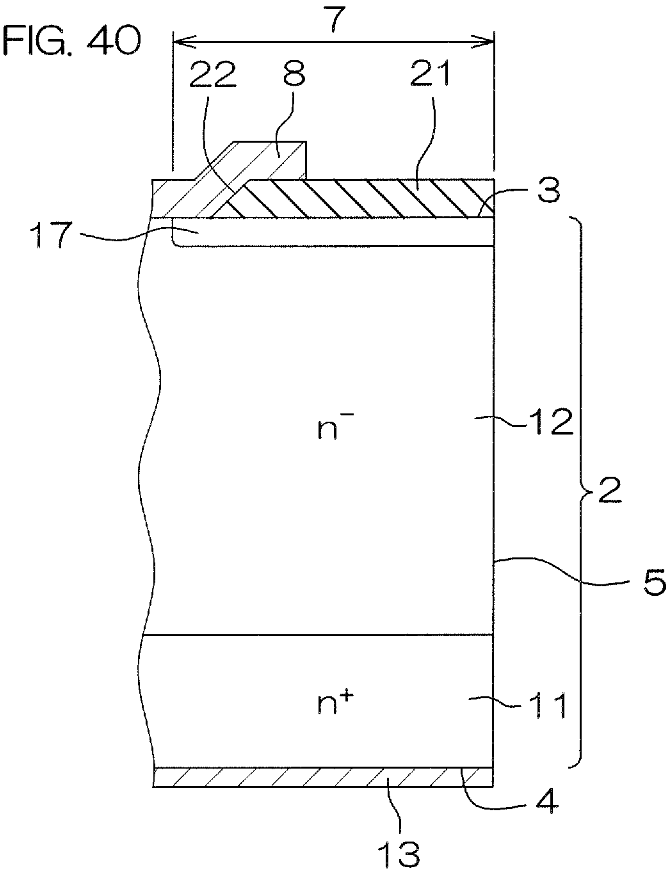
FIG. 40 is a sectional view of yet another configuration example of the p-type termination region of the semiconductor device according to the first preferred embodiment.

In the first preferred embodiment described above, the p-type termination region 17 shown in FIG. 40 may be applied. FIG. 40 is a sectional view of yet another configuration example of the p-type termination region 17 of the semiconductor device 1. Structures in FIG. 40 that are the same as the structures described for the semiconductor device 1 are provided with the same reference signs and description thereof shall be omitted.

In this configuration example, the p-type termination region 17 is formed of a single p-type impurity region. The p-type termination region 17 is formed in a band shape of comparatively wide width. An outer peripheral edge of the p-type termination region 17 is exposed from the side surfaces 5 of the chip main body 2. The p-type termination region 17 defines the device formation region 6 and also forms the outer region 7.

In each of the second to fourth preferred embodiments described above, a p-type termination region 48 having the same structure as the p-type termination region 17 shown in FIG. 40 may be adopted.

A structure with which a p-type termination region 17 or 48 is exposed from the side surfaces 5 or 35 of the chip main body 2 or 32 may be adopted in each of the preferred embodiments described above. In this case, the structure is such that an outer peripheral edge of the p-type termination region 17E or 48E which is positioned at an outermost side is exposed from the side surfaces 5 or 35 of the chip main body 2 or 32.

In the first preferred embodiment described above, the semiconductor device 1 of a structure not having the electric field relaxation regions 16 may be adopted.

In the first preferred embodiment described above, a front surface protective film, covering the anode pad electrode 8, may be formed on the insulating layer 21. The front surface protective film may cover an edge portion of the anode pad electrode 8 and have an anode pad opening exposing an inner region of the anode pad electrode 8 as a pad region. The front surface protective film may include a polyimide or other resin material. The front surface protective film may include silicon nitride or silicon oxide.

In each of the second to fourth preferred embodiments described above, a front surface protective film, covering the gate pad electrode 38 and the source pad electrode 39, may be formed on the insulating layer 57. The front surface protective film may cover an edge portion of the gate pad electrode 38 and have a gate pad opening exposing an inner region of the gate pad electrode 38 as a pad region.

Also, the front surface protective film may cover an edge portion of the source pad electrode 39 and have a source pad opening exposing an inner region of the source pad electrode 39 as a pad region. The front surface protective film may include a polyimide or other resin material. The front surface protective film may include silicon nitride or silicon oxide.

In the second preferred embodiment described above, a $p^+$-type semiconductor substrate 41 may be adopted in place of the $n^+$-type semiconductor substrate 41. That is, an IGBT (insulated gate bipolar transistor) may be formed in place of a MISFET. In this case, the "source" of the MISFET is replaced by an "emitter" of the IGBT. Also, the "drain" of the MISFET is replaced by a "collector" of the IGBT.

The carrier trapping regions 15, 47, 64 or 73 described above may take on any of various configurations besides the structures described above with the first preferred embodiment to the fourth preferred embodiment. Other configuration examples that the carrier trapping regions 15, 47, 64 or 73 may take on shall be described below.

Figure 41A:
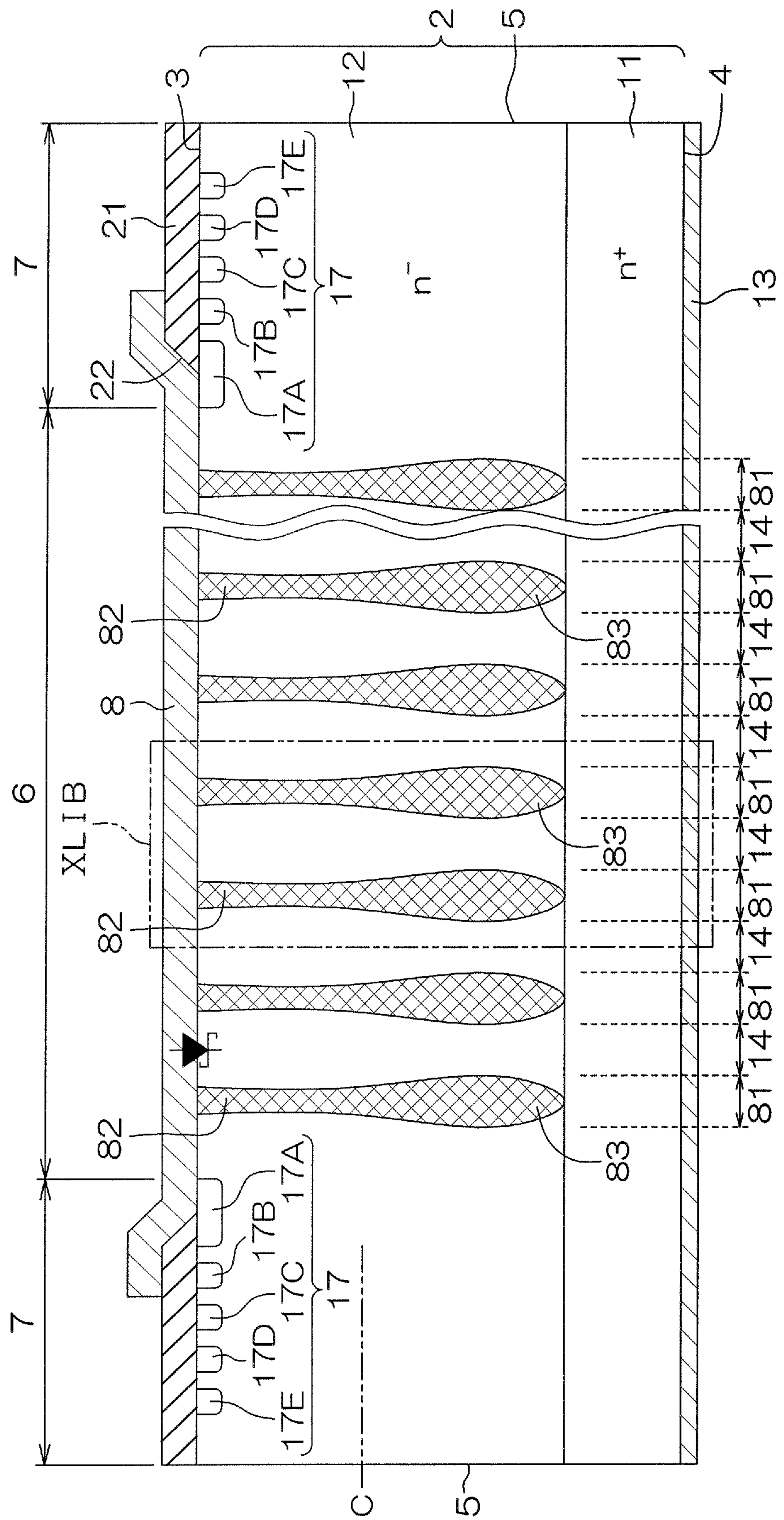
FIG. 41A is a sectional view of a portion corresponding to FIG. 2 and is a sectional view showing the semiconductor device to which a first configuration example of carrier trapping regions according to a first modification example is applied.
Figure 41B:
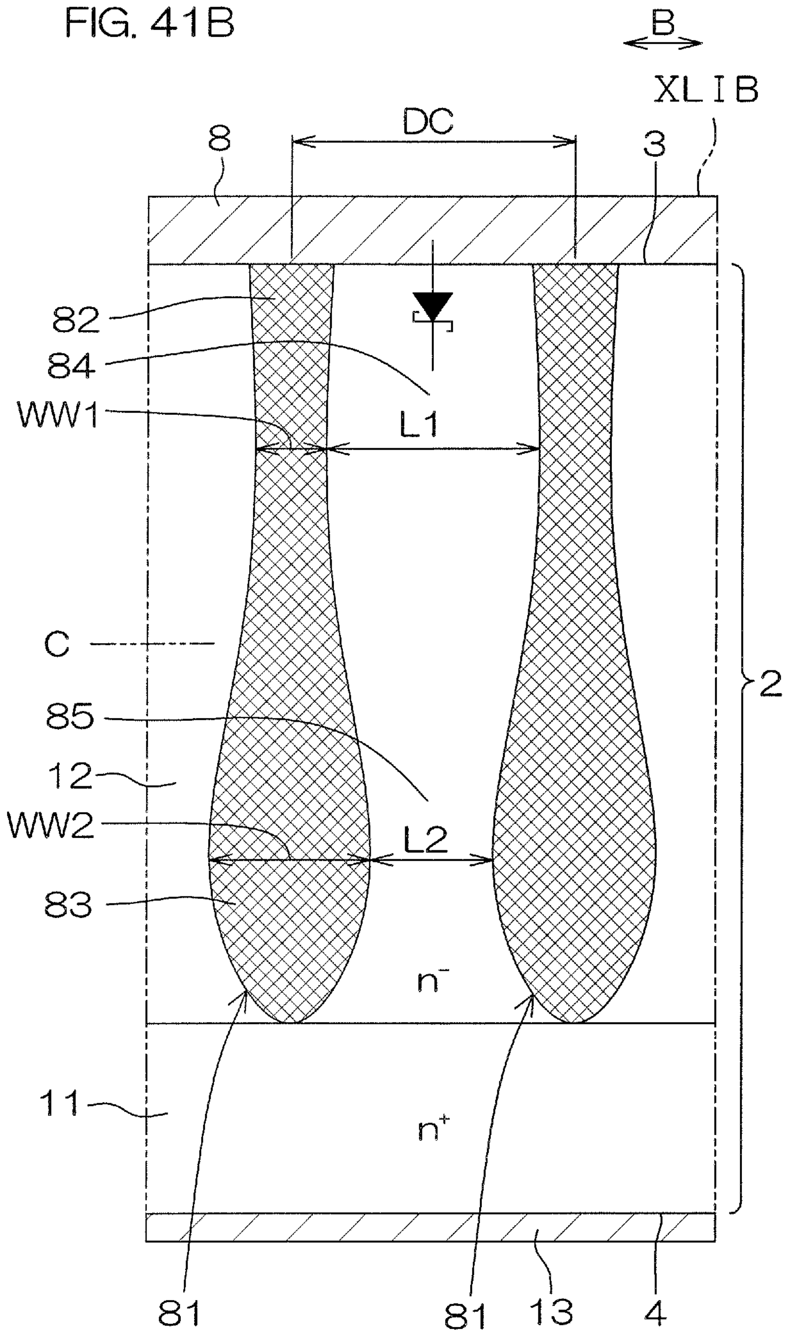
FIG. 41B is an enlarged view of a region XLIB shown in FIG. 41A.

FIG. 41A is a sectional view of a portion corresponding to FIG. 2 and is a sectional view showing the semiconductor device 1 to which a first configuration example of carrier trapping regions 81 according to a first modification example is applied. FIG. 41B is an enlarged view of a region XLIB shown in FIG. 41A.

In the following, an example where the carrier trapping regions 81 are formed in place of the carrier trapping regions 15 according to the first preferred embodiment (see FIG. 2, etc.) shall be described for the sake of convenience. In the following, structures described for the semiconductor device 1 are provided with the same reference signs and description thereof shall be omitted.

Each carrier trapping region 81 includes crystal defects that are selectively introduced into the $n^-$-type epitaxial layer 12 and has the same properties as the carrier trapping regions 15.

Referring to FIG. 41A and FIG. 41B, in this configuration example, each carrier trapping region 81 is formed in a column shape which extends along the thickness direction of the $n^-$-type epitaxial layer 12 and with which a lower portion bulges along the second direction B with respect to an upper portion.

A distance DC between carrier trapping regions 81 may be not less than 0.5 μm and not more than 10 μm. More specifically, the distance DC is a distance along the second direction B between a central portion of one carrier trapping region 81 and a central portion of another carrier trapping region 81.

Each carrier trapping region 81 includes an upper first region 82 and a lower second region 83. The first region 82 is positioned upper than the intermediate region C of the $n^-$-type epitaxial layer 12. The second region 83 is positioned lower than the intermediate region C of the $n^-$-type epitaxial layer 12. In FIG. 41A and FIG. 41B, the intermediate region C is indicated by an alternate long and two short dashed lines.

In this configuration example, the first region 82 is exposed from the first main surface 3 of the $n^-$-type epitaxial layer 12. In this configuration example, the second region 83 is connected to the $n^+$-type semiconductor substrate 11.

Each carrier trapping region 81 is formed such that a width along the second direction B increases gradually from the first region 82 toward the second region 83. The second region 83 has a shape that is bulged in the second direction B with respect to the first region 82.

A width WW1 along the second direction B of the first region 82 is not more than a width WW2 along the second direction B of the second region 83 (WW1≤WW2). The width WW1 of the first region 82 and the width WW2 of the second region 83 may be not less than 0.1 μm and not more than 10 μm.

Figure 42:
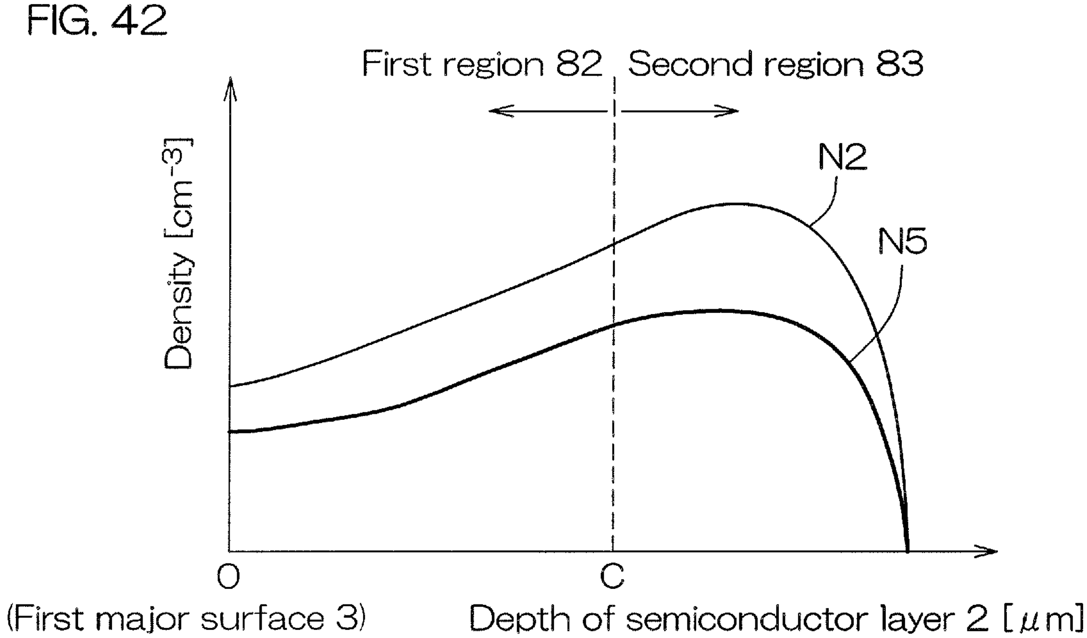
FIG. 42 is a graph of an impurity density and a defect density of each carrier trapping region shown in FIG. 41A.

FIG. 42 is a graph of an impurity density N5 and a crystal defect density N2 of each carrier trapping region 81 shown in FIG. 41A. The impurity density N5 of the carrier trapping region 81 refers to a density of light ions, electrons, or neutrons, etc., introduced into the $n^-$-type epitaxial layer 12.

In FIG. 42, the ordinate expresses the density [$cm^{-3}$] and the abscissa indicates the depth [μm] of the $n^-$-type epitaxial layer 12 when the first main surface 3 of the $n^-$-type epitaxial layer 12 is defined as zero.

The impurity density N5 of the carrier trapping region 81 has a single maximum at an intermediate portion in the thickness direction of the $n^-$-type epitaxial layer 12. The maximum of the impurity density N5 is positioned lower than the intermediate region C of the $n^-$-type epitaxial layer 12.

The maximum of the impurity density N5 corresponds to a location of the carrier trapping region 81 that bulges out the most, that is, corresponds to the second region 83. An impurity density N5 of the second region 83 is not less than an impurity density N5 of the first region 82.

On the other hand, the carrier trapping region 81 has the crystal defect density N2 not less than the impurity density N5 (N2≥N5). The crystal defect density N2 of the carrier trapping region 81 has a single maximum at an intermediate portion in the thickness direction of the $n^-$-type epitaxial layer 12. The maximum of the crystal defect density N2 is positioned lower than the intermediate region C of the $n^-$-type epitaxial layer 12.

The maximum of the crystal defect density N2 corresponds to the location of the carrier trapping region 81 that bulges out the most, that is, corresponds to the second region 83. The crystal defect density N2 of the second region 83 is not less than the crystal defect density N2 of the first region 82.

Referring to FIG. 41A and FIG. 41B, the $n^-$-type epitaxial layer 12 has a first portion 84 and a second portion 85 having mutually different distances in regard to the second direction B in each region between two mutually adjacent carrier trapping regions 81.

The first portion 84 is positioned in a region between the first regions 82 of the two mutually adjacent carrier trapping regions 81. The second portion 85 is positioned in a region between the second regions 83 of the two mutually adjacent carrier trapping regions 81. A first width L1 along the second direction B of the first portion 84 is not less than a second width L2 along the second direction B of the second portion 85 (L1≥L2).

Figure 43:
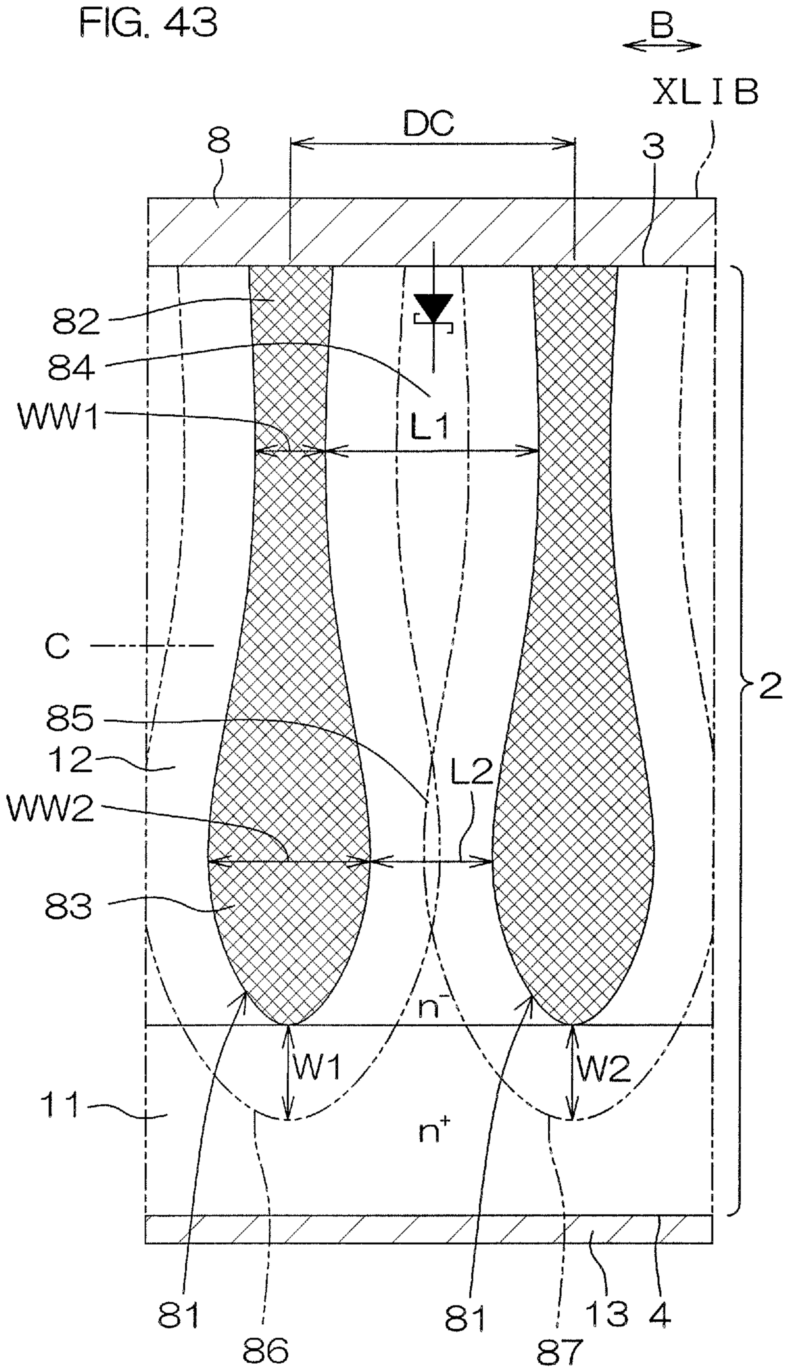
FIG. 43 is an enlarged view of a portion corresponding to FIG. 41B and is a sectional view for describing depletion layers spreading from the carrier trapping regions shown in FIG. 41A.

FIG. 43 is an enlarged view of a portion corresponding to FIG. 41B and is a sectional view for describing depletion layers spreading from the carrier trapping regions 81 shown in FIG. 41A.

The second width L2 of the second portion 85 may be not more than a sum W1+W2 of a first width W1 of a first depletion layer 86 spreading from one carrier trapping region 81 and a second width W2 of a second depletion layer 87 spreading from the other carrier trapping region 81 (L2≤W1+W2).

When L2≤W1+W2 is satisfied, the first depletion layer 86 and the second depletion layer 87 overlap mutually in the second portion 85. The second portion 85 is thereby depleted. Concentration of electric field in the second portion 85 can thereby be relaxed and a short-circuit capacity can thus be increased.

On the other hand, the first width L1 of the first portion 84 may be not less than the sum W1+W2 of the first width W1 of the first depletion layer 86 and the second width W2 of the second depletion layer 87 (L1≥W1+W2). Obviously, it may instead be such that L1≤W1+W2.

Even with this configuration example described above, the same effects as the effects described for the semiconductor device 1 can be exhibited.

FIG. 44A to FIG. 44D are enlarged views of a portion corresponding to FIG. 41B and are sectional views for describing an example of a method for forming the carrier trapping regions 81 shown in FIG. 41A. The method for forming the carrier trapping regions 81 can be incorporated in the steps for forming the carrier trapping regions 15 (step S15 and step S16) shown in FIG. 15 described above.

Figure 44A:
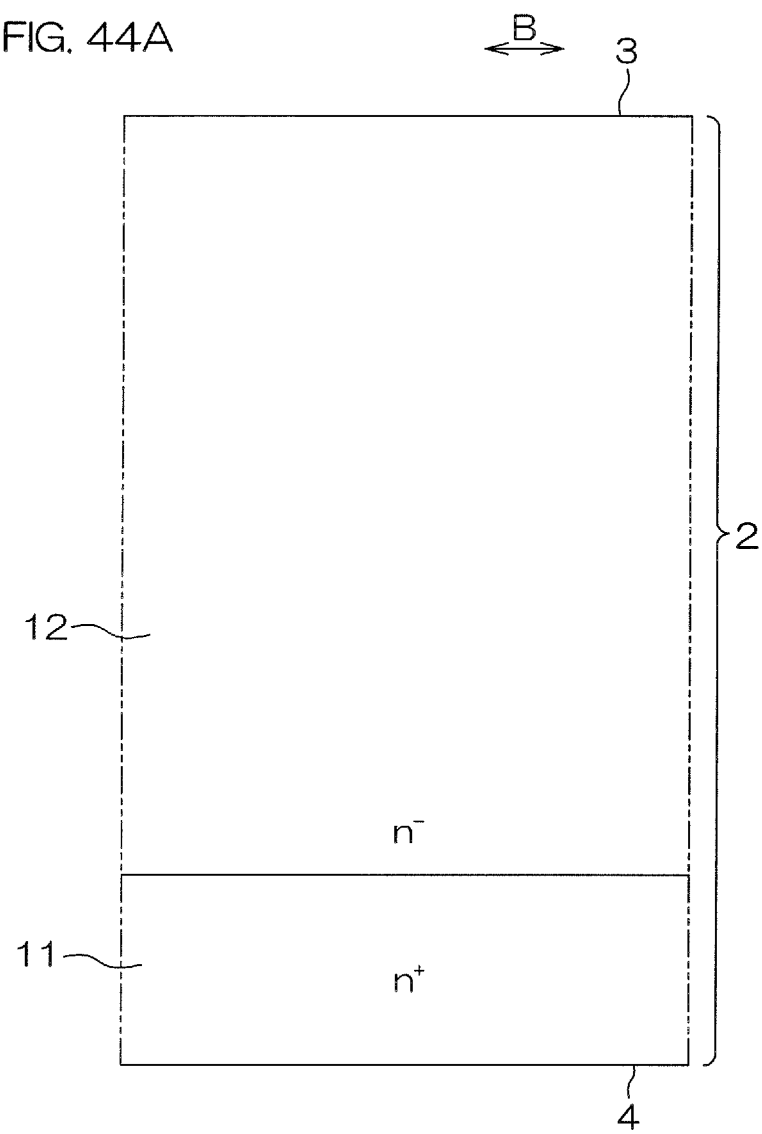
FIG. 44A is an enlarged view of a portion corresponding to FIG. 41B and is a sectional view for describing an example of a method for forming the carrier trapping regions shown in FIG. 41A.

Referring to FIG. 44A, first, the $n^+$-type semiconductor substrate 11 is prepared. Next, in parallel to introducing the n-type impurity, SiC is epitaxially grown from a main surface of the $n^+$-type semiconductor substrate 11.

The $n^-$-type epitaxial layer 12 is thereby formed on the $n^+$-type semiconductor substrate 11. The first main surface 3 is formed by the $n^-$-type epitaxial layer 12 and the second main surface 4 is formed by the $n^+$-type semiconductor substrate 11.

Figure 44B:
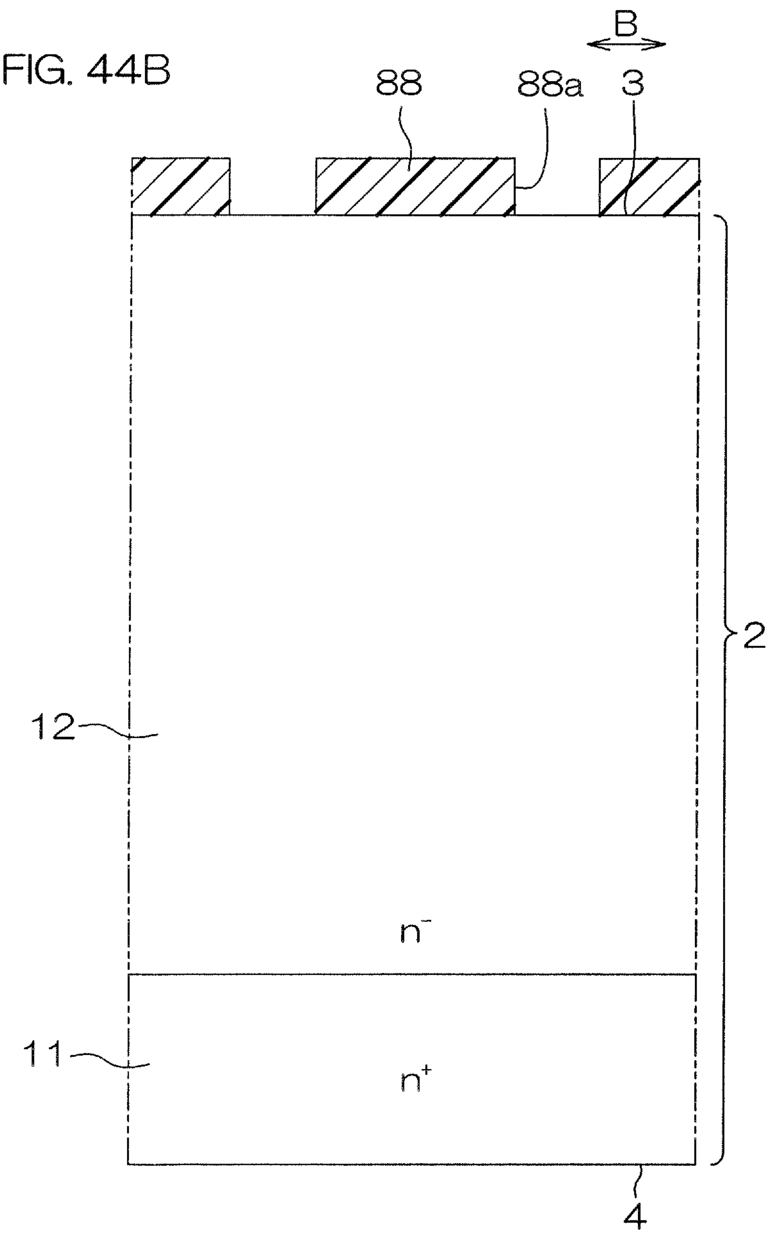
FIG. 44B is a sectional view of a step subsequent to that of FIG. 44A.

Next, referring to FIG. 44B, a mask 88 having a predetermined pattern is formed on the first main surface 3 of the $n^-$-type epitaxial layer 12. The mask 88 has openings 88*a* exposing regions at which the carrier trapping regions 81 are to be formed.

Figure 44C:
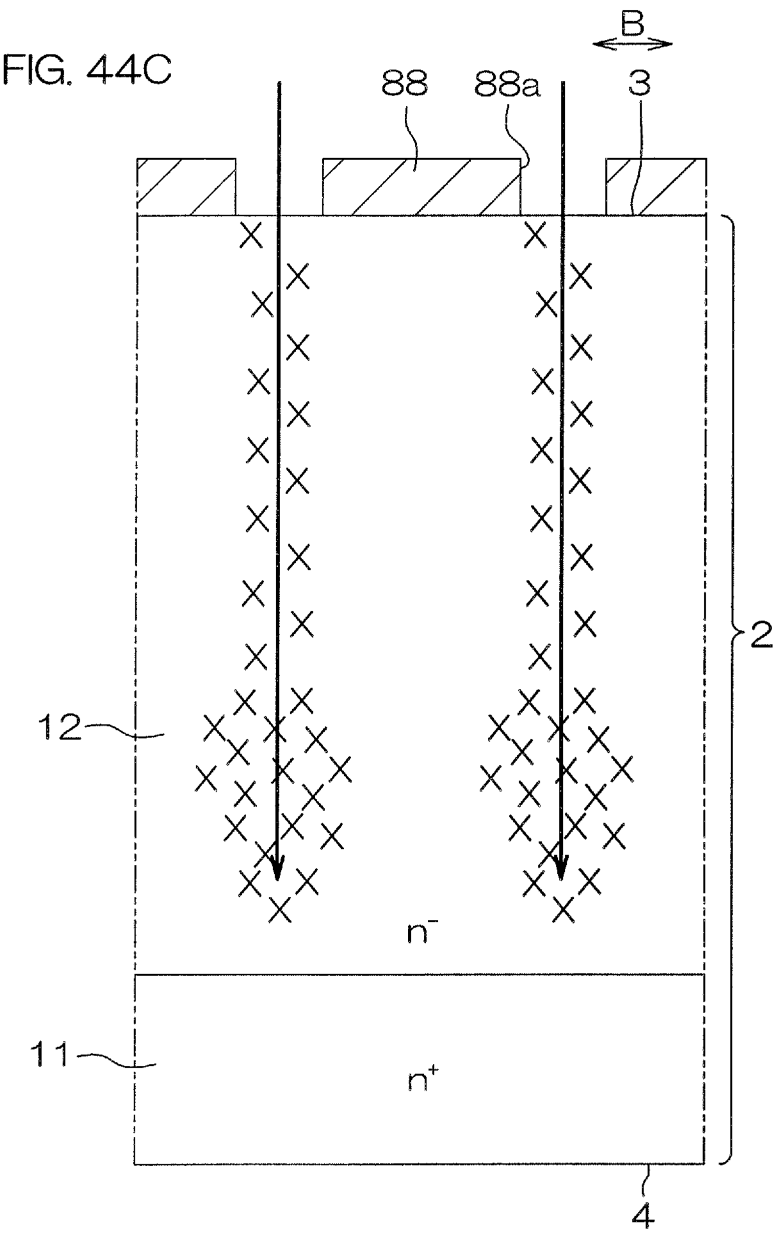
FIG. 44C is a sectional view of a step subsequent to that of FIG. 44B.

Next, referring to FIG. 44C, light ions, electrons, or neutrons, etc., are irradiated onto the $n^-$-type epitaxial layer 12 via the mask 88. The light ions may include at least one type of ions among hydrogen ions ($H^+$), helium ions ($He^+$), and boron ions ($B^+$).

In the present step, the regions of the $n^-$-type epitaxial layer 12 in which the crystal defects are to be introduced are set by adjusting the irradiation energy (acceleration voltage applied by the irradiating apparatus) of the light ions, electrons, or neutrons, etc.

In this configuration example, the light ions, electrons, or neutrons, etc., are driven in the thickness direction from the first main surface 3 of the $n^-$-type epitaxial layer 12 down to a vicinity of a boundary region of the $n^+$-type semiconductor substrate 11 and the $n^-$-type epitaxial layer 12 while forming crystal defects. In FIG. 44C, the crystal defects are indicated by "X."

Figure 44D:
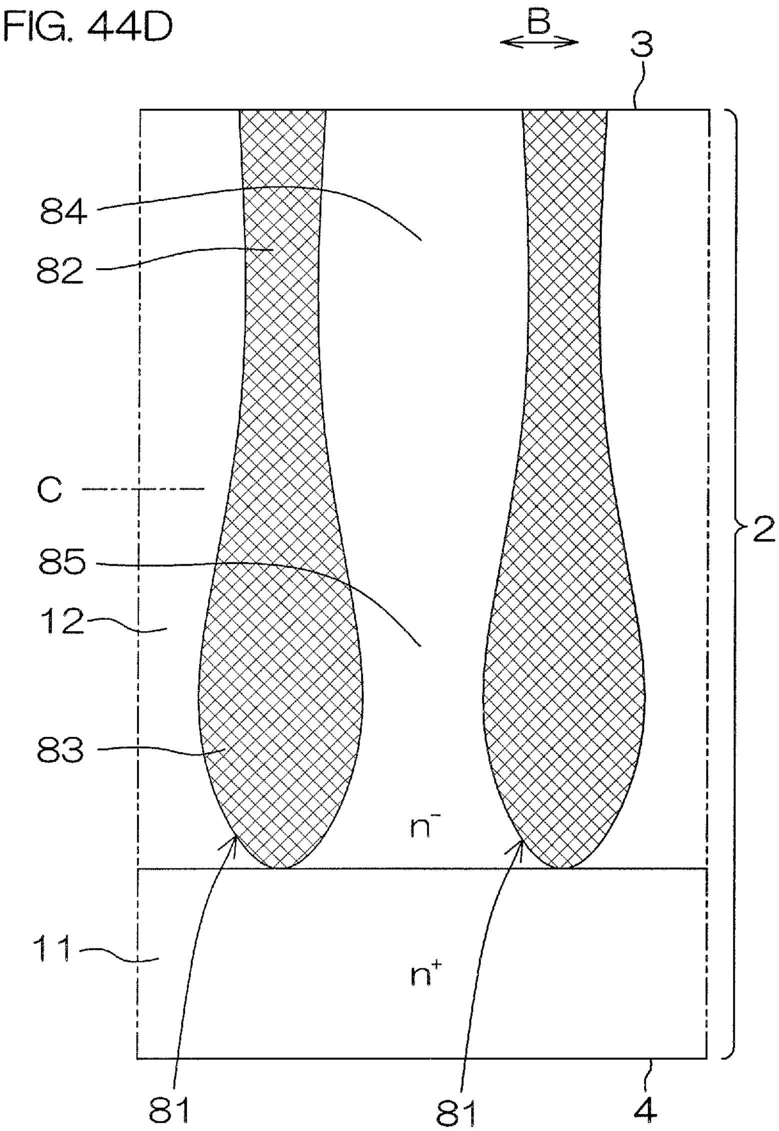
FIG. 44D is a sectional view of a step subsequent to that of FIG. 44C.

Thereby, with reference to FIG. 44D, the carrier trapping regions 81 of the predetermined shape are formed in the $n^-$-type epitaxial layer 12. Thereafter, a portion of the crystal defects formed in the $n^-$-type epitaxial layer 12 may be recovered by the annealing treatment method. The annealing treatment method may be performed under an atmosphere of less than 1500° C. (for example, not more than 1200° C.).

Besides the first preferred embodiment, the carrier trapping regions 81 can also be applied to any of the second preferred embodiment to the fourth preferred embodiment. The carrier trapping regions 81 may be incorporated in any of the configurations shown in FIG. 2, FIG. 4, FIG. 5, FIG. 6, FIG. 7, FIG. 9, FIG. 18, FIG. 19, FIG. 20, FIG. 21, FIG. 22, FIG. 24, FIG. 32, etc. Other configuration examples of the carrier trapping regions 81 shall now be described.

Figure 45:
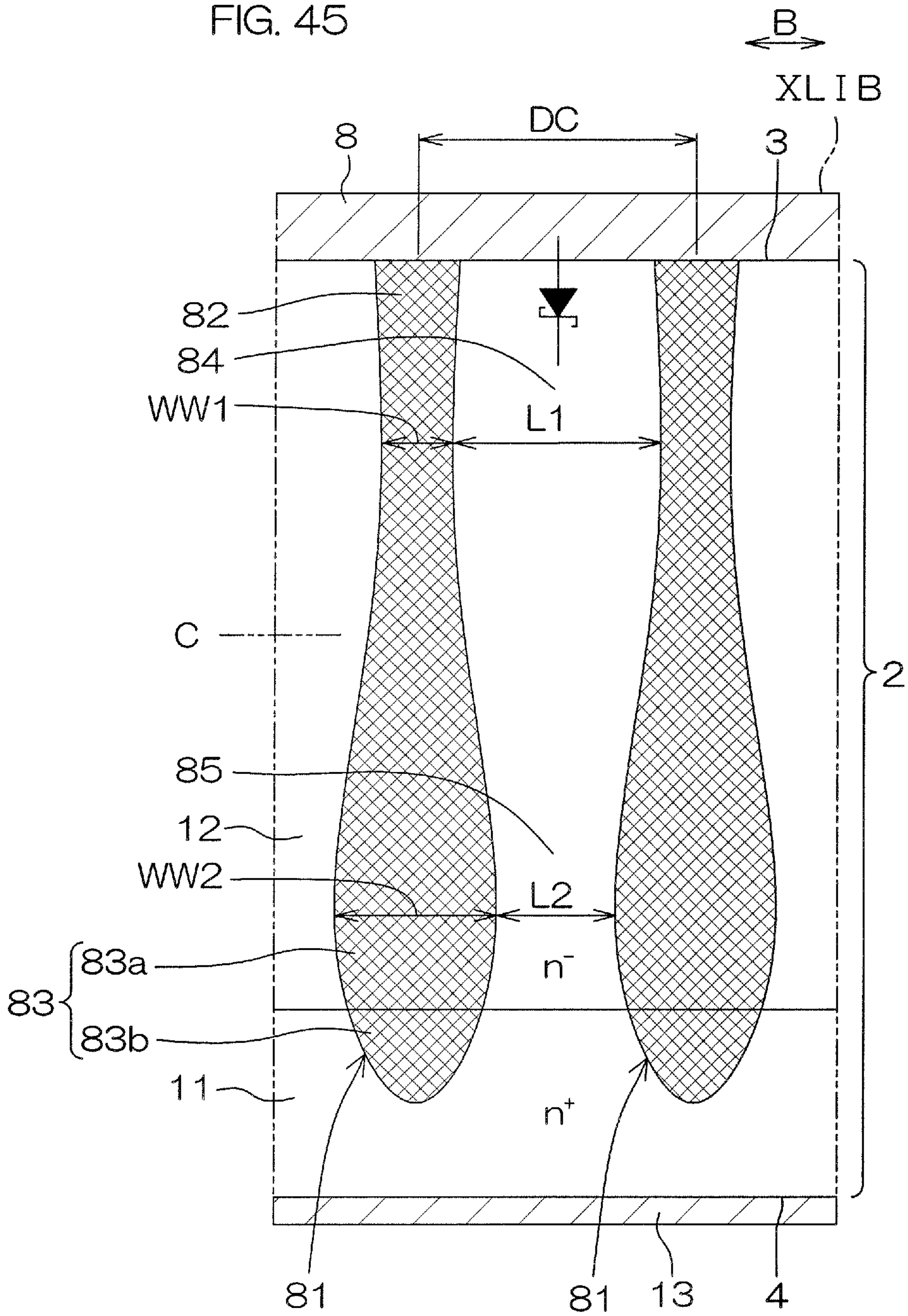
FIG. 45 is an enlarged view of a portion corresponding to FIG. 41B and is a diagram showing a second configuration example of the carrier trapping regions shown in FIG. 41A.

FIG. 45 is an enlarged view of a portion corresponding to FIG. 41B and is a sectional view showing a second configuration example of the carrier trapping regions 81 shown in FIG. 41A. Structures in FIG. 45 corresponding to structures described in FIG. 41A and FIG. 41B are provided with the same reference signs and description thereof shall be omitted.

Referring to FIG. 45, in this configuration example, the second region 83 of each carrier trapping region 81 is connected to the $n^+$-type semiconductor substrate 11. The second region 83 includes a first portion 83*a*, formed inside the $n^-$-type epitaxial layer 12, and a second portion 83*b*, formed inside the $n^+$-type semiconductor substrate 11.

A crystal defect density N2 of the first portion 83*a* is higher than the n-type impurity density N1 of the $n^-$-type epitaxial layer 12 (N2>N1). A crystal defect density N2 of the second portion 83*b* is lower than the n-type impurity density N3 of the $n^+$-type semiconductor substrate 11 (N2<N3). Functioning virtually as an acceptor is suppressed in the second portion 83*b* of the second region 83.

The maximum of the impurity density N5 and the maximum of the crystal defect density N2 in the second region 83 may be positioned inside the $n^-$-type epitaxial layer 12 (see also FIG. 42). The maximum of the impurity density N5 and the maximum of the crystal defect density N2 in the second region 83 may be positioned inside the $n^+$-type semiconductor substrate 11 (see also FIG. 42).

Figure 46:
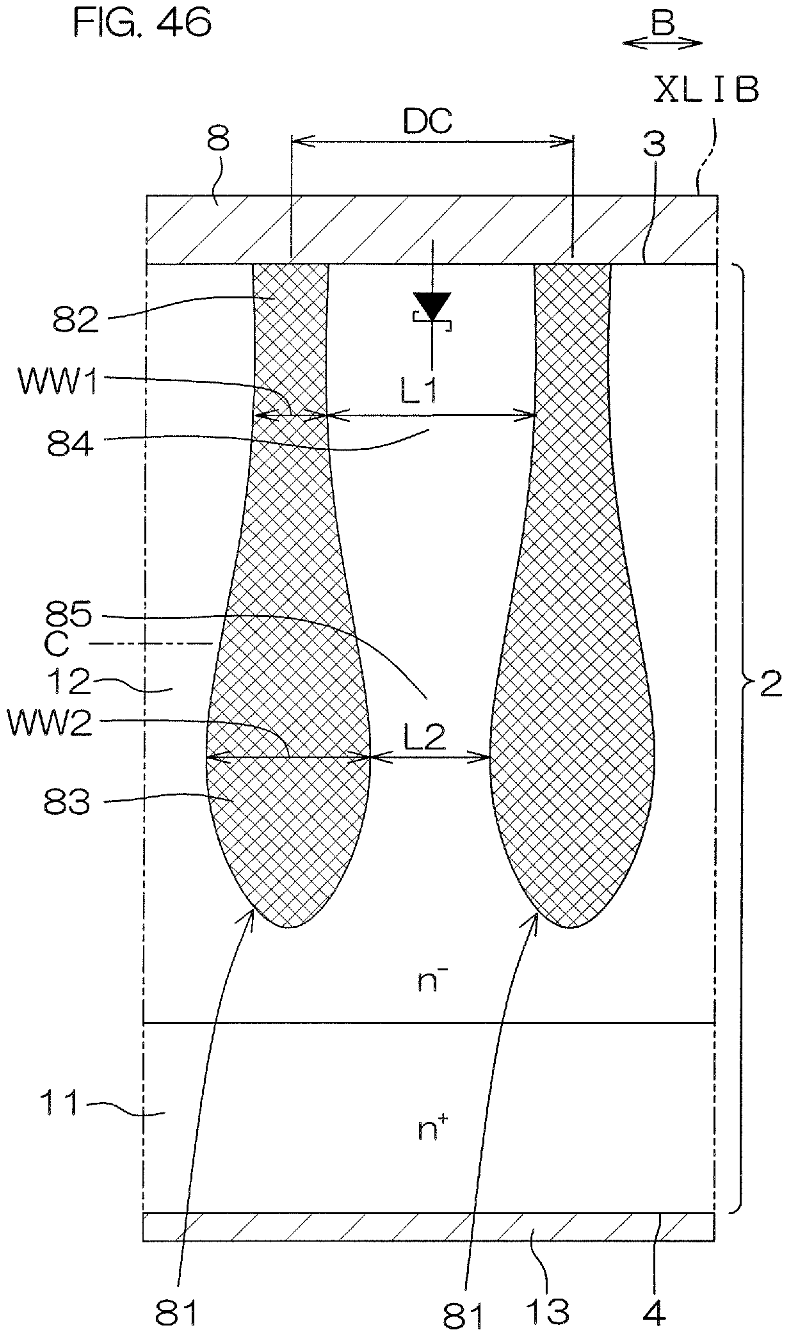
FIG. 46 is an enlarged view of a portion corresponding to FIG. 41B and is a diagram showing a third configuration example of the carrier trapping regions shown in FIG. 41A.

FIG. 46 is an enlarged view of a portion corresponding to FIG. 41B and is a sectional view showing a third configuration example of the carrier trapping regions 81 shown in FIG. 41A. Structures in FIG. 46 corresponding to structures described in FIG. 41A and FIG. 41B are provided with the same reference signs and description thereof shall be omitted.

Referring to FIG. 46, in this configuration example, the second region 83 of each carrier trapping region 81 is formed across an interval to the first main surface 3 side from the $n^+$-type semiconductor substrate 11. A portion of the $n^-$-type epitaxial layer 12 is interposed in a region between the second region 83 and the $n^+$-type semiconductor substrate 11.

Figure 47:
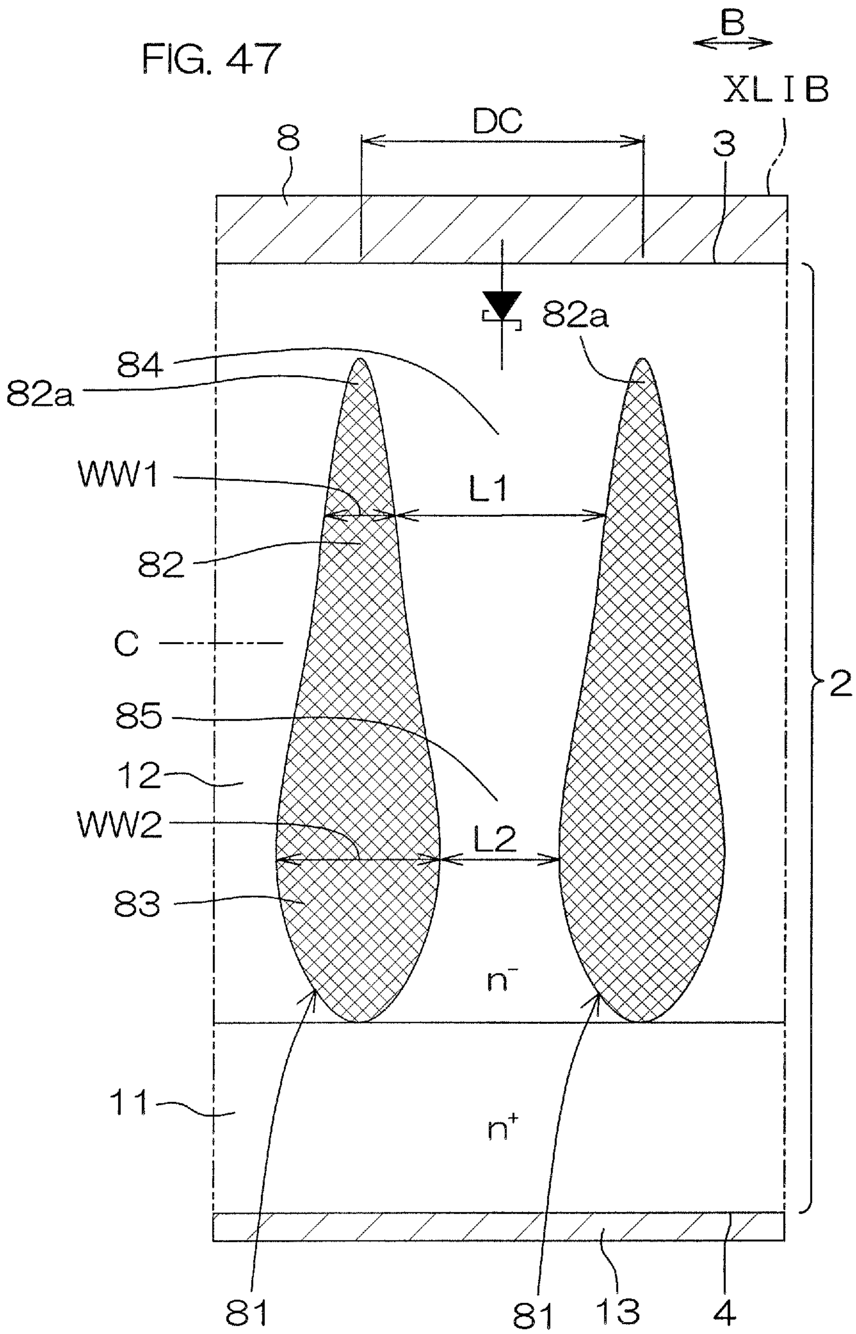
FIG. 47 is an enlarged view of a portion corresponding to FIG. 41B and is a diagram showing a fourth configuration example of the carrier trapping regions shown in FIG. 41A.

FIG. 47 is an enlarged view of a portion corresponding to FIG. 41B and is a sectional view showing a fourth configuration example of the carrier trapping regions 81 shown in FIG. 41A. Structures in FIG. 47 corresponding to structures described in FIG. 41A and FIG. 41B are provided with the same reference signs and description thereof shall be omitted.

Referring to FIG. 47, in this configuration example, the first region 82 of each carrier trapping region 81 is formed across an interval to the second main surface 4 side from the first main surface 3 of the $n^-$-type epitaxial layer 12.

In this configuration example, an upper portion 82*a* of each first region 82 is formed to a convergent shape with which the width WW1 along the second direction B decreases gradually toward the first main surface 3 of the $n^-$-type epitaxial layer 12. A portion of the $n^-$ type epitaxial layer 12 is interposed in a region between the first region 82 and the first main surface 3.

Figure 48:
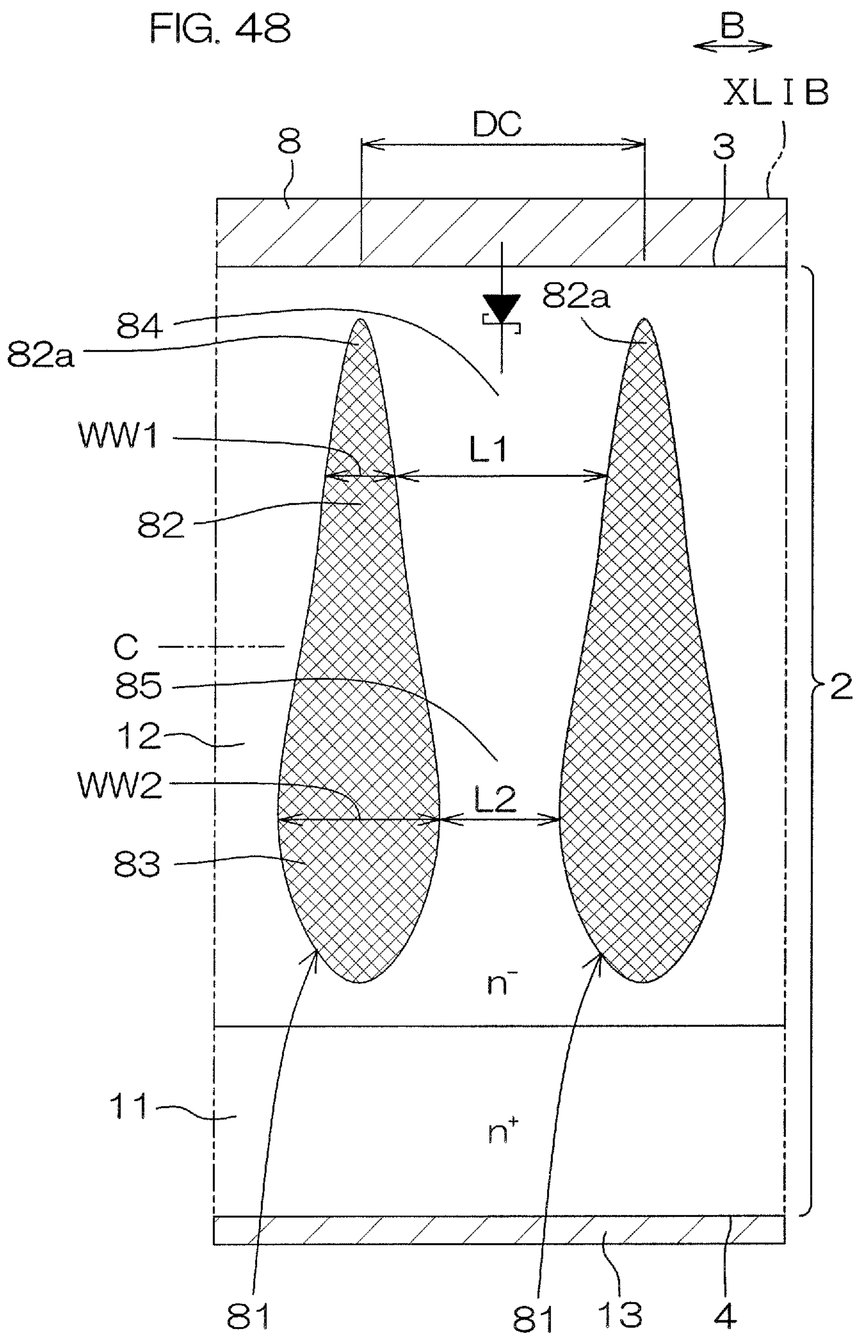
FIG. 48 is an enlarged view of a portion corresponding to FIG. 41B and is a diagram showing a fifth configuration example of the carrier trapping regions shown in FIG. 41A.

FIG. 48 is an enlarged view of a portion corresponding to FIG. 41B and is a sectional view showing a fifth configuration example of the carrier trapping regions 81 shown in FIG. 41A. Structures in FIG. 48 corresponding to structures described in FIG. 41A and FIG. 41B are provided with the same reference signs and description thereof shall be omitted.

Referring to FIG. 48, in this configuration example, the carrier trapping regions 81 are floated in the interior of the $n^-$-type epitaxial layer 12.

That is, the first region 82 of each carrier trapping region 81 is formed across an interval to the second main surface 4 side from the first main surface 3 of the $n^-$-type epitaxial layer 12. In this configuration example, the upper portion 82*a* of the first region 82 is formed to a convergent shape with which the width WW1 along the second direction B decreases gradually toward the first main surface 3 of the $n^-$-type epitaxial layer 12. A portion of the $n^-$-type epitaxial layer 12 is interposed in a region between the first region 82 and the first main surface 3.

The second region 83 of each carrier trapping region 81 is formed across an interval to the first main surface 3 side from the $n^+$-type semiconductor substrate 11. A portion of the $n^-$-type epitaxial layer 12 is interposed in a region between the second region 83 and the $n^+$-type semiconductor substrate 11.

In a case where the carrier trapping regions 81 according to any of the first configuration example to the fifth configuration example described above are applied as the carrier trapping regions 64 of a MISFET (FIG. 18, FIG. 19, FIG. 20, FIG. 21, FIG. 22, FIG. 24, FIG. 32, etc.), the following actions and effects can be exhibited.

That is, when a short circuit occurs in a state where a high voltage is applied to the $n^-$-type epitaxial layer 42, a large current can be blocked at the second portions 85 of comparatively narrow width. Heat generation at the second portions 85 can thereby be suppressed and therefore an allowable time for a short circuit due to a peripheral circuit can be designed to be longer.

On the other hand, when a conducting state voltage is applied to the $n^-$-type epitaxial layer 42, current paths can be secured at the first portions 84 of comparatively wide width. Increase of on resistance can thereby be suppressed using the first portions 84.

Figure 49A:
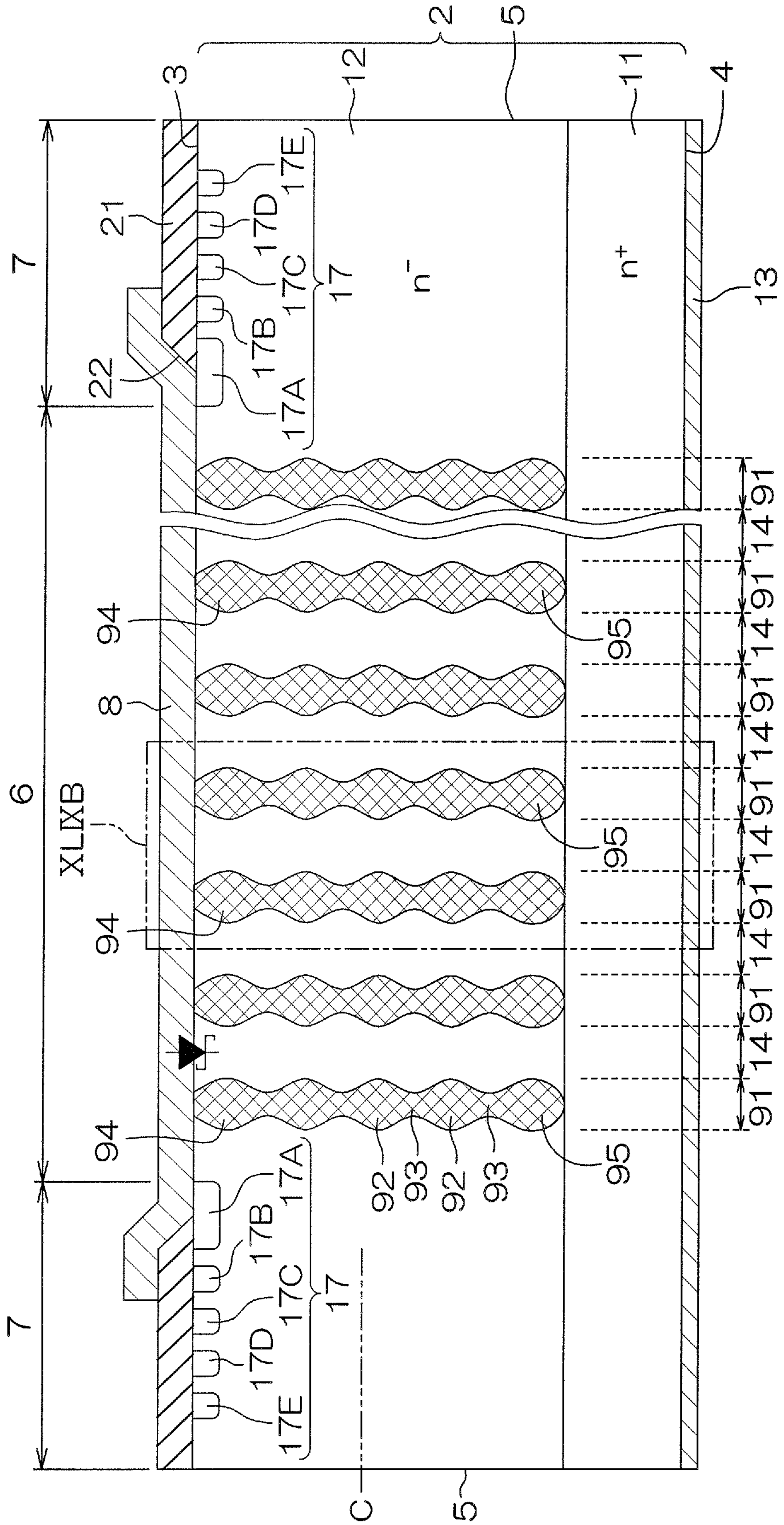
FIG. 49A is a sectional view of a portion corresponding to FIG. 2 and is a sectional view showing the semiconductor device to which a first configuration example of carrier trapping regions according to a second modification example is applied.
Figure 49B:
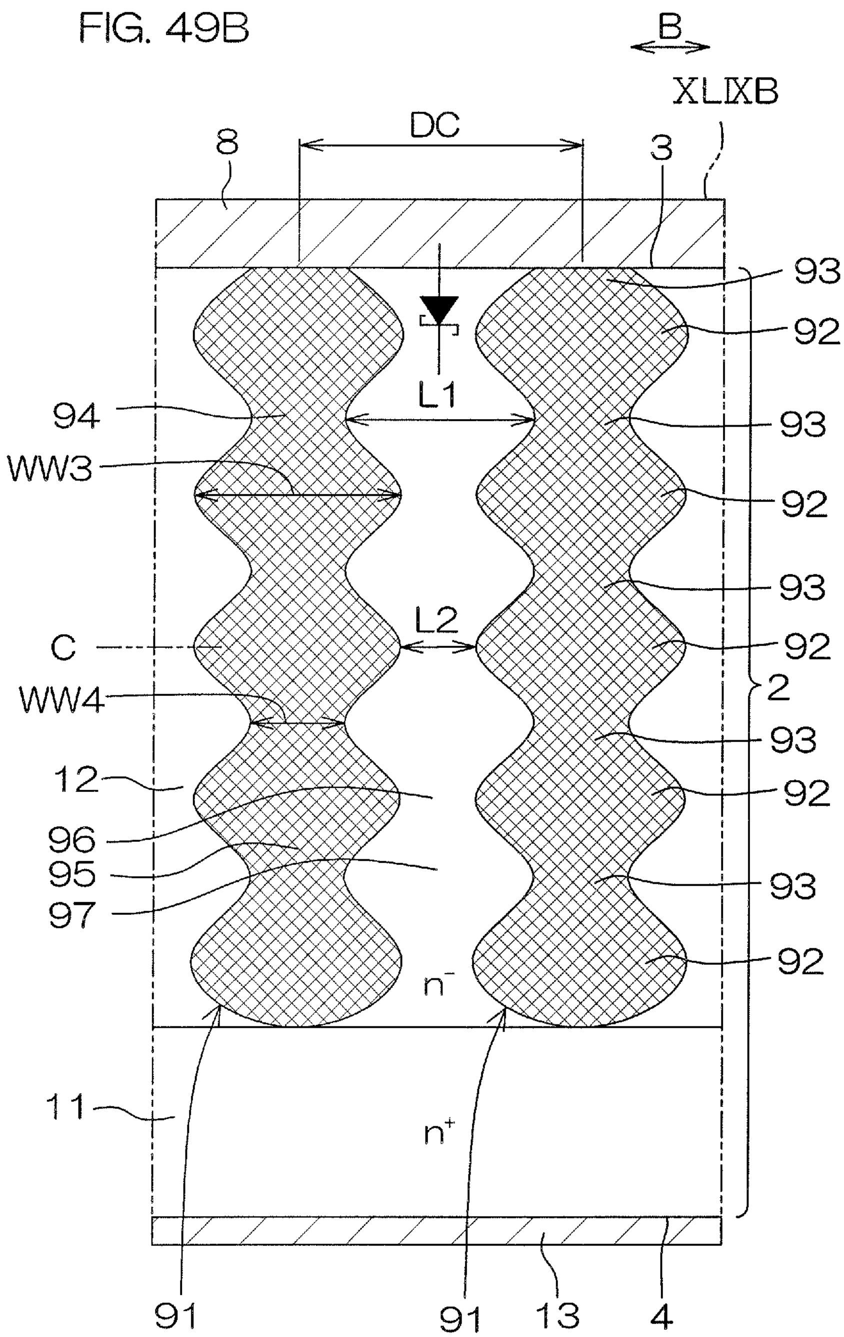
FIG. 49B is an enlarged view of a region XLIXB shown in FIG. 49A.

FIG. 49A is a sectional view of a portion corresponding to FIG. 2 and is a sectional view showing the semiconductor device 1 to which a first configuration example of carrier trapping regions 91 according to a second modification example is applied. FIG. 49B is an enlarged view of a region XLIXB shown in FIG. 49A.

In the following, an example where the carrier trapping regions 91 are formed in place of the carrier trapping regions 15 according to the first preferred embodiment (see FIG. 2, etc.) shall be described for the sake of convenience. In the following, structures described for the semiconductor device 1 are provided with the same reference signs and description thereof shall be omitted.

Each carrier trapping region 91 includes crystal defects that are selectively introduced into the $n^-$-type epitaxial layer 12 and has the same properties as the carrier trapping regions 15.

In this configuration example, each carrier trapping region 91 is formed in a column shape, extending along the thickness direction of the $n^-$-type epitaxial layer 12 and having a side portion of uneven shape.

A distance DC between carrier trapping regions 91 may be not less than 0.5 μm and not more than 10 μm. More specifically, the distance DC is a distance along the second direction B between a central portion of one carrier trapping region 91 and a central portion of another carrier trapping region 91.

Each carrier trapping region 91 includes wide-width regions 92 and narrow-width regions 93. Each narrow-width region 93 has, in regard to the second direction B, a width WW4 that is smaller than a width WW3 of each wide-width region 92 (WW4<WW3). The width WW3 of the wide-width regions 92 and the width WW4 of the narrow-width regions 93 may be not less than 0.1 μm and not more than 10 μm.

The wide-width regions 92 and the narrow-width regions 93 are formed alternately a plurality of times along the thickness direction of the $n^-$-type epitaxial layer 12. In this configuration example, five wide-width regions 92 and four narrow-width regions 93 are formed.

Each carrier trapping region 91 may also be regarded as being of a configuration where a plurality of divided portions (wide-width regions 92) formed at intervals along the thickness direction of the $n^-$-type epitaxial layer 12 are mutually connected by crystal defects (narrow-width regions 93) formed in between the divided portions.

Each carrier trapping region 91 includes an upper first region 94 and a lower second region 95. The first region 94 is positioned upper than the intermediate region C of the $n^-$-type epitaxial layer 12. The second region 95 is positioned lower than the intermediate region C of the $n^-$-type epitaxial layer 12. In FIG. 49A and FIG. 49B, the intermediate region C is indicated by an alternate long and two short dashed line.

In this configuration example, the first region 94 is exposed from the first main surface 3 of the $n^-$-type epitaxial layer 12. A wide-width region 92 is exposed from the first main surface 3 of the $n^-$-type epitaxial layer 12. In this configuration example, the second region 95 is connected to the $n^+$-type semiconductor substrate 11. A wide-width region 92 is connected to the $n^+$-type semiconductor substrate 11.

Figure 50:
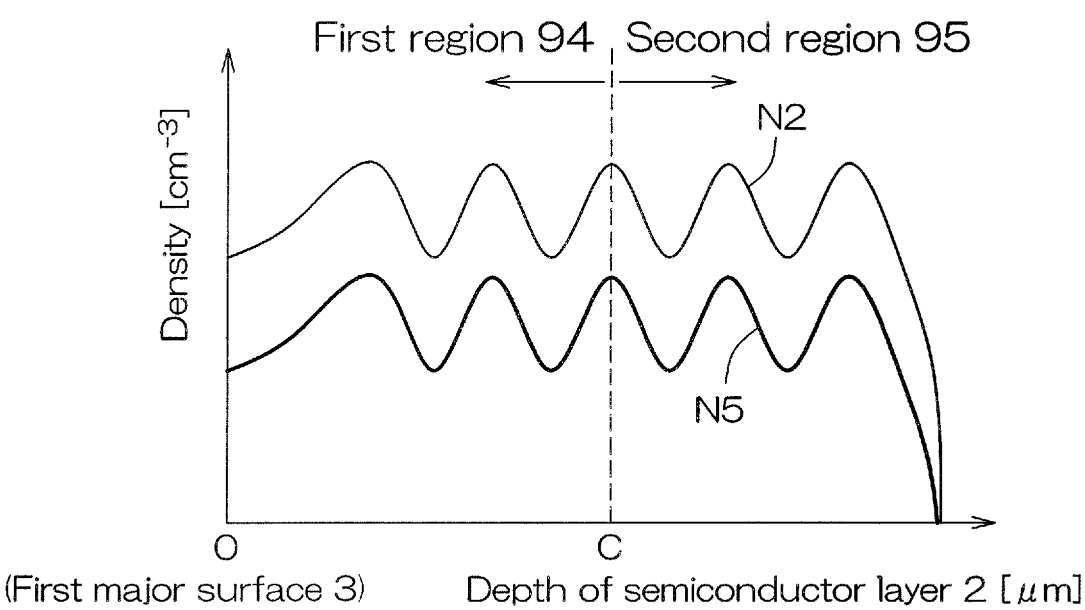
FIG. 50 is a graph of an impurity density and a defect density of each carrier trapping region shown in FIG. 49A.

FIG. 50 is a graph of an impurity density N5 and a crystal defect density N2 of each carrier trapping region 91 shown in FIG. 49A. The impurity density N5 of the carrier trapping region 91 refers to the density of light ions, electrons, or neutrons, etc., introduced into the $n^-$-type epitaxial layer 12.

In FIG. 50, the ordinate expresses the density [$cm^{-3}$] and the abscissa indicates the depth [μm] of the $n^-$-type epitaxial layer 12 when the first main surface 3 of the $n^-$-type epitaxial layer 12 is defined as zero.

The impurity density N5 of the carrier trapping region 91 has five maxima and four minima along the thickness direction of the $n^-$-type epitaxial layer 12. The five maxima of the impurity density N5 respectively correspond to the five wide-width regions 92.

The four minima of the impurity density N5 respectively correspond to the four narrow-width regions 93. An impurity density N5 of the wide-width regions 92 is not less than an impurity density N5 of the narrow-width regions 93.

On the other hand, the carrier trapping region 91 has the crystal defect density N2 not less than the impurity density N5 (N2≥N5). The crystal defect density N2 of the carrier trapping region 91 has five maxima and four minima along the thickness direction of the $n^-$-type epitaxial layer 12. The five maxima of the crystal defect density N2 respectively correspond to the five wide-width regions 92.

The four minima of the crystal defect density N2 respectively correspond to the four narrow-width regions 93. A crystal defect density N2 of the wide-width regions 92 is not less than a crystal defect density N2 of the narrow-width regions 93.

Referring to FIG. 49A and FIG. 49B, the $n^-$-type epitaxial layer 12 has first portions 96 and second portions 97 having mutually different distances in regard to the second direction B in each region between two mutually adjacent carrier trapping regions 91.

The first portions 96 are positioned in regions between the wide-width regions 92 of the two mutually adjacent carrier trapping regions 91. The second portions 97 are positioned in regions between the narrow-width regions 93 of the two mutually adjacent carrier trapping regions 91. A first width L1 along the second direction B of each first portion 96 is not less than a second width L2 along the second direction B of each second portion 97 (L1≥L2).

Figure 51:
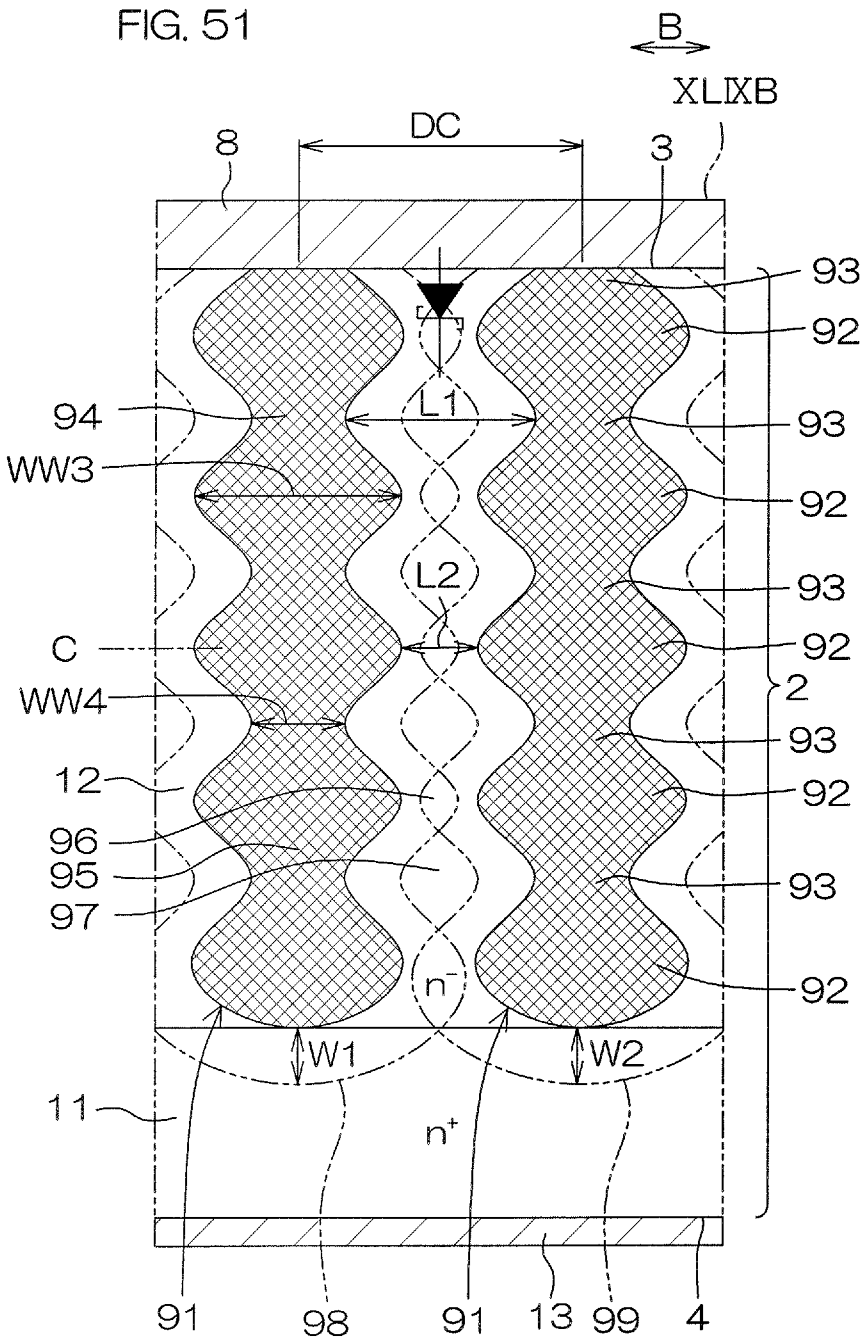
FIG. 51 is an enlarged view of a portion corresponding to FIG. 49B and is a sectional view for describing depletion layers spreading from the carrier trapping regions shown in FIG. 49A.

FIG. 51 is an enlarged view of a portion corresponding to FIG. 49B and is a sectional view for describing depletion layers spreading from the carrier trapping regions 91 shown in FIG. 49A.

The second width L2 of each second portion 97 may be not more than a sum W1+W2 of a first width W1 of a first depletion layer 98 spreading from one carrier trapping region 91 and a second width W2 of a second depletion layer 99 spreading from the other carrier trapping region 91 (L2≤W1+W2).

When L2≤W1+W2 is satisfied, the first depletion layer 98 and the second depletion layer 99 overlap mutually in the second portions 97. The second portions 97 are thereby depleted. Concentration of electric field in the second portions 97 can thereby be relaxed and a short-circuit capacity can thus be increased.

On the other hand, the first width L1 of the first portion 96 may be not less than the sum W1+W2 of the first width W1 of the first depletion layer 98 and the second width W2 of the second depletion layer 99 (L1≥W1+W2). Obviously, it may instead be such that L1≤W1+W2.

Even with this configuration example described above, the same effects as the effects described for the semiconductor device 1 can be exhibited.

FIG. 52A to FIG. 52E are enlarged views of a portion corresponding to FIG. 49B and are sectional views for describing an example of a method for forming the carrier trapping regions 91 shown in FIG. 49A. The method for forming the carrier trapping regions 91 can be incorporated in the steps for forming the carrier trapping regions 15 (step S15 and step S16) described above and shown in FIG. 15.

Figure 52A:
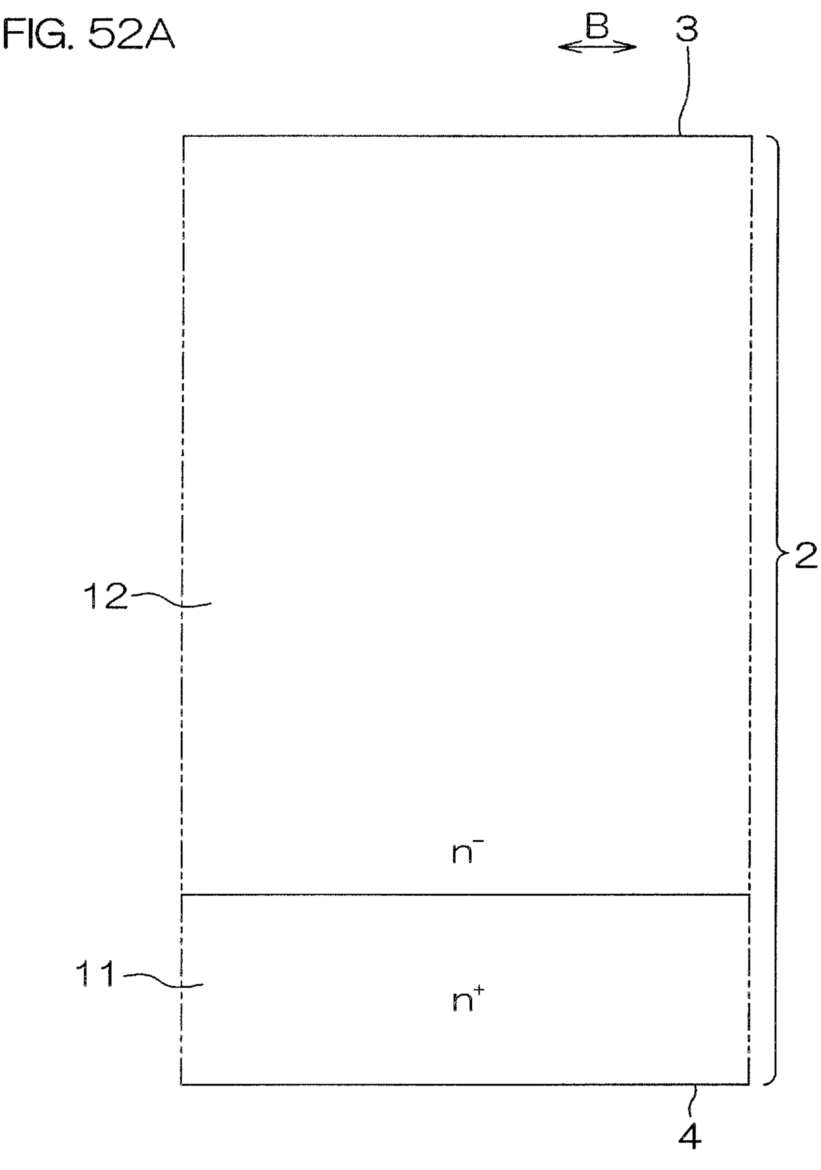
FIG. 52A is an enlarged view of a portion corresponding to FIG. 49B and is a sectional view for describing an example of a method for forming the carrier trapping regions shown in FIG. 49A.

Referring to FIG. 52A, first, the $n^+$-type semiconductor substrate 11 is prepared. Next, in parallel to introducing the n-type impurity, SiC is epitaxially grown from a main surface of the $n^+$-type semiconductor substrate 11.

The $n^-$-type epitaxial layer 12 is thereby formed on the $n^+$-type semiconductor substrate 11. The first main surface 3 is formed by the $n^-$-type epitaxial layer 12 and the second main surface 4 is formed by the $n^+$-type semiconductor substrate 11.

Figure 52B:
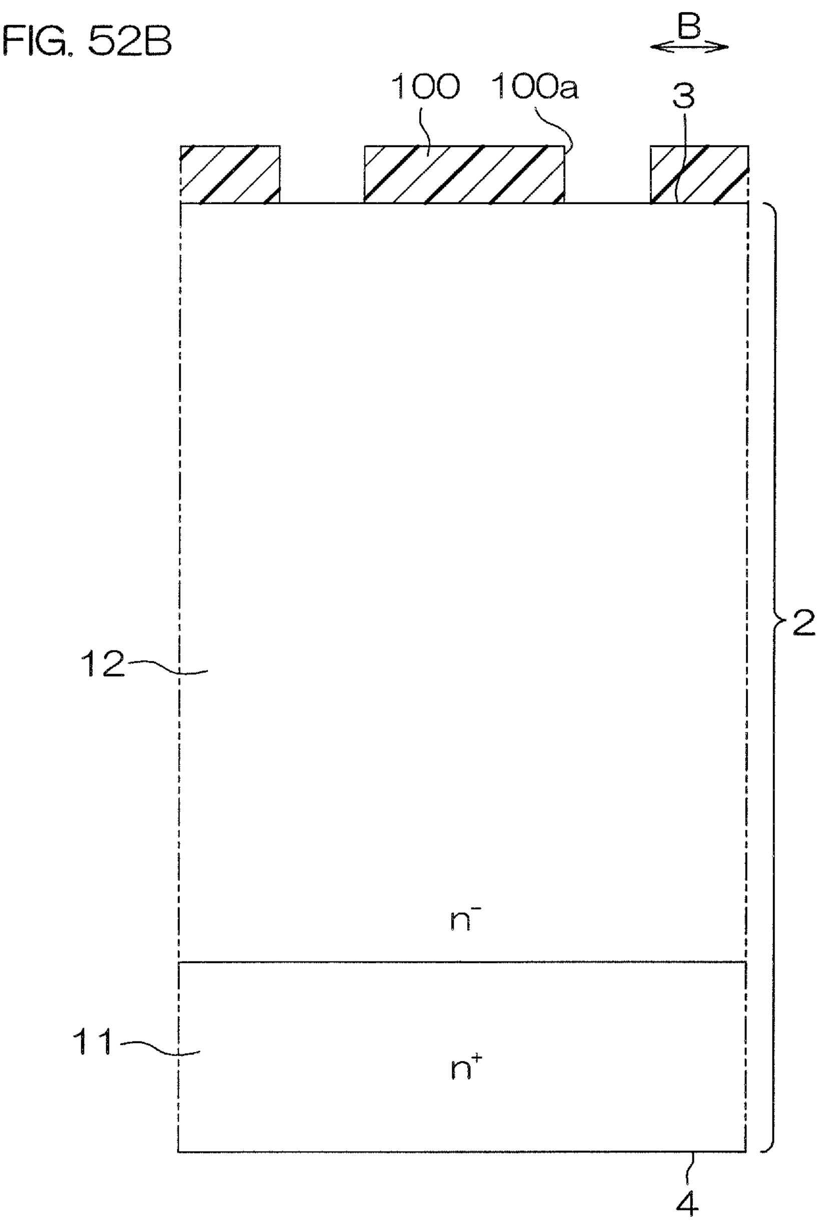
FIG. 52B is a sectional view of a step subsequent to that of FIG. 52A.

Next, referring to FIG. 52B, a mask 100 having a predetermined pattern is formed on the first main surface 3 of the $n^-$-type epitaxial layer 12. The mask 100 has openings **100*a* exposing regions at which the carrier trapping regions 91** are to be formed.

Figure 52C:
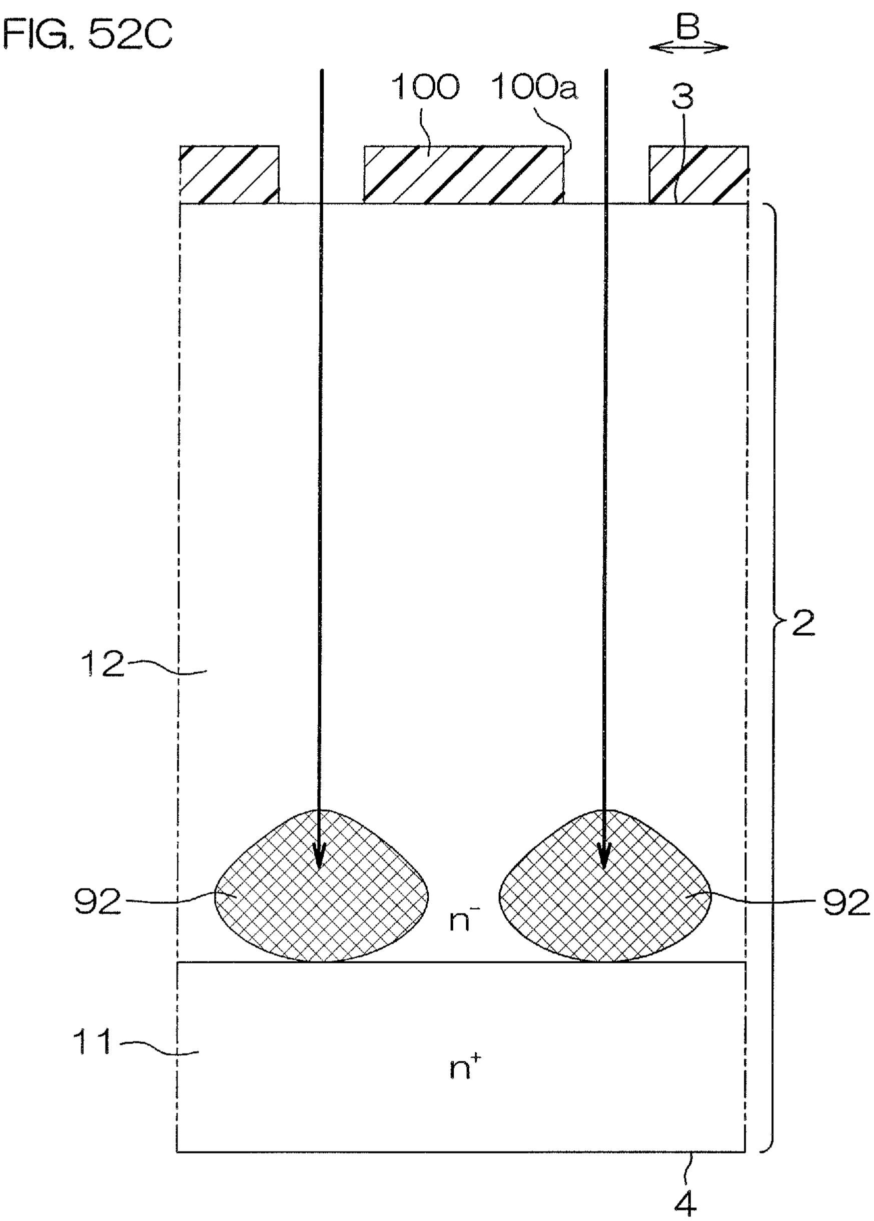
FIG. 52C is a sectional view of a step subsequent to that of FIG. 52B.

Next, referring to FIG. 52C, light ions, electrons, or neutrons, etc., are irradiated onto the $n^-$-type epitaxial layer 12 via the mask 100. The light ions may include at least one type of ions among hydrogen ions ($H^+$), helium ions ($He^+$), and boron ions ($B^+$).

In the present step, the regions of the $n^-$-type epitaxial layer 12 in which the crystal defects are to be introduced are set by adjusting the irradiation energy (acceleration voltage applied by the irradiating apparatus) of the light ions, electrons, or neutrons, etc.

In the present step, the light ions, electrons, or neutrons, etc., are driven into the $n^-$ -type epitaxial layer 12 down to a vicinity of the boundary region of the $n^+$-type semiconductor substrate 11 and the $n^-$-type epitaxial layer 12.

Lowermost wide-width regions 92 of the carrier trapping regions 91 are thereby formed. An upper portion of each lowermost wide-width region 92 is formed to a convergent shape with which a width along the second direction B decreases gradually toward the first main surface 3 of the $n^-$-type epitaxial layer 12.

Figure 52D:
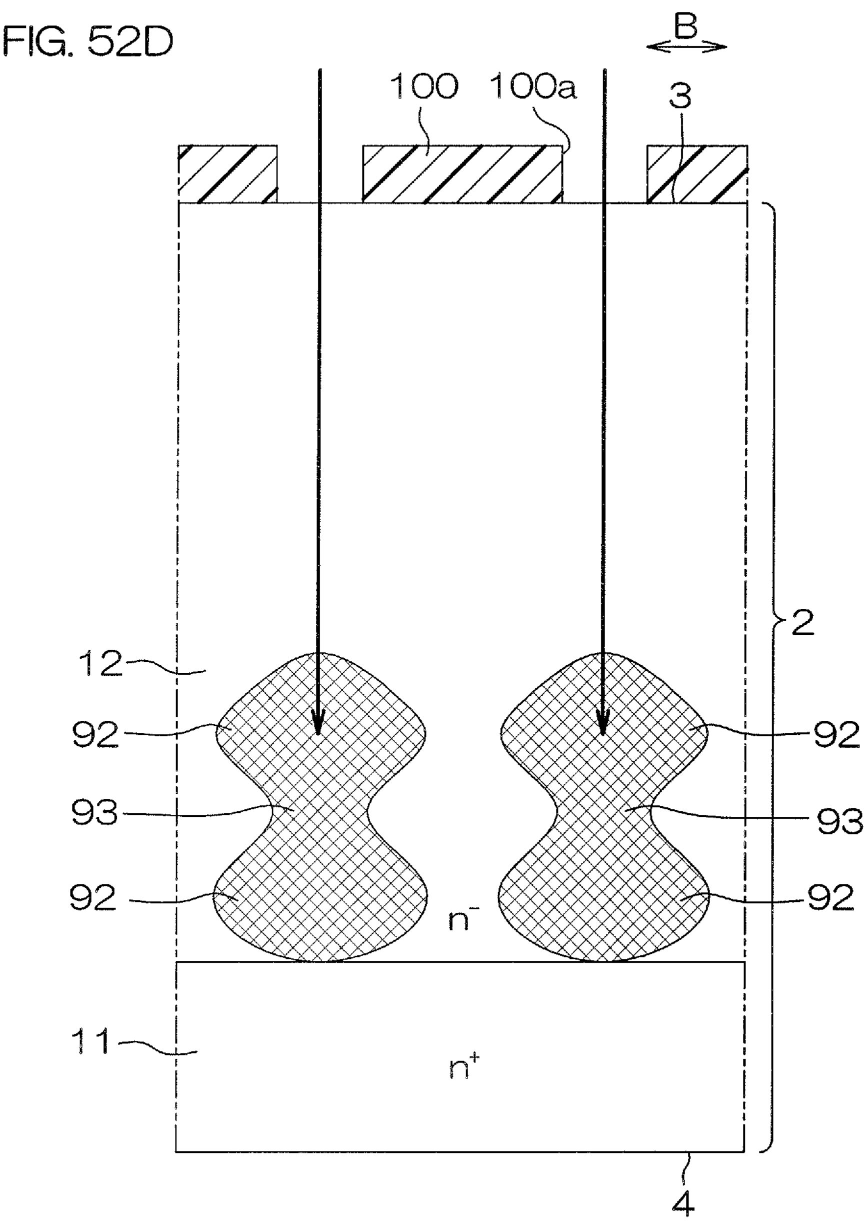
FIG. 52D is a sectional view of a step subsequent to that of FIG. 52C.

Next, referring to FIG. 52D, the light ions, electrons, or neutrons, etc., are irradiated onto the $n^-$-type epitaxial layer 12 via the mask 100. The light ions may include at least one type of ions among hydrogen ions ($H^+$), helium ions ($He^+$), and boron ions ($B^+$).

In the present step, the light ions, electrons, or neutrons, etc., are irradiated onto regions of the $n^-$-type epitaxial layer 12 upper than the lowermost wide-width regions 92. Second wide-width regions 92 are thereby formed in the regions of the $n^-$-type epitaxial layer 12 upper than the lowermost wide-width regions 92.

A lower portion of each second wide-width region 92 is formed such as to be connected to the upper portion of a lowermost wide-width region 92. Narrow-width regions 93 of the carrier trapping regions 91 are formed by connection portions between the lowermost wide-width regions 92 and the second wide-width regions 92. An upper portion of each second wide-width region 92 is formed to a convergent shape with which a width along the second direction B decreases gradually toward the first main surface 3 of the $n^-$-type epitaxial layer 12.

Figure 52E:
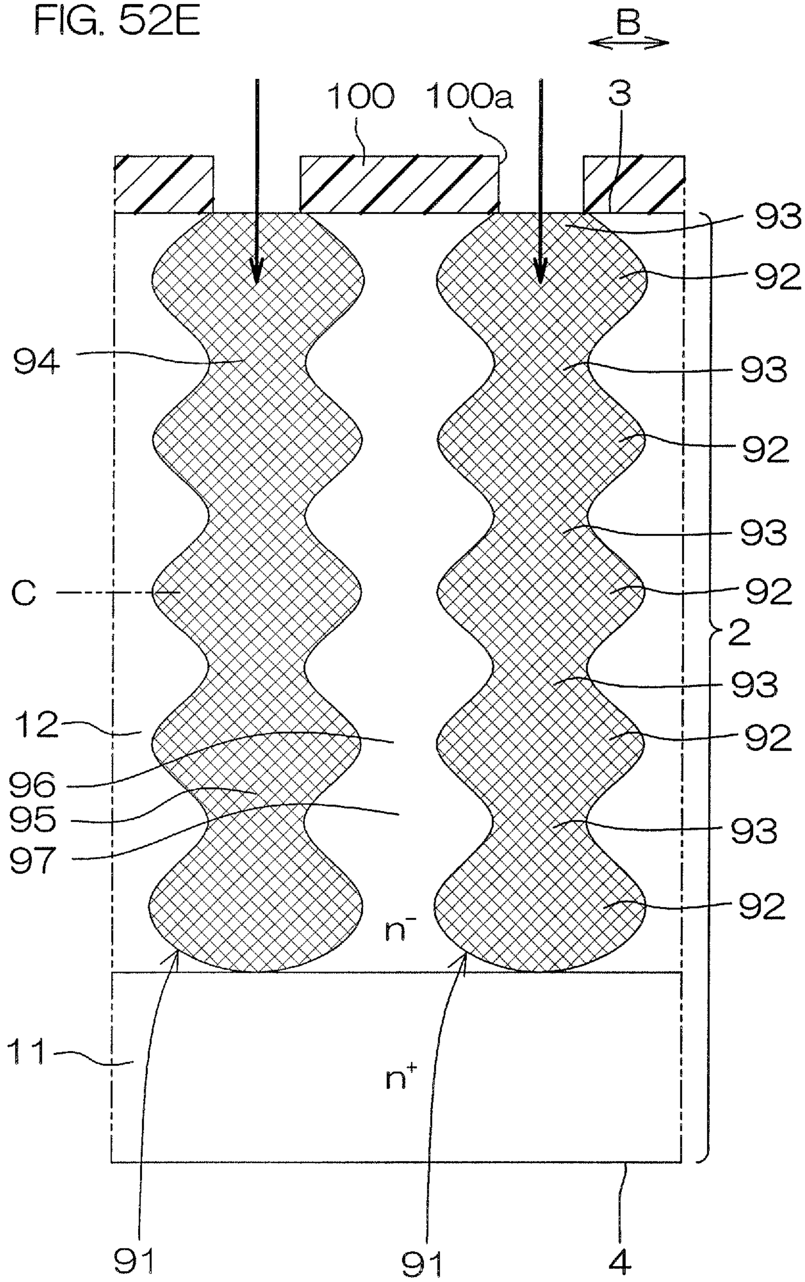
FIG. 52E is a sectional view of a step subsequent to that of FIG. 52D.

Next, with reference to FIG. 52E, the same method as that of FIG. 52D is repeated to irradiate the light ions, electrons, or neutrons, etc., in multiple steps in a shallowing direction toward the first main surface 3 of the $n^-$-type epitaxial layer 12. The carrier trapping regions 91 each including the plurality of wide-width regions 92 and the plurality of narrow-width regions 93 formed alternately with respect to each other along the thickness direction of the $n^-$-type epitaxial layer 12 are thereby formed.

Thereafter, a portion of the crystal defects formed in the $n^-$-type epitaxial layer 12 may be recovered by the annealing treatment method. The annealing treatment method may be performed under an atmosphere of less than 1500° C. (for example, not more than 1200° C.).

Besides the first preferred embodiment, the carrier trapping regions 91 can also be applied to any of the second preferred embodiment to the fourth preferred embodiment. The carrier trapping regions 91 may be incorporated in any of the configurations shown in FIG. 2, FIG. 4, FIG. 5, FIG. 6, FIG. 7, FIG. 9, FIG. 18, FIG. 19, FIG. 20, FIG. 21, FIG. 22, FIG. 24, FIG. 32, etc. Other configuration examples of the carrier trapping regions 91 shall now be described.

Figure 53:
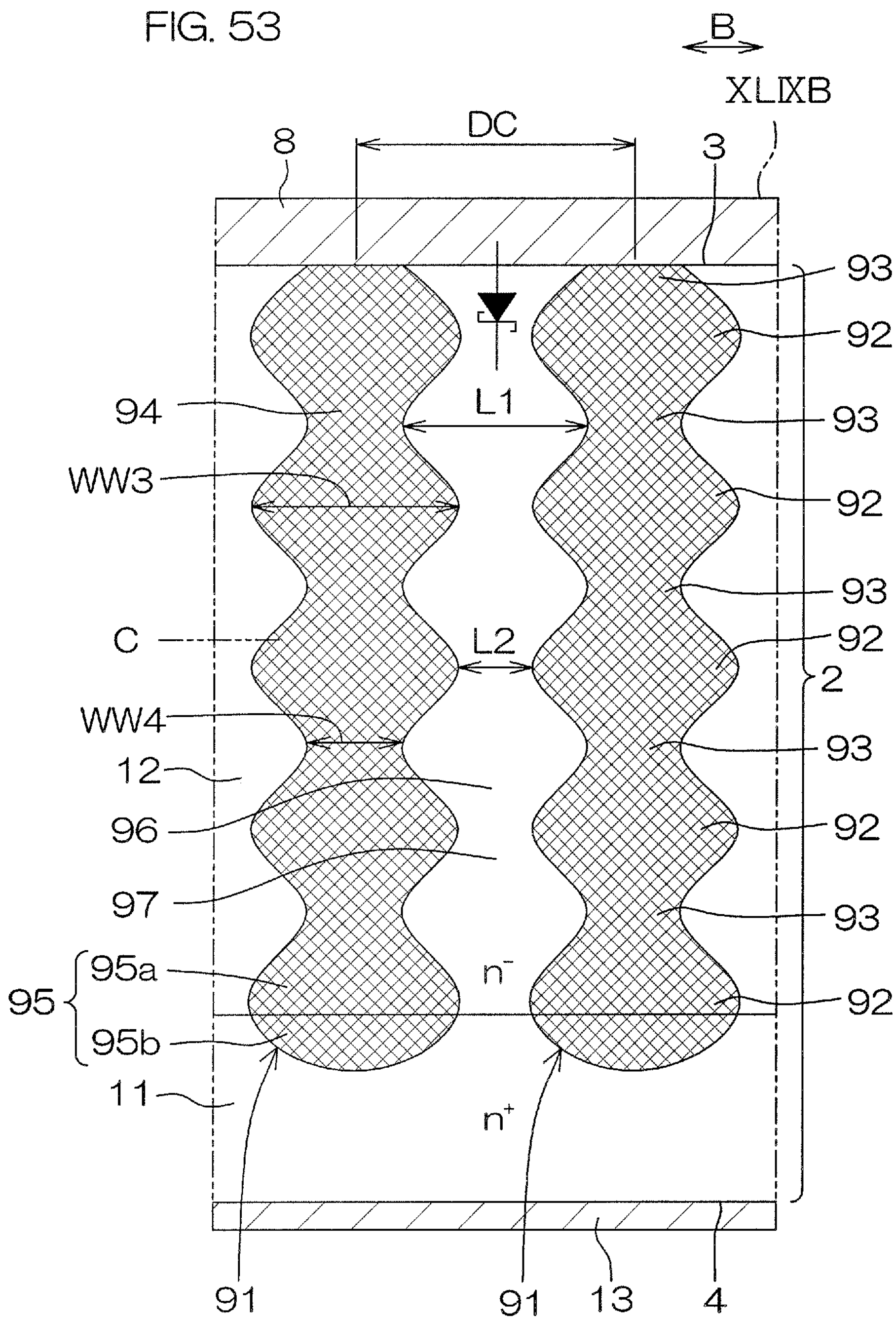
FIG. 53 is an enlarged view of a portion corresponding to FIG. 49B and is a sectional view showing a second configuration example of the carrier trapping regions shown in FIG. 49A.

FIG. 53 is an enlarged view of a portion corresponding to FIG. 49B and is a sectional view showing a second configuration example of the carrier trapping regions 91 shown in FIG. 49A. Structures in FIG. 53 corresponding to structures described in FIG. 49A and FIG. 49B are provided with the same reference signs and description thereof shall be omitted.

Referring to FIG. 53, in this configuration example, the second region 95 of each carrier trapping region 91 is connected to the $n^+$-type semiconductor substrate 11. The second region 95 includes a first portion **95*a* formed inside the $n^-$-type epitaxial layer 12 and a second portion 95*b* formed inside the $n^+$-type semiconductor substrate 11**.

A crystal defect density N2 of the first portion **95*a* is higher than the n-type impurity density N1 of the $n^-$-type epitaxial layer 12 (N2>N1). A crystal defect density N2 of the second portion 95*b* is lower than the n-type impurity density N3 of the $n^+$-type semiconductor substrate 11 (N2<N3). Functioning virtually as an acceptor is suppressed in the second portion 95*b* of the second region 95**.

A maximum of the impurity density N5 and a maximum of the crystal defect density N2 in the second region 95 may be positioned inside the n⁻-type epitaxial layer 12 (see also FIG. 50). A maximum of the impurity density N5 and a maximum of the crystal defect density N2 in the second region 95 may be positioned inside the n⁺-type semiconductor substrate 11 (see also FIG. 50).

Figure 54:
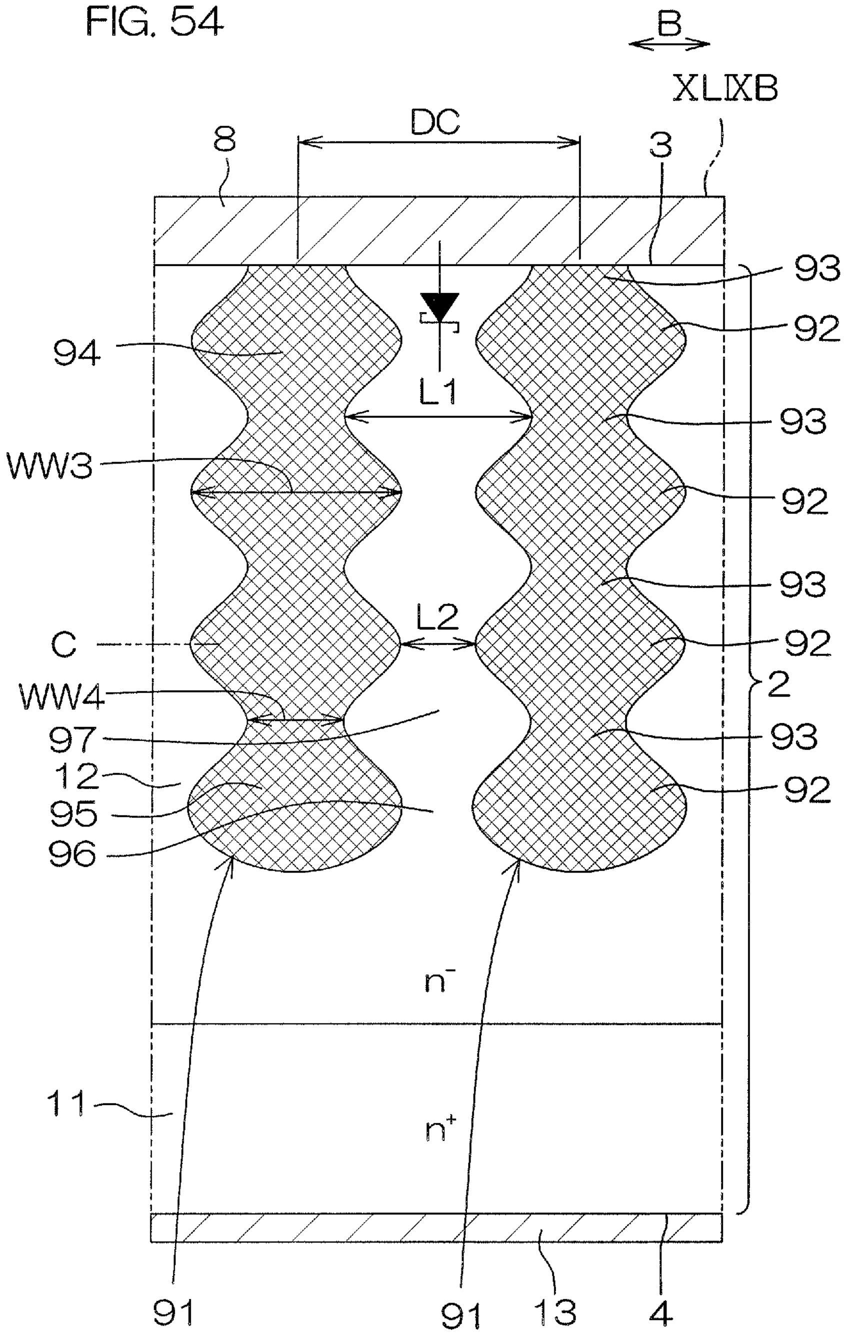
FIG. 54 is an enlarged view of a portion corresponding to FIG. 49B and is a sectional view showing a third configuration example of the carrier trapping regions shown in FIG. 49A.

FIG. 54 is an enlarged view of a portion corresponding to FIG. 49B and is a sectional view showing a third configuration example of the carrier trapping regions 91 shown in FIG. 49A. Structures in FIG. 54 corresponding to structures described in FIG. 49A and FIG. 49B are provided with the same reference signs and description thereof shall be omitted.

Referring to FIG. 54, in this configuration example, the second region 95 of each carrier trapping region 91 is formed across an interval to the first main surface 3 side from the n⁺-type semiconductor substrate 11. A portion of the n⁻-type epitaxial layer 12 is interposed in a region between the second region 95 and the n⁺-type semiconductor substrate 11.

Figure 55:
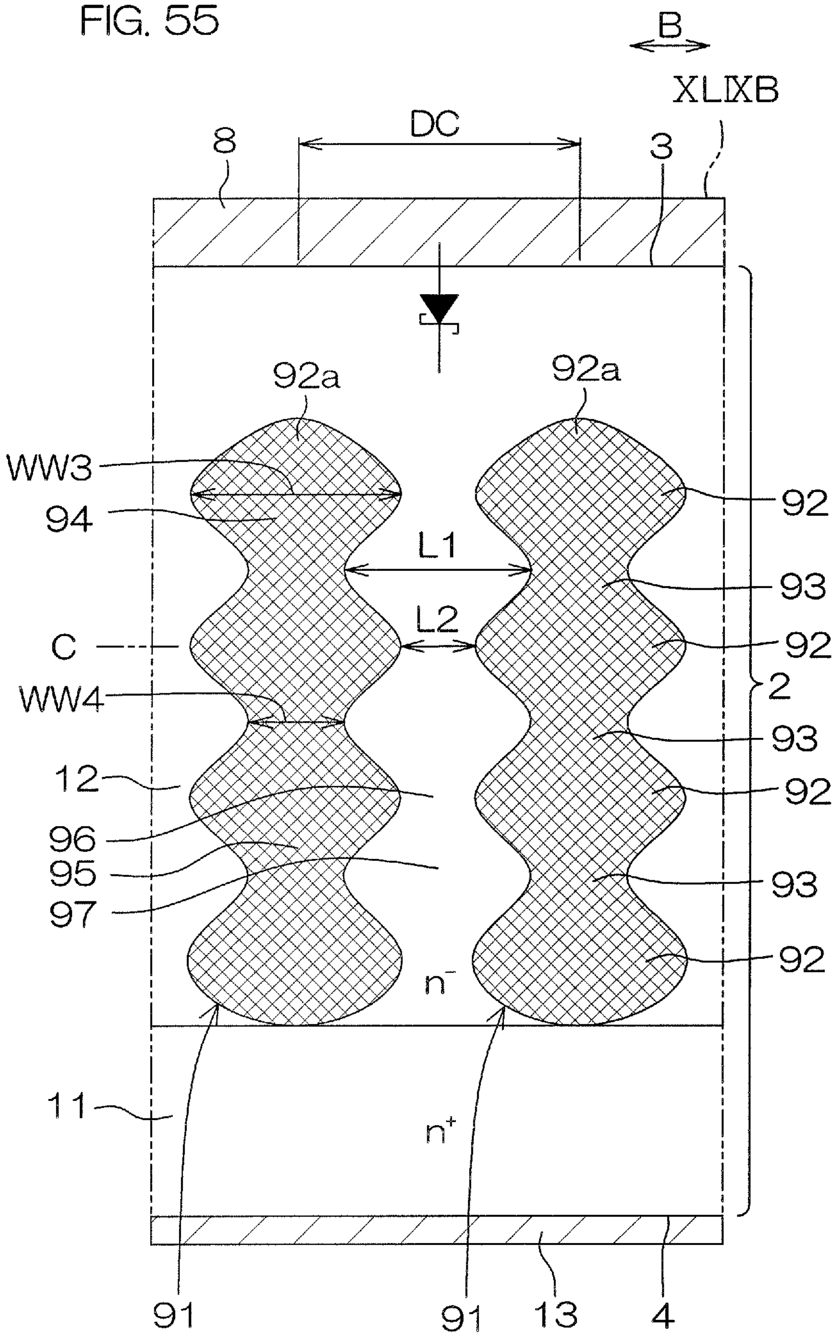
FIG. 55 is an enlarged view of a portion corresponding to FIG. 49B and is a sectional view showing a fourth configuration example of the carrier trapping regions shown in FIG. 49A.

FIG. 55 is an enlarged view of a portion corresponding to FIG. 49B and is a sectional view showing a fourth configuration example of the carrier trapping regions 91 shown in FIG. 49A. Structures in FIG. 55 corresponding to structures described in FIG. 49A and FIG. 49B are provided with the same reference signs and description thereof shall be omitted.

Referring to FIG. 55, in this configuration example, the first region 94 of each carrier trapping region 91 is formed across an interval to the second main surface 4 side from the first main surface 3 of the n⁻-type epitaxial layer 12. A portion of the n⁻-type epitaxial layer 12 is interposed in a region between the first region 94 and the first main surface 3.

In this configuration example, an upper portion 92*a* of an uppermost wide-width region 92 of each carrier trapping region 91 is formed to a convergent shape with which a width WW1 along the second direction B decreases gradually toward the first main surface 3 of the n⁻ type epitaxial layer 12.

Figure 56:
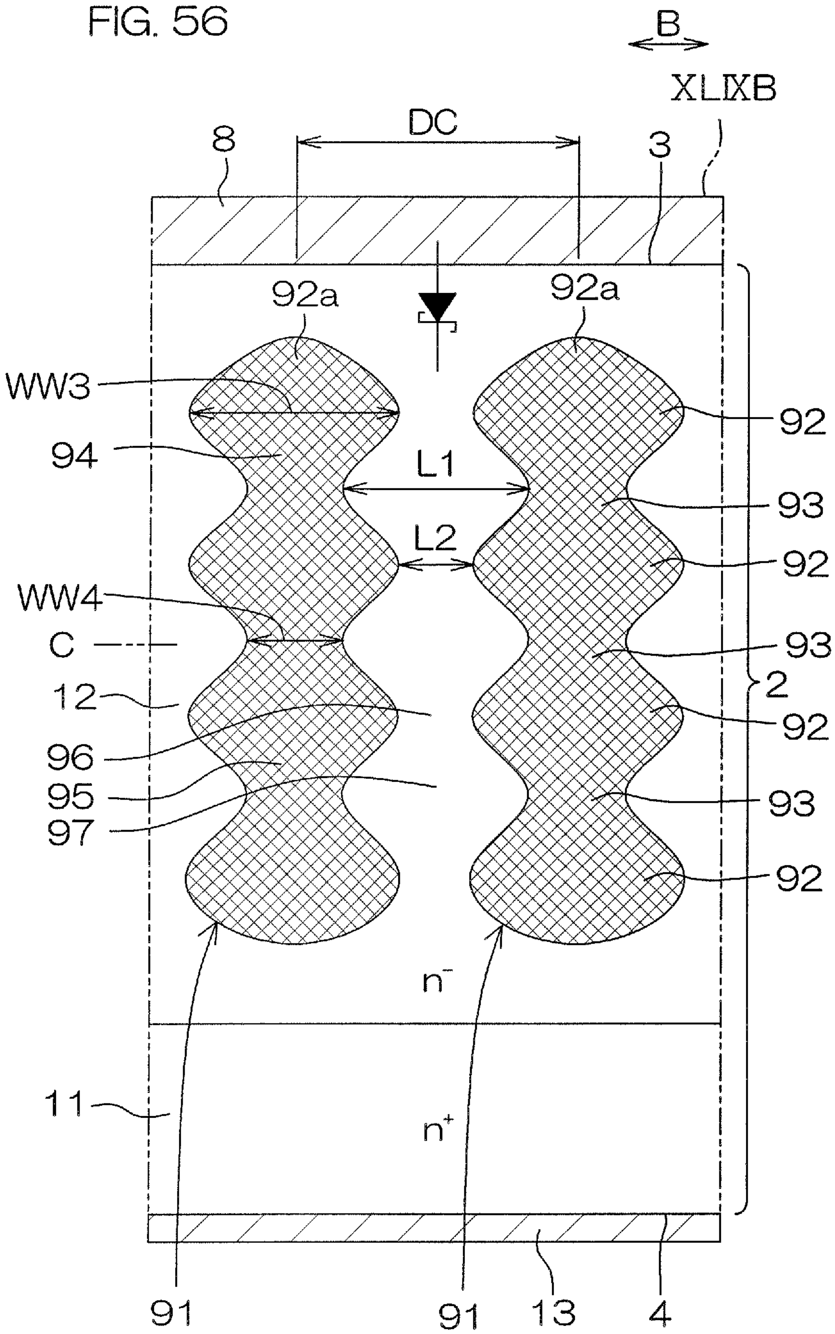
FIG. 56 is an enlarged view of a portion corresponding to FIG. 49B and is a sectional view showing a fifth configuration example of the carrier trapping regions shown in FIG. 49A.

FIG. 56 is an enlarged view of a portion corresponding to FIG. 49B and is a sectional view showing a fifth configuration example of the carrier trapping regions 91 shown in FIG. 49A. Structures in FIG. 56 corresponding to structures described in FIG. 49A and FIG. 49B are provided with the same reference signs and description thereof shall be omitted.

Referring to FIG. 56, in this configuration example, the carrier trapping regions 91 are floated in the interior of the n⁻-type epitaxial layer 12.

That is, the first region 94 of each carrier trapping region 91 is formed across an interval to the second main surface 4 side from the first main surface 3 of the n⁻-type epitaxial layer 12. A portion of the n⁻-type epitaxial layer 12 is interposed in a region between the first region 94 and the first main surface 3.

In this configuration example, the upper portion 92*a* of the uppermost wide-width region 92 of each carrier trapping region 91 is formed to a convergent shape with which the width WW1 along the second direction B decreases gradually toward the first main surface 3 of the n⁻-type epitaxial layer 12.

The second region 95 of each carrier trapping region 91 is formed across an interval to the first main surface 3 side from the n⁺-type semiconductor substrate 11. A portion of the n⁻-type epitaxial layer 12 is interposed in a region between the second region 95 and the n⁺-type semiconductor substrate 11.

Figure 57:
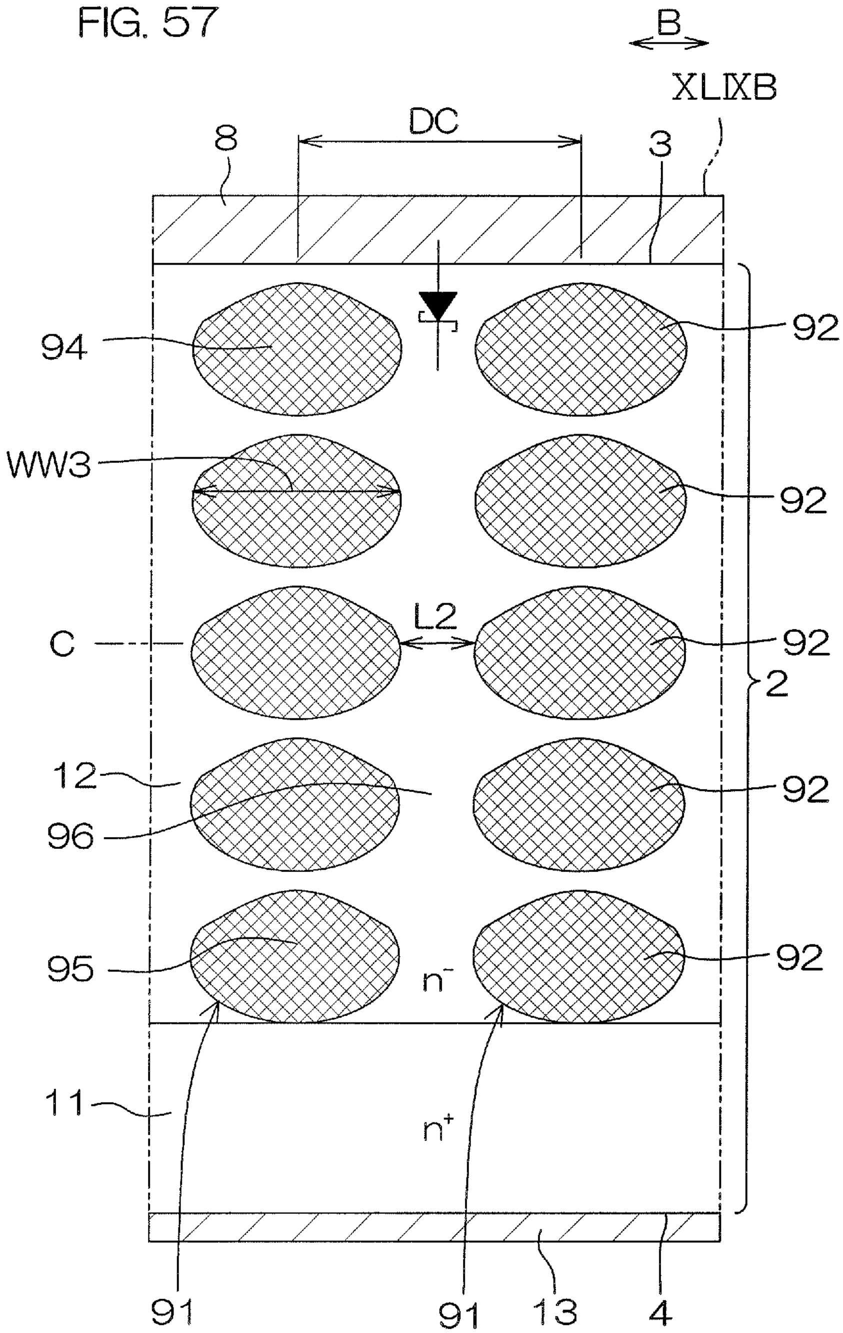
FIG. 57 is an enlarged view of a portion corresponding to FIG. 49B and is a sectional view showing a sixth configuration example of the carrier trapping regions shown in FIG. 49A.

FIG. 57 is an enlarged view of a portion corresponding to FIG. 49B and is a sectional view showing a sixth configuration example of the carrier trapping regions 91 shown in FIG. 49A. Structures in FIG. 57 corresponding to structures described in FIG. 49A and FIG. 49B are provided with the same reference signs and description thereof shall be omitted.

Referring to FIG. 57, in this configuration example, the carrier trapping regions 91 lack the narrow-width regions 93. The plurality of wide-width regions 92 are formed as divided regions at intervals from each other along the thickness direction of the n⁻-type epitaxial layer 12.

In a case where the carrier trapping regions 91 according to any of the first configuration example to the sixth configuration example described above are applied as the carrier trapping regions 64 of a MISFET (FIG. 18, FIG. 19, FIG. 20, FIG. 21, FIG. 22, FIG. 24, FIG. 32, etc.), the following actions and effects can be exhibited.

That is, when a short circuit occurs in a state where a high voltage is applied to the n⁻-type epitaxial layer 42, a large current can be blocked at the second portions 85 of comparatively narrow width. Heat generation at the second portions 85 can thereby be suppressed and therefore an allowable time for a short circuit due to a peripheral circuit can be designed to be longer.

On the other hand, when a conducting state voltage is applied to the n⁻-type epitaxial layer 42, current paths can be secured at the first portions 96 of comparatively wide width. Increase of on resistance can thereby be suppressed using the first portions 96.

Figure 58A:
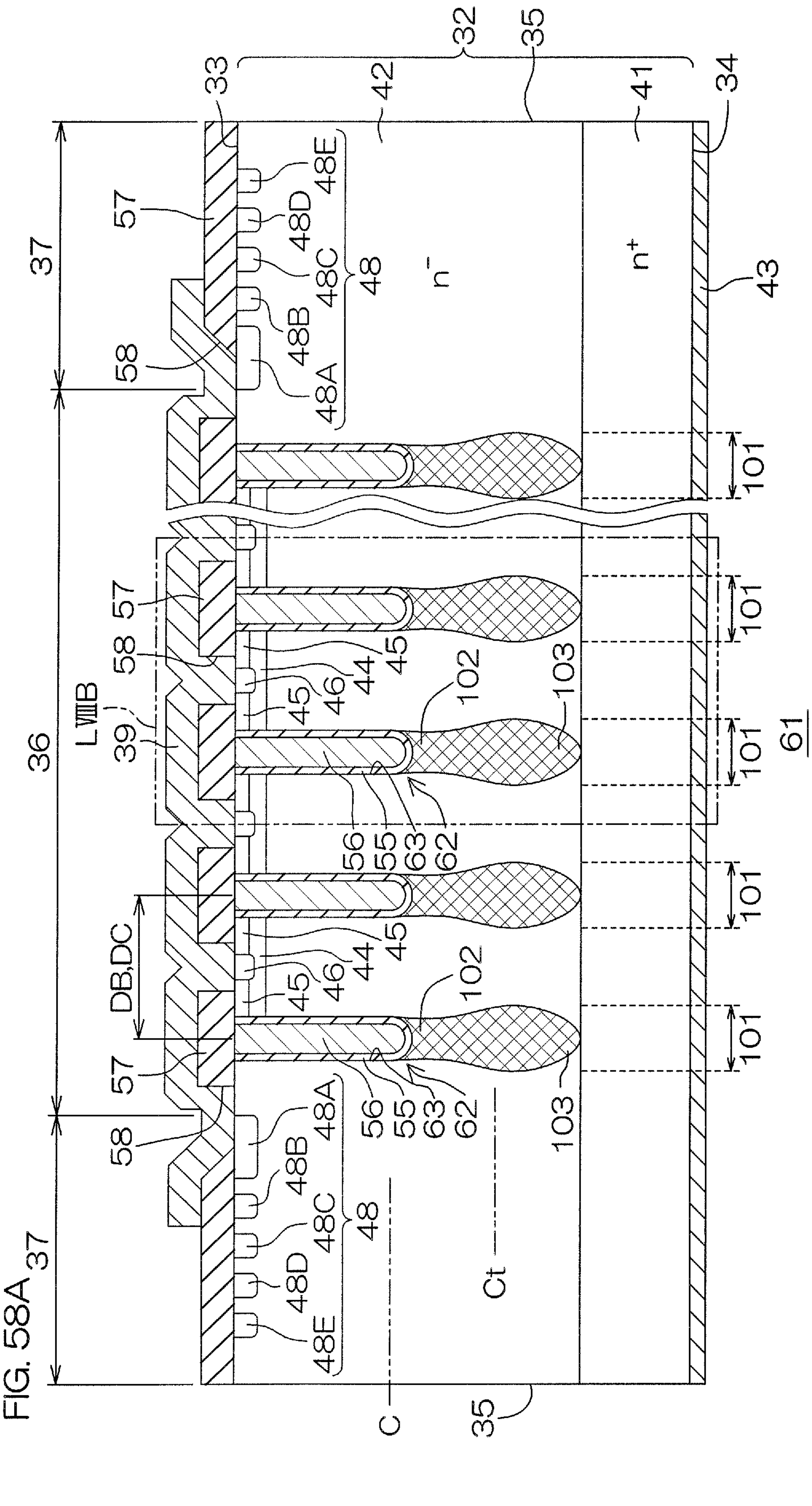
FIG. 58A is a sectional view of a portion corresponding to FIG. 2 and is a sectional view showing the semiconductor device to which a first configuration example of carrier trapping regions according to a third modification example is applied.
Figure 58B:
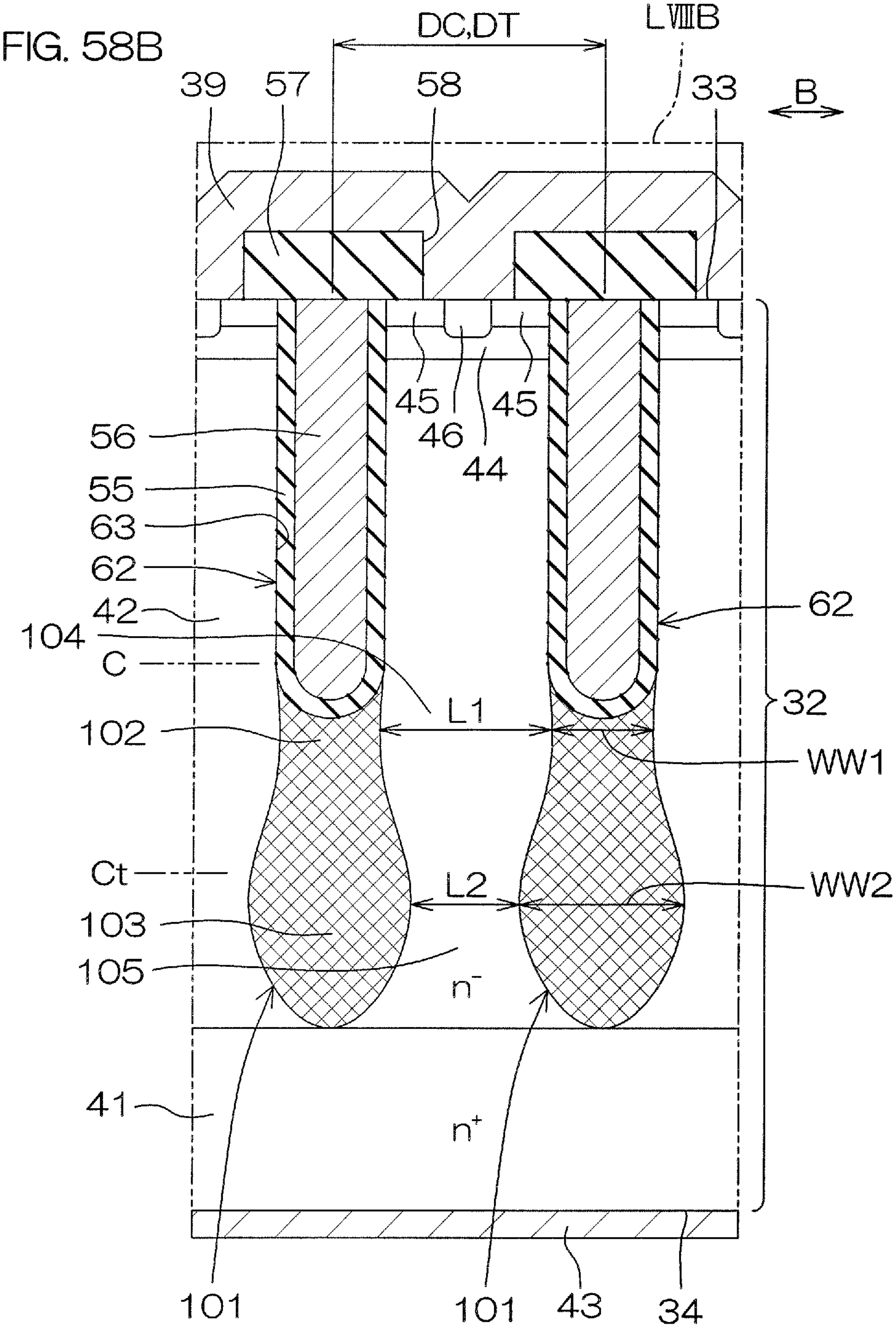
FIG. 58B is an enlarged view of a region LVIIIB shown in FIG. 58A.

FIG. 58A is a sectional view of a portion corresponding to FIG. 2 and is a sectional view showing the semiconductor device 61 to which a first configuration example of carrier trapping regions 101 according to a third modification example is applied. FIG. 58B is an enlarged view of a region LVIIIB shown in FIG. 58A.

In the following, an example where the carrier trapping regions 101 are formed in place of the carrier trapping regions 64 according to the third preferred embodiment (see FIG. 26, etc.) shall be described for the sake of convenience. In the following, structures described for the semiconductor device 61 are provided with the same reference signs and description thereof shall be omitted.

Each carrier trapping region 101 includes crystal defects that are selectively introduced into the n⁻-type epitaxial layer 42 and has the same properties as the carrier trapping regions 64.

Each carrier trapping region 101 is formed in a region of the n⁻-type epitaxial layer 42 lower than the bottom wall of a gate trench 63. The carrier trapping region 101 overlaps with the gate trench 63 in plan view. In this configuration example, the carrier trapping region 101 extends along the first direction A such as to be oriented along the gate trench 63.

A distance DC between carrier trapping regions 101 is substantially equal to the distance DT between trench gate structures 62. The distance DC may be not less than 0.5 μm and not more than 10 μm.

More specifically, the distance DC is a distance along the second direction B between a central portion of one carrier trapping region 101 and a central portion of another carrier trapping region 101. The distance DT is, more specifically, a distance along the second direction B between a central portion of one trench gate structure 62 and a central portion of another trench gate structure 62.

The respective carrier trapping regions 101 are formed in one-to-one correspondence with the respective trench gate structures 62. Each carrier trapping region 101 is formed in a column shape which extends along the thickness direction of the $n^-$-type epitaxial layer 42 and with which a lower portion bulges along the second direction B with respect to an upper portion.

Each carrier trapping region 101 includes a first region 102 positioned at an upper side and a second region 103 positioned at a lower side in a region lower than the bottom wall of a gate trench 63.

The first region 102 is positioned upper than the lower intermediate region Ct of the $n^-$-type epitaxial layer 42. The second region 103 is positioned lower than the lower intermediate region Ct of the $n^-$-type epitaxial layer 42. In FIG. 58A and FIG. 58B, the lower intermediate region Ct is indicated by an alternate long and two short dashed line.

Each first region 102 is formed in a region of the $n^-$-type epitaxial layer 42 along the bottom wall of a gate trench 63. The first region 102 may cover an edge portion connecting the side wall and the bottom wall of the gate trench 63.

In this configuration example, the first region 102 is exposed from the bottom wall of the gate trench 63. Each first region 102 faces a gate electrode 56 across a gate insulating film 55.

In this configuration example, each second region 103 is connected to the $n^+$-type semiconductor substrate 41. Each carrier trapping region 101 is formed such that a width along the second direction B increases gradually from the first region 102 toward the second region 103. The second region 103 has a shape that is bulged in the second direction B with respect to the first region 102.

A width WW1 along the second direction B of the first region 102 is not more than a width WW2 along the second direction B of the second region 103 (WW1≤WW2). The width WW1 of the first region 102 and the width WW2 of the second region 103 may be not less than 0.1 μm and not more than 10 μm.

As with the impurity density N5 of each carrier trapping region 81 described above, an impurity density N5 of each carrier trapping region 101 has a single maximum at an intermediate portion in the thickness direction of the $n^-$-type epitaxial layer 42.

The maximum of the impurity density N5 of the carrier trapping region 101 is positioned lower than the lower intermediate region Ct of the $n^-$-type epitaxial layer 42. The maximum of the impurity density N5 corresponds to a location of the carrier trapping region 101 that bulges out the most, that is, corresponds to the second region 103. An impurity density N5 of the second region 103 is not less than an impurity density N5 of the first region 102.

On the other hand, as with the crystal defect density N2 of each carrier trapping region 81 described above, a crystal defect density N2 of each carrier trapping region 101 is not less than the impurity density N5 of the carrier trapping region 101 (N2≥N5). That is, the carrier trapping region 101 has the crystal defect density N2 that is not less than the impurity density N5.

The crystal defect density N2 of the carrier trapping region 101 has a single maximum at an intermediate portion in the thickness direction of the $n^-$-type epitaxial layer 42. The maximum of the crystal defect density N2 is positioned lower than the lower intermediate region Ct of the $n^-$-type epitaxial layer 42.

The maximum of the crystal defect density N2 corresponds to the location of the carrier trapping region 101 that bulges out the most, that is, corresponds to the second region 103. The crystal defect density N2 of the second region 103 is not less than the crystal defect density N2 of the first region 102.

The $n^-$-type epitaxial layer 42 has a first portion 104 and a second portion 105 having mutually different distances in regard to the second direction B in each region between two mutually adjacent carrier trapping regions 101. A first width L1 along the second direction B of the first portion 104 is not less than a second width L2 along the second direction B of the second portion 105 (L1≥L2).

The first portion 104 of the $n^-$-type epitaxial layer 42 is positioned in a region between the first regions 102 of the two mutually adjacent carrier trapping regions 101. The second portion 105 of the $n^-$-type epitaxial layer 42 is positioned in a region between the second regions 103 of the two mutually adjacent carrier trapping regions 101.

Figure 59:
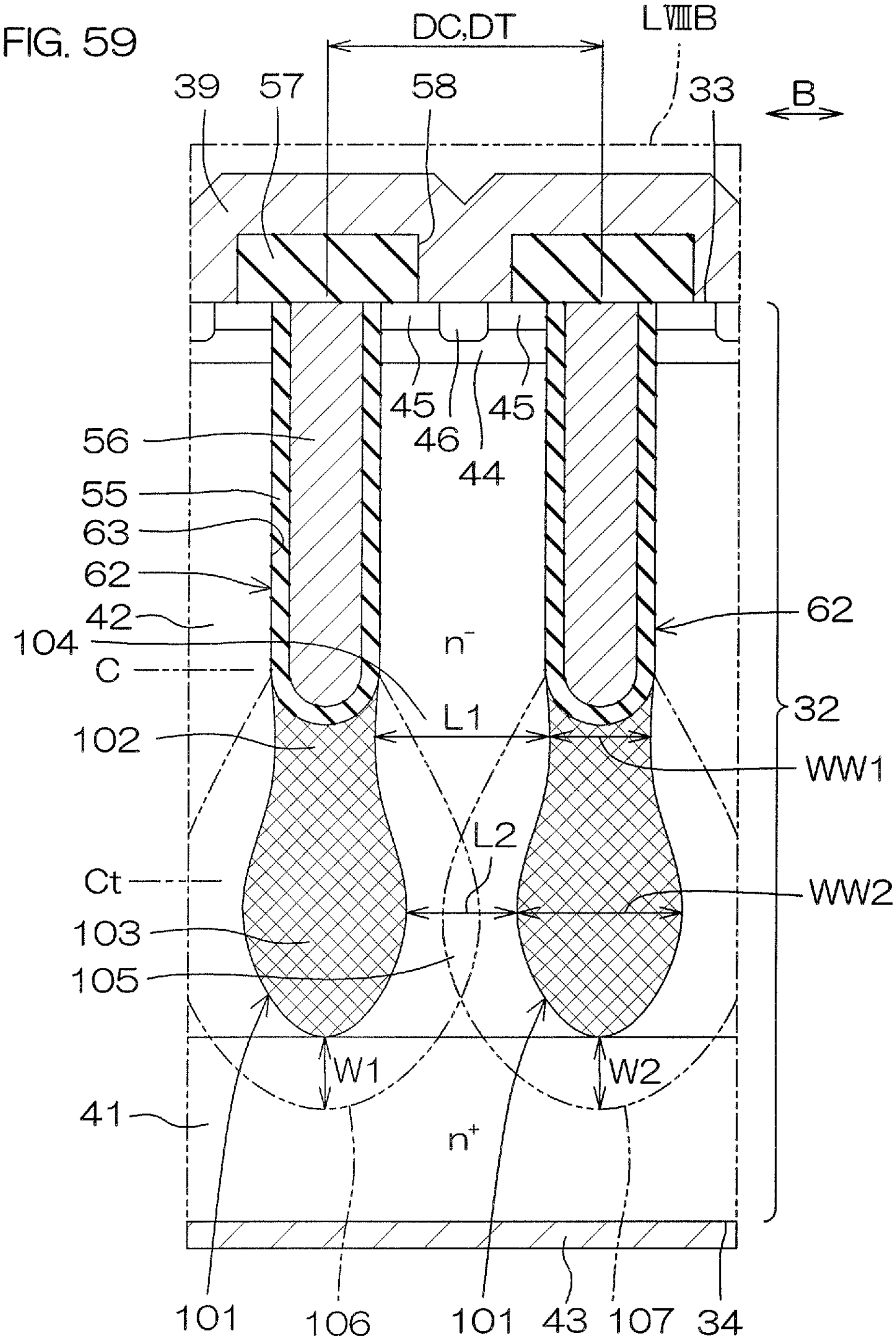
FIG. 59 is a sectional view for describing depletion layers spreading from the carrier trapping regions shown in FIG. 58A.

FIG. 59 is a sectional view for describing depletion layers spreading from the carrier trapping regions 101 shown in FIG. 58A.

The second width L2 of the second portion 105 may be not more than a sum W1+W2 of a first width W1 of a first depletion layer 106 spreading from one carrier trapping region 101 and a second width W2 of a second depletion layer 107 spreading from the other carrier trapping region 101 (L2≤W1+W2).

When L2≤W1+W2 is satisfied, the first depletion layer 106 and the second depletion layer 107 overlap mutually in the second portion 105. The second portion 105 is thereby depleted. Concentration of electric field in the second portion 105 can thereby be relaxed and a short-circuit capacity can thus be increased.

On the other hand, the first width L1 of the first portion 104 may be not less than the sum W1+W2 of the first width W1 of the first depletion layer 106 and the second width W2 of the second depletion layer 107 (L1≥W1+W2). Obviously, it may instead be such that L1≤W1+W2.

Even with this configuration example described above, the same effects as the effects described for the semiconductor device 61 can be exhibited. Also, with this configuration example, the first portions 104 of comparatively wide width and the second portions 105 of comparatively narrow width are formed in the $n^-$-type epitaxial layer 42.

For example, when a short circuit occurs in a state where a high voltage is applied to the $n^-$-type epitaxial layer 42, a large current can be blocked at the second portions 105 of comparatively narrow width. Heat generation at the second portions 105 can thereby be suppressed and therefore an allowable time for a short circuit due to a peripheral circuit can be designed to be longer.

On the other hand, when a conducting state voltage is applied to the $n^-$-type epitaxial layer 42, current paths can be secured at the first portions 104 of comparatively wide width. Increase of on resistance can thereby be suppressed using the first portions 104.

With this configuration example, an example where each second region 103 has the maximum of the impurity density N5 and the maximum of the crystal defect density N2 was described. However, in place of the second region 103, each first region 102 may have the maximum of the impurity density N5 and the maximum of the crystal defect density N2.

FIG. 60A to FIG. 60F are enlarged views of a portion corresponding to FIG. 58B and are sectional views for describing an example of a method for forming the carrier trapping regions 101 shown in FIG. 58A. The method for forming the carrier trapping regions 101 can be incorporated in the steps for forming the carrier trapping regions 64 (step S15 and step S16) shown in FIG. 25 described above.

Figure 60A:
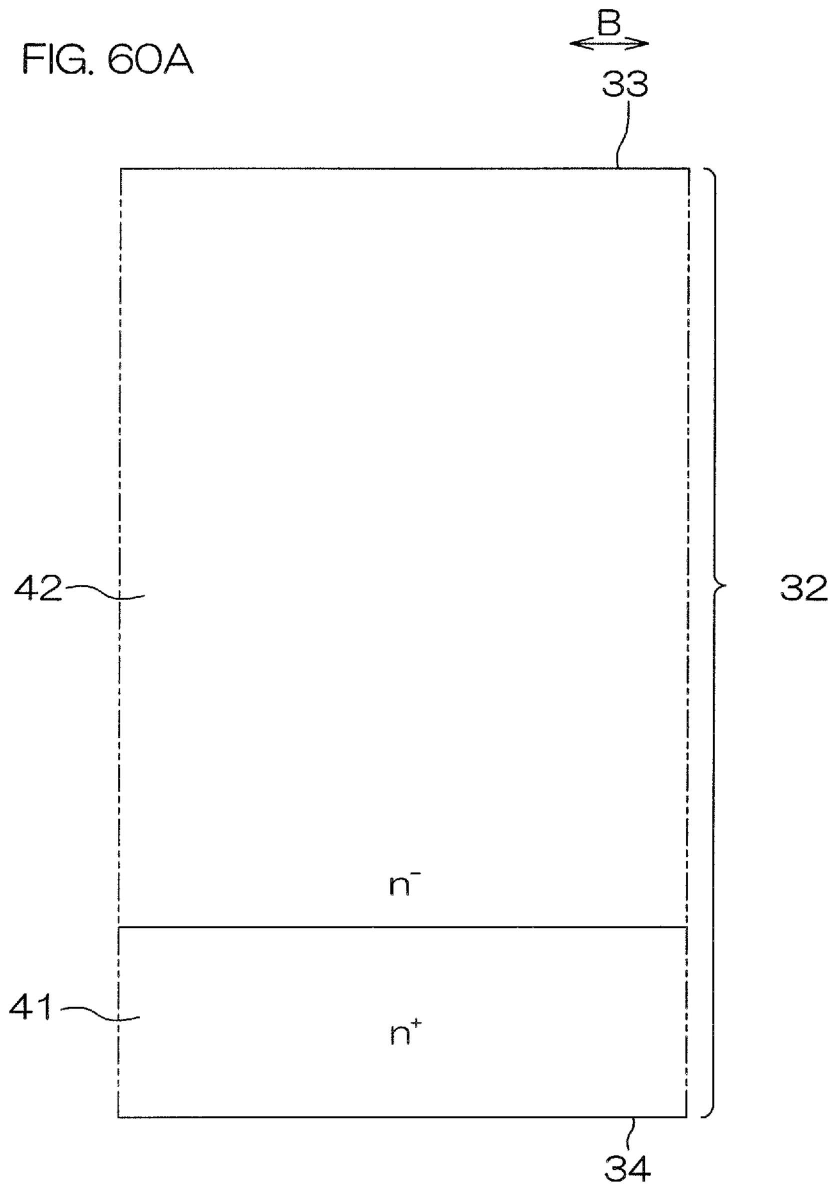
FIG. 60A is an enlarged view of a portion corresponding to FIG. 58B and is a sectional view for describing an example of a method for forming the carrier trapping regions shown in FIG. 58A.

Referring to FIG. 60A, first, the $n^+$-type semiconductor substrate 41 is prepared. Next, in parallel to introducing the n-type impurity, SiC is epitaxially grown from a main surface of the $n^+$-type semiconductor substrate 41.

The $n^-$-type epitaxial layer 42 is thereby formed on the $n^+$-type semiconductor substrate 41. The first main surface 33 is formed by the $n^-$-type epitaxial layer 42 and the second main surface 34 is formed by the $n^+$-type semiconductor substrate 41.

Figure 60B:
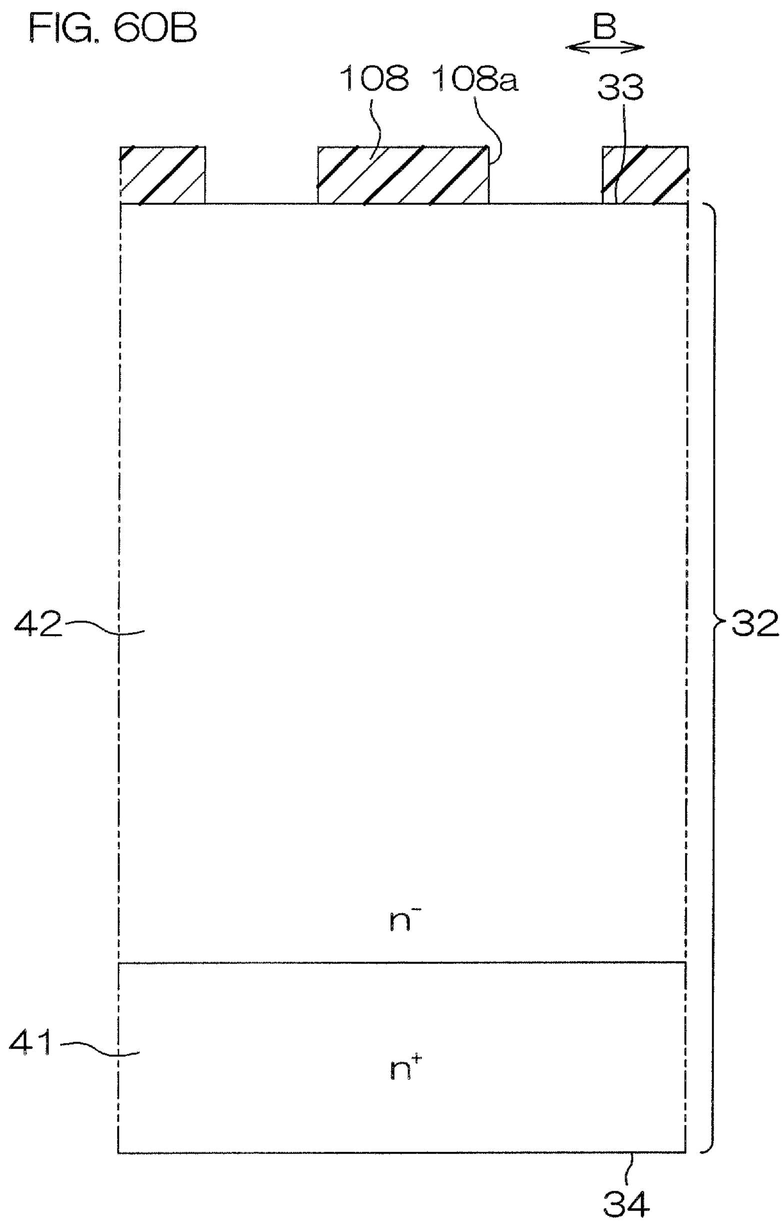
FIG. 60B is a sectional view of a step subsequent to that of FIG. 60A.

Next, referring to FIG. 60B, a mask 108 having a predetermined pattern is formed on the first main surface 33 of the $n^-$-type epitaxial layer 42. The mask 108 has openings 108*a* exposing regions at which the gate trenches 63 are to be formed.

Figure 60C:
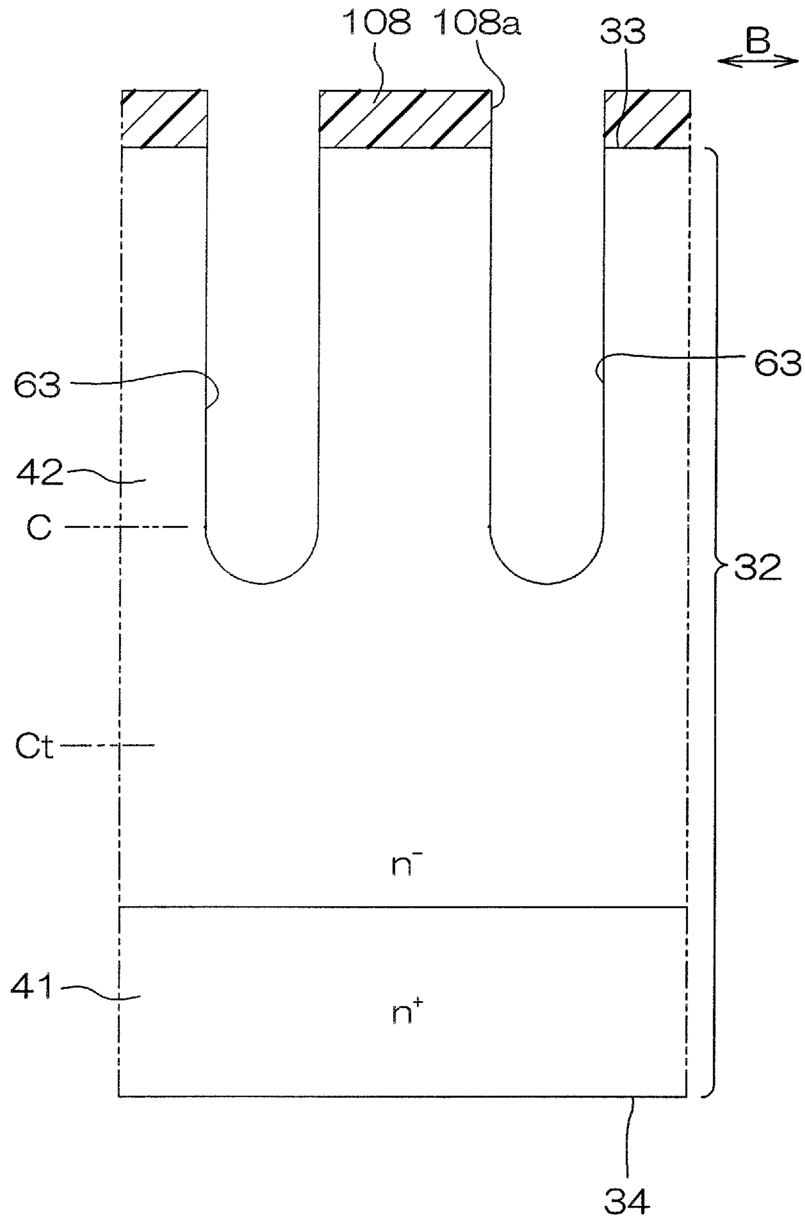
FIG. 60C is a sectional view of a step subsequent to that of FIG. 60B.

Next, referring to FIG. 60C, unnecessary portions of the $n^-$-type epitaxial layer 42 are selectively removed by an etching method via the mask 108. The gate trenches 63 are thereby formed in the first main surface 33 of the $n^-$-type epitaxial layer 42.

Figure 60D:
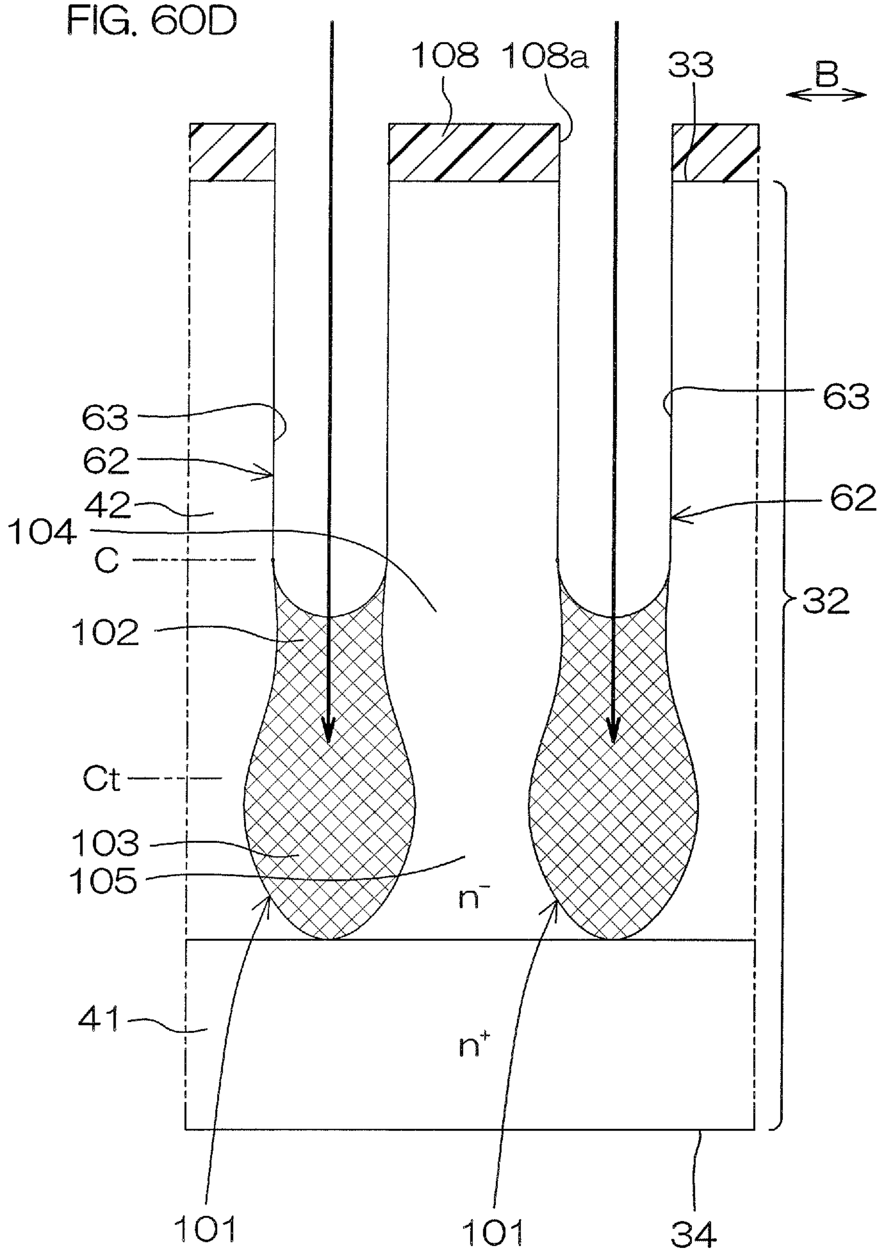
FIG. 60D is a sectional view of a step subsequent to that of FIG. 60C.

Next, referring to FIG. 60D, light ions, electrons, or neutrons, etc., are irradiated onto the bottom walls of gate trenches 63 that are exposed from the mask 108. The light ions may include at least one type of ions among hydrogen ions ($H^+$), helium ions ($He^+$), and boron ions ($B^+$).

In the present step, the regions of the $n^-$-type epitaxial layer 42 in which the crystal defects are to be introduced are set by adjusting the irradiation energy (acceleration voltage applied by the irradiating apparatus) of the light ions, electrons, or neutrons, etc.

In this configuration example, the light ions, electrons, or neutrons, etc., are driven in the thickness direction of the $n^-$-type epitaxial layer 42 from the bottom walls of the gate trenches 63 down to a vicinity of a boundary region of the $n^+$-type semiconductor substrate 41 and the $n^-$-type epitaxial layer 42 while forming crystal defects.

Thereby, the carrier trapping regions 101 of the predetermined shape are formed in the $n^-$-type epitaxial layer 42. Thereafter, a portion of the crystal defects may be recovered by the annealing treatment method. The annealing treatment method may be performed under an atmosphere of less than 1500° C. (for example, not more than 1200° C.).

Figure 60E:
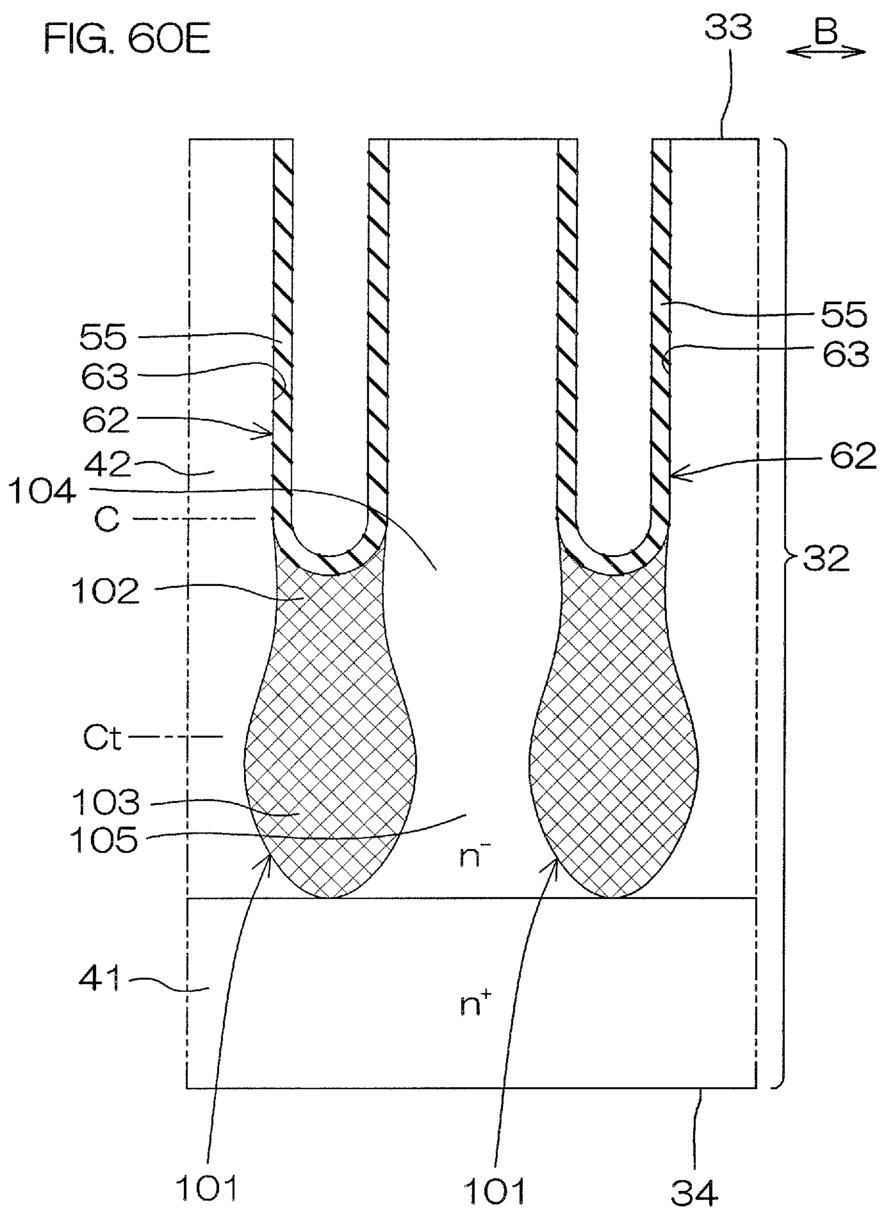
FIG. 60E is a sectional view of a step subsequent to that of FIG. 60D.

Next, with reference to FIG. 60E, the gate insulating films 55 are formed on the side walls and the bottom walls of the gate trenches 63. The gate insulating films 55 may be formed by the thermal oxidation treatment method or the CVD method.

Figure 60F:
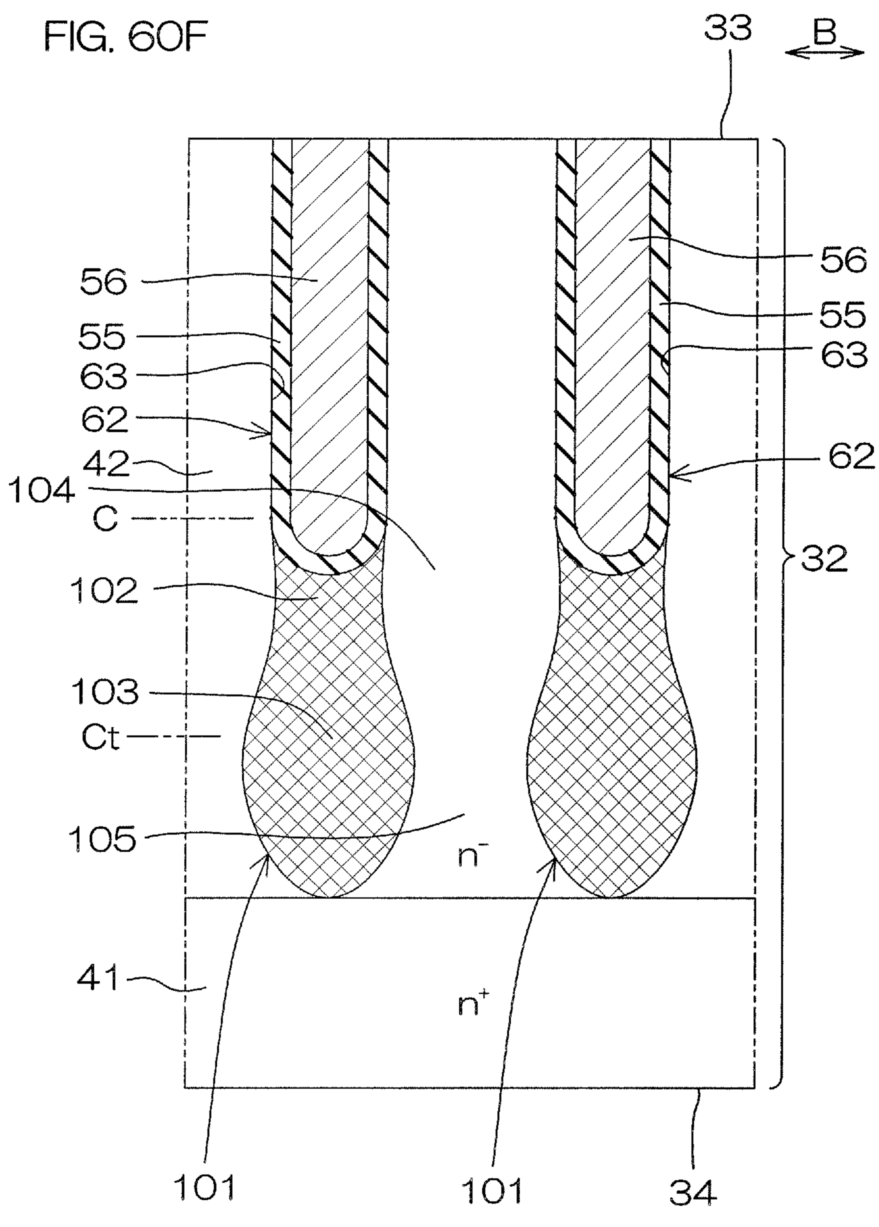
FIG. 60F is a sectional view of a step subsequent to that of FIG. 60E.

Next, with reference to FIG. 60F, the gate electrodes 56 are embedded in the gate trenches 63. In the present step, first, a conductor layer that is to be a base of the gate electrodes 56 is formed such as to fill the gate trenches 63 and cover the first main surface 33 of the $n^-$-type epitaxial layer 42. The conductor layer may be formed by a CVD method.

Next, portions of the conductor layer covering the first main surface 33 of the $n^-$ type epitaxial layer 42 are selectively removed. Unnecessary portions of the conductor layer may be removed by an etching method (etch back method). The gate electrodes 56 are thereby embedded in the gate trenches 63. Through steps including the above, the carrier trapping regions 101 are formed in regions below the trench gate structures 62.

Besides the third preferred embodiment, the carrier trapping regions 101 can also be applied to the fourth preferred embodiment. The carrier trapping regions 101 may be incorporated, for example, in any of the configurations shown in FIG. 26, FIG. 27, FIG. 28, FIG. 29, FIG. 30, FIG. 35, FIG. 36, etc. Other configuration examples of the carrier trapping regions 101 shall now be described.

Figure 61:
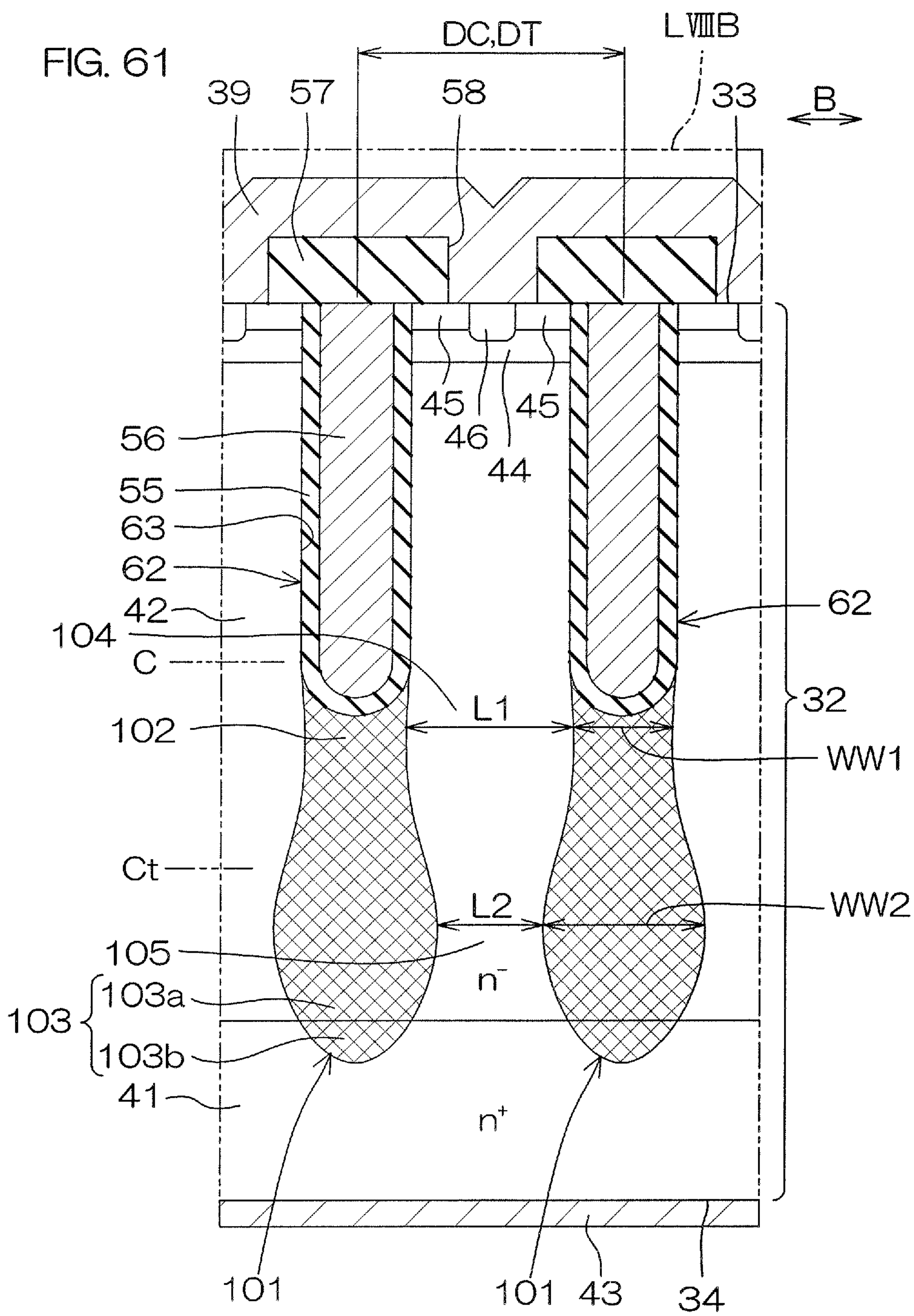
FIG. 61 is an enlarged view of a portion corresponding to FIG. 58B and is a sectional view showing a second configuration example of the carrier trapping regions shown in FIG. 58A.

FIG. 61 is an enlarged view of a portion corresponding to FIG. 58B and is a sectional view showing a second configuration example of the carrier trapping regions 101 shown in FIG. 58A. Structures in FIG. 61 corresponding to structures described in FIG. 58A and FIG. 58B are provided with the same reference signs and description thereof shall be omitted.

Referring to FIG. 61, in this configuration example, the second region 103 of each carrier trapping region 101 is connected to the $n^+$-type semiconductor substrate 41. The second region 103 includes a first portion 103*a*, formed inside the $n^-$-type epitaxial layer 42, and a second portion 103*b*, formed inside the $n^+$-type semiconductor substrate 41.

A crystal defect density N2 of the first portion 103*a* is higher than the n-type impurity density N1 of the $n^-$-type epitaxial layer 42 (N2>N1). A crystal defect density N2 of the second portion 103*b* is lower than the n-type impurity density N3 of the $n^+$-type semiconductor substrate 41 (N2<N3). Functioning virtually as an acceptor is suppressed in the second portion 103*b* of the second region 103.

The maximum of the impurity density N5 and the maximum of the crystal defect density N2 in the second region 103 may be positioned inside the $n^-$-type epitaxial layer 42. The maximum of the impurity density N5 and the maximum of the crystal defect density N2 in the second region 103 may be positioned inside the $n^+$-type semiconductor substrate 41.

Figure 62:
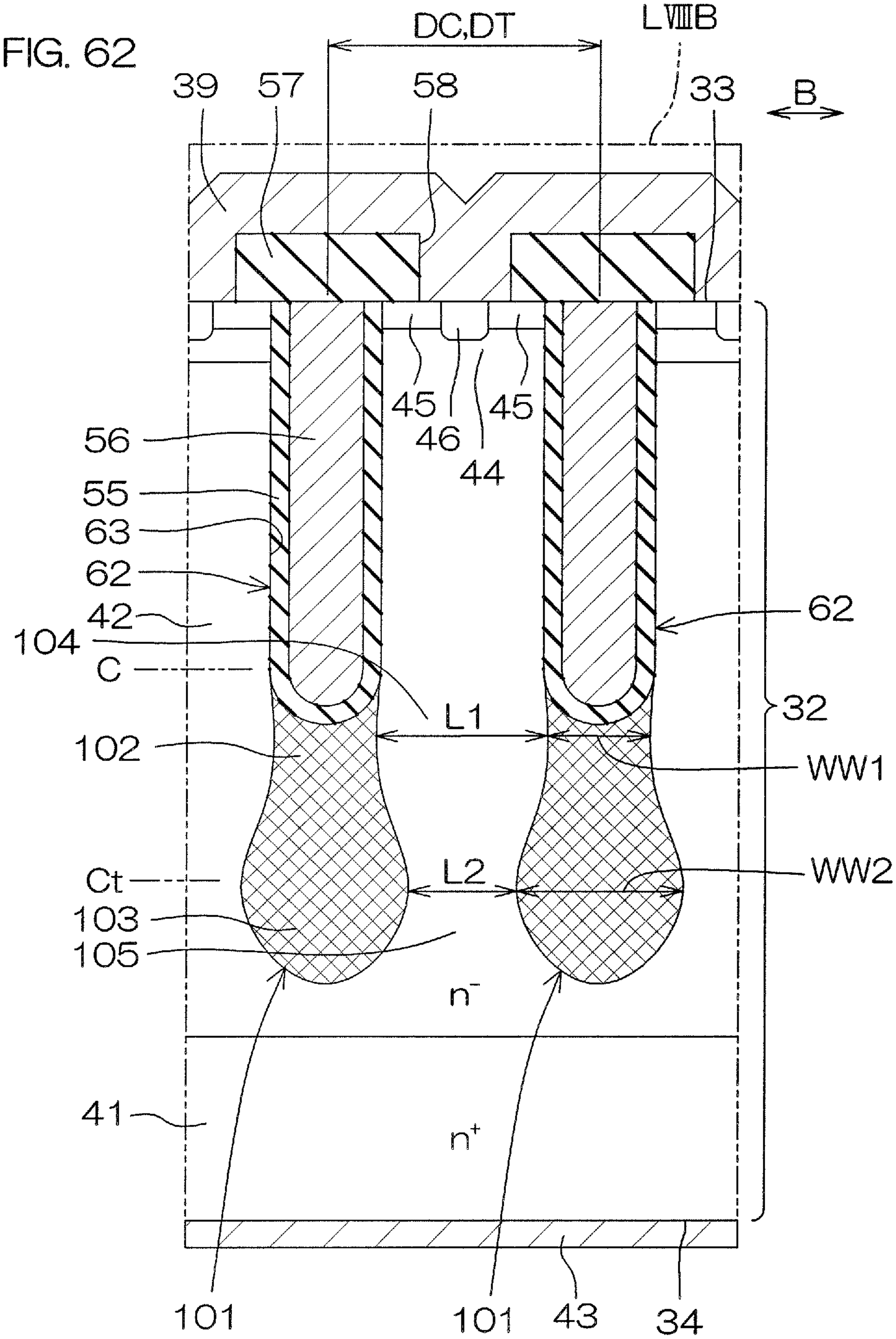
FIG. 62 is an enlarged view of a portion corresponding to FIG. 58B and is a sectional view showing a third configuration example of the carrier trapping regions shown in FIG. 58A.

FIG. 62 is an enlarged view of a portion corresponding to FIG. 58B and is a sectional view showing a third configuration example of the carrier trapping regions 101 shown in FIG. 58A. Structures in FIG. 62 corresponding to structures described in FIG. 58A and FIG. 58B are provided with the same reference signs and description thereof shall be omitted.

Referring to FIG. 62, in this configuration example, the second region 103 of each carrier trapping region 101 is formed across an interval to the first main surface 33 side from the $n^+$-type semiconductor substrate 41. A portion of the $n^-$-type epitaxial layer 42 is interposed in a region between the second region 103 and the $n^+$-type semiconductor substrate 41.

Figure 63:
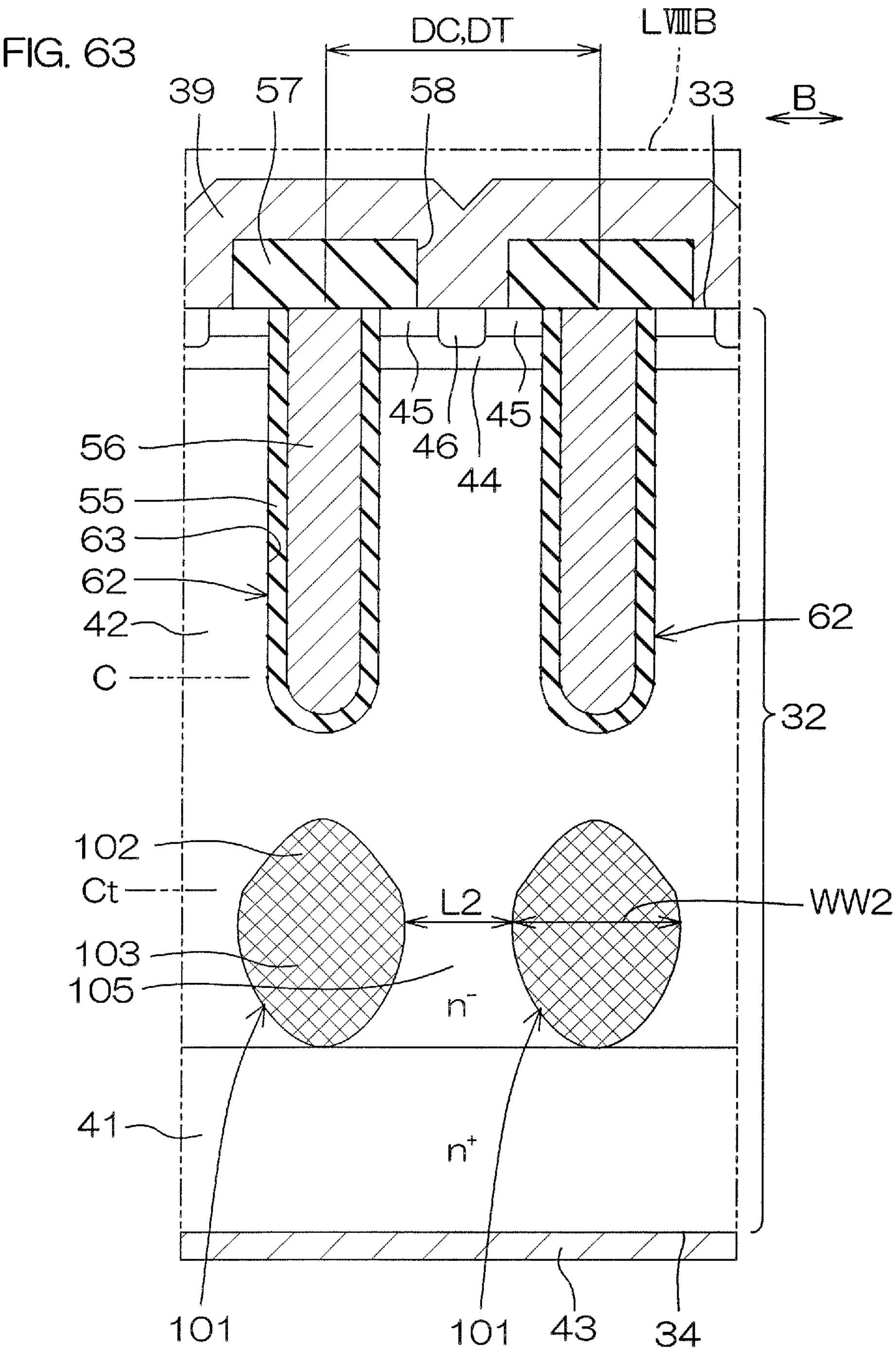
FIG. 63 is an enlarged view of a portion corresponding to FIG. 58B and is a sectional view showing a fourth configuration example of the carrier trapping regions shown in FIG. 58A.

FIG. 63 is an enlarged view of a portion corresponding to FIG. 58B and is a sectional view showing a fourth configuration example of the carrier trapping regions 101 shown in FIG. 58A. Structures in FIG. 63 corresponding to structures described in FIG. 58A and FIG. 58B are provided with the same reference signs and description thereof shall be omitted.

Referring to FIG. 63, in this configuration example, the first region 102 of each carrier trapping region 101 is formed across an interval to the second main surface 34 side from the first main surface 33 of the $n^-$-type epitaxial layer 42.

In this configuration example, the first region 102 of the carrier trapping region 101 is formed to a convergent shape with which the width WW1 along the second direction B decreases gradually toward the first main surface 33 of the $n^-$-type epitaxial layer 42. A portion of the $n^-$-type epitaxial layer 42 is interposed in a region between the first region 102 and the first main surface 33.

Figure 64:
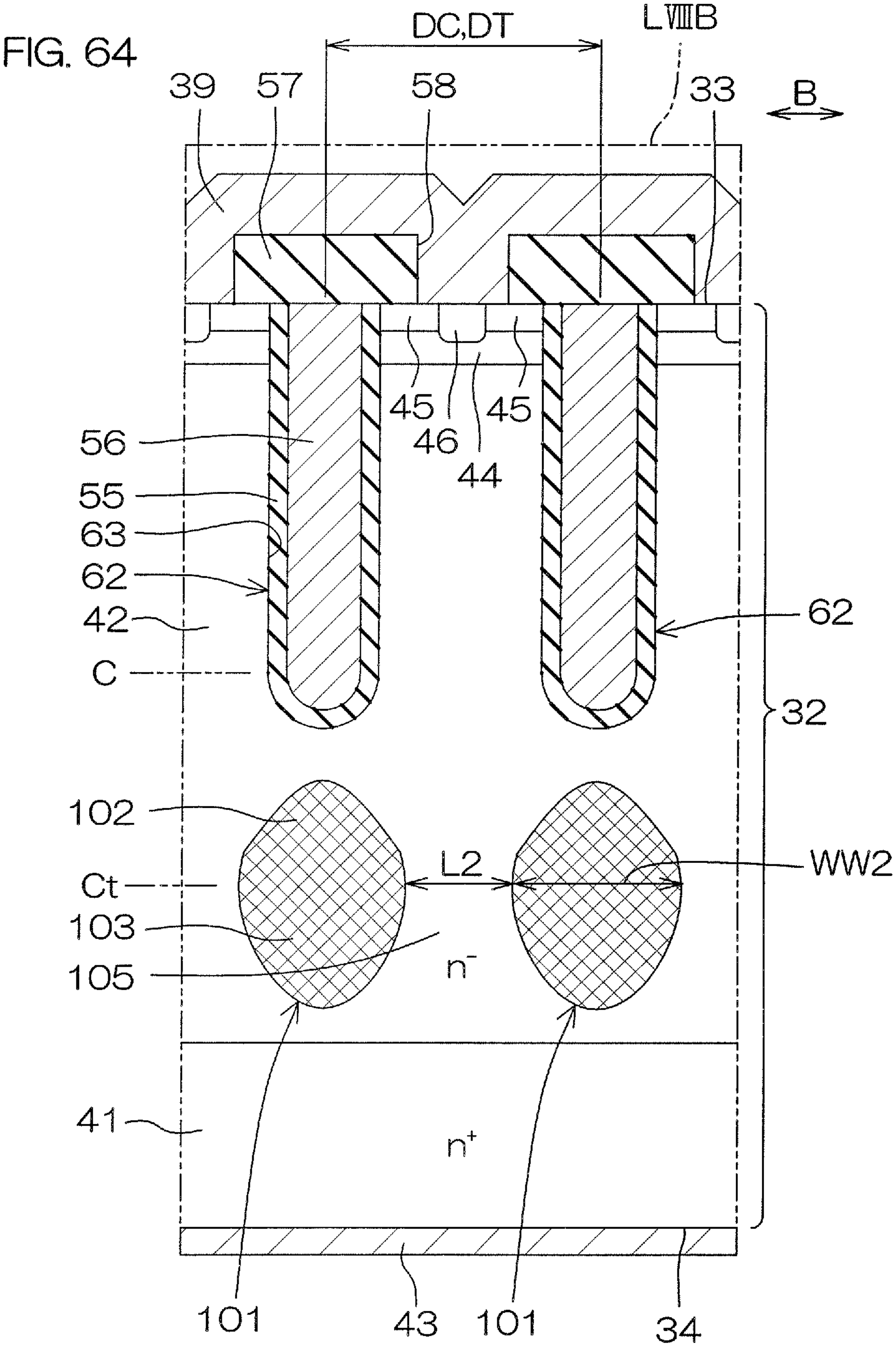
FIG. 64 is an enlarged view of a portion corresponding to FIG. 58B and is a sectional view showing a fifth configuration example of the carrier trapping regions shown in FIG. 58A.

FIG. 64 is an enlarged view of a portion corresponding to FIG. 58B and is a sectional view showing a fifth configuration example of the carrier trapping regions 101 shown in FIG. 58A. Structures in FIG. 64 corresponding to structures described in FIG. 58A and FIG. 58B are provided with the same reference signs and description thereof shall be omitted.

Referring to FIG. 64, in this configuration example, the carrier trapping regions 101 are floated in the interior of the $n^-$-type epitaxial layer 42.

That is, the first region 102 of each carrier trapping region 101 is formed across an interval to the second main surface 34 side from the first main surface 33 of the $n^-$-type epitaxial layer 42.

In this configuration example, the first region 102 of the carrier trapping region 101 is formed to a convergent shape with which the width WW1 along the second direction B decreases gradually toward the first main surface 33 of the $n^-$-type epitaxial layer 42. A portion of the $n^-$-type epitaxial layer 42 is interposed in a region between the first region 102 and the first main surface 33.

On the other hand, the second region 103 of each carrier trapping region 101 is formed across an interval to the first main surface 33 side from the $n^+$-type semiconductor substrate 41. A portion of the $n^-$-type epitaxial layer 42 is interposed in a region between the second region 103 and the $n^+$-type semiconductor substrate 41.

Figure 65A:
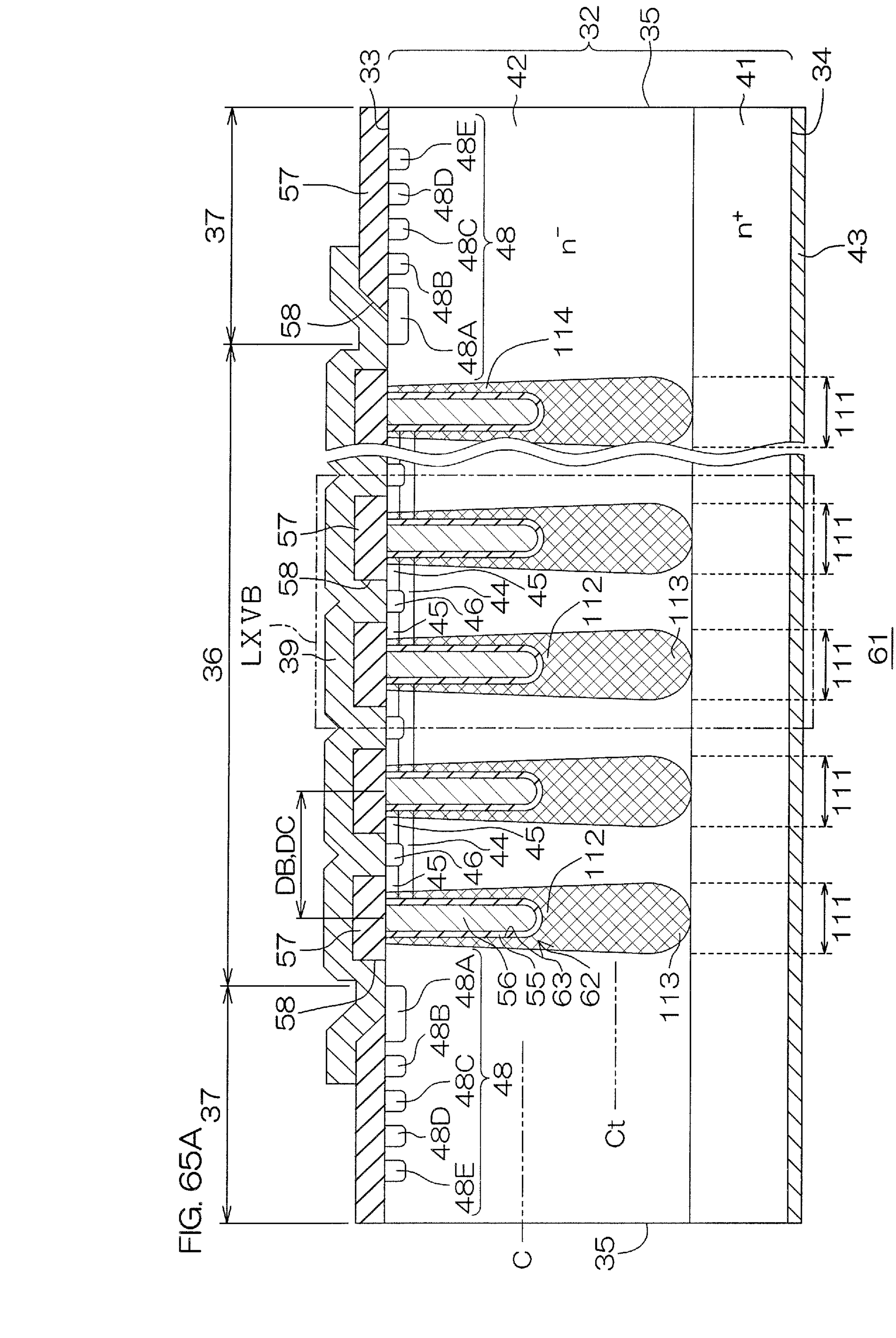
FIG. 65A is a sectional view of a portion corresponding to FIG. 26 and is a sectional view showing the semiconductor device to which a first configuration example of carrier trapping regions according to a fourth modification example is applied.
Figure 65B:
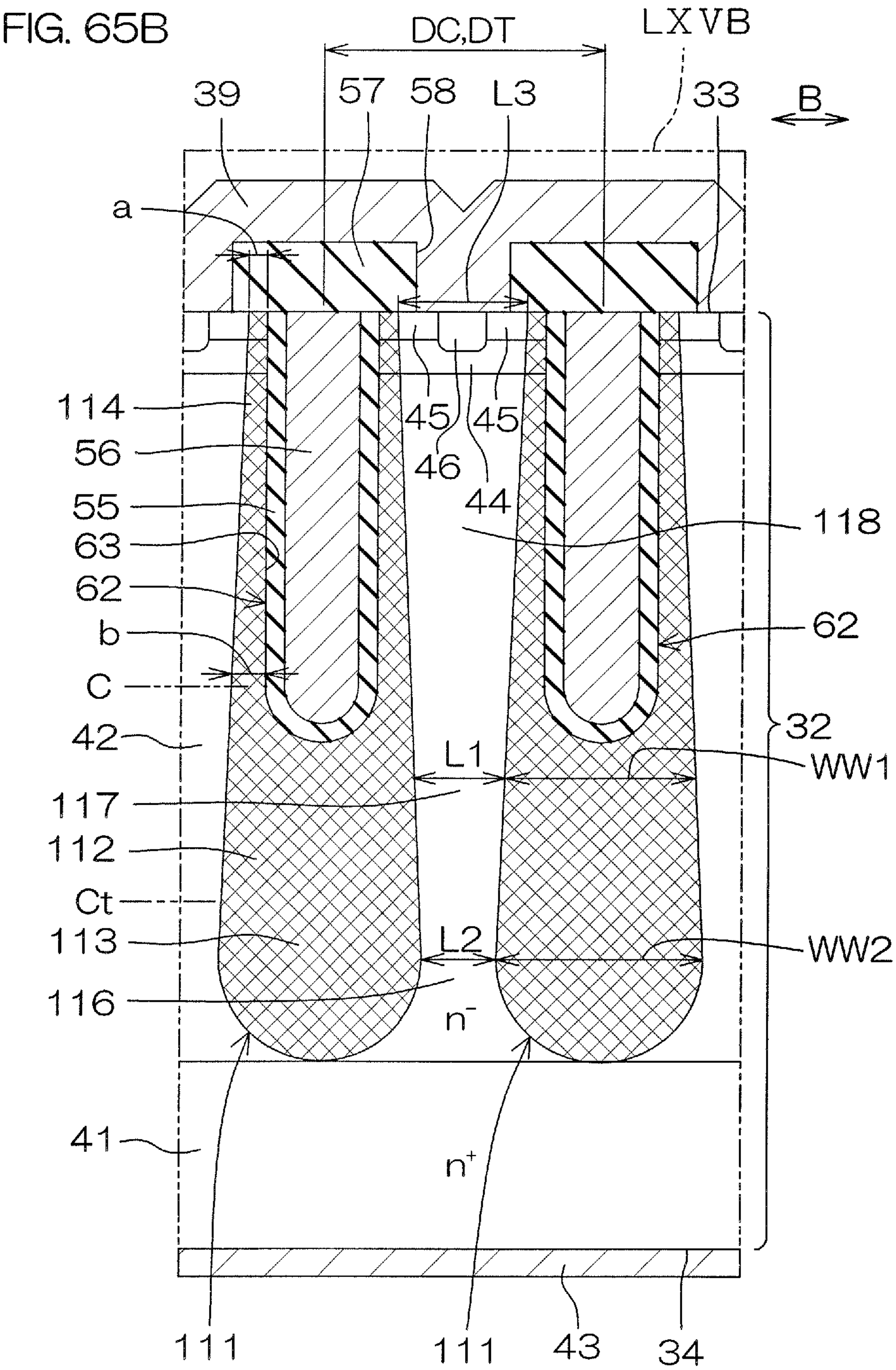
FIG. 65B is an enlarged view of a region LXVB shown in FIG. 65A.

FIG. 65A is a sectional view of a portion corresponding to FIG. 26 and is a sectional view showing the semiconductor device 61 to which a first configuration example of carrier trapping regions 111 according to a fourth modification example is applied. FIG. 65B is an enlarged view of a region LXVB shown in FIG. 65A.

In the following, an example where the carrier trapping regions 111 are formed in place of the carrier trapping regions 64 according to the third preferred embodiment (see FIG. 26, etc.) shall be described for the sake of convenience. In the following, structures described for the semiconductor device 61 are provided with the same reference signs and description thereof shall be omitted.

Each carrier trapping region 111 includes crystal defects that are selectively introduced into the $n^-$-type epitaxial layer 42 and has the same properties as the carrier trapping regions 64.

Each carrier trapping region 111 is formed in a region of the $n^-$-type epitaxial layer 42 lower than the bottom wall of a gate trench 63. The carrier trapping region 111 overlaps with the gate trench 63 in plan view. In this configuration example, the carrier trapping region 111 extends along the first direction A such as to be oriented along the gate trench 63.

A distance DC between carrier trapping regions 111 is substantially equal to the distance DT between trench gate structures 62. The distance DC may be not less than 0.5 μm and not more than 10 μm.

More specifically, the distance DC is a distance along the second direction B between a central portion of one carrier trapping region 111 and a central portion of another carrier trapping region 111. The distance DT is, more specifically, a distance along the second direction B between a central portion of one trench gate structure 62 and a central portion of another trench gate structure 62.

The respective carrier trapping regions 111 are formed in one-to-one correspondence with the respective trench gate structures 62. In this configuration example, each carrier trapping region 111 is formed in a column shape which extends along the thickness direction of the $n^-$-type epitaxial layer 42 and with which a lower portion bulges along the second direction B with respect to an upper portion.

Each carrier trapping region 111 includes a first region 112 positioned at an upper side and a second region 113 positioned at a lower side in a region lower than the bottom wall of a gate trench 63.

The first region 112 is positioned upper than the lower intermediate region Ct of the $n^-$-type epitaxial layer 42. The second region 113 is positioned lower than the lower intermediate region Ct of the $n^-$-type epitaxial layer 42. In FIG. 65A and FIG. 65B, the lower intermediate region Ct is indicated by an alternate long and two short dashed line.

Each first region 112 is formed in a region of the $n^-$-type epitaxial layer 42 along the bottom wall of a gate trench 63. The first region 112 is exposed from the bottom wall of the gate trench 63.

The first region 112 may cover an edge portion connecting the side wall and the bottom wall of the gate trench 63. Each first region 112 faces a gate electrode 56 across a gate insulating film 55.

Each carrier trapping region 111 is formed such that a width along the second direction B increases gradually from the first region 112 toward the second region 113. The second region 113 has a shape that is bulged in the second direction B with respect to the first region 112. In this configuration example, each second region 113 is connected to the $n^+$-type semiconductor substrate 41.

A width WW1 along the second direction B of the first region 112 is not less than a width WT along the second direction B of the gate trench 63 (WW1≥WT). A width WW2 along the second direction B of the second region 113 is not less than the width WW1 along the second direction B of the first region 112 (WW2≥WW1). The width WW1 of the first region 112 and the width WW2 of the second region 113 may be not less than 0.1 μm and not more than 10 μm.

In this configuration example, each carrier trapping region 111 further includes a third region 114 extending along the side wall of a gate trench 63. The third region 114 is connected to the first region 112 at the bottom wall side of the gate trench 63.

The third region 114 crosses the intermediate region C of the $n^-$-type epitaxial layer 42. In FIG. 65A and FIG. 65B, the intermediate region C is indicated by an alternate long and two short dashed line. In this configuration example, the third region 114 is exposed from the first main surface 33 of the $n^-$-type epitaxial layer 42. The third region 114 may instead be formed across an interval to the second main surface 34 side from the first main surface 33 of the $n^-$-type epitaxial layer 42.

The third region 114 is formed such that a width in the second direction increases gradually along the thickness direction of the $n^-$-type epitaxial layer 42. A width a along the second direction B of a portion of the third region 114 positioned at the bottom wall side of the gate trench 63 is not less than a width b along the second direction B of a portion of the third region 114 positioned at the opening side of the gate trench 63 (a≥b).

The carrier trapping region 111 is thereby formed in a column shape which increases gradually in width along the second direction B as a whole in the thickness direction of the $n^-$-type epitaxial layer 42.

The $n^+$-type source regions 45 are formed in the surface layer portion of the $n^-$-type epitaxial layer 42 (see also FIG. 26, etc.). A crystal defect density N2 of each third region 114 is higher than the n-type impurity density N4 of each $n^+$-type source region 45 (N2<N4). Functioning virtually as an acceptor is thus suppressed in a portion of the third region 114 that is present inside the $n^+$-type source region 45.

As with the impurity density N5 of each carrier trapping region 81 described above, an impurity density N5 of each carrier trapping region 111 has a single maximum at an intermediate portion in the thickness direction of the $n^-$-type epitaxial layer 42. The maximum of the impurity density N5 is positioned lower than the lower intermediate region Ct of the $n^-$-type epitaxial layer 42.

The maximum of the impurity density N5 corresponds to a location of the carrier trapping region 111 that bulges out the most, that is, corresponds to the second region 113. An impurity density N5 of the second region 113 is not less than an impurity density N5 of the first region 112 and an impurity density N5 of the third region 114.

On the other hand, each carrier trapping region 111 has a crystal defect density N2 not less than the impurity density N5 (N2≥N5). The crystal defect density N2 of the carrier trapping region 111 has a single maximum at an intermediate portion in the thickness direction of the $n^-$-type epitaxial layer 42.

The maximum of the crystal defect density N2 is positioned lower than the lower intermediate region Ct. The maximum of the crystal defect density N2 corresponds to the location of the carrier trapping region 111 that bulges out the most, that is, corresponds to the second region 113. The crystal defect density N2 of the second region 113 is not less than the crystal defect density N2 of the first region 112.

The $n^-$-type epitaxial layer 42 has a first portion 115, a second portion 116, and a third portion 117 having mutually different distances in regard to the second direction B in each region between two mutually adjacent carrier trapping regions 111.

The first portion 115 is positioned in a region between the first regions 112 of the two mutually adjacent carrier trapping regions 111. The second portion 116 is positioned in a region between the second regions 113 of the two mutually adjacent carrier trapping regions 111. The third portion 117 is positioned in a region between the third regions 114 of the two mutually adjacent carrier trapping regions 111.

A first width L1 along the second direction B of the first portion 115 is not less than a second width L2 along the second direction B of the second portion 116 (L1≥L2). A third width L3 along the second direction B of the third portion 117 is not less than the first width L1 along the second direction B of the first portion 115 (L3≥L1).

Figure 66:
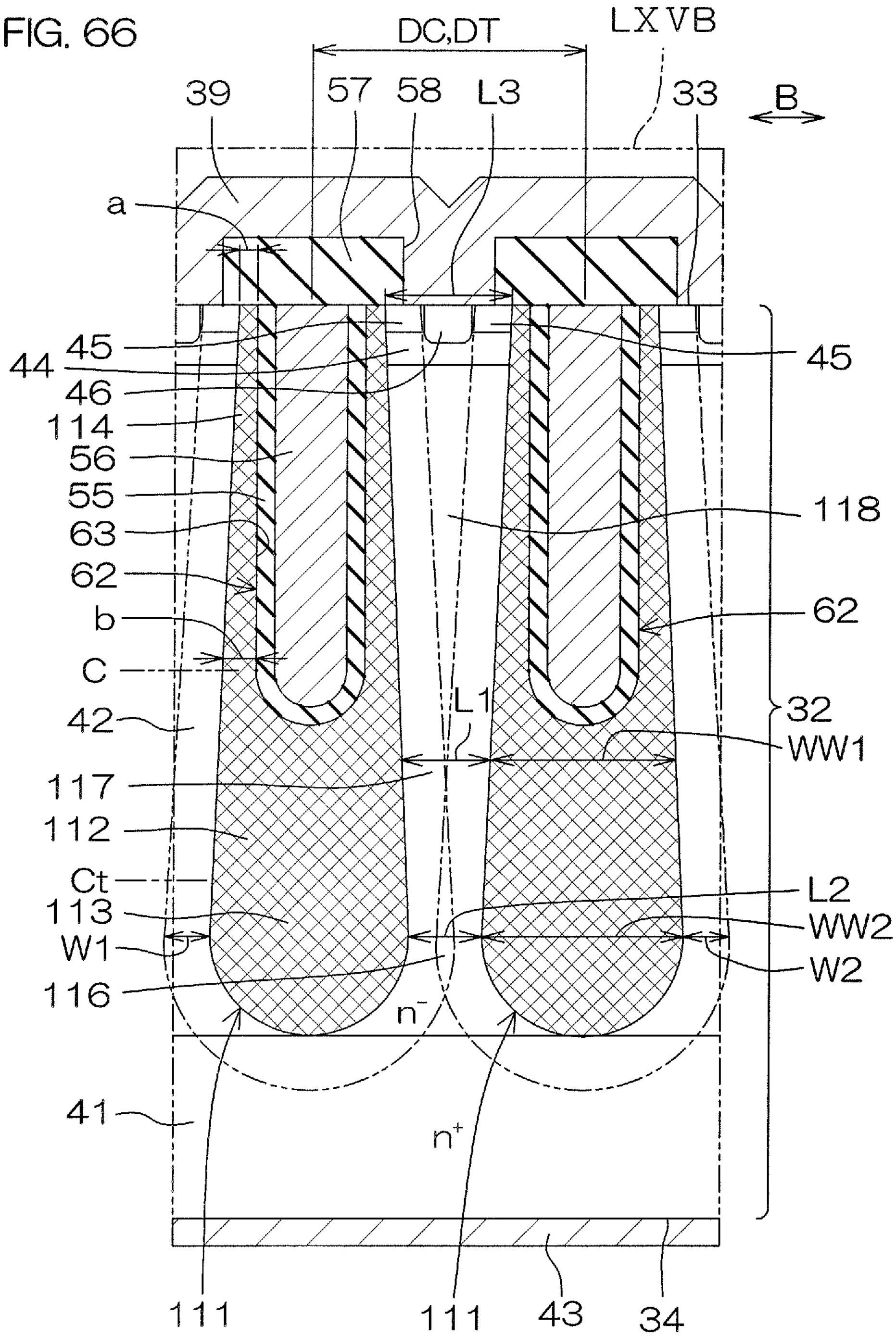
FIG. 66 is an enlarged view of a portion corresponding to FIG. 65B and is a sectional view for describing depletion layers spreading from the carrier trapping regions shown in FIG. 65A.

FIG. 66 is an enlarged view of a portion corresponding to FIG. 65B and is a sectional view for describing depletion layers spreading from the carrier trapping regions 111 shown in FIG. 65A.

The second width L2 of the second portion 116 may be not more than a sum W1+W2 of a first width W1 of a first depletion layer 118 spreading from one carrier trapping region 111 and a second width W2 of a second depletion layer 119 spreading from the other carrier trapping region 111 (L2≤W1+W2).

When L2≤W1+W2 is satisfied, the first depletion layer 118 and the second depletion layer 119 overlap mutually in the second portion 116. The second portion 116 is thereby depleted. Concentration of electric field in the second portion 116 can thereby be relaxed and a short-circuit capacity can thus be increased.

The first width L1 of the first portion 115 may be not less than the sum W1+W2 of the first width W1 of the first depletion layer 118 and the second width W2 of the second depletion layer 119 (L1≥W1+W2). Obviously, it may instead be such that L1≤W1+W2.

The third width L3 of the third portion 117 may be not less than the sum W1+W2 of the first width W1 of the first depletion layer 118 and the second width W2 of the second depletion layer 119 (L3≥W1+W2). Obviously, it may instead be such that L3≤W1+W2.

Even with this configuration example described above, the same effects as the effects described for the semiconductor device 61 can be exhibited. Also, with this configuration example, the first portions 115 of comparatively wide width and the second portions 116 of comparatively narrow width are formed in the $n^-$-type epitaxial layer 42.

For example, when a short circuit occurs in a state where a high voltage is applied to the $n^-$-type epitaxial layer 42, a large current can be blocked at the second portions 116 of comparatively narrow width. Heat generation at the second portions 116 can thereby be suppressed and therefore an allowable time for a short circuit due to a peripheral circuit can be designed to be longer.

On the other hand, when a conducting state voltage is applied to the $n^-$-type epitaxial layer 42, current paths can be secured at the first portions 115 of comparatively wide width. Increase of on resistance can thereby be suppressed using the first portions 115.

With this configuration example, an example where each second region 113 has the maximum of the impurity density N5 and the maximum of the crystal defect density N2 was described. However, in place of the second region 113, each first region 112 may have the maximum of the impurity density N5 and the maximum of the crystal defect density N2.

FIG. 67A to FIG. 67F are enlarged views of a portion corresponding to FIG. 65B and are sectional views for describing an example of a method for forming the carrier trapping regions 111 shown in FIG. 65A. The method for forming the carrier trapping regions 111 can be incorporated in the steps for forming the carrier trapping regions 64 (step S15 and step S16) shown in FIG. 34 described above.

Figure 67A:
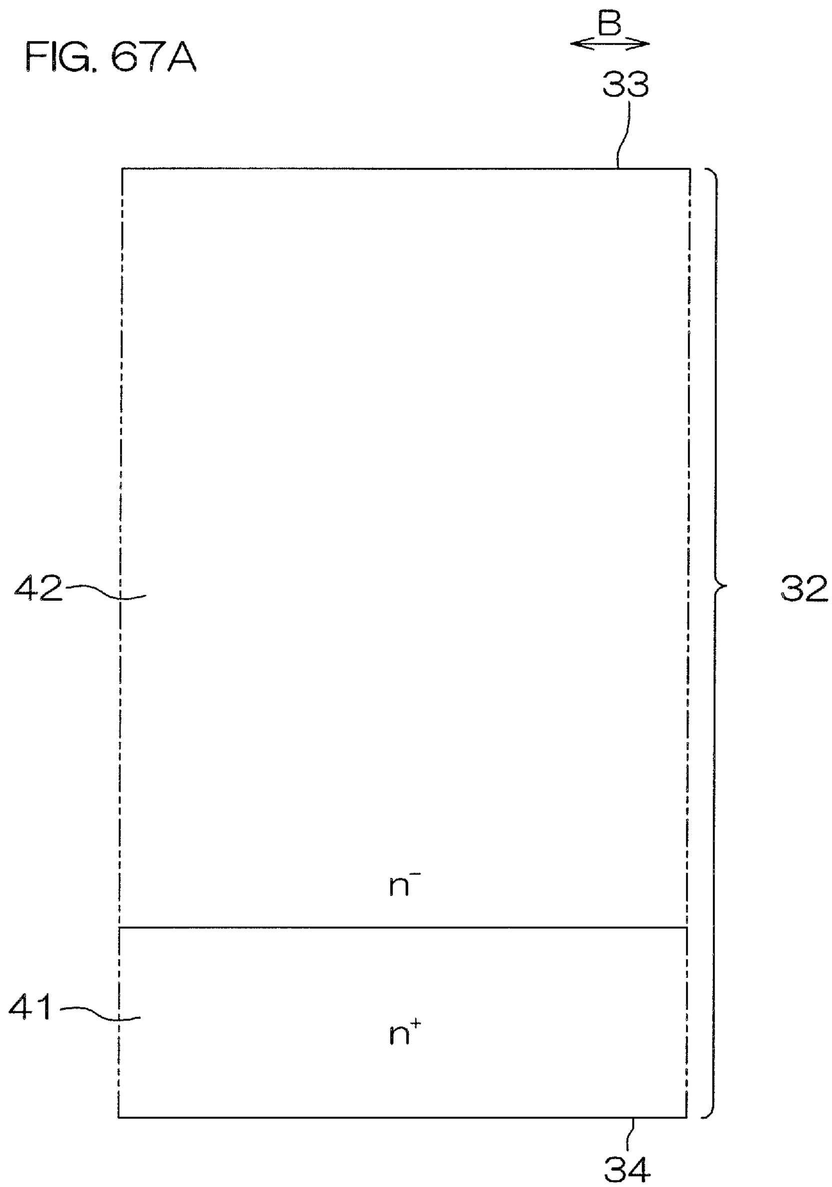
FIG. 67A is an enlarged view of a portion corresponding to FIG. 65B and is a sectional view for describing an example of a method for forming the carrier trapping regions shown in FIG. 65A.

Referring to FIG. 67A, first, the $n^+$-type semiconductor substrate 41 is prepared. Next, in parallel to introducing the n-type impurity, SiC is epitaxially grown from a main surface of the $n^+$-type semiconductor substrate 41.

The $n^-$-type epitaxial layer 42 is thereby formed on the $n^+$-type semiconductor substrate 41. The first main surface 33 is formed by the $n^-$-type epitaxial layer 42 and the second main surface 34 is formed by the $n^+$-type semiconductor substrate 41.

Figure 67B:
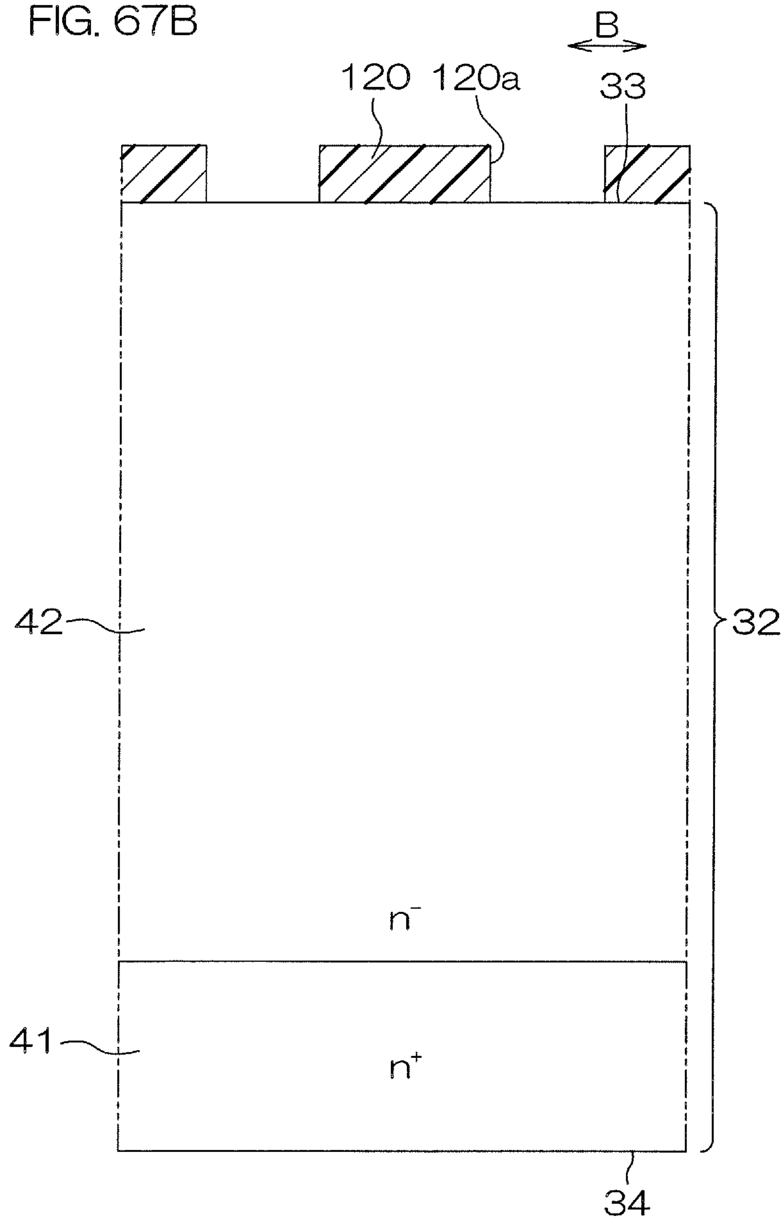
FIG. 67B is a sectional view of a step subsequent to that of FIG. 67A.

Next, referring to FIG. 67B, a mask 120 having a predetermined pattern is formed on the first main surface 33 of the $n^-$-type epitaxial layer 42. The mask 120 has openings 120*a* exposing regions at which the gate trenches 63 are to be formed.

Figure 67C:
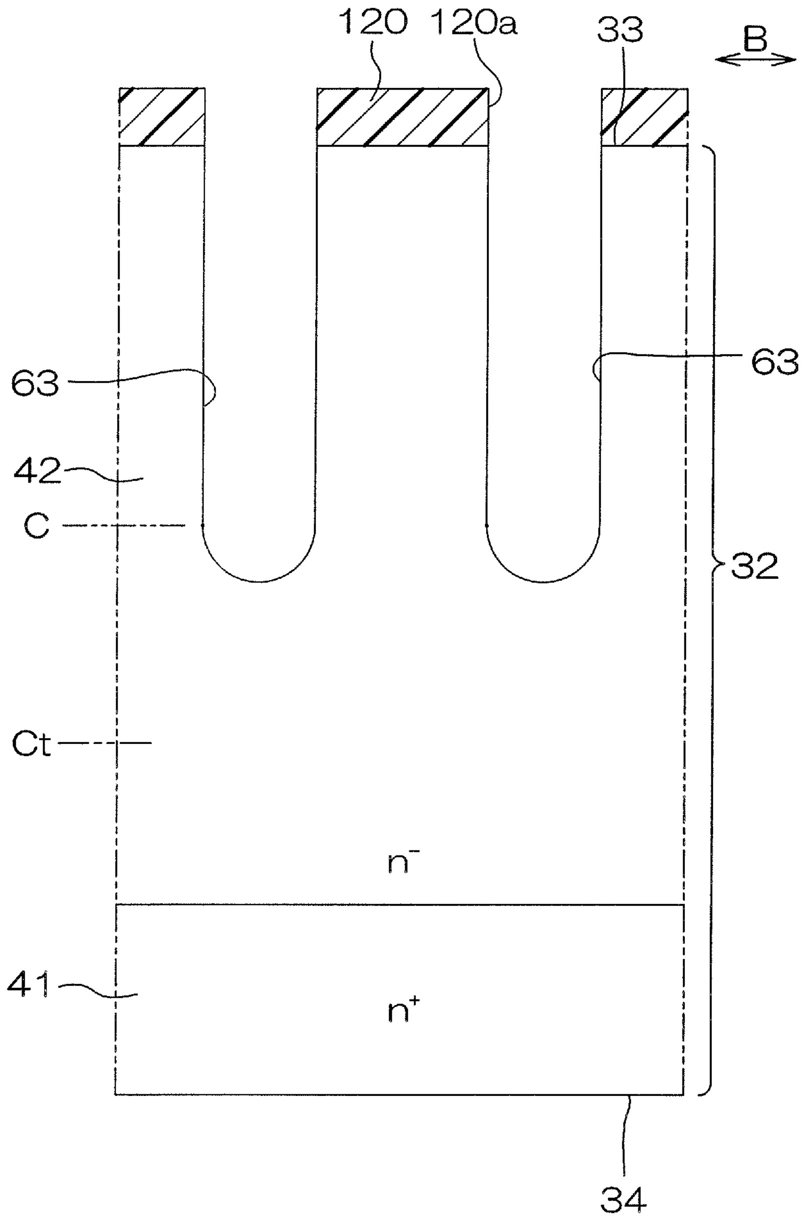
FIG. 67C is a sectional view of a step subsequent to that of FIG. 67B.

Next, referring to FIG. 67C, unnecessary portions of the $n^-$-type epitaxial layer 42 are selectively removed by an etching method via the mask 120. The gate trenches 63 are thereby formed in the first main surface 33 of the $n^-$-type epitaxial layer 42. After the gate trenches 63 are formed, the mask 120 is removed.

Figure 67D:
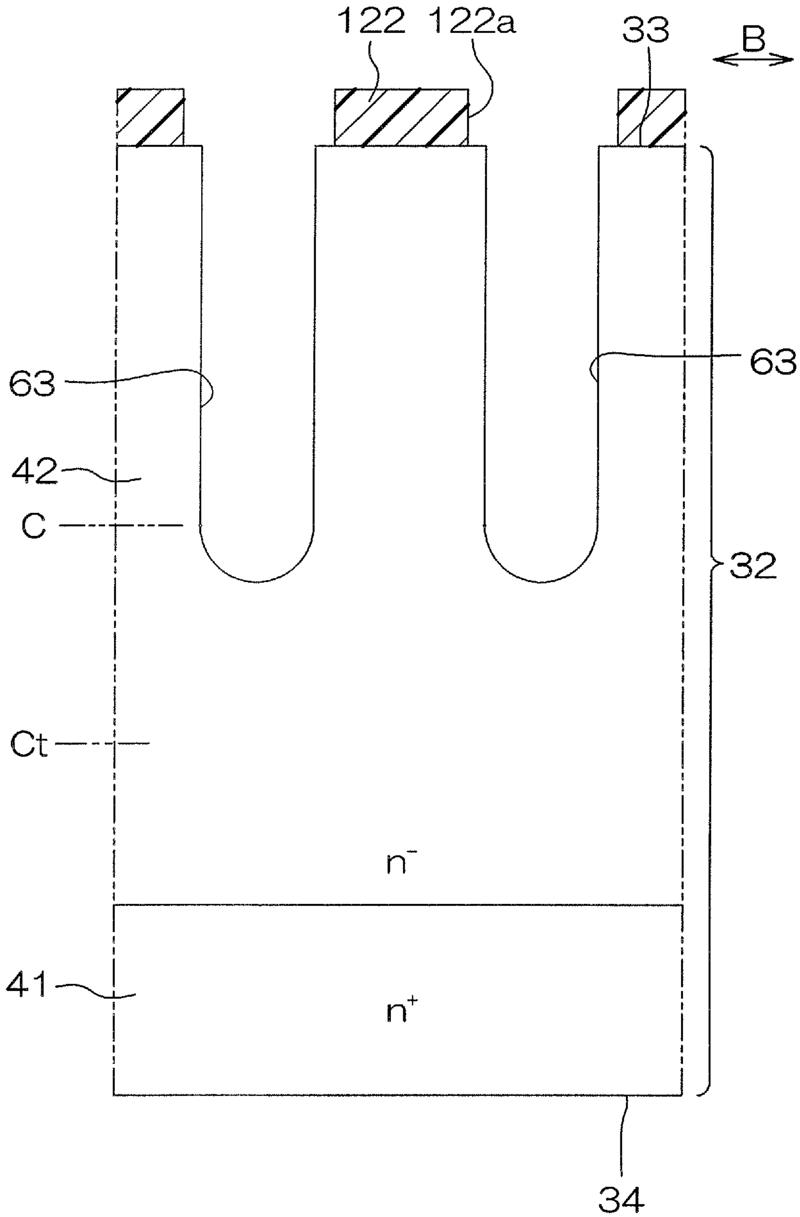
FIG. 67D is a sectional view of a step subsequent to that of FIG. 67C.

Next, referring to FIG. 67D, a mask 122 exposing the gate trenches 63 is formed on the first main surface 33 of the $n^-$-type epitaxial layer 42. The mask 122 has openings 122*a* exposing opening edge portions of the first main surface 33 of the $n^-$-type epitaxial layer 42 and the gate trenches 63.

Figure 67E:
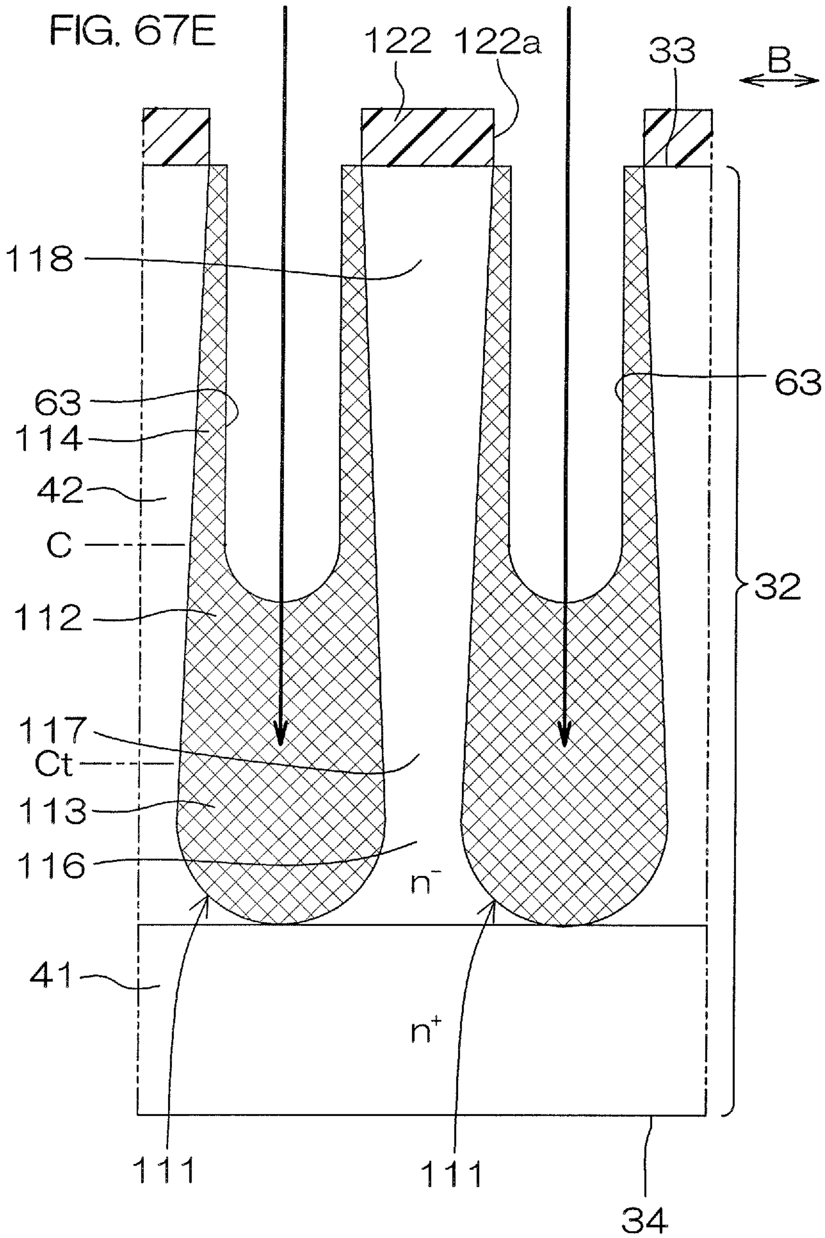
FIG. 67E is a sectional view of a step subsequent to that of FIG. 67D.

Next, referring to FIG. 67E, light ions, electrons, or neutrons, etc., are irradiated onto the first main surface 33 of the $n^-$-type epitaxial layer 42 and the inner walls of the gate trenches 63 that are exposed from the mask 122. The light ions may include at least one type of ions among hydrogen ions ($H^+$), helium ions ($He^+$), and boron ions ($B^+$).

In the present step, the regions of the $n^-$-type epitaxial layer 42 in which the crystal defects are to be introduced are set by adjusting the irradiation energy (acceleration voltage applied by the irradiating apparatus) of the light ions, electrons, or neutrons, etc.

In this configuration example, the light ions, electrons, or neutrons, etc., are driven in the thickness direction of the $n^-$-type epitaxial layer 42 down to a vicinity of a boundary region of the $n^+$-type semiconductor substrate 41 and the $n^-$-type epitaxial layer 42 while forming crystal defects.

Thereby, the carrier trapping regions 111 of the predetermined shape are formed in the $n^-$-type epitaxial layer 42. Thereafter, a portion of the crystal defects may be recovered by the annealing treatment method. The annealing treatment method may be performed under an atmosphere of less than 1500° C. (for example, not more than 1200° C.).

Figure 67F:
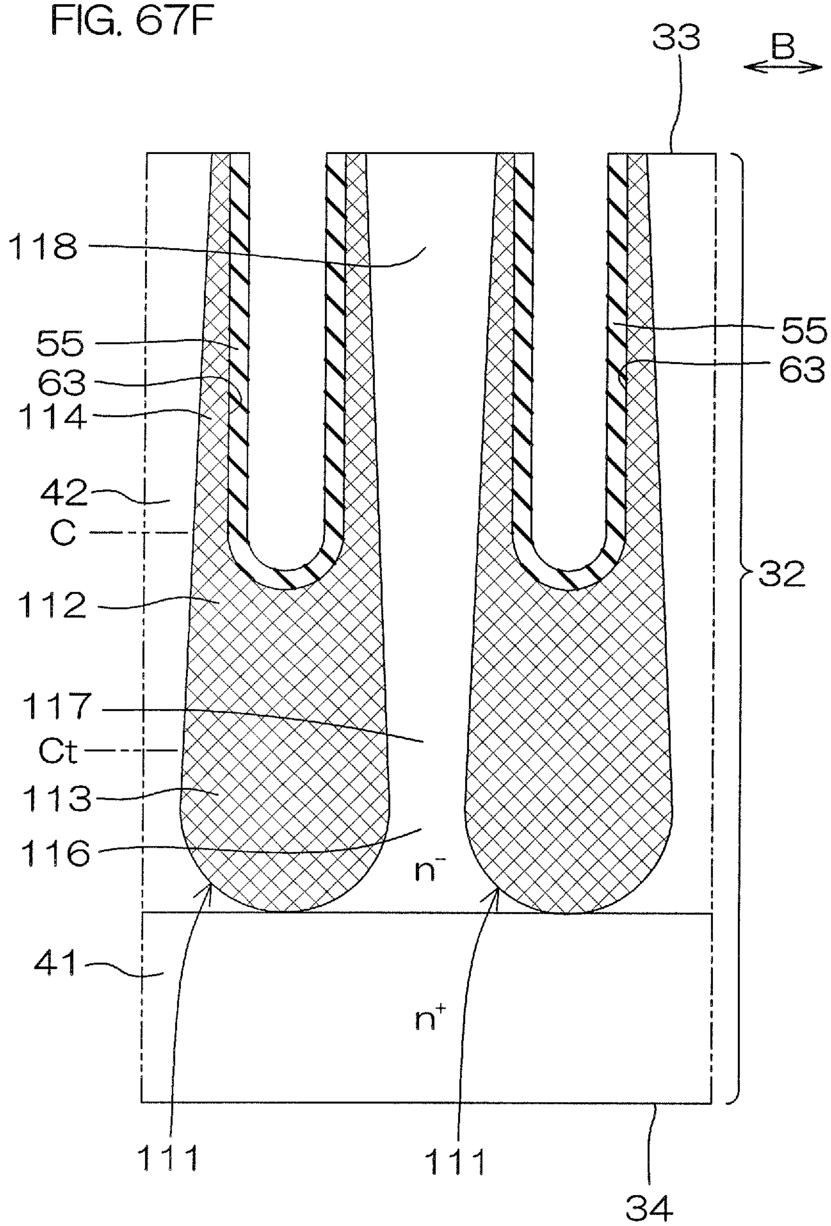
FIG. 67F is a sectional view of a step subsequent to that of FIG. 67E.

Next, with reference to FIG. 67F, the gate insulating films 55 are formed on the side walls and the bottom walls of the gate trenches 63. The gate insulating films 55 may be formed by the thermal oxidation treatment method or the CVD method.

Figure 67G:
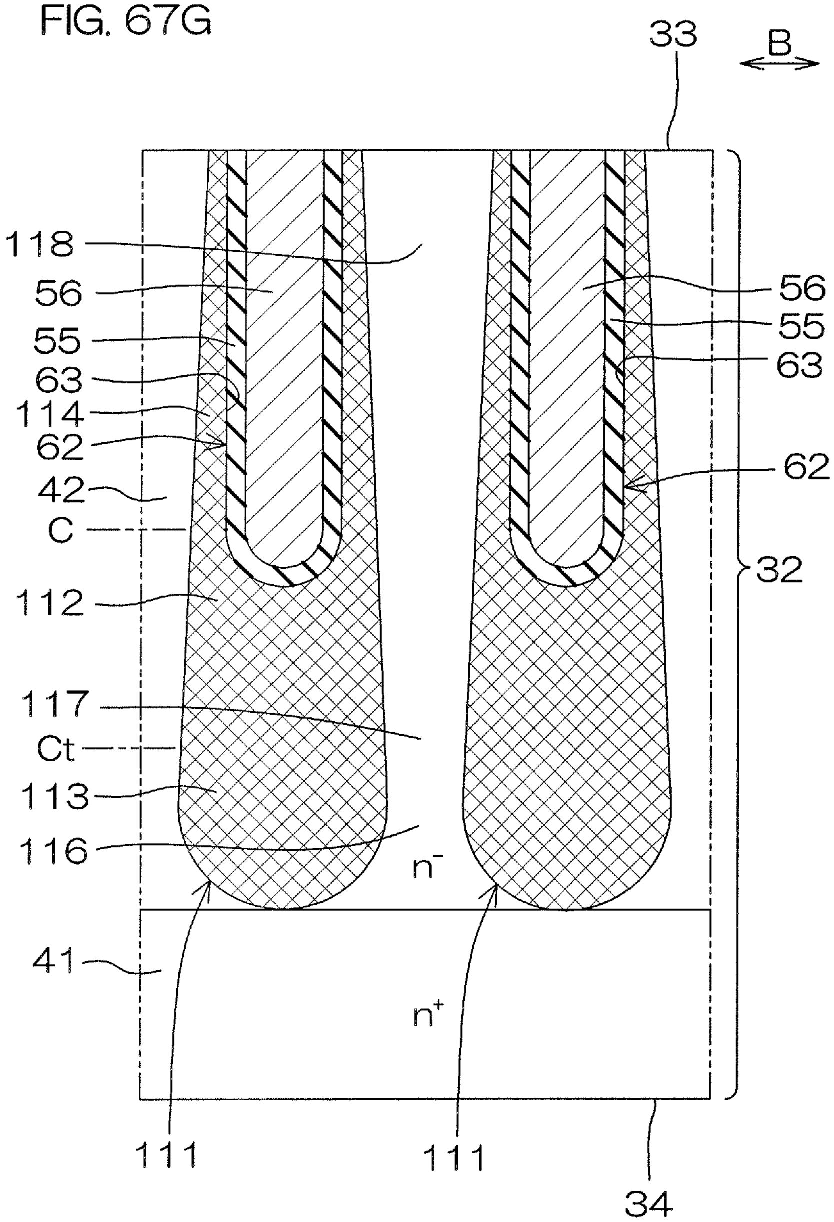
FIG. 67G is a sectional view of a step subsequent to that of FIG. 67F.

Next, with reference to FIG. 67G, the gate electrodes 56 are embedded in the gate trenches 63. In the present step, first, the conductor layer that is to be the base of the gate electrodes 56 is formed such as to fill the gate trenches 63 and cover the first main surface 33 of the $n^-$-type epitaxial layer 42. The conductor layer may be formed by the CVD method.

Next, portions of the conductor layer covering the first main surface 33 of the $n^-$ type epitaxial layer 42 are selectively removed. Unnecessary portions of the conductor layer may be removed by an etching method (etch back method).

The gate electrodes 56 are thereby embedded in the gate trenches 63. Through steps including the above, the carrier trapping regions 111 are formed in regions below the trench gate structures 62.

Besides the third preferred embodiment, the carrier trapping regions 111 can also be applied to the fourth preferred embodiment. The carrier trapping regions 111 may be incorporated, for example, in any of the configurations shown in FIG. 26, FIG. 27, FIG. 28, FIG. 30, FIG. 33, FIG. 35, FIG. 36, etc. Other configuration examples of the carrier trapping regions 111 shall now be described.

Figure 68:
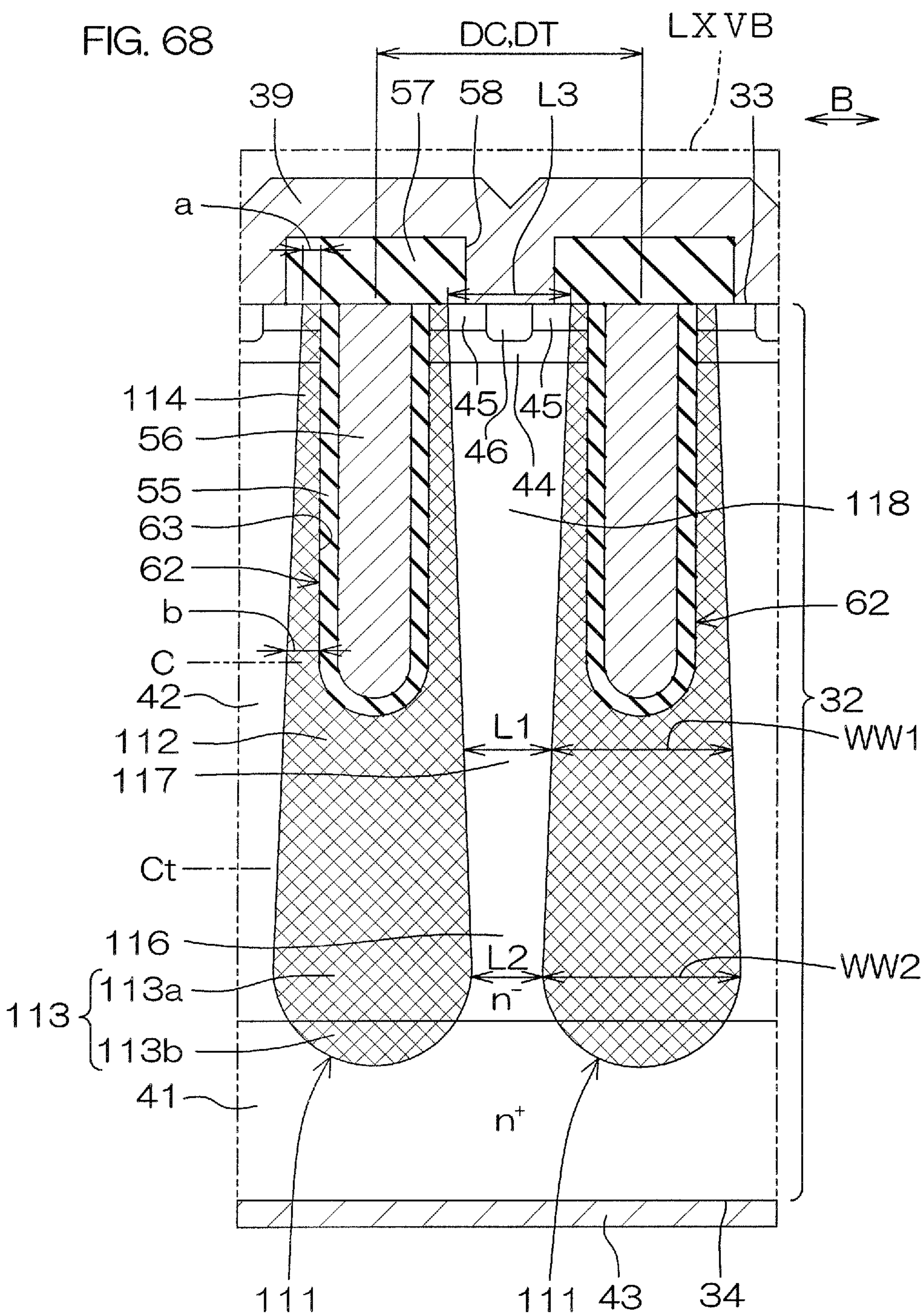
FIG. 68 is an enlarged view of a portion corresponding to FIG. 65B and is a sectional view showing a second configuration example of the carrier trapping regions shown in FIG. 65A.

FIG. 68 is an enlarged view of a portion corresponding to FIG. 65B and is a sectional view showing a second configuration example of the carrier trapping regions 111 shown in FIG. 65A. Structures in FIG. 68 corresponding to structures described in FIG. 65A and FIG. 65B are provided with the same reference signs and description thereof shall be omitted.

Referring to FIG. 68, in this configuration example, the second region 113 of each carrier trapping region 111 is connected to the $n^+$-type semiconductor substrate 41. The second region 113 includes a first portion 113*a*, formed inside the $n^-$-type epitaxial layer 42, and a second portion 113*b*, formed inside the $n^+$-type semiconductor substrate 41.

A crystal defect density N2 of the first portion 113*a* is higher than the n-type impurity density N1 of the $n^-$-type epitaxial layer 42 (N2>N1). A crystal defect density N2 of the second portion 113*b* is lower than the n-type impurity density N3 of the $n^+$-type semiconductor substrate 41 (N2<N3). Functioning virtually as an acceptor is thus suppressed in the second portion 113*b* of the second region 113.

The maximum of the impurity density N5 and the maximum of the crystal defect density N2 in the second region 113 may be positioned inside the $n^-$-type epitaxial layer 42. The maximum of the impurity density N5 and the maximum of the crystal defect density N2 in the second region 113 may be positioned inside the $n^+$-type semiconductor substrate 41.

Figure 69:
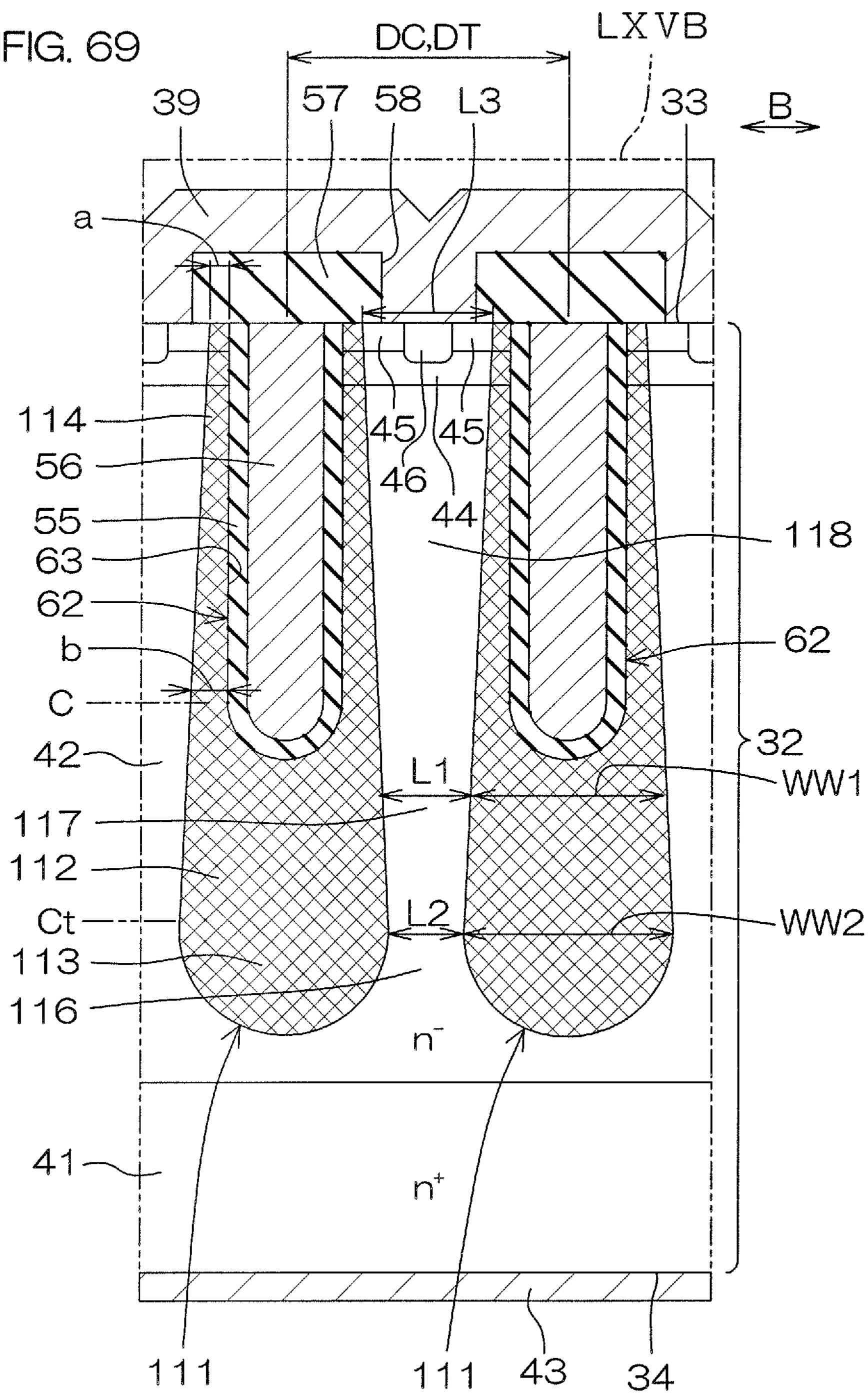
FIG. 69 is an enlarged view of a portion corresponding to FIG. 65B and is a sectional view showing a third configuration example of the carrier trapping regions shown in FIG. 65A.

FIG. 69 is an enlarged view of a portion corresponding to FIG. 65B and is a sectional view showing a third configuration example of the carrier trapping regions 111 shown in FIG. 65A. Structures in FIG. 69 corresponding to structures described in FIG. 65A and FIG. 65B are provided with the same reference signs and description thereof shall be omitted.

Referring to FIG. 69, in this configuration example, the second region 113 of each carrier trapping region 111 is formed across an interval to the first main surface 33 side from the $n^+$-type semiconductor substrate 41. A portion of the $n^-$-type epitaxial layer 42 is interposed in a region between the second region 113 and the $n^+$-type semiconductor substrate 41.

Figure 70A:
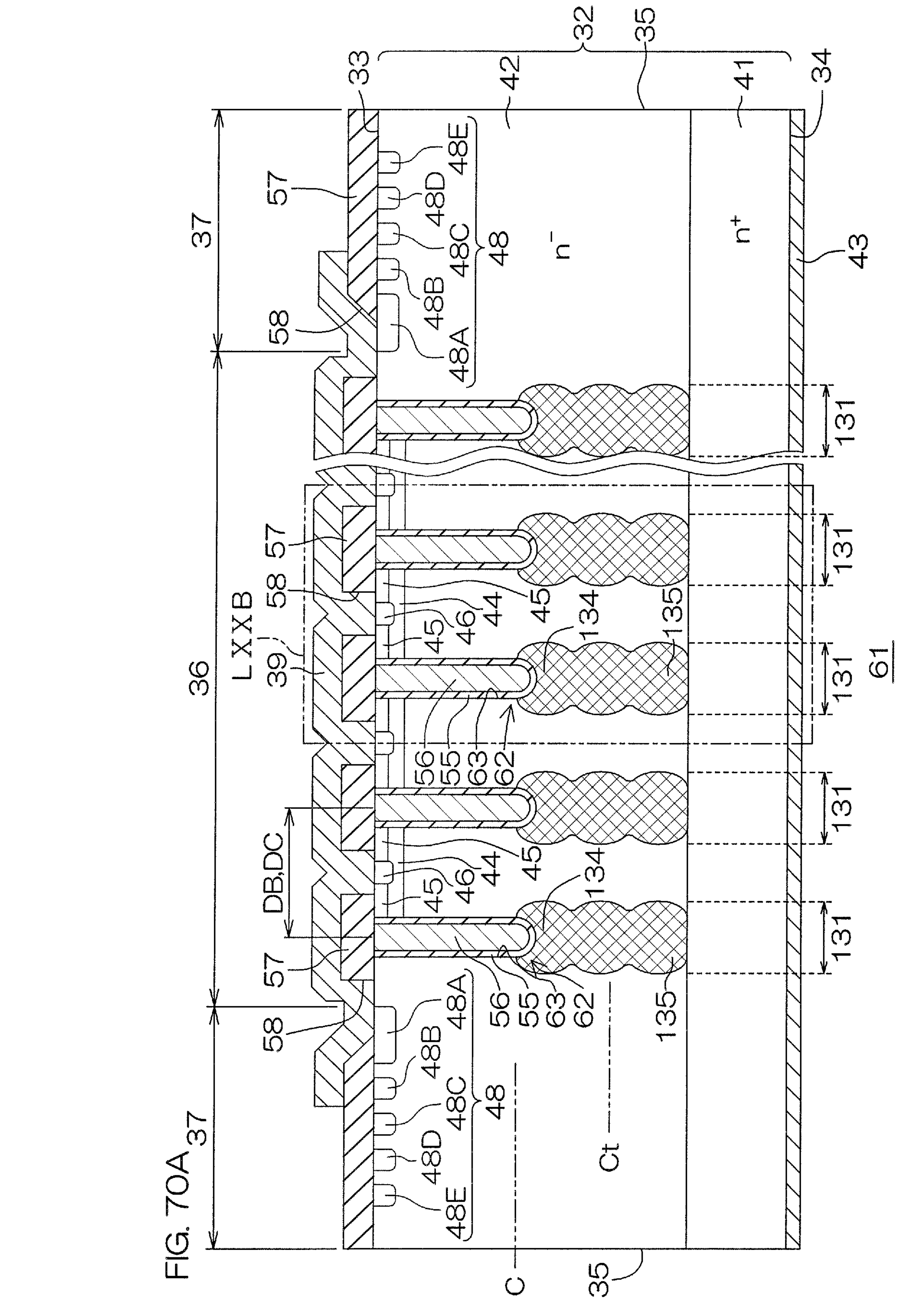
FIG. 70A is a sectional view of a portion corresponding to FIG. 26 and is a sectional view showing the semiconductor device to which carrier trapping regions according to a fifth modification example are applied.
Figure 70B:
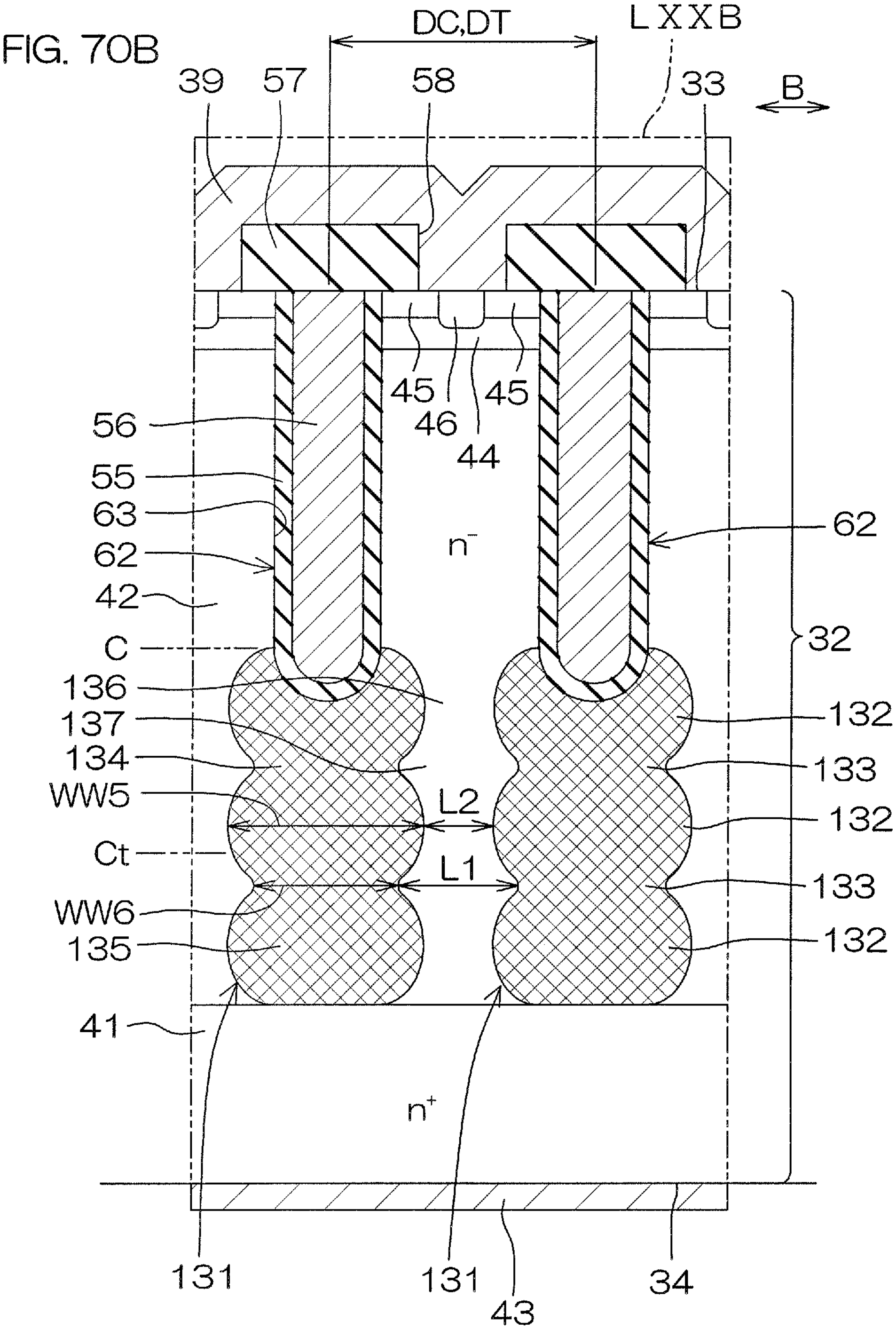
FIG. 70B is an enlarged view of a region LXXB shown in FIG. 70A.

FIG. 70A is a sectional view of a portion corresponding to FIG. 26 and is a sectional view showing the semiconductor device 61 to which carrier trapping regions 131 according to a fifth modification example are applied. FIG. 70B is an enlarged view of a region LXXB shown in FIG. 70A.

In the following, an example where the carrier trapping regions 131 are formed in place of the carrier trapping regions 64 according to the third preferred embodiment (see FIG. 26, etc.) shall be described for the sake of convenience. In the following, structures described for the semiconductor device 61 are provided with the same reference signs and description thereof shall be omitted.

Each carrier trapping region 131 includes crystal defects that are selectively introduced into the $n^-$-type epitaxial layer 42 and has the same properties as the carrier trapping regions 64.

Each carrier trapping region 131 is formed in a region of the $n^-$-type epitaxial layer 42 lower than the bottom wall of a gate trench 63. The carrier trapping region 131 overlaps with the gate trench 63 in plan view. In this configuration example, the carrier trapping region 131 extends along the first direction A such as to be oriented along the gate trench 63.

A distance DC between carrier trapping regions 131 is substantially equal to the distance DT between trench gate structures 62. The distance DC may be not less than 0.5 μm and not more than 10 μm.

More specifically, the distance DC is a distance along the second direction B between a central portion of one carrier trapping region 131 and a central portion of another carrier trapping region 131. The distance DT is, more specifically, a distance along the second direction B between a central portion of one trench gate structure 62 and a central portion of another trench gate structure 62.

The respective carrier trapping regions 131 are formed in one-to-one correspondence with the respective trench gate structures 62. In this configuration example, each carrier trapping region 131 is formed in a column shape which extends along the thickness direction of the $n^-$-type epitaxial layer 42 and has a side portion of uneven shape, in a region lower than the bottom wall of a gate trench 63.

Each carrier trapping region 131 includes wide-width regions 132 and narrow-width regions 133. Each narrow-width region 133 has a width WW6 that is smaller than a width WW5 of each wide-width region 132 (WW6<WW5) in regard to the second direction B. The width WW5 of the wide-width regions 132 and the width WW6 of the narrow-width regions 133 may be not less than 0.1 μm and not more than 10 μm.

The wide-width regions 132 and the narrow-width regions 133 are formed alternately a plurality of times along the thickness direction of the $n^-$-type epitaxial layer 42. In this configuration example, three wide-width regions 132 and two narrow-width regions 133 are formed.

Each carrier trapping region 131 may also be regarded as being of a configuration where a plurality of divided portions (wide-width regions 132) formed at intervals along the thickness direction of the $n^-$-type epitaxial layer 42 are mutually connected by crystal defects (narrow-width regions 133) formed in between the divided portions.

Each carrier trapping region 131 includes an upper first region 134 and a lower second region 135. The first region 134 is positioned upper than the lower intermediate region Ct of the $n^-$-type epitaxial layer 42.

The second region 135 is positioned lower than the lower intermediate region Ct of the $n^-$-type epitaxial layer 42. In FIG. 70A and FIG. 70B, the lower intermediate region Ct is indicated by an alternate long and two short dashed line.

Each first region 134 is exposed from the bottom wall of a gate trench 63. A narrow-width region 133 is exposed from the bottom wall of the gate trench 63. Each second region 135 is connected to the $n^+$-type semiconductor substrate 41. A wide-width region 132 is connected to the $n^+$-type semiconductor substrate 41.

An impurity density N5 of each carrier trapping region 131 has three maxima and two minima along the thickness direction of the $n^-$-type epitaxial layer 42. The three maxima of the impurity density N5 respectively correspond to the three wide-width regions 132.

The two minima of the impurity density N5 respectively correspond to the two narrow-width regions 133. An impurity density N5 of the wide-width regions 132 is not less than an impurity density N5 of the narrow-width regions 133.

On the other hand, the carrier trapping region 131 has a crystal defect density N2 not less than the impurity density N5 (N2≥N5). The crystal defect density N2 of the carrier trapping region 131 has three maxima and two minima along the thickness direction of the $n^-$ type epitaxial layer 42. The three maxima of the crystal defect density N2 respectively correspond to the three wide-width regions 132.

The two minima of the crystal defect density N2 respectively correspond to the two narrow-width regions 133. A crystal defect density N2 of the wide-width regions 132 is not less than a crystal defect density N2 of the narrow-width regions 133.

The $n^-$-type epitaxial layer 42 has first portions 136 and second portions 137 having mutually different distances in regard to the second direction B in each region between two mutually adjacent carrier trapping regions 131.

The first portions 136 are positioned in regions between the wide-width regions 132 of the two mutually adjacent carrier trapping regions 131. The second portions 137 are positioned in regions between the narrow-width regions 133 of the two mutually adjacent carrier trapping regions 131. A first width L1 along the second direction B of each first portion 136 is not less than a second width L2 along the second direction B of each second portion 137 (L1≥L2).

Figure 71:
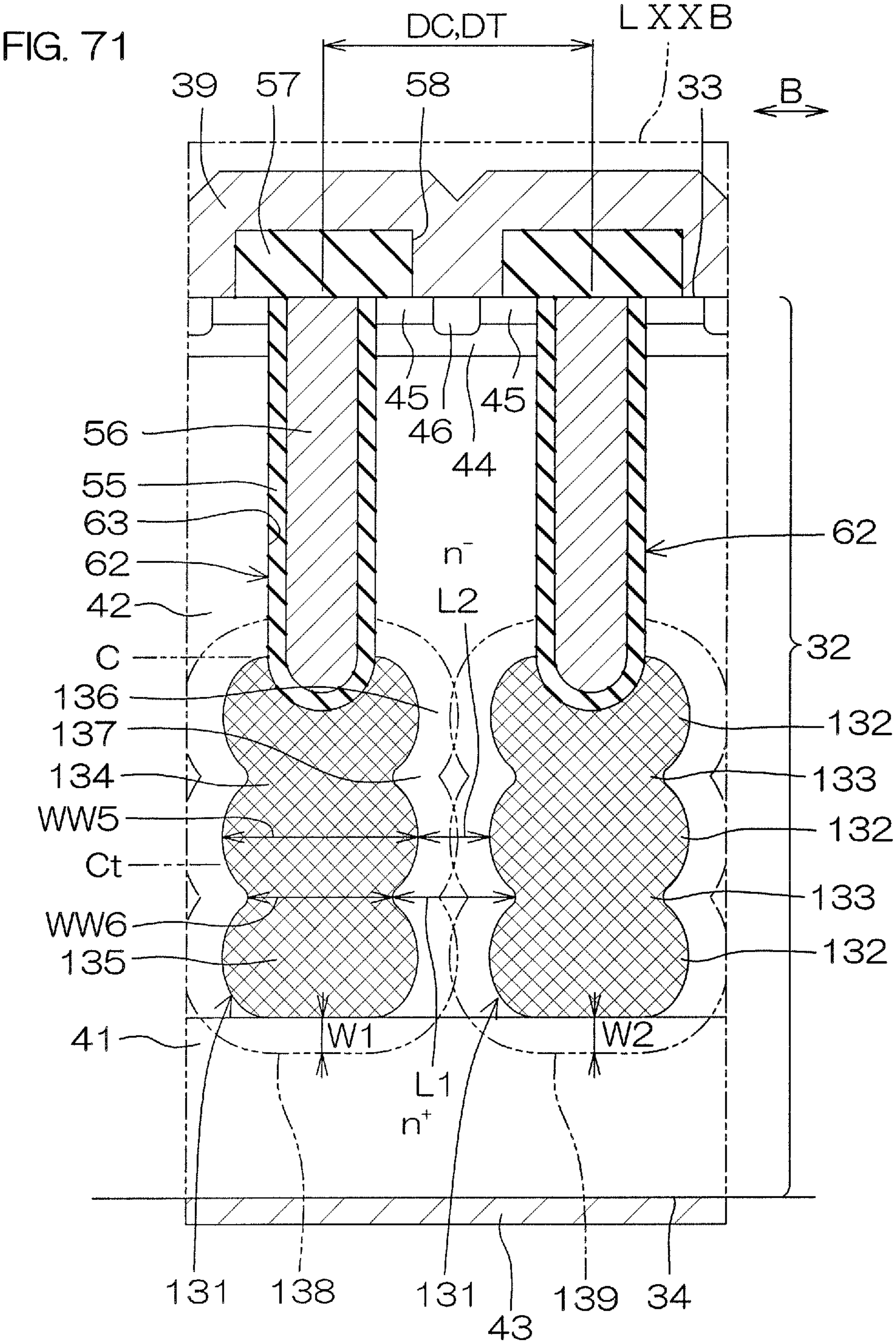
FIG. 71 is an enlarged view of a portion corresponding to FIG. 70B and is a sectional view for describing depletion layers spreading from the carrier trapping regions shown in FIG. 70A.

FIG. 71 is an enlarged view of a portion corresponding to FIG. 70B and is a sectional view for describing depletion layers spreading from the carrier trapping regions 131 shown in FIG. 70A.

The second width L2 of each second portion 137 may be not more than a sum W1+W2 of a first width W1 of a first depletion layer 138 spreading from one carrier trapping region 131 and a second width W2 of a second depletion layer 139 spreading from the other carrier trapping region 131 (L2≤W1+W2).

When L2≤W1+W2 is satisfied, the first depletion layer 138 and the second depletion layer 139 overlap mutually in the second portions 137. The second portions 137 are thereby depleted. Concentration of electric field in the second portions 137 can thereby be relaxed and a short-circuit capacity can thus be increased.

On the other hand, the first width L1 of the first portion 136 may be not less than the sum W1+W2 of the first width W1 of the first depletion layer 138 and the second width W2 of the second depletion layer 139 (L1≥W1+W2). Obviously, it may instead be such that L1≤W1+W2.

Even with this configuration example described above, the same effects as the effects described for the semiconductor device 61 can be exhibited. Also, with this configuration example, the first portions 136 of comparatively wide width and the second portions 137 of comparatively narrow width are formed in the $n^-$-type epitaxial layer 42.

For example, when a surge voltage is applied to the $n^-$-type epitaxial layer 42, a large current can be blocked at the second portions 137 of comparatively narrow width. Heat generation at the second portions 137 can thereby be suppressed and therefore decrease of withstand voltage can be suppressed.

On the other hand, when a conducting state voltage is applied to the $n^-$-type epitaxial layer 42, current paths can be secured at the first portions 136 of comparatively wide width. Increase of on resistance can thereby be suppressed using the first portions 136.

The carrier trapping regions 131 of such structure can be formed by applying a method for forming the carrier trapping regions 131 according to the second modification example after forming the gate trenches 63.

That is, the carrier trapping regions 131 can be formed by irradiating light ions, electrons, or neutrons, etc., in multiple steps toward the interior of the $n^-$-type epitaxial layer 42 from the bottom walls of the gate trenches 63.

The carrier trapping regions 131 that lack the narrow-width regions 133 may be adopted. That is, the plurality of wide-width regions 132 may be formed as divided regions at intervals from each other along the thickness direction of the $n^-$-type epitaxial layer 42.

Figure 72A:
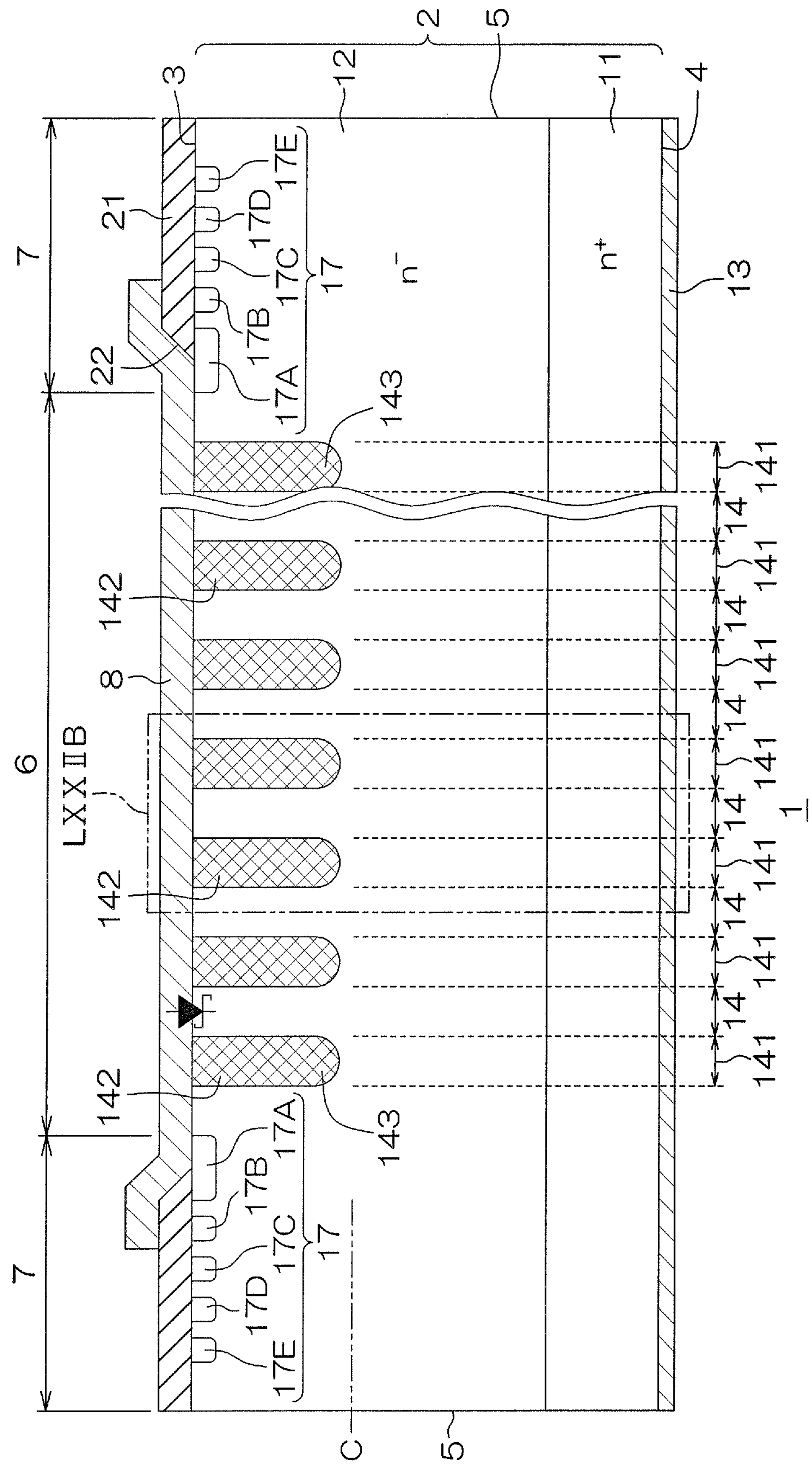
FIG. 72A is a sectional view of a portion corresponding to FIG. 2 and is a sectional view showing the semiconductor device to which carrier trapping regions according to a sixth modification example are applied.
Figure 72B:
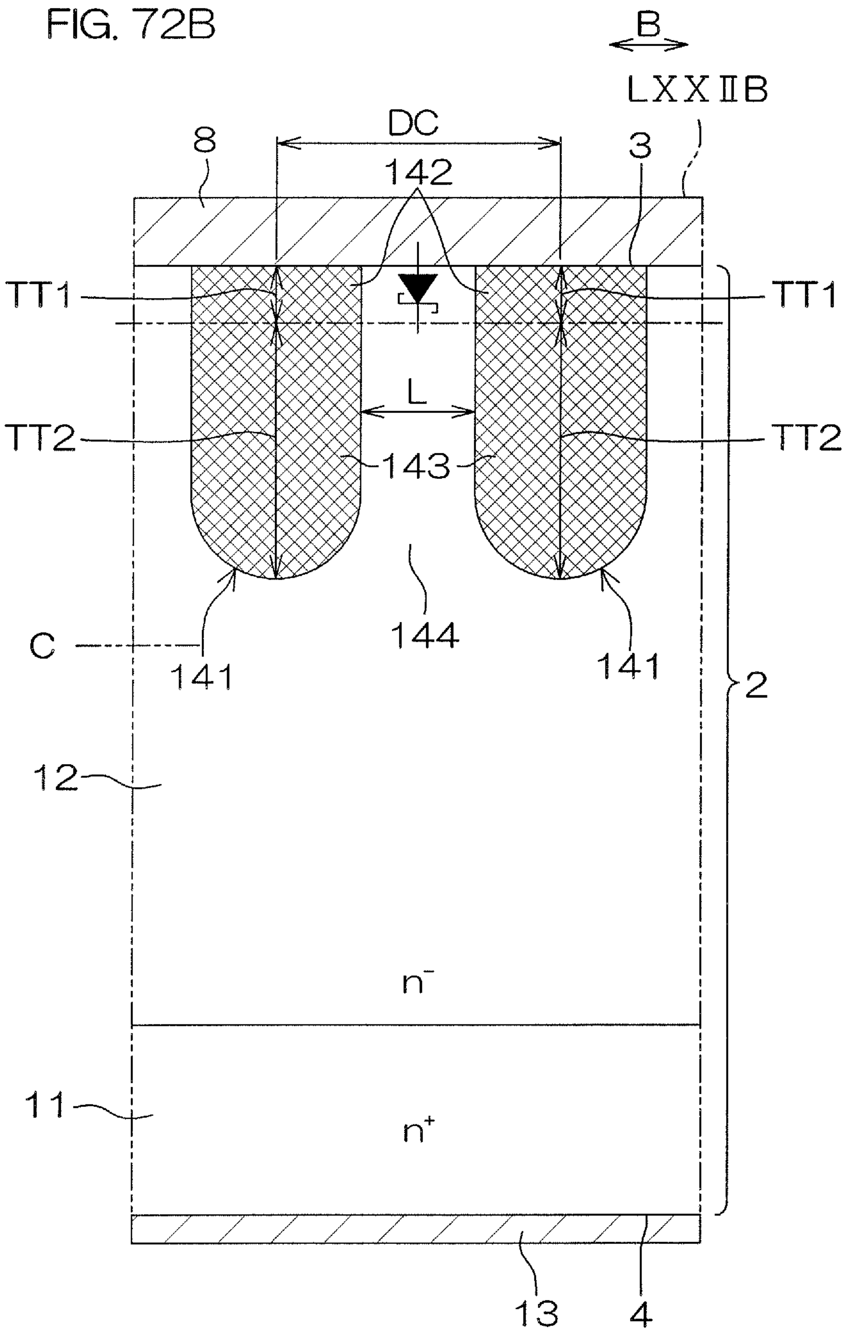
FIG. 72B is an enlarged view of a region LXXIIB shown in FIG. 72A.

FIG. 72A is a sectional view of a portion corresponding to FIG. 2 and is a sectional view showing the semiconductor device 1 to which carrier trapping regions 141 according to a sixth modification example are applied. FIG. 72B is an enlarged view of a region LXXIIB shown in FIG. 72A.

In the following, an example where the carrier trapping regions 141 are formed in place of the carrier trapping regions 15 according to the first preferred embodiment (see FIG. 2, etc.) shall be described for the sake of convenience. In the following, structures described for the semiconductor device 1 are provided with the same reference signs and description thereof shall be omitted.

Each carrier trapping region 141 includes crystal defects that are selectively introduced into the $n^-$-type epitaxial layer 12 and has the same properties as the carrier trapping regions 15.

In this configuration example, each carrier trapping region 141 is formed in a column shape extending along the thickness direction of the $n^-$-type epitaxial layer 12. A width WC in the second direction B of each carrier trapping region 141 may be not less than 0.1 μm and not more than 10 μm.

A distance DC between carrier trapping regions 141 may be not less than 0.5 μm and not more than 10 More specifically, the distance DC is a distance along the second direction B between a central portion of one carrier trapping region 141 and a central portion of another carrier trapping region 141.

In this configuration example, each carrier trapping region 141 is formed across an interval to the first main surface 3 side of the $n^-$-type epitaxial layer 12 from the intermediate region C.

Figure 73:
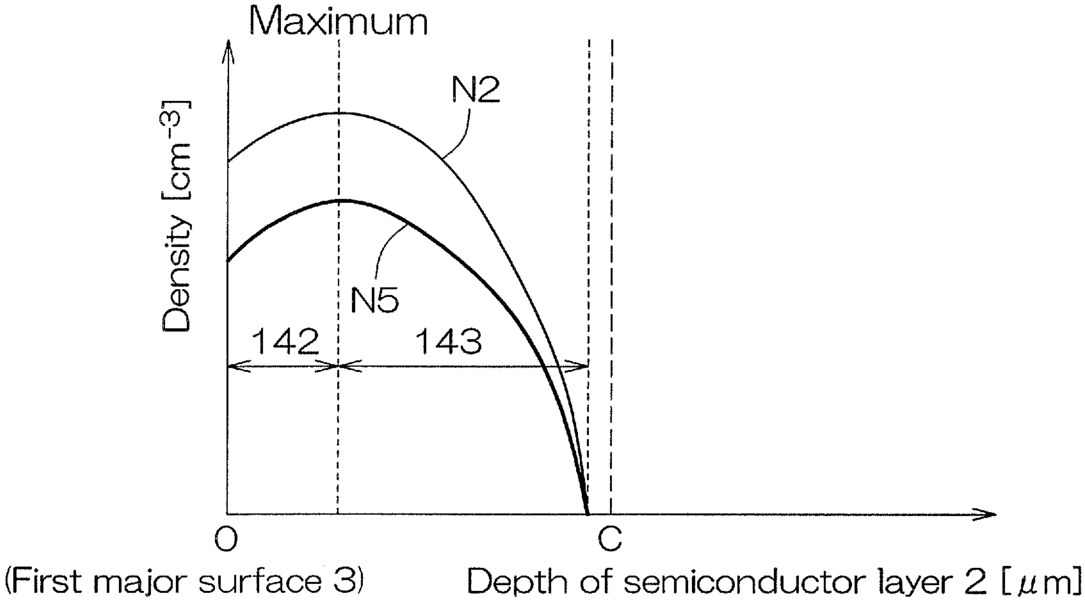
FIG. 73 is a graph of an impurity density and a defect density of each carrier trapping region shown in FIG. 72A.

FIG. 73 is a graph of an impurity density N5 and a crystal defect density N2 of each carrier trapping region 141 shown in FIG. 72A. The impurity density N5 of the carrier trapping region 141 refers to a density of light ions, electrons, or neutrons, etc., introduced into the $n^-$-type epitaxial layer 12.

In FIG. 73, the ordinate expresses the density [$cm^{-3}$] and the abscissa indicates the depth [μm] of the $n^-$-type epitaxial layer 12 when the first main surface 3 of the $n^-$-type epitaxial layer 12 is defined as zero.

The impurity density N5 of the carrier trapping region 141 has a single maximum at an intermediate portion in the thickness direction of the $n^-$-type epitaxial layer 12. The maximum of the impurity density N5 is positioned upper than the intermediate region C of the $n^-$ -type epitaxial layer 12.

Each carrier trapping region 141 has a first region 142 positioned at the first main surface 3 side of the $n^-$-type epitaxial layer 12, and a second region 143 positioned at the second main surface 4 side with respect to the first region 142.

The first region 142 is a region in which the impurity density N5 increases gradually toward the maximum from the first main surface 3. The second region 143 is a region in which the impurity density N5 decreases gradually from the maximum toward the second main surface 4.

In regard to the thickness direction of the $n^-$-type epitaxial layer 12, a thickness TT1 of the first region 142 is not more than a thickness TT2 of the second region 143 (TT1≤TT2). More specifically, the thickness TT1 is less than TT2 (TT1≤TT2).

On the other hand, the carrier trapping region 141 has the crystal defect density N2 not less than the impurity density N5 (N2≥N5). The crystal defect density N2 of the carrier trapping region 141 has a single maximum at an intermediate portion in the thickness direction of the $n^-$-type epitaxial layer 12. The maximum of the crystal defect density N2 is positioned upper than the intermediate region C of the $n^-$-type epitaxial layer 12.

A crystal defect density N2 of the first region 142 increases gradually toward the maximum from the first main surface 3. A crystal defect density N2 of the second region 143 decreases gradually from the maximum toward the second main surface 4.

Figure 74:
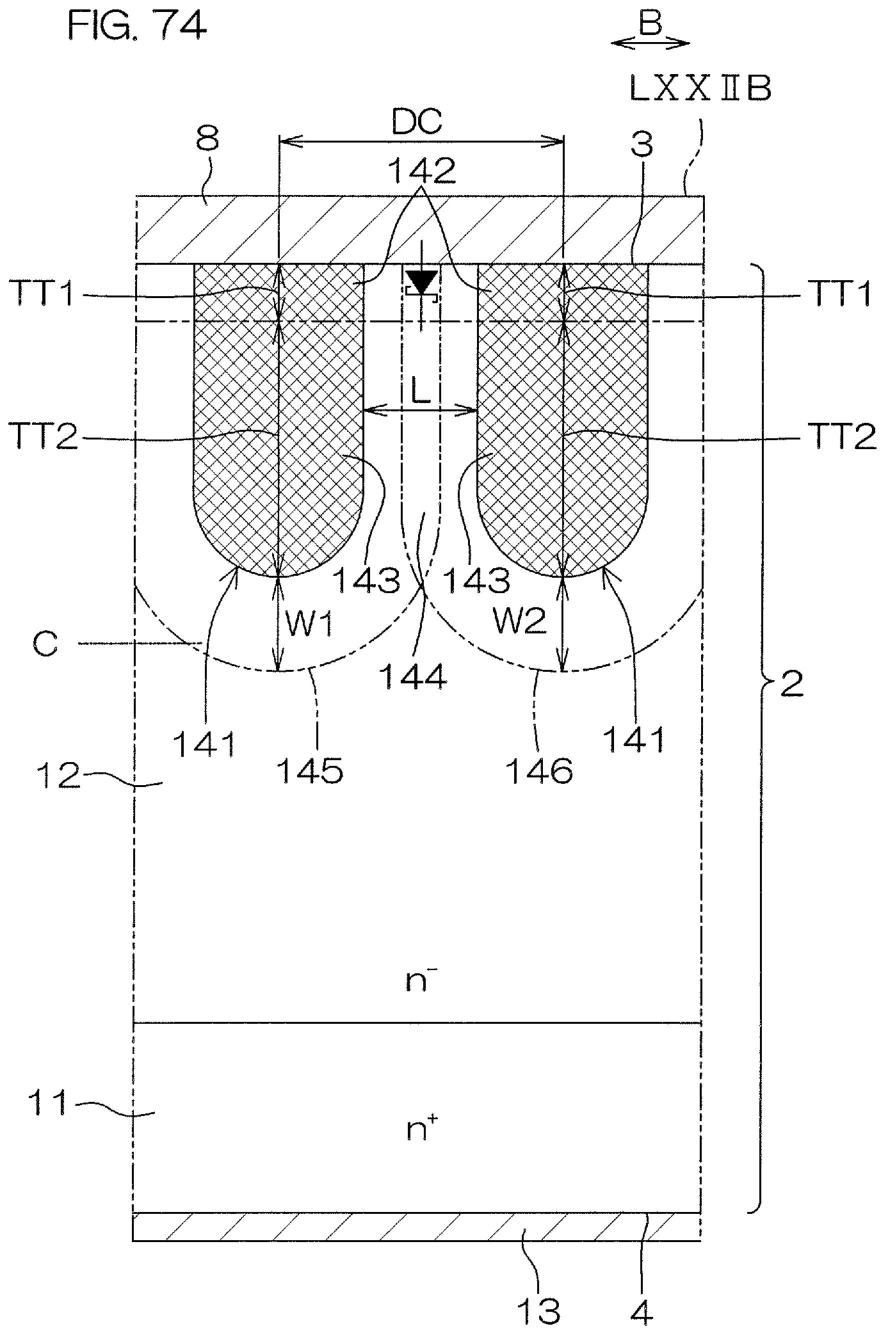
FIG. 74 is an enlarged view of a portion corresponding to FIG. 72B and is a sectional view for describing depletion layers spreading from the carrier trapping regions shown in FIG. 72A.

FIG. 74 is an enlarged view of a portion corresponding to FIG. 72B and is a sectional view for describing depletion layers spreading from the carrier trapping regions 141 shown in FIG. 72A.

A distance L, along the second direction B, of an intermediate portion 144 of the $n^-$-type epitaxial layer 12 positioned between two mutually adjacent carrier trapping regions 141 may be not more than a sum W1+W2 of a first width W1 of a first depletion layer 145 spreading from one carrier trapping region 141 and a second width W2 of a second depletion layer 146 spreading from the other carrier trapping region 141 (L≤W1+W2).

When L2≤W1+W2 is satisfied, the first depletion layer 145 and the second depletion layer 146 overlap mutually in the intermediate portion 144. The intermediate portion 144 is thereby depleted. Concentration of electric field in the intermediate portion 144 can thus be relaxed and a short-circuit capacity can thus be increased.

Even with this configuration example described above, the same effects as the effects described for the semiconductor device 1 can be exhibited. Also, with this configuration example, the distance L of the intermediate portion 144 is not more than the sum W1+W2 of the first width W1 of the first depletion layer 145 and the second width W2 of the second depletion layer 146 (L≤W1+W2). The intermediate portion 144 can thus be depleted and the withstand voltage can thus be improved.

With this configuration example, an example was described where each carrier trapping region 141 includes the first region 142 in which the impurity density N5 increases gradually, and the second region 143 in which the impurity density N5 decreases gradually.

However, the thickness TT1 of the first region 142 may be 0. That is, the carrier trapping region 141 that includes just the second region 143 may be adopted. Also, the carrier trapping region 141 may be formed such that the impurity density N5 decreases gradually from the first main surface 3 toward the second main surface 4.

Also, with this configuration example, an example where the carrier trapping regions 141 are formed at positions upper than the intermediate region C was described. However, the carrier trapping regions 141 may instead be formed such as to cross the intermediate region C in regard to the thickness direction of the $n^-$-type epitaxial layer 12.

Besides the first preferred embodiment, the carrier trapping regions 141 can also be applied to any of the second preferred embodiment to the fourth preferred embodiment. The carrier trapping regions 141 may be incorporated in any of the configurations shown in FIG. 2, FIG. 4, FIG. 5, FIG. 9, FIG. 18, FIG. 19, FIG. 20, FIG. 24, FIG. 26, FIG. 27, FIG. 28, FIG. 32, FIG. 33, FIG. 35, FIG. 36, etc. Also, the structure of the carrier trapping regions 141 may be incorporated in any of the first modification example to the fifth modification example.

FIG. 75A to FIG. 75D are enlarged views of a portion corresponding to FIG. 72B and are sectional views for describing an example of a method for forming the carrier trapping regions 141 shown in FIG. 72A. The method for forming the carrier trapping regions 141 can be incorporated in the steps for forming the carrier trapping regions 15 (step S15 and step S16) shown in FIG. 15 described above.

Figure 75A:
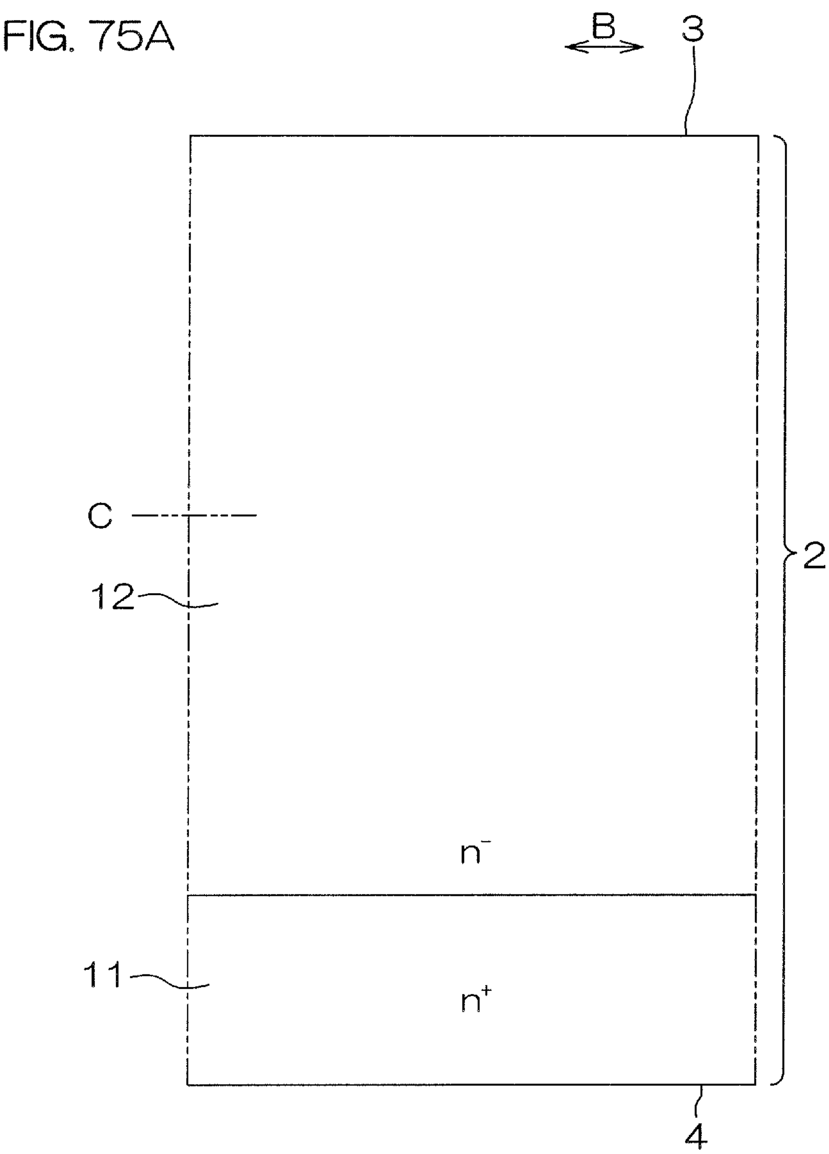
FIG. 75A is an enlarged view of a portion corresponding to FIG. 72B and is a sectional view for describing an example of a method for forming the carrier trapping regions shown in FIG. 72A.

Referring to FIG. 75A, first, the $n^+$-type semiconductor substrate 11 is prepared. Next, in parallel to introducing the n-type impurity, SiC is epitaxially grown from a main surface of the $n^+$-type semiconductor substrate 11.

The $n^-$-type epitaxial layer 12 is thereby formed on the $n^+$-type semiconductor substrate 11. The first main surface 3 is formed by the $n^-$-type epitaxial layer 12 and the second main surface 4 is formed by the $n^+$-type semiconductor substrate 11.

Figure 75B:
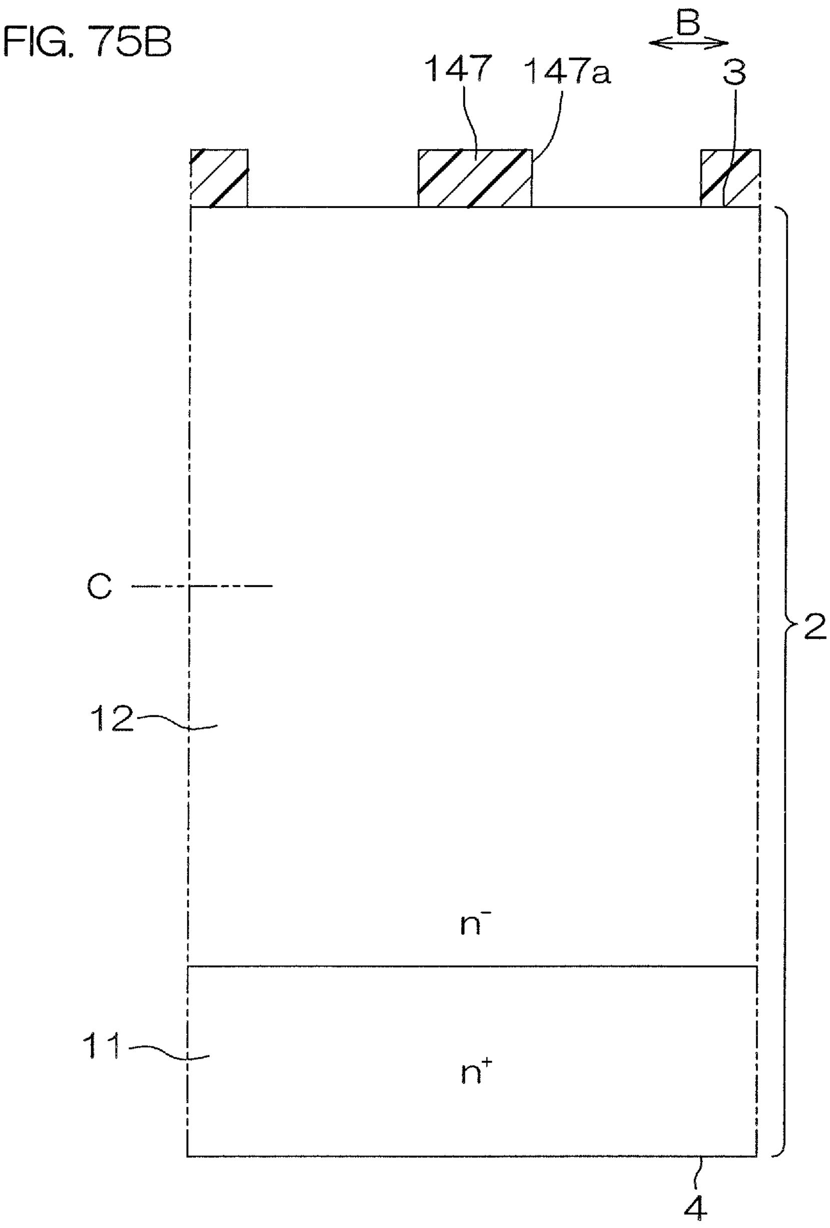
FIG. 75B is a sectional view of a step subsequent to that of FIG. 75A.

Next, referring to FIG. 75B, a mask 147 having a predetermined pattern is formed on the first main surface 3 of the $n^-$-type epitaxial layer 12. The mask 147 has openings 147*a* exposing regions at which the carrier trapping regions 141 are to be formed.

Figure 75C:
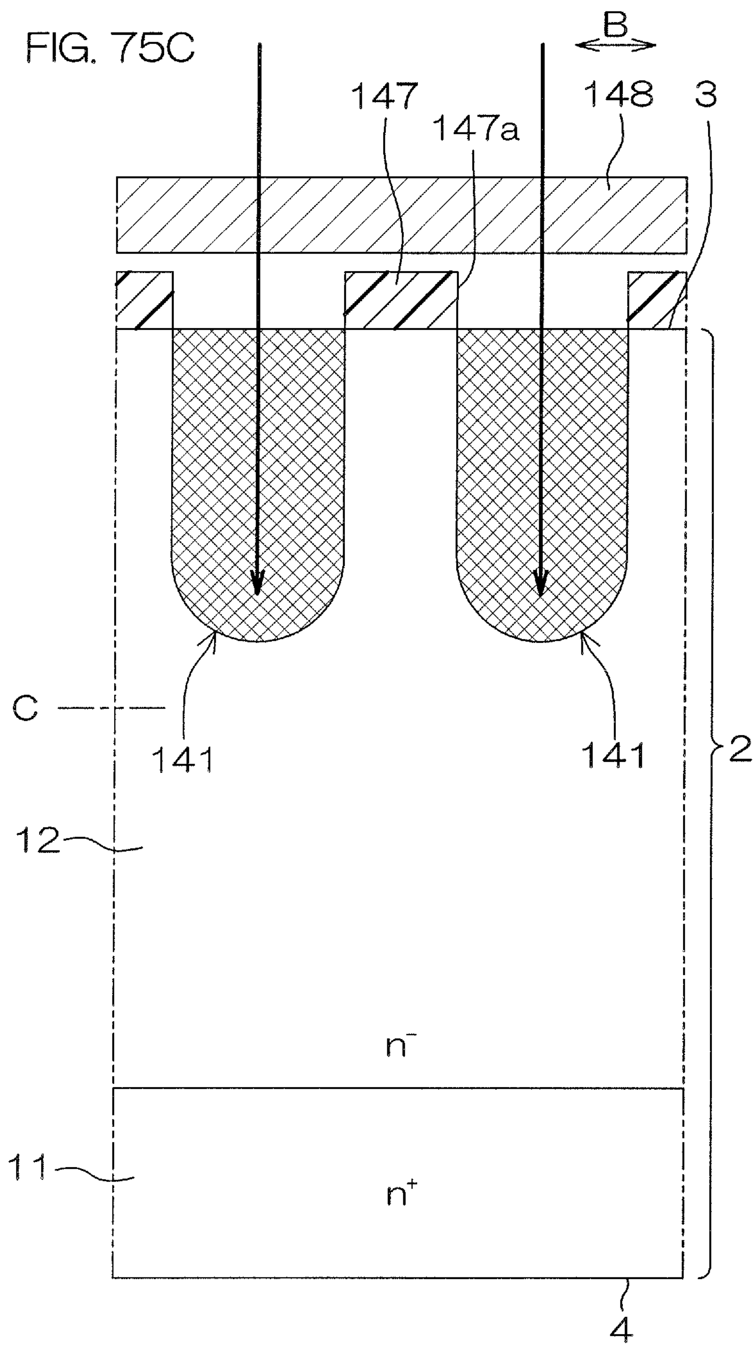
FIG. 75C is a sectional view of a step subsequent to that of FIG. 75B.

Next, referring to FIG. 75C, light ions, electrons, or neutrons, etc., are irradiated onto the $n^-$-type epitaxial layer 12 via the mask 147. Also, with this embodiment, the light ions, electrons, or neutrons, etc., are irradiated onto the $n^-$-type epitaxial layer 12 via a shielding plate 148. The light ions may include at least one type of ions among hydrogen ions ($H^+$), helium ions ($He^+$), and boron ions ($B^+$).

In the present step, depth positions into which the light ions, electrons, or neutrons, etc., are driven with respect to the $n^-$-type epitaxial layer 12 are adjusted by a material and a thickness of the shielding plate 148 in addition to the irradiation energy (acceleration voltage applied by the irradiating apparatus) of the light ions, electrons, or neutrons, etc.

As the shielding plate 148, any member may be adopted as long as it is a member that partially obstructs the introduction of the light ions, electrons, or neutrons, etc., into the first main surface 3 of the $n^-$-type epitaxial layer 12. The shielding plate 148 may, for example, be a metal plate. The metal plate may be an aluminum plate.

Thereafter, the mask 147 and the shielding plate 148 are removed. The carrier trapping regions 141 having the comparatively high impurity density N5 are thereby formed in the first main surface 3 of the $n^-$-type epitaxial layer 12.

Thereafter, a portion of the crystal defects formed in the $n^-$-type epitaxial layer 12 may be recovered by the annealing treatment method. The annealing treatment method may be performed under an atmosphere of less than 1500° C. (for example, not more than 1200° C.).

Examples of features extracted from the present description and drawings are indicated below.

[Item 1] A semiconductor device including a semiconductor layer of a first conductivity type having a main surface in which a first trench is formed, a gate electrode embedded in the first trench across a gate insulating film, a second conductivity type impurity region formed in a surface layer portion of the main surface of the semiconductor layer and facing the gate electrode across the gate insulating film, a first conductivity type impurity region formed in a surface layer portion of the second conductivity type impurity region and facing the gate electrode across the gate insulating film, and a carrier trapping region including crystal defects and formed in a region of the semiconductor layer lower than a bottom wall of the first trench.

The semiconductor device according to Item 1 has a field effect type transistor that uses a trench gate structure. The carrier trapping region is formed in the region of the semiconductor layer lower than the bottom wall of the first trench.

Majority carriers inside the semiconductor layer are trapped by the crystal defects included in the carrier trapping region. The crystal defects included in the carrier trapping region thus have the same function as donors or acceptors.

The carrier trapping region becomes charged oppositely to a first conductivity type impurity that is ionized by trapping the majority carriers. Decrease in electric field strength along a thickness direction of the semiconductor layer when a voltage is applied to the semiconductor layer can thereby be suppressed. Consequently, the electric field strength inside the semiconductor layer can be made close to being uniform and a withstand voltage can thus be improved.

Also, with the semiconductor device of Item 1, the semiconductor layer can be increased in first impurity concentration while forming the carrier trapping region. Reduction of on resistance can thereby be achieved.

Such a carrier trapping region may be formed, for example, by irradiating the semiconductor layer with light ions, electrons, or neutrons, etc. A complicated manufacturing process is thus not required to form the carrier trapping region.

Also, by the irradiation of light ions, electrons, or neutrons, etc., a carrier trapping region having arbitrary crystal defect density can be formed in arbitrary region of the semiconductor layer by just adjusting conditions, such as an irradiation amount, irradiation energy, etc. A semiconductor device which is easy to manufacture and with which reduction of on resistance and improvement of withstand voltage can be achieved can thus be provided.

[Item 2] The semiconductor device according to Item 1, further including a semiconductor substrate, wherein the semiconductor layer is formed on the semiconductor substrate and the carrier trapping region includes a first region positioned upper than an intermediate region between the bottom wall of the first trench and the semiconductor substrate in regard to a thickness direction of the semiconductor layer, and a second region positioned lower than the intermediate region.

[Item 3] The semiconductor device according to Item 2, wherein a conductivity type of the semiconductor substrate is the first conductivity type.

[Item 4] The semiconductor device according to Item 2, wherein a conductivity type of the semiconductor substrate is the second conductivity type.

[Item 5] The semiconductor device according to any one of Items 1 to 4, wherein the carrier trapping region has a crystal defect density that is higher than a first conductive type impurity density of the semiconductor layer.

[Item 6] The semiconductor device according to any one of Items 1 to 5, wherein the carrier trapping region has a higher specific resistance than a specific resistance of the semiconductor layer.

[Item 7] The semiconductor device according to any one of Items 1 to 6, wherein the carrier trapping region is formed in a column shape extending along a thickness direction of the semiconductor layer.

[Item 8] The semiconductor device according to any one of Items 1 to 7, wherein the carrier trapping region is floated in an interior of the semiconductor layer.

[Item 9] The semiconductor device according to any one of Items 1 to 8, wherein the carrier trapping region includes a plurality of portions formed at intervals along a thickness direction of the semiconductor layer.

[Item 10] The semiconductor device according to any one of Items 1 to 9, wherein the first trench extends along one direction in plan view and the carrier trapping region extends along the one direction and overlaps with the first trench in plan view.

[Item 11] The semiconductor device according to any one of Items 1 to 9, wherein the first trench extends along a first direction in plan view and the carrier trapping region extends along a second direction intersecting the first direction in plan view.

[Item 12] The semiconductor device according to any one of Items 1 to 11, further including a main surface electrode formed on the main surface of the semiconductor layer and electrically connected to the second conductivity type impurity region and the first conductivity type impurity region.

[Item 13] The semiconductor device according to Item 12, wherein a second trench is formed across an interval from the first trench in the main surface of the semiconductor layer, the second conductivity type impurity region is exposed from an inner wall of the second trench, the first conductivity type impurity region is exposed from the inner wall of the second trench, and the main surface electrode is electrically connected to the second conductivity type impurity region and the first conductivity type impurity region inside the second trench.

[Item 14] The semiconductor device according to any one of Items 1 to 13, wherein the semiconductor layer is an epitaxial layer.

[Item 15] The semiconductor device according to any one of Items 1 to 14, wherein the semiconductor layer includes a wide bandgap semiconductor.

[Item 16] The semiconductor device according to Item 15, wherein the semiconductor layer includes an SiC as the wide bandgap semiconductor.

[Item 17] The semiconductor device according to Item 15, wherein the semiconductor layer includes a diamond as the wide bandgap semiconductor.

[Item 18] The semiconductor device according to Item 15, wherein the semiconductor layer includes a nitride semiconductor as the wide bandgap semiconductor.

[Item 19] The semiconductor device according to any one of Items 1 to 14, wherein the semiconductor layer includes S1.

[Item 20] A semiconductor package including an island, a lead terminal arranged at a periphery of the island, the semiconductor device according to any one of Items 1 to 19 that is mounted on the island, a lead wire electrically connected the lead terminal and the semiconductor device, and a sealing resin sealing the island, the lead terminal, the semiconductor device and the lead wire such as to expose a portion of the lead terminal.

[Item 21] An inverter including a first wiring connected to a high voltage side of a power supply, a second wiring connected to a low voltage side of the power supply, an arm circuit connected between the first wiring and the second wiring and including a plurality of the semiconductor devices according to any one of Items 1 to 19 that are serially connected, and an output wiring connected to connection portions of the plurality of semiconductor devices in the arm circuit.

The present application corresponds to Japanese Patent Application No. 2017-011610 filed on Jan. 25, 2017 in the Japan Patent Office, and the entire disclosure of this application is incorporated herein by reference.

While preferred embodiments of the present invention have been described in detail, these are merely specific examples used to clarify the technical content of the present invention and the present invention should not be interpreted as being limited to these specific examples and the scope of the present invention are to be limited only by the appended claims.

REFERENCE SIGNS LIST

1 Semiconductor device
8 Anode pad electrode (anode electrode)
12 $n^-$-type epitaxial layer (semiconductor layer)
14 $n^-$-type diode region
15 Carrier trapping region
16 Electric field relaxation region
18 First region of carrier trapping region
19 Second region of carrier trapping region
23 Divided portion of carrier trapping region
24 Embedded insulator (insulator)
31 Semiconductor device
42 $n^-$-type epitaxial layer
44 p-type body region (second conductivity type impurity region)
45 $n^+$-type source region (first conductivity type impurity region)
47 Carrier trapping region
49 First region of carrier trapping region
50 Second region of carrier trapping region
55 Gate insulating film
56 Gate electrode
53 Divided portion of carrier trapping region
61 Semiconductor device
62 Trench gate structure
63 Gate trench
64 Carrier trapping region
65 First region of carrier trapping region
66 Second region of carrier trapping region
67 Divided portion of carrier trapping region
71 Semiconductor device
72 Trench source structure
73 Source trench
74 Embedded source electrode
301 Semiconductor package
401 Inverter circuit
A First direction
B Second direction
C Intermediate region
N1 n-type impurity density of $n^-$-type epitaxial layer
N2 Crystal defect density of carrier trapping region

The invention claimed is:

1. A semiconductor device, comprising:

a semiconductor substrate of a first conductivity type;

a semiconductor layer of the first conductivity type that is formed on the semiconductor substrate, that includes SiC, and that has a main surface;

a diode region of the first conductivity type formed in a surface layer portion of the main surface of the semiconductor laver;

a carrier trapping region that is formed along a peripheral edge of the diode region in the surface layer portion of the main surface of the semiconductor layer such as to extend perpendicular with respect to the main surface as viewed in cross section, that includes crystal defects which are formed by irradiating with electrons, neutrons or light ions and which do not have trivalent elements and heavy ions, and that traps majority carriers inside the semiconductor layer;

a termination region of a second conductivity type that is formed in the surface layer portion of the main surface of the semiconductor layer such as to enclose the diode region and the carrier trapping region as viewed in plan; and an electrode formed on the main surface of the semiconductor layer and electrically connected to the diode region, wherein the carrier trapping region is formed in a column shape extending along the thickness direction of the semiconductor layer and having a side portion of an uneven shape, the carrier trapping region includes a first region positioned on the main surface side with respect to a depth position of an intermediate region of the semiconductor layer and a second region positioned on the semiconductor substrate side with respect to the depth position of the intermediate region of the semiconductor layer and crossed a boundary portion between the semiconductor substrate and the semiconductor layer, the carrier trapping region includes wide-width regions and narrow-width regions, each narrow-width region has a width WW4 that is smaller than a width WW3 of each wide-width region, the wide-width regions and the narrow-width regions are formed alternately a plurality of times along the thickness direction of the semiconductor layer, the second region includes a first portion formed inside the semiconductor layer and a second portion formed inside the semiconductor substrate, a crystal defect density N2 of the first portion is higher than first conductivity type impurity density N1 of the semiconductor layer (N2>N1), and a crystal defect density N2 of the second portion is lower than a first conductivity type impurity density N3 of the semiconductor substrate (N2<N3), wherein the termination region has a depth smaller than a depth of the carrier trapping region and is formed at an interval to the main surface side from the depth position of the intermediate region of the semiconductor layer, wherein an uppermost wide-width region of the carrier trapping region is exposed from the main surface of the semiconductor layer, and wherein the termination region has a depth smaller than a depth of the uppermost wide-width region of the carrier trapping region.

2. The semiconductor device according to claim 1, wherein the carrier trapping region has a higher specific resistance than a specific resistance of the semiconductor layer.

3. The semiconductor device according to claim 1, wherein the carrier trapping region is formed at an interval to the semiconductor substrate side from the main surface.

4. The semiconductor device according to claim 1, further comprising:

an insulator embedded in the surface layer portion of the main surface of the semiconductor layer;

wherein the carrier trapping region is formed along the insulator in the semiconductor layer.

5. The semiconductor device according to claim 1, further comprising:

a plurality of electric field relaxation regions each formed along the peripheral edge of the diode region in the surface layer portion of the main surface of the semiconductor layer and relaxing an electric field in the surface layer portion of the main surface of the semiconductor layer;

wherein the electrode is electrically connected to the plurality of electric field relaxation regions.

6. The semiconductor device according to claim 1, wherein the semiconductor layer is an epitaxial layer.

7. The semiconductor device according to claim 1, wherein a voltage drop occurring in the semiconductor layer is not less than 100 V and not more than 30000 V, when a reverse current of 1 mA is applied to the diode region.

8. A semiconductor device, comprising:

a semiconductor substrate of a first conductivity type;

a semiconductor layer of the first conductivity type that is formed on the semiconductor substrate, that includes SiC, and that has a main surface;

a diode region of the first conductivity type formed in a surface layer portion of the main surface of the semiconductor layer;

a carrier trapping region that is formed along a peripheral edge of the diode region in the surface layer portion of the main surface of the semiconductor layer such as to extend perpendicular with respect to the main surface as viewed in cross section, that includes crystal defects which are formed by irradiating with electrons, neutrons or light ions and which do not have trivalent elements and heavy ions, and that traps majority carriers inside the semiconductor layer;

a termination region of a second conductivity type that is formed in the surface layer portion of the main surface of the semiconductor layer such as to enclose the diode region and the carrier trapping region as viewed in plan; and an electrode formed on the main surface of the semiconductor layer and electrically connected to the diode region, wherein the carrier trapping region is formed in a column shape extending along the thickness direction of the semiconductor layer and having a side portion of an uneven shape, the carrier trapping region includes a first region positioned on the main surface side with respect to a depth position of an intermediate region of the semiconductor layer and a second region positioned on the semiconductor substrate side with respect to the depth position of the intermediate region of the semiconductor layer and crossed a boundary portion between the semiconductor substrate and the semiconductor layer, the carrier trapping region includes wide-width regions and narrow-width regions, each narrow-width region has a width WW4 that is smaller than a width WW3 of each wide-width region, the wide-width regions and the narrow-width regions are formed alternately a plurality of times along the thickness direction of the semiconductor layer, the second region includes a first portion formed inside the semiconductor layer and a second portion formed inside the semiconductor substrate, a crystal defect density N2 of the first portion is higher than first conductivity type impurity density N1 of the semiconductor layer (N2>N1), and a crystal defect density N2 of the second portion is lower than a first conductivity type impurity density N3 of the semiconductor substrate (N2<N3), wherein the termination region has a depth smaller than a depth of the carrier trapping region and is formed at an interval to the main surface side from the depth position of the intermediate region of the semiconductor layer, wherein an upper part of a lowermost wide-width region of the carrier trapping region forms the first portion of the second region and a lower part of the lowermost wide-width region of the carrier trapping region forms the second portion of the second region, wherein an uppermost wide-width region of the carrier trapping region is exposed from the main surface of the semiconductor layer, and wherein the termination region has a depth smaller than a depth of the uppermost wide-width region of the carrier trapping region.

9. The semiconductor device according to claim 8, wherein the carrier trapping region has a higher specific resistance than a specific resistance of the semiconductor layer.

10. The semiconductor device according to claim 8, wherein the carrier trapping region is formed at an interval to the semiconductor substrate side from the main surface.

11. The semiconductor device according to claim 8, further comprising:

an insulator embedded in the surface layer portion of the main surface of the semiconductor layer;

wherein the carrier trapping region is formed along the insulator in the semiconductor layer.

12. The semiconductor device according to claim 8, further comprising:

a plurality of electric field relaxation regions each formed along the peripheral edge of the diode region in the surface layer portion of the main surface of the semiconductor layer and relaxing an electric field in the surface layer portion of the main surface of the semiconductor layer;

wherein the electrode is electrically connected to the plurality of electric field relaxation regions.

13. The semiconductor device according to claim 8, wherein the semiconductor layer is an epitaxial layer.

14. The semiconductor device according to claim 8, wherein a voltage drop occurring in the semiconductor layer is not less than 100 V and not more than 30000 V, when a reverse current of 1 mA is applied to the diode region.

* * * * *